United States Patent
Nishihara et al.

(10) Patent No.: US 6,566,698 B2
(45) Date of Patent: May 20, 2003

(54) FERROELECTRIC-TYPE NONVOLATILE SEMICONDUCTOR MEMORY AND OPERATION METHOD THEREOF

(75) Inventors: Toshiyuki Nishihara, Kanagawa (JP); Koji Watanabe, Mie (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/866,317

(22) Filed: May 25, 2001

(65) Prior Publication Data

US 2002/0079520 A1 Jun. 27, 2002

(30) Foreign Application Priority Data

| May 26, 2000 | (JP) | ............. | 2000-156089 |
| Aug. 17, 2000 | (JP) | ............. | 2000-247143 |
| Aug. 23, 2000 | (JP) | ............. | 2000-252080 |
| Aug. 31, 2000 | (JP) | ............. | 2000-262755 |
| Oct. 18, 2000 | (JP) | ............. | 2000-317880 |

(51) Int. Cl.⁷ ............. H01L 31/113; H01L 31/119; H01L 29/76; H01L 29/94; H01L 27/108

(52) U.S. Cl. ............. 257/295; 257/296; 257/298; 257/303; 257/306; 257/310

(58) Field of Search ............. 257/295, 306, 257/303, 310, 298, 296

(56) References Cited

U.S. PATENT DOCUMENTS

| 5,400,275 | A | * | 3/1995 | Abe et al. | 365/145 |
| 5,574,679 | A | * | 11/1996 | Ohtsuki et al. | 365/145 |
| 5,805,495 | A | * | 9/1998 | Kimura | 365/145 |
| 6,038,160 | A | * | 3/2000 | Nakane et al. | 365/145 |
| 6,072,711 | A | * | 6/2000 | Kang | 365/65 |
| 6,118,687 | A | * | 9/2000 | Kang | 365/145 |
| 6,147,895 | A | * | 11/2000 | Kamp | 365/145 |
| 6,256,220 | B1 | * | 7/2001 | Kamp | 365/145 |

* cited by examiner

*Primary Examiner*—Amir Zarabian
*Assistant Examiner*—Ida M. Soward
(74) *Attorney, Agent, or Firm*—Robert J. Depke; Holland & Knight LLC

(57) ABSTRACT

A ferroelectric-type nonvolatile semiconductor memory comprising (A) a bit line, (B) a transistor for selection, (C) memory units in the number of N, each memory unit including memory cells in the number of M wherein $N \geq 2$ and $M \geq 2$, and (D) plate lines in the number of M×N, in which the memory units in the number of N are stacked through an insulating interlayer, each memory cell includes a first electrode, a ferroelectric layer and a second electrode, the first electrodes are in common in each memory unit, and the common first electrode is connected to the bit line through the transistor for selection, and the second electrode of the m-th memory cell in the n-th memory unit is connected to the [(n−1)M+m]-th plate line wherein m=1, 2 . . . M and n=1, 2 . . . N.

44 Claims, 57 Drawing Sheets

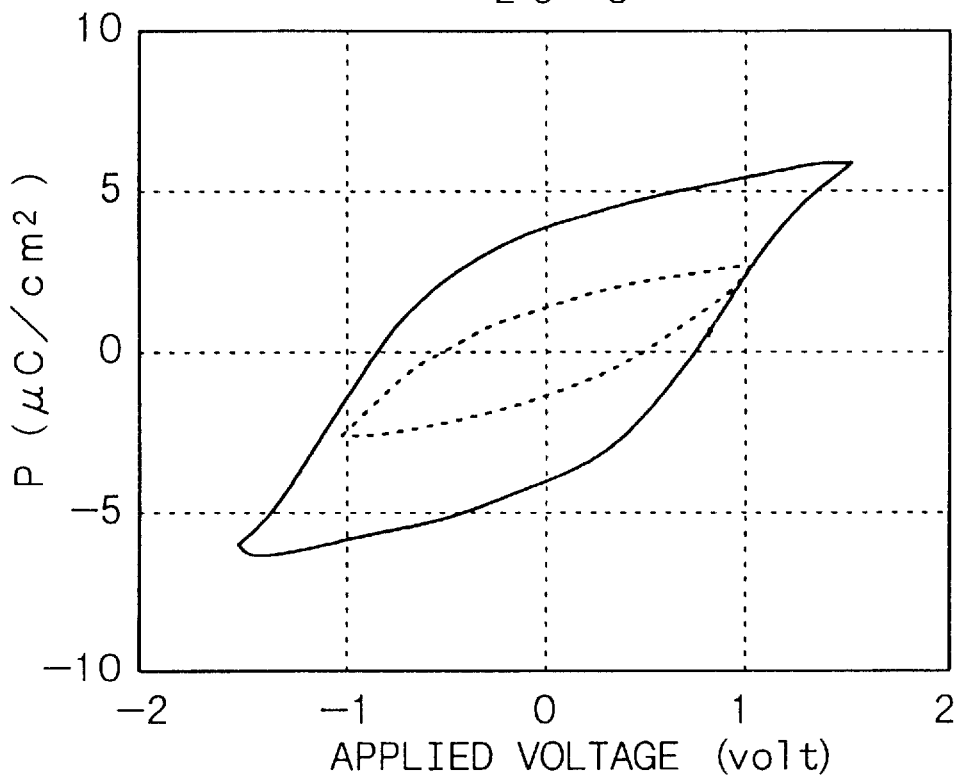
Fig. 56A Prior Art 20° C
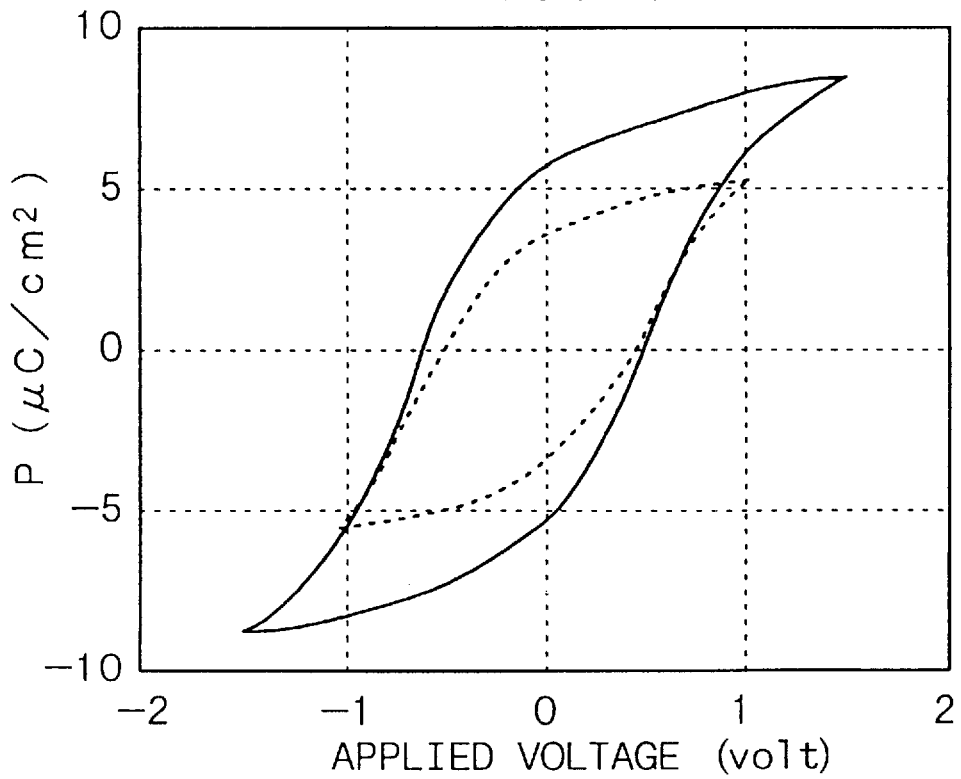
Fig. 56B Prior Art 105° C

FERROELECTRIC-TYPE NONVOLATILE SEMICONDUCTOR MEMORY AND OPERATION METHOD THEREOF

RELATED APPLICATION DATA

The present and foregoing application claim priority to Japanese Application Nos. P2000-156089 filed May 26, 2000, No. P2000-247143 filed Aug. 17, 2000, No. P2000-252080 filed Aug. 23, 2000, No. P2000-262755 filed Aug. 31, 2000 and No. P2000-317880 filed Oct. 18, 2000. All of the foregoing applications are incorporated herein by reference to the extent permitted by law.

BACKGROUND OF THE INVENTION AND RELATED ART STATEMENT

The present invention relates to a ferroelectric-type nonvolatile semiconductor memory (so-called FERAM) and an operation method-thereof.

In recent years, studies are actively made with regard to a ferroelectric-type nonvolatile semiconductor memory having a large capacity. A ferroelectric-type nonvolatile semiconductor memory (to be sometimes abbreviated as "nonvolatile memory" hereinafter) permits rapid access and is nonvolatile, and it consumes less electric power and has strength against an impact, so that it is expected to be used as a main storage device in various electronic machines and equipment having functions of file storage and resume, such as a portable computer, a cellular phone and a game machine, or as a recording medium for recording voices or images.

The above nonvolatile memory is a fast rewritable nonvolatile memory according to a method in which a change in an accumulated charge amount in a capacitor member having a ferroelectric layer is detected by utilizing a fast polarization inversion and its residual polarization of the ferroelectric layer, and the nonvolatile memory comprises the capacitor member (memory cell) and a transistor for selection (transistor for switching). The capacitor member comprises, for example, a lower electrode, an upper electrode and the ferroelectric layer having a high dielectric constant $\epsilon$ interposed between these electrodes. Data is written into and read out from the above nonvolatile memory by using the P-E hysteresis loop of the ferroelectric layer shown in FIG. 53. That is, when an external electric field is applied to the ferroelectric layer and then removed, the ferroelectric layer exhibits a spontaneous polarization. When an external electric field in the plus direction is applied, the residual polarization of the ferroelectric layer comes to be $+P_r$, and when an external electric field in the minus direction is applied, it comes to be $-P_r$. When the residual polarization is in the state of $+P_r$ (see "D" in FIG. 53), such a state represents "0", and when the residual polarization is in the state of $-P_r$ (see "A" in FIG. 53), such a state represents "1".

For discriminating the state of "1" or "0", an external electric field, for example, in the plus direction is applied to the ferroelectric layer, whereby the polarization of the ferroelectric layer comes into the state of "C" in FIG. 53. In this case, when the data is "0", the polarization state of the ferroelectric layer changes from the state of "D" to the state of "C". When the data is "1", the polarization state of the ferroelectric layer changes from the state of "A" to the state of "C" through the state of "B". When the data is "0", the polarization inversion does not take place in the ferroelectric layer. When the date is "1", the polarization inversion takes place in the ferroelectric layer. As a result, there is caused a difference in the accumulated charge amount in the capacitor member. The above accumulated charge is detected as a signal current by bringing, into an ON-state, the transistor for selection in a selected nonvolatile memory. When the external electric field is brought into 0 after data is read out, the polarization state of the ferroelectric layer comes into the state of "D" in FIG. 53 both when the data is "0" and when it is "1". That is, when the data is read out, the data "1" is once destroyed. When the data is "1", therefore, the polarization is brought into the state of "A" through "D" and "E" by applying the external electric field in the minus direction, to re-write data "1".

The structure and the operation of a currently mainstream nonvolatile memory are proposed by S. Sheffiled et al. in U.S. Pat. No. 4,873,664. The above nonvolatile memory comprises two nonvolatile memory cells as shown in a circuit diagram of FIG. 54. In FIG. 54, each nonvolatile memory is surrounded by a dotted line. Each nonvolatile memory comprises, for example, transistors for selection $TR_{11}$ and $TR_{12}$ and capacitor members (memory cells) $FC_{11}$ and $FC_{12}$.

Concerning two-digit or three-digit subscripts, for example, a subscript "11" is a subscript that should be shown as "1,1", and for example, a subscript "111" is a subscript that should be shown as "1,1,1". For simplified showing, the subscripts are shown as two-digit or three-digit subscripts. Further, a subscript "M" is used to show, for example, a plurality of memory cells or plate lines in a block, and a subscript "m" is used to show an individual, for example, of a plurality of the memory cells or the plate lines. A subscript "N" is used to show, for example, transistors for selection or sub-memory units in a block, and a subscript "n" is used to show, for example, an individual of the transistors for selection or the sub-memory units.

A complementary data is written into the above nonvolatile memory (a pair of the memory cells), and the nonvolatile memory stores 1 bit. In FIG. 54, symbol "WL" stands for a word line, symbol "BL" stands for a bit line, and symbol "PL" stands for a plate line. When one nonvolatile memory is taken, the word line $WL_1$ is connected to a word line decoder/driver WD. The bit lines $BL_1$ and $BL_2$ are connected to a sense amplifier SA. Further, the plate line $PL_1$ is connected to a plate line decoder/driver PD.

When the stored data is read out from the thus-structured nonvolatile memory, the word line $WL_1$ is selected, and further, the plate line $PL_1$ is driven. In this case, a complementary data appears between a pair of the bit lines $BL_1$ and $BL_2$ as voltages (bit line voltages) from a pair of the capacitor members $FC_{11}$ and $FC_{12}$ through the transistors for selection $TR_{11}$ and $TR_{12}$. The voltages (bit line voltages) between a pair of the bit lines $BL_1$ and $BL_2$ are detected with the sense amplifier SA.

One nonvolatile memory occupies a region surrounded by the word line $WL_1$ and a pair of the bit lines $BL_1$ and $BL_2$. If the word lines and the bit lines are arranged at a smallest pitch, therefore, the smallest area of one nonvolatile memory is $8F^2$ when the minimum fabrication dimension is "F". Therefore, the thus-structured nonvolatile memory has a smallest area of $8F^2$.

When it is attempted to increase the capacity of the above-structured nonvolatile memories, its realization can only rely on minuteness of fabrication dimension. Constitution of one nonvolatile memory requires two transistors for selection and two capacitor members. Further, it is required to arrange the plate lines at the same pitch as that at which the word lines are arranged. It is therefore almost impossible to arrange the nonvolatile memories at the minimum pitch, and in reality, the area that one nonvolatile memory occupies comes to be much greater than $8F^2$.

Moreover, it is also required to arrange the word line decoders/drivers WD and the plate line decoders/drivers PD at a pitch equal to a pitch at which the nonvolatile memories are arranged. In other words, two decoders/drivers are required for selecting one low-address. It is therefore difficult to layout peripheral circuits, and the area that the peripheral circuits occupy comes to be large.

One means for decreasing an area of a nonvolatile memory is disclosed in JP-A-121032/1997. As FIG. 55 shows a circuit diagram, the nonvolatile memory disclosed in the above Laid-open comprises a plurality of memory cells $MC_{1M}$ (for example, M=4) one end of each of which is connected to one end of one transistor for selection $TR_1$ in parallel, and a plurality of memory cells $MC_{2M}$ one end of each of which is connected to one end of one transistor for selection $TR_2$ in parallel. The memory cells $MC_{1M}$ pair with the memory cells $MC_{2M}$. The other ends of the transistors for selection $TR_1$ and $TR_2$ are connected to the bit lines $BL_1$ and $BL_2$, respectively. The paired bit lines $BL_1$ and $BL_2$ are connected to a sense amplifier SA. Further, the other ends of the memory cells $MC_{1m}$ and $MC_{2m}$ (m=1, 2 . . . M) are connected to the plate line $PL_m$, and the plate line $PL_m$ is connected to a plate line decoder/driver PD. Further, the word line WL is connected to a word line decoder/driver WD.

Complementary data is stored in a pair of the memory cells $MC_{1m}$ and $MC_{2m}$ (m=1, 2 . . . M). For reading out the data stored, for example, in the memory cells $MC_{1k}$ and $MC_{2k}$ (wherein k is one of 1, 2, 3 and 4), the word line WL is selected, and the plate line $PL_k$ is driven in a state where a voltage of $(1/2)V_{CC}$ is applied to the plate lines $PL_m$ (m≠k). The above $V_{CC}$ is, for example, a power source voltage. By the above procedure, the complementary data appears between a pair of the bit lines $BL_1$ and $BL_2$ as voltages (bit line voltages) from a pair of the memory cells $MC_{1k}$ and $MC_{2k}$ through the transistors for selection $TR_1$ and $TR_2$. And, the sense amplifier SA detects the voltages (bit line voltages) between a pair of the bit lines $BL_1$ and $BL_2$.

A pair of the transistors for selection $TR_1$ and $TR_2$ in the nonvolatile memory occupy a region surrounded by the word lines WL and a pair of the bit lines $BL_1$ and $BL_2$. If the word lines and the bit lines are arranged at a smallest pitch, therefore, a pair of the transistors for selection $TR_1$ and $TR_2$ in the nonvolatile memory have a minimum area of $8F^2$. Since, however, a pair of the transistors for selection $TR_1$ and $TR_2$ are shared by M sets of pairs of the memory cells $MC_{1m}$ and $MC_{2m}$ (m=1, 2 . . . M), the number of the transistors for selection $TR_1$ and $TR_2$ per bit can be decreased, and the layout of the word lines WL is moderate, so that the nonvolatile memory can be easily decreased in size. Further, with regard to the peripheral circuits, M bits can be selected with one word line decoder/driver WD and M plate line decoders/drivers PD. When the above constitution is employed, therefore, the layout in which the cell area is close to $8F^2$ can be attained, and a chip size equal to a DRAM can be attained.

When attempts are made to increase the capacity of a nonvolatile memory having a conventional structure, the capacity thereof is defined by the minimum fabrication dimension. As is clear in the above conventional example, the minimum cell area thereof is $8F^2$. This critical value is also true of DRAM. When every semiconductor memory such as EPROM is taken into account, the limit of area of a memory cell arranged in a region occupied by one bit line and one word line which lines are arranged at a minimum pitch is said to be $4F^2$.

However, the above minimum fabrication dimension, i.e., a decrease in a design rule can be attained only after micro-fabrication techniques including lithography as a main technique develop in the future. Further, such micro-fabrication techniques are facing increasing difficulties generation after generation, and the amount of investments comes to be huge amounts of money, which results in an increase in a chip cost. In the semiconductor memory, therefore, it is difficult to achieve break-through improvements in storage capacity at present for a short period of time.

The essential reason why the upper limit of the integration of a semiconductor memory is defined as described above involves the following two points.

First, a memory cell in a semiconductor memory is two-dimensionally arranged on a surface of a semiconductor substrate, and is not three-dimensionally stacked in any case. That is because almost all of conventional semiconductor memories include at least one transistor (FET) per storage unit. Since the transistors can be formed only in a good semiconductor substrate, it is no choice but to arrange the memory cell on the semiconductor substrate two-dimensionally. At present attempts are made to stack a semiconductor crystal layer by crystallization based on an epitaxial growth technique or a laser anneal technique. However, no sufficient yield or performances have been attained. Further, even if the above attempts can be successfully made, the number of steps increases approximately twice for manufacturing memory cell in the semiconductor crystal layer, which results in spoiling of a cost merit.

Second, accessing to a semiconductor memory is performed through a two-dimensional matrix made of word lines (row direction) and bit lines (column direction). In a conventional semiconductor memory, a selection in the row direction is one-dimensionally performed through the word line, and a column selection is carried out from data set read out in the bit lines. In the conventional examples shown in FIGS. 54 and 55, a selection in the row direction is performed through the plate line, and yet, there is no difference in that the selection is performed substantially one-dimensionally.

If the integration degree of semiconductor memories should be doubled while keeping the page length as it is, it is naturally required to double the numbers of the word lines and plate lines. It is accordingly required to double the integration degree of the peripheral circuits for decoding and driving the word lines and the plate lines as well. These circuits naturally require transistors, so that they are two-dimensionally arranged near the cell array. There is therefore caused another difficulty in the layout of the peripheral circuits.

As described above, the memory cells per se are limited to the two-dimensional layout, and further, even if the memory cells are decreased in size, the address selection method that can be employed at present causes a difficulty on the layout of the peripheral circuits. The increase in the capacity of the semiconductor memory can be dependent only upon the development of a design rule.

Further, while the method of decreasing the area of the nonvolatile memory disclosed in JP-A-121032/1997 is very effective, it has the following problems.

That is, for example, when data "1" is written into the memory cell $MC_{11}$ in a pair of the memory cells $MC_{11}$ and $MC_{21}$, the plate line $PL_1$ is brought into a ground level (0 volt) and the bit line $BL_1$ is brought to $V_{CC}$, to polarize the ferroelectric layer. In this case, for retaining data "0" in the memory cell $MC_{21}$, it is required to bring the bit line $BL_2$ to a ground level (0 volt).

On the other hand, for preventing the destruction of the data stored in the memory cells $MC_{1m}$ and $MC_{2m}$ (m=2, 3, 4) connected to the non-selected plate lines $PL_m$ (m=2, 3, 4), the non-selected plate lines $PL_m$ (m=2, 3, 4) is fixed at $(1/2)V_{CC}$ that is an intermediate voltage between the voltages of the bit lines $BL_1$ and $BL_2$, to ease an electric field to be applied to the ferroelectric layer constituting the capacitor member of the non-selected memory cells $MC_{1m}$ and $MC_{2m}$. That is, a disturbance of $(1/2)V_{CC}$ is exerted on the non-selected memory cells $MC_{1m}$ and $MC_{2m}$.

Meanwhile, as an essential physical property, the ferroelectric material for constituting the ferroelectric layer has a temperature characteristic that its inversion voltage is negative. FIGS. 56A and 56B show P-E hysteresis loops of a ferroelectric material at 20° C. and 105° C. In FIGS. 56A and 56B, solid-line P-E hysteresis loops show a case where $V_{CC}$=1.5 volts, and dotted-line P-E hysteresis loops show a case where $V_{CC}$=1.0 volts. In these loops, a polarization difference between the state of data "1" and the state of data "0" at 0 volt is $2P_r$, and the value of $2P_r$ corresponds to a signal amount (signal charge). In FIG. 56A, the inversion voltage at an operation temperature of 20° C. is approximately ±0.9 volt. Therefore, if the nonvolatile memory is operated at $V_{CC}$=1.5 volts, a signal charge of 7.9 $\mu C/cm^2$ can be retained at a disturbance voltage of $(1/2)V_{CC}$ without destroying data stored in the non-selected memory call. In contrast, the inversion voltage at 105° C. is approximately ±0.55 volt. Therefore, if the nonvolatile memory is operated at $V_{CC}$=1.5 volts, while a signal charge of 11 $\mu C/cm^2$ can be retained, the charge of the non-selected memory cell is inversed at the disturbance voltage of $(1/2)V_{CC}$ and the stored data is destroyed.

For preventing the inversion of the charge of the non-selected memory cell at an operation temperature of 105° C. unlike the above, $V_{CC}$ is required to be approximately 1 volt. In this case, a signal charge of 6.9 $\mu C/cm^2$ can be retained. However, only a signal charge of 2.8 $\mu C/cm^2$ can be retained at 20° C., and the signal amount decreases to excess.

As described above, the coercive voltage of the nonvolatile memory has a great negative temperature dependency. That is, with an increase in temperature, the coercive voltage of the nonvolatile memory decreases, and the charge of the non-selected capacitor member is liable to be inverted. Therefore, if no measures are taken against the characteristic that the inversion voltage of a ferroelectric material for constituting the ferroelectric layer has the above negative temperature characteristic, the operation of the nonvolatile memory in a temperature range required of LSI may be no longer ensured.

Further, when the nonvolatile memory having the above structure is more shrunk, it is inevitably required to decrease the area of the capacitor member. Further, data is stored on the basis of polarization in the ferroelectric layer, so that the amount of charge to be accumulated in the ferroelectric layer does not increase even if the thickness of the ferroelectric layer is decreased unlike the insulating layer in the DRAM, and the accumulated charge amount decreases in proportion to the area of capacitor member.

For attaining a nonvolatile memory of 256M bits, the capacitor member is required to have an area of approximately 0.1 $\mu M^2$. In this case, the accumulated charge amount comes to be approximately 10 fC, and when the bit line capacity is assumed to be 200 fF, a sense signal amount (potential that appears in a bit line during a reading operation) of only approximately 50 mV can be obtained. Such a sense signal amount provides an insufficient sense margin, and when the nonvolatile memory is further shrunk, readout of data stored in the nonvolatile memory can be no longer performed.

As one of measures to be taken against a decrease in the sense signal amount in DRAM, there is disclosed an amplification type memory cell called "gain cell" (for example, see JP-A-67861/1987 and JP-A-255269/1989). The gain cell whose circuit diagram is shown in FIG. 57A comprises a transistor for writing-in $TR_W$, a transistor for read-out $TR_R$, a transistor for detection $TR_S$ and a capacitor member C. When data is written into the gain cell, the transistor for writing-in $TR_W$ is brought into an ON-state to accumulate a charge in the capacitor member C. When data is read out from the gain cell, the transistor for read-out $TR_R$ is brought into an ON-state. The transistor for detection $TR_S$ comes into an ON-state or an OFF-state depending upon the data stored in the capacitor member C.

FIG. 57B shows a circuit diagram prepared when the above-constituted gain cell is applied to the conventional nonvolatile memory disclosed in U.S. Pat. No. 4,873,664. The above gain cell type nonvolatile memory can comprise a transistor for writing-in $TR_W$, a transistor for read-out $TR_R$, a transistor for detection $TR_S$ and a capacitor member FC. One source/drain region of the transistor for writing-in $TR_W$ is connected to the bit line BL, and the other source/drain region is connected to a lower electrode of the capacitor member FC. One end of the transistor for detection $TR_S$ is connected to a wiring having a predetermined potential $V_{CC}$ (for example, a power source line made of an impurity layer) and the other end thereof is connected to the bit line BL through the transistor for read-out $TR_R$. Further, the lower electrode of the capacitor member FC is connected to the gate electrode of the transistor for detection $TR_S$.

In the thus-constituted nonvolatile memory, pulse voltage is applied to the plate line PL when data is read out, and the operation state of the transistor for detection $TR_S$ constituted of a depression type NMOS-FET is controlled depending upon the amount of an accumulated charge caused on the basis of whether or not polarization inversion takes place in the capacitor member FC. That is, when the transistor for read-out $TR_R$ is brought into an ON-state after the bit line BL is equalized to 0 volt, a current flows from the power source $V_{CC}$ through the transistor for detection $TR_S$ and the transistor for read-out $TR_R$, and a potential appears in the bit line BL. Such a potential is dependent upon the data stored in the nonvolatile memory cell. Due to this, it can be known whether the data stored in the capacitor member FC is "1" or "0". That is, on the basis of a small accumulated charge in the capacitor member FC, a great bit line load can be driven.

However, the above-constituted nonvolatile memory has a problem that three transistors are required per memory cell, so that the cell area per bit greatly increases, and that the cost per bit increases.

When the data is read out and when the pulse voltage is applied to the plate line PL, polarization inversion takes place only when a sufficient potential difference is caused between the upper electrode connected to the plate line PL and the lower electrode connected to the gate electrode of the transistor for detection $TR_S$. When the data is read out, however, the lower electrode connected to the gate electrode of the transistor for detection $TR_S$ is in a floating state, and the load capacity thereof is only equal approximately to the gate capacity of the transistor for detection $TR_S$. When the pulse voltage is applied to the plate line PL, therefore, the potential of the lower electrode greatly increases according to the coupling of the upper electrode and the lower electrode. As a result, no sufficient electric field is formed between the upper electrode and the lower electrode, which causes a problem that no polarization inversion takes place in the ferroelectric layer. For preventing the above potential increase caused on the lower electrode by the coupling, it is required to add a load capacity several times larger than that of the capacity member FC to the lower electrode, and for this purpose, an additional capacitor is required. However, the cell area is greatly increased accordingly.

OBJECT AND SUMMARY OF THE INVENTION

It is a first object of the present invention to provide a ferroelectric-type nonvolatile semiconductor memory that can be increased in capacity without being limited by the minimum fabrication dimension and is more highly integrated.

It is a second object of the present invention to provide a ferroelectric-type nonvolatile semiconductor memory that permits a decrease in the size of peripheral circuits by decreasing the number of driving lines for address selection.

Further, it is a third object of the present invention to provide a ferroelectric-type nonvolatile semiconductor memory that compatibly allows a decrease in the size of memory cells and a decrease in the number of peripheral circuits and permits an increase in consistent integration degree as an entire device.

Further, it is a fourth object of the present invention to provide a ferroelectric-type nonvolatile semiconductor memory that is provided with measures against a characteristic that the inversion voltage of a ferroelectric material for constituting a ferroelectric layer has a negative temperature characteristic, i.e., the negative temperature dependency of coercive voltage of the ferroelectric-type nonvolatile semiconductor memory, and which can reliably ensure operation in a required temperature range.

Further, it is a fifth object of the present invention to provide a gain cell type ferroelectric-type nonvolatile semiconductor memory that permits a decrease in area per bit and allows reliable readout of stored data, that is, which makes it possible to obtain a sufficient sense signal amount.

Further, it is a sixth object of the present invention to provide a ferroelectric-type nonvolatile semiconductor memory which is more highly integrated and is excellent in resistance to disturbance, and which permits fast operation and a low consumption power, and an operation method thereof.

A ferroelectric-type nonvolatile semiconductor memory according to a first aspect of the present invention for achieving the above first to third objects comprises;
(A) a bit line,
(B) a transistor for selection,
(C) memory units in the number of N, each memory unit comprising memory cells in the number of M wherein $N \geq 2$ and $M \geq 2$, and
(D) plate lines in the number of M×N, in which
the memory units in the number of N are stacked through an insulating interlayer,
each memory cell comprises a first electrode, a ferroelectric layer and a second electrode,
the first electrodes are in common in each memory unit, and the common first electrode is connected to the bit line through the transistor for selection, and
the second electrode of the m-th memory cell in the n-th memory unit is connected to the [(n−1)M+m]-th plate line wherein m=1, 2 ... M and n=1, 2 ... N.

A ferroelectric-type nonvolatile semiconductor memory according to a second aspect of the present invention for achieving the above first to third objects differs from the ferroelectric-type nonvolatile semiconductor memory according to the first aspect of the present invention in constitution of the transistor for selection and constitution of the plate lines. That is, the ferroelectric-type nonvolatile semiconductor memory according to the second aspect of the present invention comprises;
(A) a bit line,
(B) transistors for selection in the number of N wherein $N \geq 2$,
(C) memory units in the number of N, each memory unit comprising memory cells in the number of M wherein $M \geq 2$, and
(D) plate lines in the number of M, in which
each memory cell comprises a first electrode, a ferroelectric layer and a second electrode,
the first electrodes are in common in each memory unit,
the common first electrode in the n-th memory unit is connected to the bit line through the n-th transistor for selection wherein n=1, 2 ... N, and
in the n-th memory unit, the second electrode of the m-th memory cell is connected to the m-th plate line common to the memory units wherein m=1, 2 ... M.

In a preferred embodiment of the ferroelectric-type nonvolatile semiconductor memory according to the second aspect of the present invention, the memory units in the number of N are stacked through an insulating interlayer.

A ferroelectric-type nonvolatile semiconductor memory according to a third aspect of the present invention for achieving the above first to third objects of the present invention differs from the ferroelectric-type nonvolatile semiconductor memory according to the second aspect of the present invention in constitution of the second electrode. That is, the ferroelectric nonvolatile semiconductor memory according to the third aspect of the present invention comprises;
(A) a bit line,
(B) transistors for selection in the number of 2N wherein $N \geq 1$,
(C) memory units in the number of 2N, each memory unit comprising memory cells in the number of M wherein $M \geq 2$, and
(D) plate lines in the number of M, in which
each memory cell comprises a first electrode, a ferroelectric layer and a second electrode,
the first electrodes are in common in each memory unit,
the common first electrode in the (2n−1)-th memory unit is connected to the bit line through the (2n−1)-th transistor for selection wherein n=1, 2 ... N,
the common first electrode in the 2n-th memory unit is connected to the bit line through the 2n-th transistor for selection, and
the m-th memory cell constituting the (2n−1)-th memory unit and the m-th memory cell constituting the 2n-th memory unit share the second electrode, and the shared m-th second electrode is connected to the m-th plate line wherein m=1, 2 ... M.

A ferroelectric-type nonvolatile semiconductor memory according to a fourth aspect of the present invention for achieving the above first to third objects of the present invention comprises a first memory unit and a second memory unit, the first memory unit comprising;

(A-1) a first bit line,
(B-1) first transistor or transistors for selection in the number of N wherein $N \geq 1$,
(C-1) first sub-memory unit or units in the number of N, each first sub-memory unit comprising first memory cells in the number of M wherein $M \geq 2$, and
(D-1) plate lines in the number of M, each of the plate lines being common to the first memory cell or cells constituting the first sub-memory unit or units in the number of N, and the second memory unit comprising;
(A-2) a second bit line,
(B-2) second transistor or transistors for selection in the number of N,
(C-2) second sub-memory unit or units in the number of N, each second sub-memory unit comprising second memory cells in the number of M, and
(D-2) the plate lines in the number of M, each of the plate lines being common to the second memory cell or cells constituting the second sub-memory unit or units in the number of N, the plate lines constituting the second memory unit being common to the plate lines constituting the first memory unit, in which
the first sub-memory unit is stacked on the second sub-memory unit through an insulating interlayer,
each memory cell comprises a first electrode, a ferroelectric layer and a second electrode,
in the first memory unit, the first electrodes of the first memory cells constituting the n-th-place first sub-memory unit are in common in the n-th-place first sub-memory unit wherein $n=1, 2 \ldots N$; the common first electrode in the n-th-place first sub-memory unit is connected to the first bit line through the n-th-place first transistor for selection; and the second electrode of the m-th-place first memory cell is connected to the common m-th plate line wherein $m=1, 2 \ldots M$, and
in the second memory unit, the first electrodes of the second memory cells constituting the n-th-place second sub-memory unit are in common in the n-th-place second sub-memory unit; the common first electrode in the n-th-place second sub-memory unit is connected to the second bit line through the n-th-place second transistor for selection; and the second electrode of the m-th-place second memory cell is connected to the common m-th plate line.

A ferroelectric-type nonvolatile semiconductor memory according to a fifth aspect of the present invention for achieving the above first to third objects differs from the ferroelectric-type nonvolatile semiconductor memory according to the fourth aspect of the present invention in constitution of the second electrode. That is, the ferroelectric-type nonvolatile semiconductor memory according to the fifth aspect of the present invention comprises a first memory unit and a second memory unit, the first memory unit comprising;

(A-1) a first bit line,
(B-1) first transistor or transistors for selection in the number of N wherein $N \geq 1$,
(C-1) first sub-memory unit or units in the number of N, each first sub-memory unit comprising first memory cells in the number of M wherein $M \geq 2$, and
(D-1) plate lines in the number of M, each of the plate lines being common to the first memory cell or cells constituting the first sub-memory unit or units in the number of N, and the second memory unit comprising;
(A-2) a second bit line,
(B-2) second transistor or transistors for selection in the number of N,
(C-2) second sub-memory unit or units in the number of N, each second sub-memory unit comprising second memory cells in the number of M, and
(D-2) the plate lines in the number of M, each of the plate lines being common to the second memory cell or cells constituting the second sub-memory unit or units in the number of N, the plate lines constituting the second memory unit being common to the plate lines constituting the first memory unit, in which
each memory cell comprises a first electrode, a ferroelectric layer and a second electrode,
in the first memory unit, the first electrodes of the first memory cells constituting the n-th-place first sub-memory unit are in common in the n-th-place first sub-memory unit wherein $n=1, 2 \ldots N$; and the common first electrode in the n-th-place first sub-memory unit is connected to the first bit line through the n-th-place first transistor for selection,
in the second memory unit, the first electrodes of the second memory cells constituting the n-th-place second sub-memory unit are in common in the n-th-place second sub-memory unit; and the common first electrode in the n-th-place second sub-memory unit is connected to the second bit line through the n-th-place second transistor for selection, and
the m-th-place first memory cell constituting the n-th-place first sub-memory unit in the first memory unit and the m-th-place second memory cell constituting the n-th-place second sub-memory unit in the second memory unit share the second electrode, and the shared m-th second electrode is connected to the m-th plate line wherein $m=1, 2 \ldots M$.

In the ferroelectric-type nonvolatile semiconductor memory according to the fourth or fifth aspect of the present invention, preferably, one of the first bit line and the second bit line is connected to a sense amplifier to which the other is connected. In this case, the n-th-place first transistor for selection and the n-th-place second transistor for selection may be connected to the same word line or different word lines. Depending upon an operation method of the ferroelectric-type nonvolatile semiconductor memory, 1 bit may be stored in one memory cell, or complementary data may be stored in a pair of the memory cells.

In the ferroelectric-type nonvolatile semiconductor memory according to the first or second aspect of the present invention, it is sufficient to satisfy $M \geq 2$, and for example, the practical value of M includes exponents of 2 (2, 4, 8 . . . ). Further, it is sufficient to satisfy $N \geq 2$, and for example, the practical value of N includes exponents of 2 (2, 4, 8 . . . ).

In the ferroelectric-type nonvolatile semiconductor memory according to any one of the third to fifth aspects of the present invention, it is sufficient to satisfy $M \geq 2$, and for example, the practical value of M includes exponents of 2 (2, 4, 8 . . . ). Further, it is sufficient to satisfy $N \geq 1$, and for example, the practical value of N includes 1 and exponents of 2 (2, 4, 8 . . . ).

The ferroelectric-type nonvolatile semiconductor memory according to any one of the first to fifth aspects of the present invention, a plurality of memory cells share one transistor for selection. Further, the memory unit or the sub-memory unit is allowed to have a three-dimensionally stacked structure, whereby there is no case limited by the number of transistors occupying the surface of a semiconductor substrate, the storage capacity can be remarkably increased as compared with any conventional ferroelectric-type nonvolatile semiconductor memory, and the effective occupation area per bit storage unit can be remarkably decreased.

In the ferroelectric-type nonvolatile semiconductor memory according to any one of the second to fifth aspects of the present invention, further, the address selection in the row direction is performed on the basis of a two-dimensional matrix constituted of the transistors for selection and the plate lines. For example, when a row address selection unit is constituted of 8 transistors for selection and 8 plate lines, for example, 64-bit memory cells can be selected with 16 decoder/driver circuits. The storage capacity can be quadrupled even if the ferroelectric-type nonvolatile semiconductor memory has an integration degree equal to a conventional one. Further, the number of peripheral circuits and driving wirings for address selection can be decreased.

In the ferroelectric-type nonvolatile semiconductor memory according to any one of the first to fifth aspects of the present invention, preferably, the memory unit or the sub-memory unit has a $2^P$-layered, structure ($p=1, 2, 3 \ldots$) such as a two-layered, four-layered or eight-layered structure.

In a preferred embodiment of the ferroelectric-type nonvolatile semiconductor memory according to the first or second aspect of the present invention, preferably, the ferroelectric layer constituting the memory cells of the memory unit positioned above has a lower crystallization temperature than the ferroelectric layer constituting the memory cells of the memory unit positioned below. In the ferroelectric-type nonvolatile semiconductor memory according to the third aspect of the present invention, when $N \geqq 2$, the ferroelectric layer constituting the memory cells of a set of the memory units positioned above has a lower crystallization temperature than the ferroelectric layer constituting the memory cells of a set of the memory units positioned below. In the ferroelectric-type nonvolatile semiconductor memory according to the fourth or fifth aspect of the present invention, preferably, the ferroelectric layer constituting the memory cells of the sub-memory unit positioned above has a lower crystallization temperature than the ferroelectric layer constituting the memory cells of the sub-memory unit positioned below.

The ferroelectric-type nonvolatile semiconductor memory according to a sixth aspect of the present invention for achieving the above first object is a ferroelectric-type nonvolatile semiconductor memory having memory cells each of which comprises a first electrode, a ferroelectric layer and a second electrode and which are stacked through an insulating interlayer, in which the ferroelectric layer constituting the memory cell positioned above has a lower crystallization temperature than the ferroelectric layer constituting the memory cell positioned below.

In the ferroelectric-type nonvolatile semiconductor memory according to the sixth aspect of the present invention, the memory cells can have a $2^P$-layered structure ($p=1, 2, 3 \ldots$) such as a two-layered, four-layered or eight-layered structure.

In the ferroelectric-type nonvolatile semiconductor memory according to the sixth aspect of the present invention or in a preferred embodiment of the ferroelectric-type nonvolatile semiconductor memory according to any one of the first to fifth aspects of the present invention, the crystallization temperature of the ferroelectric layer constituting the memory cell can be determined, for example, by means of an X-ray diffraction analyzer or a surface scanning electron microscope. Specifically, for example, a ferroelectric material layer is formed and then heat-treated for crystallization promotion by changing heat-treatment temperatures for crystallization of the ferroelectric material layer, the heat-treated ferroelectric material layer is subjected to X-ray diffraction analysis and a diffraction pattern intensity characteristic of the ferroelectric material (height of diffraction peak) is evaluated, whereby the crystallization temperature of the ferroelectric layer can be determined.

Meanwhile, for producing a ferroelectric-type nonvolatile semiconductor memory having a constitution in which capacitor members to be described later, the memory units or the sub-memory units are stacked, the heat treatment (that will be referred to as "crystallization heat treatment") is carried out for crystallization of the ferroelectric layer or a ferroelectric thin film constituting the ferroelectric layer, and it is required to carry out the above crystallization heat treatment as many times as the number of stacked stages of the capacitor members, the memory units or the sub-memory units. The capacitor members, the memory unit(s) or the sub-memory unit(s) positioned on the lower stage(s) are subjected to the crystallization heat treatment for a longer period of time, and the capacitor members, the memory unit(s) or the sub-memory unit(s) positioned on the upper stage(s) are subjected to the crystallization heat treatment for a shorter period of time. When optimum crystallization heat treatment is carried out on the capacitor members, the memory unit(s) or the sub-memory unit(s) positioned on the upper stage(s), the capacitor members, the memory unit(s) or the sub-memory unit(s) positioned on the lower stage(s) may suffer a heat load to excess, and the capacitor members, the memory unit(s) or the sub-memory unit(s) positioned on the lower stage(s) may be deteriorated in properties. It is thinkable to employ a method in which the capacitor members, the memory units or the sub-memory units are formed in a multi-stage and subjected to the crystallization heat treatment once. However, the above method is liable to involve problems that the ferroelectric layers cause a great change in volume during the crystallization and that each ferroelectric layer highly possibly causes degassing so that the ferroelectric layers undergo cracking or peeling.

In the ferroelectric-type nonvolatile semiconductor memory according to the sixth aspect of the present invention or in a preferred embodiment of the ferroelectric-type nonvolatile semiconductor memory according to any one of the first to fifth aspects of the present invention, the ferroelectric layer constituting the capacitor members, the memory unit(s) or the sub-memory unit(s) positioned above has a lower crystallization temperature than the ferroelectric layer constituting the capacitor members, the memory unit(s) or the sub-memory unit(s) positioned below, so that there is caused no problem that the memory cells for constituting the capacitor members, the memory units or the sub-memory units are deteriorated in properties, even if the above crystallization heat treatment is carried out as many times as the number of stacked stages of the capacitor members, the memory units or the sub-memory units. Further, the memory cells for constituting the capacitor members, the memory units or the sub-memory units can be heat-treated for crystallization under optimum conditions, so that a ferroelectric-type nonvolatile semiconductor memory excellent in properties can be obtained.

The ferroelectric-type nonvolatile semiconductor memory according to a seventh aspect of the present invention for achieving the fourth object is a ferroelectric-type nonvolatile semiconductor memory having a memory unit in which a plurality of memory cells having a capacitor member having a ferroelectric layer are provided and which has a structure in which a disturbance takes place in non-selected memory cells when a selected memory cell is accessed, in which provided is a power source circuit that is connected to the capacitor member and whose output has a negative temperature characteristic.

The ferroelectric-type nonvolatile semiconductor memory according to any one of the first to sixth aspect of the present invention, including the preferred embodiments thereof, can be applied to the ferroelectric-type nonvolatile semiconductor memory according to the seventh aspect of the present invention.

As described above, the ferroelectric-type nonvolatile semiconductor memory according to the seventh aspect of the present invention is provided with the power source circuit that is connected to the capacitor member and whose output has a negative temperature characteristic, so that the voltage outputted from the power source circuit decreases when the operation temperature increases and the coercive voltage decreases. As a result, the value of $(1/2)V_{CC}$ decreases, and the charge inversion of the capacitor member in the non-selected memory cell can be prevented. The above disturbance refers to a phenomenon that an electric field is exerted on the ferroelectric layer of the capacitor member in the non-selected memory cell in the direction in which the polarization is inverted, that is, in the direction in which the stored data is deteriorated or destroyed.

The ferroelectric-type nonvolatile semiconductor memory according to the seventh aspect of the present invention may have a constitution in which one end of the capacitor member is connected to a bit line, the other end thereof is connected to a plate line, and the power source circuit is connected to the bit line or the plate line or is connected to the bit line and the plate line.

In the ferroelectric-type nonvolatile semiconductor memory according to the seventh aspect of the present invention, preferably, the power source circuit comprises;

(a) a reference-voltage circuit, (b) a comparator having a first input portion into which a reference voltage outputted from the reference-voltage circuit is inputted, and (c) a circuit for applying a negative feed back to an output voltage from the comparator according to the output voltage from the comparator, for example, a PMOS-type FET having a gate portion to which the output voltage from the comparator is inputted and a drain region connected to a second input portion of the comparator and the capacitor member.

The power source circuit can be constituted of a reference-voltage circuit alone. The connection of the drain region of the PMOS type FET to the capacitor member specifically means it is connected to the bit line or the plate line or is connected to the bit line and the plate line.

For simplifying the circuit, preferably, the reference-voltage circuit comprises a first resistance element having one end connected to a power source and a second resistance element having one end connected to the other end of the first resistance element and the other end grounded, and has a constitution in which the reference voltage is outputted from a connection portion of the first resistance element and the second resistance element.

In this case, there may be employed a constitution in which the first resistance element and the second resistance element have a negative temperature characteristic (that is, the resistance value decreases with an increase in temperature) and the absolute value of a change in the resistance value of the second resistance element based on the temperature change is greater than the absolute value of a change in the resistance value of the first resistance element based on the temperature change. The above absolute value of a change in the resistance value based on the temperature change can be expressed by $|r_2-r_1|$ wherein $r_1$ is an electric resistance value at a temperature of $t_1°$ C. and $r_2$ is an electric resistance value at a temperature of $t_2°$ C. ($t_2 > t_1$). Specifically, the first resistance element and the second resistance element can be constituted of a resistance material. More specifically, for example, there can be employed a constitution in which the first resistance element comprises a semiconductor layer doped with an impurity and the second resistance element comprises a semiconductor layer doped with an impurity having a concentration lower than the impurity concentration of the semiconductor layer constituting the first resistance element; or a constitution in which the first resistance element comprises an Si—Ge semiconductor layer and the second resistance element comprises an Si semiconductor layer. The first resistance element and the second resistance element shall not be limited to the above constitutions. Alternatively, there may be also employed a constitution in which the first resistance element and the second resistance element have a positive temperature characteristic (that is, the resistance value increases with an increase in temperature) and the absolute value of a change in the resistance value of the second resistance element based on the temperature change is smaller than the absolute value of a change in the resistance value of the first resistance element based on the temperature change.

Alternatively, the above case may employ a constitution in which the first resistance element comprises a resistance material, and the second resistance element comprises at least one PMOS FET having a drain portion and a gate portion which are short-circuited (a structure formed of PMOS FETs connected in series in some case).

Alternatively, the above case may employ a constitution in which the first resistance element has a positive temperature characteristic (that is, the resistance value increases with an increase in temperature), and the second resistance element has a negative temperature characteristic (that is, the resistance value decreases with an increase in temperature). Specifically, there may be employed a constitution in which the first resistance element comprises a PMOS FET having a gate portion grounded and the second resistance element comprises a resistance material, while the constitution shall not be limited the above.

The ferroelectric-type nonvolatile semiconductor memory according to an eighth aspect of the present invention for achieving the above fourth object is a ferroelectric-type nonvolatile semiconductor memory having a memory unit in which a plurality of memory cells having a capacitor member having a ferroelectric layer are provided and which has a structure in which a disturbance takes place in non-selected memory cells when a selected memory cell is accessed, in which one end of the capacitor member is connected to a bit line and the other end thereof is connected to a plate line, and provided is a clamp circuit which is connected to the bit line and whose clamp voltage has a negative temperature characteristic.

The ferroelectric-type nonvolatile semiconductor memory according to any one of the first to sixth aspects of the present invention, including preferred embodiments thereof, can be applied to the ferroelectric-type nonvolatile semiconductor memory according to the eighth aspect of the present invention. The ferroelectric-type nonvolatile semiconductor memory according to the seventh aspect of the present invention and the ferroelectric-type nonvolatile semiconductor memory according to the eighth aspect of the present invention may be combined.

In the ferroelectric-type nonvolatile semiconductor memory according to the eighth aspect of the present invention, the clamp circuit whose clamp voltage has a negative temperature characteristic (that is, the clamp voltage decreases or lowers with an increase in temperature) is connected to the bit line, so that the voltage (potential) of the bit line is clamped to a low voltage (potential) when the operation temperature increases and the coercive voltage decreases. As a result, the charge inversion of the non-selected capacitor member can be prevented.

The ferroelectric-type nonvolatile semiconductor memory according to the eighth aspect of the present invention may have a constitution in which a power source circuit connected to the plate line is further provided and the output of the power source circuit has a negative temperature characteristic. The power source circuit connected to the plate line can be structured to have the same constitution as that of the power source circuit connected to the plate line in the ferroelectric-type nonvolatile semiconductor memory according to the seventh aspect of the present invention.

In the ferroelectric-type nonvolatile semiconductor memory according to the eighth aspect of the present invention, desirably, the clamp circuit is constituted to have a structure in which PMOS FETs whose drain portion and gate portion are short-circuited each are connected in series, while the structure shall not be limited thereto.

The ferroelectric-type nonvolatile semiconductor memory according to a ninth aspect of the present invention for achieving the above fifth object is a ferroelectric-type nonvolatile semiconductor memory comprising;

(A) a bit line,
(B) a transistor for selection,
(C) a memory unit comprising memory cells in the number of M wherein M≧2, and
(D) plate lines in the number of M, in which
each memory cell comprises a first electrode, a ferroelectric layer and a second electrode,
the first electrodes of the memory cells are in common in each memory unit,
the common first electrode is connected to the bit line through the transistor for selection, and
the second electrode constituting the memory cell is connected to the plate line, and further in which
(E) a signal detective circuit for detecting a change in potential of the common first electrode and transmitting a detection result to the bit line as a current or a voltage is further provided.

In the ferroelectric-type nonvolatile semiconductor memory according to the ninth aspect of the present invention, preferably, the transistor for selection and the signal detective circuit are formed on a semiconductor substrate, and the memory unit is formed on an insulation layer formed on the semiconductor substrate. The number of the memory unit may be 1 or at least 2. In the latter case, preferably, a plurality of the memory units are stacked through an insulating interlayer.

The ferroelectric-type nonvolatile semiconductor memory according to a tenth aspect of the present invention for achieving the above fifth object is a so-called gain cell type ferroelectric-type nonvolatile semiconductor memory and comprises;

(A) a bit line,
(B) a transistor for writing-in,
(C) a memory unit comprising memory cells in the number of M wherein M≧2, and
(D) plate lines in the number of M, in which
each memory cell comprises a first electrode, a ferroelectric layer and a second electrode,
the first electrodes of the memory cells are in common in each memory unit,
the common first electrode is connected to the bit line through the transistor for writing-in, and
the second electrode constituting the memory cell is connected to the plate line, and
the ferroelectric-type nonvolatile semiconductor memory further having;
(E) a transistor for detection, and
(F) a transistor for read-out,
and further in which one end of the transistor for detection is connected to a wiring having a predetermined potential, and the other end thereof is connected to the bit line through the transistor for read-out, and
when data stored in the memory cell is read out, the transistor for read-out is brought into a continuity state, and the operation of the transistor for detection is controlled by means of a potential that takes place in the common first electrode on the basis of the data stored in the memory cell.

The ferroelectric-type nonvolatile semiconductor memory according to an eleventh aspect of the present invention for achieving the fifth aspect is a so-called gain cell type ferroelectric-type nonvolatile semiconductor memory and comprises;

(A) a bit line,
(B) a transistor for writing-in,
(C) memory units in the number of N, each memory unit comprising memory cells in the number of M wherein N≧2 and M≧2,
(D) transistors for selection in the number of N, and
(E) plate lines in the number of M, each plate line being common to the memory cells each of which constitutes each of the memory units in the number of N, in which
each memory cell comprises a first electrode, a ferroelectric layer and a second electrode,
the first electrodes are in common in each memory unit,
the common first electrode in the n-th memory unit is connected to the bit line through the n-th transistor for selection and the transistor for writing-in wherein n=1, 2 . . . N, and
the second electrode constituting the m-th memory cell is connected to the common m-th plate line wherein m=1, 2 . . . M,
the ferroelectric-type nonvolatile semiconductor memory further comprising;
(F) a transistor for detection, and
(G) a transistor for read-out,
and further in which one end of the transistor for detection is connected to a wiring having a predetermined potential, and the other end thereof is connected to the bit line through the transistor for read-out, and when data stored in the memory cell constituting the n-th memory unit is read out, the n-th transistor for selection and the transistor for read-out are brought into a continuity state, and the operation of the transistor for detection is controlled by means of a potential that takes place in the common first electrode on the basis of the data stored in the memory cell.

In the ferroelectric-type nonvolatile semiconductor memory according to the eleventh aspect of the present invention, it is sufficient to satisfy $N \geq 2$, and the actual value of N includes, for example, exponents of 2 (2, 4, 8 . . . ).

In the ferroelectric-type nonvolatile semiconductor memory according to the ninth, tenth or eleventh aspect of the present invention, desirably, the value of M satisfies $2 \leq M \leq 128$, preferably $4 \leq M \leq 32$.

In the ferroelectric-type nonvolatile semiconductor memory according to the tenth or eleventh aspect of the present invention, preferably, various transistors are formed on a silicon semiconductor substrate, an insulation layer is formed on the various transistors and the memory cells are formed on the insulation layer in view of decreasing the cell area. In some cases, a plurality of the memory units may be stacked through an insulating interlayer. The ferroelectric-type nonvolatile semiconductor memory according to any one of the first to sixth aspect of the present invention, including preferred embodiments thereof, may be applied to the ferroelectric-type nonvolatile semiconductor memory according to the tenth or eleventh aspect of the present invention, or further to the ferroelectric-type nonvolatile semiconductor memory according to the ninth aspect of the present invention having two or more memory units. Further, the ferroelectric-type nonvolatile semiconductor memory according to the ninth, tenth or eleventh aspect of the present invention and the ferroelectric-type nonvolatile semiconductor memory according to the seventh or eighth aspect of the present invention may be combined.

When the various transistors are constituted of FETs in the constitution of the ferroelectric-type nonvolatile semiconductor memory according to the tenth aspect of the present invention, specifically, there can be employed a constitution in which one source/drain region of the transistor for writing-in is connected to the bit line, the other source/drain region thereof is connected to the common first electrode, one source/drain region of the transistor for detection is connected to a wiring having a predetermined potential (for example, a power source line made of an impurity layer), the other source/drain region thereof is connected to one source/drain region of the transistor for read-out, the other source/drain region of the transistor for read-out is connected to the bit line, and further, the common first electrode (or the other source/drain region of the transistor for writing-in) is connected to the gate electrode of the transistor for detection. The constitution in which the other source/drain region of the transistor for detection is connected to one source/drain region of the transistor for read-out includes a constitution in which the other source/drain region of the transistor for detection and the one source/drain region of the transistor for read-out occupy one source/drain region.

When the various transistors are constituted of FETs in the constitution of the ferroelectric-type nonvolatile semiconductor memory according to the eleventh aspect of the present invention, specifically, there can be employed a constitution in which one source/drain region of the transistor for writing-in is connected to the bit line, the other source/drain region thereof is connected to one source/drain region of each of the transistors for selection in the number of N, the other source/drain region of the n-th transistor for selection is connected to the common first electrode constituting the n-th memory unit, one source/drain region of the transistor for detection is connected to a wiring having a predetermined potential, the other source/drain region thereof is connected to one source/drain region of the transistor for read-out, the other source/drain region of the transistor for read-out is connected to the bit line, and, the common first electrode constituting each memory unit (or the other source/drain region of the transistor for writing-in) is connected to the gate electrode of the transistor for detection. The constitution in which the other source/drain region of the transistor for detection is connected to one source/drain region of the transistor for read-out includes a constitution in which the other source/drain region of the transistor for detection and the one source/drain region of the transistor for read-out occupy one source/drain region.

In the ferroelectric-type nonvolatile semiconductor memory according to the ninth aspect of the present invention, since the memory cells in the number of M are provided for one transistor for selection and the signal detective circuit, the cell area per bit can be decreased. In the ferroelectric-type nonvolatile semiconductor memory according to the tenth aspect of the present invention, since the memory cells in the number of M are provided for one transistor for writing-in, one transistor for detection and one transistor for read-out, the cell area per bit can be decreased. In the ferroelectric-type nonvolatile semiconductor memory according to the eleventh aspect of the present invention, since the memory cells in the number of M×N are provided for one transistor for writing-in, one transistor for detection, one transistor for read-out and transistors for selection in the number of N, the cell area per bit can be further decreased. Further, a change in potential of the common first electrode is detected with the signal detective circuit, or the operation of the transistor for detection is controlled by means of a potential that takes place in the common first electrode on the basis of the data stored in the memory cell, and the first electrode is common to the memory cells in the number of M, so that there is caused a state in which a kind of additional load capacity is added to the first electrode. As a result, when a voltage is applied to the plate line for reading out the data, an increase in the potential of the first electrode can be suppressed, and a sufficient potential difference is caused between the first electrode and the second electrode, so that a reliable polarization inversion takes place in the ferroelectric layer.

The operation method of a ferroelectric-type nonvolatile semiconductor memory according to a first aspect of the present invention for achieving the above sixth object is an operation method of a ferroelectric-type nonvolatile semiconductor memory comprising a first memory unit and a second memory unit, the first memory unit comprising;

(A-1) a first bit line, (B-1) first transistor or transistors for selection in the number of N wherein $N \geq 1$, (C-1) first sub-memory unit or units in the number of N, each first sub-memory unit comprising first memory cells in the number of M wherein $M \geq 2$, and (D-1) plate lines in the number of M, each of the plate lines being common to the first memory cell or cells constituting the first sub-memory unit or units in the number of N, and the second memory unit comprising;

(A-2) a second bit line, (B-2) second transistor or transistors for selection in the number of N, (C-2) second sub-memory unit or units in the number of N, each second sub-memory unit comprising second memory cells in the number of M, and (D-2) the plate lines in the number of M, each of the plate lines being common to the second memory cell or cells constituting the second sub-memory unit or units in the number of N, the plate lines constituting the second memory unit being common to the plate lines constituting the first memory unit, in which
each memory cell comprises a first electrode, a ferroelectric layer and a second electrode,
in the first memory unit, the first electrodes of the first memory cells constituting the n-th-place first sub-memory unit are in common in the n-th-place first sub-memory unit wherein n=1, 2 . . . N; the common first electrode in the n-th-place first sub-memory unit is connected to the first bit line through the n-th-place first transistor for selection; and the second electrode of the m-th-place first memory cell is connected to the common m-th-place plate line wherein m=1, 2 . . . M, and
in the second memory unit, the first electrodes of the second memory cells constituting the n-th-place second sub-memory unit are common in the n-th-place second sub-memory unit; the common first electrode in the n-th-place second sub-memory unit is connected to the second bit line through the n-th-place second transistor for selection; and the second electrode of the m-th-place second memory cell is connected to the common m-th-place plate line,
the method comprising performing reading out data stored in the first memory cell of the first sub-memory unit and the second memory cell of the second sub-memory unit which memory cells share the plate line and re-writing data into the first memory cell of the first sub-memory unit and the second memory cell of the second sub-memory unit which memory cells share the plate line by performing potential rising (voltage rising) and potential falling (voltage falling) once each.

In the operation method of the ferroelectric-type nonvolatile semiconductor memory according to the first aspect of the present invention (to be abbreviated as "operation method according to the first aspect of the present invention" hereinafter), there may be employed a constitution in which latch circuits in the number of 2N are provided between the first bit line and the second bit line for latching data stored in the first memory cells and the second memory cells, re-writing into the first memory cell constituting the n-th place first sub-memory unit is carried out according to the data latched in the (2n−1)-th latch circuit, and re-writing into the second memory cell constituting the n-th second sub-memory unit is carried out according to the data latched in the 2n-th latch circuit. That is, 1 bit can be stored in each of the first memory cell constituting the n-th-place first sub-memory unit and the second memory cell constituting the n-th-place second sub-memory unit which memory cells share the plate line (i.e., form a pair), whereby the higher integration of the ferroelectric-type nonvolatile semiconductor memory can be attained. The thus-constituted operation method according to the first aspect of the present invention will be referred to as "operation method according to the first constitution of the present invention".

The operation method according to the first constitution of the present invention may employ a constitution in which, when the data stored in the first memory cell is read out, the first transistor for selection is brought into an ON-state, the second transistor for selection is brought into an OFF-state and a reference potential is applied to the second bit line, and when the data stored in the second memory cell is read out, the second transistor for selection is brought into an ON-state, the first transistor for selection is brought into an OFF-state and a reference potential is applied to the first bit line.

In the operation method according to the first constitution of the present invention, preferably, the potential rising of the plate line is performed in a state in which the transistor for selection is in an OFF-state for reading out the data stored in the first memory cell of the first sub-memory unit and the second memory cell of the second sub-memory unit which memory cells share the plate line and re-writing the data into the first memory cell of the first sub-memory unit and the second memory cell of the second sub-memory unit which memory cells share the plate line, and then the transistor for selection is brought into an ON-state. Further, preferably, after readout of the data stored in the first memory cell of the first sub-memory unit and the second memory cell of the second sub-memory unit which memory cells share the plate line, the data are latched in the latch circuits, one (for example, data "0") of binary data is written into these memory cells, then, potential falling of the plate line is performed, and then data (for example, data "1") is re-written into these memory cells.

Alternatively, the operation method according to the first aspect of the present invention may employ a constitution in which $N \geq 2$, latch circuits in the number of N are provided between the first bit line and the second bit line for latching data stored in the first memory cell and the second memory cell, and re-writing into the first memory cell constituting the n-th-place first sub-memory unit and the second memory cell constituting the n-th-place second sub-memory unit is carried out according to the data latched in the n-th latch circuit.

That is, 1 bit as a complementary data can be stored in the first memory cell constituting the n-th-place first sub-memory unit and the second memory cell constituting the n-th-place second sub-memory unit which memory cells share the plate line (for example, for a pair). The above-constituted operation method according to the first aspect of the present invention will be referred to as "operation method according to the second constitution of the present invention".

The operation method according to the second constitution of the present invention may employ a constitution in which the m-th-place first memory cell constituting the n-th-place first sub-memory unit and the m-th-place second memory cell constituting the n-th-place second sub-memory unit form a pair to store the complementary data wherein m=1, 2 . . . M.

In the operation method according to the second constitution of the present invention, preferably as well, the potential rising of the plate line is performed in a state in which the transistor for selection is in an OFF-state for reading out the data stored in the first memory cell of the first sub-memory unit and the second memory cell of the second sub-memory unit which memory cells share the plate line and re-writing the data into the first memory cell of the first sub-memory unit and the second memory cell of the second sub-memory unit which memory cells share the plate line, and then the transistor for selection is brought into an ON-state. Further, preferably, after readout of the data stored in the first memory cell of the first sub-memory unit and the second memory cell of the second sub-memory unit which memory cells share the plate line, the data are latched in the latch circuit, one (for example, data "0") of binary data is written into these memory cells, then, potential falling of the plate line is performed, and then data (for example, data "1") is re-written into these memory cells.

A ferroelectric-type nonvolatile semiconductor memory according to a twelfth aspect of the present invention for achieving the above sixth object comprises a first memory unit and a second memory unit, the first memory unit comprising;

(A-1) a first bit line, (B-1) first transistor or transistors for selection in the number of N wherein N≧1, (C-1) first sub-memory unit or units in the number of N, each first sub-memory unit comprising first memory cells in the number of M wherein M≧2, and (D-1) plate lines in the number of M, each of the plate lines being common to the first memory cell or cells constituting the first sub-memory unit or units in the number of N, and the second memory unit comprising;

(A-2) a second bit line, (B-2) second transistor or transistors for selection in the number of N, (C-2) second sub-memory unit or units in the number of N, each second sub-memory unit comprising second memory cells in the number of M, (D-2) the plate lines in the number of M, each of the plate lines being common to the second memory cell or cells constituting the second sub-memory unit or units in the number of N, the plate lines constituting the second memory unit being common to the plate lines constituting the first memory unit, in which each memory cell comprises a first electrode, a ferroelectric layer and a second electrode, in the first memory unit, the first electrodes of the first memory cells constituting the n-th-place first sub-memory unit are in common in the n-th-place first sub-memory unit wherein n=1, 2 . . . N; the common first electrode in the n-th-place first sub-memory unit is connected to the first bit line through the n-th-place first transistor for selection; and the second electrode of the m-th-place first memory cell is connected to the common m-th-place plate line wherein m=1, 2 . . . M, in the second memory unit, the first electrodes of the second memory cells constituting the n-th-place second sub-memory unit are in common in the n-th-place second sub-memory unit; the common first electrode in the n-th-place second sub-memory unit is connected to the second bit line through the n-th-place second transistor for selection; and the second electrode of the m-th-place second memory cell is connected to the common m-th-place plate line, and further wherein latch circuits in the number of P are provided between the first bit line and the second bit line for latching data stored in the first memory cell and second memory cell.

In the ferroelectric-type nonvolatile semiconductor memory according to the twelfth aspect of the present invention, there may be employed a constitution in which N≧1 and P=2N are satisfied. The above-constituted ferroelectric-type nonvolatile semiconductor memory will be referred to as ferroelectric-type nonvolatile semiconductor memory according to the twelfth-A aspect of the present invention. In the above constitution, the operation method according to the first constitution of the present invention can be carried out. In the ferroelectric-type nonvolatile semiconductor memory according to the twelfth-A aspect of the present invention, preferably, the (2n−1)-th latch circuit latches the data stored in the first memory cell constituting the n-th-place first sub-memory unit, and the 2n-th latch circuit latches the data stored in the second memory cell constituting the n-th-place second sub-memory unit.

The ferroelectric-type nonvolatile semiconductor memory according to the twelfth aspect of the present invention, there may be employed a constitution in which N≧2 and P=N are satisfied. The above-constituted ferroelectric-type nonvolatile semiconductor memory will be referred to as ferroelectric-type nonvolatile semiconductor memory according to the twelfth-B aspect of the present invention. In the above constitution, the operation method according to the second constitution of the present invention can be carried out. In the ferroelectric-type nonvolatile semiconductor memory according to the twelfth-B aspect of the present invention, preferably, the n-th latch circuit latches the data stored in the first memory cell constituting the n-th-place first sub-memory unit and the second memory cell constituting the n-th-place second sub-memory unit.

The operation method of a ferroelectric-type nonvolatile semiconductor memory according to a second aspect of the present invention (to be sometimes referred to as "operation method according to the second aspect of the present invention) for achieving the above sixth object is an operation method of a ferroelectric-type nonvolatile semiconductor memory comprising;

(A) a bit line, (B) transistors for selection in the number of N wherein N≧2, (C) memory units in the number of N, each memory unit comprising memory cells in the number of M wherein M≧2, and (D) plate lines in the number of M, in which each memory cell comprises a first electrode, a ferroelectric layer and a second electrode, the first electrodes are in common in each memory unit, the common first electrode in the n-th memory unit is connected to the bit line through the n-th transistor for selection wherein n=1, 2 . . . N, and in the n-th memory unit, the second electrode of the m-th memory cell is connected to the m-th plate line common to the memory units wherein m=1, 2 . . . M, the method comprising performing reading out data stored in the memory cells sharing the plate line in the memory units in the number of N and re-writing data into the memory cells sharing the plate line in the memory units in the number of N by performing potential rising (voltage rising) and potential falling (voltage falling) once each.

The operation method of a ferroelectric-type nonvolatile semiconductor memory according to a third aspect of the present invention (to be sometimes referred to as "operation method according to the third aspect of the present invention) for achieving the above sixth object is an operation method of a ferroelectric-type nonvolatile semiconductor memory comprising;

(A) a bit line, (B) transistors for selection in the number of N wherein N≧2, (C) memory units in the number of N, each memory unit comprising memory cells in the number of M wherein M≧2, and (D) plate lines in the number of M, in which each memory cell comprises a first electrode, a ferroelectric layer and a second electrode, the first electrodes are in common in each memory unit, the common first electrode in the n-th memory unit is connected to the bit line through the n-th transistor for selection wherein n=1, 2 . . . N, and in the n-th memory unit, the second electrode of the m-th memory cell is connected to the m-th plate line common to the memory units wherein m=1, 2 . . . M, the method comprising reading out data stored in the memory cells sharing the plate line in the memory units in the number of N by first providing the plate line with a pulse and then consecutively selecting the transistors for selection in the number of N.

In the operation method according to the second or third aspect of the present invention, preferably, the memory units in the number of N are stacked through an insulating interlayer. And, this case can employ the ferroelectric-type nonvolatile semiconductor memory according to the sixth aspect of the present invention including the preferred embodiment thereof.

A ferroelectric-type nonvolatile semiconductor memory according to a thirteenth aspect of the present invention for achieving the above sixth object comprises;

(A) a bit line, (B) transistors for selection in the number of N wherein N≧2, (C) memory units in the number of N, each memory unit comprising memory cells in the number of M wherein M≧2, and (D) plate lines in the number of M, in which each memory cell comprises a first electrode, a ferroelectric layer and a second electrode, the first electrodes are in common in each memory unit, the common first electrode in the n-th memory unit is connected to the bit line through the n-th transistor for selection wherein n=1, 2 . . . N, and in the n-th memory unit, the second electrode of the m-th memory cell is connected to the m-th plate line common to the memory units wherein m=1, 2 . . . M, and further in which latch circuits in the number of at least N are connected to the bit line for latching data stored in the memory cells.

In the ferroelectric-type nonvolatile semiconductor memory according to the thirteenth aspect of the present invention, preferably, the n-th latch circuit latches the data stored in the memory cell constituting the n-th memory unit wherein n=1, 2 . . . N. Further, preferably, the memory units in the number of N are stacked through an insulating interlayer.

The ferroelectric-type nonvolatile semiconductor memory according to any one of the first to sixth aspects of the present invention including the preferred embodiments thereof can be applied to a preferred embodiment of the ferroelectric-type nonvolatile semiconductor memory according to the twelfth or thirteenth aspect of the present invention.

That is, in the ferroelectric-type nonvolatile semiconductor memory according to the twelfth-A aspect of the present invention, for attaining a higher integration, there may be employed a constitution in which a first memory unit constituting a ferroelectric-type nonvolatile semiconductor memory and a first memory unit constituting a ferroelectric-type nonvolatile semiconductor memory adjacent to the above ferroelectric-type nonvolatile semiconductor memory in the extending direction of the first bit line are stacked through an insulating interlayer, and a second memory unit constituting the ferroelectric-type nonvolatile semiconductor memory and a second memory unit constituting the ferroelectric-type nonvolatile semiconductor memory adjacent to the above ferroelectric-type nonvolatile semiconductor memory in the extending direction of the second bit line are stacked through the insulating interlayer.

For attaining a higher integration, for example, the ferroelectric-type nonvolatile semiconductor memory according to the twelfth-B aspect of the present invention may employ a constitution in which the first sub-memory units constituting the first memory unit are stacked through an insulating interlayer and the second sub-memory units constituting the second memory unit are stacked through an insulating interlayer. There may be also employed another constitution in which the first sub-memory unit constituting the first memory unit and the second sub-memory unit constituting the second memory unit are stacked through an insulating interlayer.

Alternatively, the ferroelectric-type nonvolatile semiconductor memory according to any one of the seventh to eleventh aspect of the present invention including the preferred embodiments thereof may be applied to the ferroelectric-type nonvolatile semiconductor memory according to the twelfth or thirteenth aspect of the present invention.

In the ferroelectric-type nonvolatile semiconductor memory according to the twelfth or thirteenth aspect of the present invention or the operation method according to the second or third aspect of the present invention, it is sufficient to satisfy M≧2, and the actual value of M includes, for example, exponents of 2 (2, 4, 8 . . . ). In the ferroelectric-type nonvolatile semiconductor memory according to the twelfth-A aspect of the present invention or the operation method according to the first constitution of the present invention, it is sufficient to satisfy N≧1, and the actual value of N includes, for example, 1 and exponents of 2 (2, 4, 8 . . . ). In the ferroelectric-type nonvolatile semiconductor memory according to the twelfth-B aspect of the present invention or the operation method according to the second constitution of the present invention, it is sufficient to satisfy N≧2, and the actual value of N includes, for example, exponents of 2 (2, 4, 8 . . . ).

In the ferroelectric-type nonvolatile semiconductor memory according to the twelfth or thirteenth aspect of the present invention or the operation method of the ferroelectric-type nonvolatile semiconductor memory, the latch circuit may be constituted of a known latch circuit.

In the ferroelectric-type nonvolatile semiconductor memory according to the twelfth aspect of the present invention or the operation method according to the first aspect of the present invention, a plurality of the first and second memory cells are connected to the first and second transistors for selection in parallel, and the first and second memory cells share the plate line, so that a higher integration of the ferroelectric-type nonvolatile semiconductor memory can be attained. Further, in the operation method according to the first aspect of the present invention, readout of the data stored in the first memory cell and the second memory cell which memory cells share the plate line and re-writing of the data into the first memory cell and the second memory cell which memory cells share the plate line are performed by performing the potential rising and potential falling of the plate line once each, so that the frequency of each memory cell suffering a disturbance can be decreased, and that the rapid operation and low power consumption can be attained. In the ferroelectric-type nonvolatile semiconductor memory according to the twelfth or thirteenth aspect of the present invention, the latch circuit is provided, so that re-writing of the data into the memory cell or re-writing of the data into the first and second memory cells can be reliably performed.

In the operation method according to the second aspect of the present invention, the data stored in the memory cells sharing the plate line in the memory units in the number of N is read out and the data is re-written into the memory cells sharing the plate line in the memory units in the number of N by performing the potential rising and potential falling of the plate line once each, so that the frequency of each memory cell suffering a disturbance can be decreased, and that the rapid operation and low power consumption can be attained. In the operation method according to the third aspect of the present invention, readout of the data stored in the memory cells sharing the plate line in the memory units in the number of N is performed by providing the plate line with a pulse and then consecutively selecting the transistors for selection in the number of N, so that the frequency of each memory cell suffering a disturbance can be decreased, and that the rapid operation and low power consumption can be attained.

The material for constituting the ferroelectric layer in the ferroelectric-type nonvolatile semiconductor memory of the present invention includes bismuth layer compounds, more specifically, a Bi-containing layer perovskite-type ferroelectric material. The Bi-containing layer perovskite-type ferroelectric material comes under so-called non-stoichiometric compounds, and shows tolerance of compositional deviations in both sites of a metal element and anions (O, etc.). Further, it is not a rare case that the above material having a composition deviated from its stoichiometric composition to some extent exhibits optimum electric characteristics. The Bi-containing layer perovskite-type ferroelectric material can be expressed, for example, by the general formula, $$(Bi_2O_2)^{2+}(A_{m-1}B_mO_{3m+1})^{2-}$$

wherein A is one metal selected from the group consisting of metals such as Bi, Pb, Ba, Sr, Ca, Na, K, Cd, etc., and B is one metal selected from the group consisting of Ti, Nb, Ta, W, Mo, Fe, Co and Cr or a combination of a plurality of these metals combined in any amount ratio, and m is an integer of 1 or more.

Alternatively, the material for constituting the ferroelectric layer preferably contains, as a main crystal phase, a crystal phase represented by the formula (1), $$(Bi_X, Sr_{1-X})_2(Sr_Y, Bi_{1-Y})(Ta_Z, Nb_{1-Z})_2O_d \qquad (1)$$

wherein $0.9 \leq X \leq 1.0$, $0.7 \leq Y \leq 1.0$, $0 \leq Z \leq 1.0$, and $8.7 \leq d \leq 9.3$.

Otherwise, the material for constituting the ferroelectric layer preferably contains, as a main crystal phase, a crystal phase represented by the formula (2), $$Bi_XSr_YTa_2O_d \qquad (2)$$

wherein X+Y=3, $0.7 \leq Y \leq 1.3$ and $8.7 \leq d \leq 9.3$.

In the above case, more preferably, the material for constituting the ferroelectric layer preferably contains, as a main crystal phase, at least 85% of a crystal phase represented by the formula (1) or (2). In the above formula (1), $(Bi_X, Sr_{1-X})$ means that Sr occupies the site that Bi should have occupied in a crystal structure and that the Bi:Sr amount ratio is X:(1-X). Further, $(Sr_Y, Bi_{1-Y})$ means that Bi occupies the site that Sr should have occupied in a crystal structure and that the Sr:Bi amount ratio is Y:(1-Y). The material for constituting the ferroelectric layer and containing, as a main crystal phase, the crystal phase of the above formula (1) or (2), may contain an oxide of Bi, oxides of Ta and Nb and composite oxides of Bi, Ta and Nb to some extent.

Alternatively, the material for constituting the ferroelectric layer may contain a crystal phase represented by the formula (3), $$Bi_X(Sr, Ca, Ba)_Y(Ta_Z, Nb_{1-Z})_2O_d \qquad (3)$$

wherein $1.7 \leq X \leq 2.5$, $0.6 \leq Y \leq 1.2$, $0 \leq Z \leq 1.0$ and $8.0 \leq d \leq 10.0$.

(Sr, Ca, Ba) stands for one element selected from the group consisting of Sr, Ca and Ba. When the above material for the ferroelectric layer, having the above formulae, is expressed by a stoichiometric composition, the composition includes $Bi_2SrTa_2O_9$, $Bi_2SrNb_2O_9$, $Bi_2BaTa_2O_9$ and $Bi_2SrTaNbO_9$. Otherwise, the material for constituting the ferroelectric layer also includes $Bi_4SrTi_4O_{15}$, $Bi_4Ti_3O_{12}$ and $Bi_2PbTa_2O_9$. In these cases, the amount ratio of the metal elements may be varied to such an extent that the crystal structure does not change. That is, the above material may have a composition deviated from its stoichiometric composition in both sites of metal elements and oxygen element.

Further, the material for constituting the ferroelectric layer includes $PbTiO_3$, lead titanate zirconate [PZT, $Pb(Zr_{1-y}, Ti_y)O_3$ wherein $0<y<1$] which is a solid solution of $PbZrO_3$ and $PbTiO_3$ having a perovskite structure, and PZT-containing compounds such as PLZT which is a metal oxide prepared by adding La to PZT and PNZT which is a metal oxide prepared by adding Nb to PZT.

In the above materials for constituting the ferroelectric layer, the crystallization temperature can be changed by deviating their compositions from their stoichiometric compositions.

In the ferroelectric-type nonvolatile semiconductor memory according to the sixth aspect or in a preferred embodiment of the ferroelectric-type nonvolatile semiconductor memory according to any one of the first to fifth and seventh to thirteenth aspects of the present invention, the above materials for constituting the ferroelectric layers are properly selected, whereby it can be attained that the ferroelectric layer constituting the memory cells positioned above has a lower crystallization temperature than the ferroelectric layer constituting the memory cells positioned below, or that the ferroelectric layer of the memory cells constituting the memory unit or the sub-memory unit positioned above has a lower crystallization temperature than the ferroelectric layer of the memory cells constituting the memory unit or the sub-memory unit positioned below. The following Table 1 shows crystallization temperatures of typical materials for constituting the ferroelectric layers, while the materials for constituting the ferroelectric layers shall not be limited thereto.

TABLE 1

| Material | Crystallization temperature |
| --- | --- |
| $Bi_2SrTa_2O_9$ | 700–800° C. |
| $Bi_2Sr(Ta_{1.5}, Nb_{0.5})O_9$ | 650–750° C. |
| $Bi_4Ti_3O_{12}$ | 600–700° C. |

TABLE 1-continued

| Material | Crystallization temperature |
| --- | --- |
| $Pb(Zr_{0.48}, Ti_{0.52})O_3$ | 550–650° C. |
| $PbTiO_3$ | 500–600° C. |

In the ferroelectric-type nonvolatile semiconductor memories according to various aspects of the present invention, there may be employed a constitution in which the first electrode is formed below the ferroelectric layer and the second electrode is formed on the ferroelectric layer (that is, the first electrode corresponds to the lower electrode and the second electrode corresponds to the upper electrode), or there may be employed a constitution in which the first electrode is formed on the ferroelectric layer and the second electrode is formed below the ferroelectric layer (that is, the first electrode corresponds to the upper electrode and the second electrode corresponds to the lower electrode). There may be employed a constitution in which the plate line extends from the second electrode, or the plate line is formed separately from the second electrode and is connected to the second electrode. In the latter case, the wiring material for constituting the plate line includes, for example, aluminum and an aluminum-containing alloy. The structure in which the first electrode is common specifically includes a structure in which the first electrode in the form of a stripe is formed and the ferroelectric layer is formed on the entire surface of the first electrode in the form of a stripe. In the above structure, an overlapping region df the first electrode, the ferroelectric layer and the second electrode corresponds to a memory cell or a capacitor member. In addition, the structure in which the first electrode is common includes a structure in which ferroelectric layers are formed on predetermined regions of the first electrode and the second electrodes are formed on the ferroelectric layers, and a structure in which the first electrodes are formed in predetermined surface regions of a wiring layer, the ferroelectric layers are formed on the first electrodes and the second electrodes are formed on the ferroelectric layers, although the above structure shall not be limited thereto.

For forming the ferroelectric layer, a ferroelectric thin film is formed, and a step to come thereafter, the ferroelectric thin film is patterned. Some cases require no patterning of the ferroelectric thin film. The ferroelectric thin film can be formed by a method suitable for a material that is to constitute the ferroelectric thin film, such as an MOCVD method, a pulse laser abrasion method, a sputtering method or a sol-gel method. Further, the ferroelectric thin film can be patterned, for example, by an anisotropic ion etching (RIE) method.

In the present invention, the material for constituting the first electrode and second electrode include, for example, Ir, $IrO_{2-X}$, $SrIrO_3$, Ru, $RuO_{2-X}$, $SrRuO_3$, Pt, $Pt/IrO_{2-X}$, $Pt/RuO_{2-X}$, Pd, a Pt/Ti stacked structure, a Pt/Ta stacked structure, a Pt/Ti/Ta stacked structure, $La_{0.5}Sr_{0.5}CoO_3$ (LSCO), a Pt/LSCO stacked structure and $YBa_2Cu_3O_7$. The value of the above X is in the range of $0 \leq X < 2$. In the above stacked structures, a material described before "/" constitutes the upper layer, and a material described after "/" constitutes the lower layer. The first electrode and the second electrode may be constituted of one material, materials of the same kind or materials of different kinds. For forming the first electrode or the second electrode, a first electrode material layer or a second electrode material layer is formed, and in a step to come thereafter, the first electrode material layer or the second electrode material layer is patterned. The first electrode material layer or the second electrode material layer can be formed by a method properly suitable for the materials for constituting the first electrode material layer or the second electrode material layer, such as a sputtering method, a reactive sputtering method, an electron beam deposition method, an MOCVD method or a pulse laser abrasion method. The first electrode material layer or the second electrode material layer can be patterned, for example, by an ion milling method or an RIE method.

In the present invention, the material for constituting the insulating interlayer includes silicon oxide ($SiO_2$), silicon nitride (SiN), SiON, SOG, NSG, BPSG, PSG, BSG and LTO.

The transistor for selection (transistor for switching) and various transistors can be constituted, for example, of known MIS type FETs or MOS type FETs. The material for constituting the bit line includes an impurity-doped polysilicon and a refractory metal material. The common first electrode and the transistor for selection can be electrically connected through a contact hole made in an insulation layer formed between the common first electrode and the transistor for selection or through a contact hole made in the above insulation layer and a wiring layer formed on the insulation layer. The material for constituting the insulation layer includes silicon oxide ($SiO_2$), silicon nitride (SiN), SiON, SOG, NSG, BPSG, PSG, BSG and LTO.

BRIEF DESCRIPTION OF THE DRAWINGS

Examples of the present invention will be explained with reference to drawings.

FIGS. 56A and 56B are diagrams illustrating P-E hysteresis loops of a ferroelectric material at 20° C. and 105° C.

DESCRIPTION OF THE PREFERRED EMBODIMENTS

EXAMPLE 1

Figure 1:
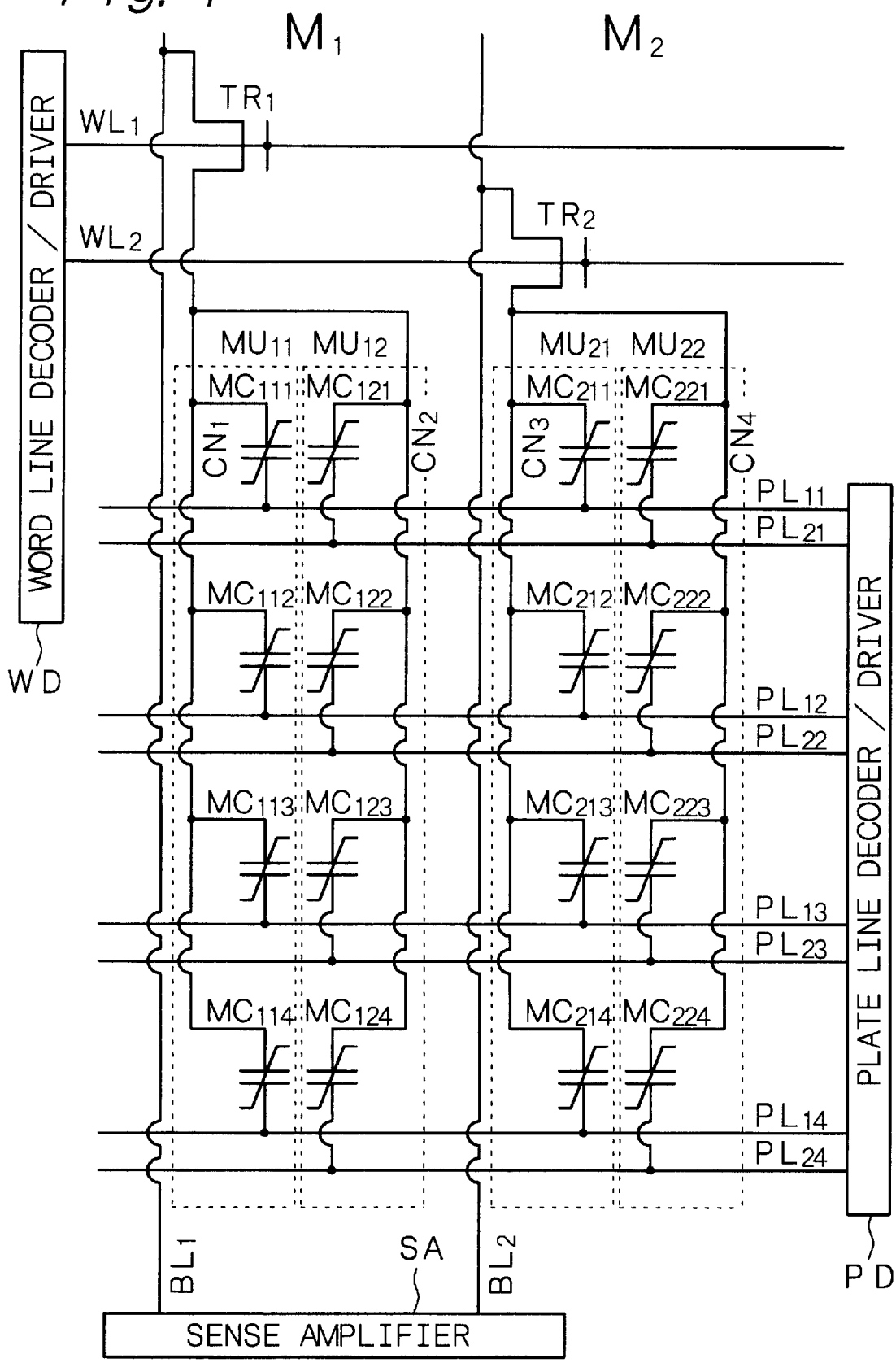
FIG. 1 is a circuit diagram of a ferroelectric-type nonvolatile semiconductor memory in Example 1.
Figure 2:
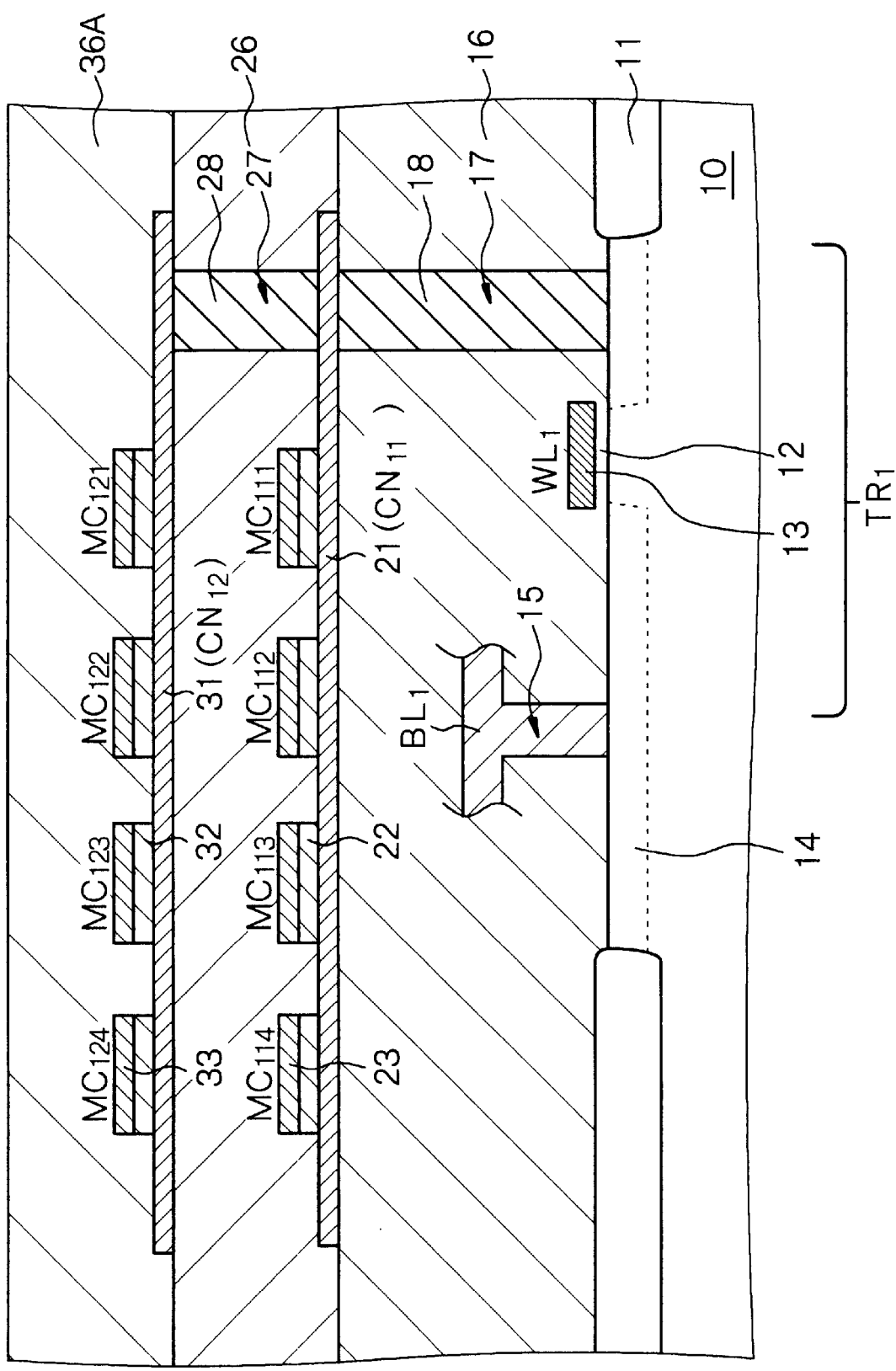
FIG. 2 is a schematic partial cross-sectional view of the ferroelectric-type nonvolatile semiconductor memory in Example 1.

Example 1 is concerned with the ferroelectric-type nonvolatile semiconductor memory (to be referred to as "nonvolatile memory" hereinafter) according to the first and sixth aspects of the present invention. FIG. 1 shows a circuit diagram of the nonvolatile memory in Example 1, and FIG. 2 shows a schematic partial cross-sectional view thereof. While FIG. 1 shows the two nonvolatile memories $M_1$ and $M_2$, these nonvolatile memories have the same circuits. The following explanation will discuss the nonvolatile memory $M_1$.

The above nonvolatile memory $M_1$ comprises a bit line $BL_1$, a transistor for selection $TR_1$ made of a MOS type FET, memory units in the number of N (provided that $N \geq 2$, and N=2 in Example 1) or memory units $MU_{11}$ and $MU_{12}$, and plate lines. The memory unit $MU_{11}$ comprises memory cells in the number of M (provided that $M \geq 2$, and M=4 in Example 1) or memory cells $MC_{11m}$ (m=1, 2, 3, 4). The memory unit $MU_{12}$ also comprises memory cells in the number of M (M=4) or memory cells $MC_{12m}$ (M=1, 2, 3, 4). The number of the plate lines is M×N (8 in Example 1), and the plate lines are represented by $PL_{1m}$ and $PL_{2m}$ (m=1, 2, 3, 4). A word line $WL_1$ connected to the gate electrode of the transistor for selection $TR_1$ is connected to a word line decoder/driver WD. The plate lines $PL_{1m}$ and $PL_{2m}$ are connected to a plate line decoder/driver PD.

Each of the memory cells $MC_{11m}$ constituting the memory unit $MU_{11}$ comprises a first electrode 21, a ferroelectric layer 22 and a second electrode 23, and each of the memory cells $MC_{12m}$ constituting the memory unit $MU_{12}$ comprises a first electrode 31, a ferroelectric layer 32 and a second electrode 33. In the memory unit $MU_{11}$ or $MU_{12}$, the first electrodes 21 or 31 of the memory cells $MC_{11m}$ or $MC_{12m}$ are in common in the memory cells $MC_{11m}$ or $MC_{12m}$. The above common first electrode 21 or 31 will be referred to as a common node $CN_{11}$ or $CN_{12}$ for the sake of convenience. The common nodes $CN_{11}$ and $CN_{12}$ (common first electrodes 21 and 31) are connected to the bit line $BL_1$ through the transistor for selection $TR_1$. In the n-th memory unit $MU_{11}$ or $MU_{12}$ wherein n=1, 2 ... N, the second electrode 23 or 33 of the m-th memory cell $MC_{11m}$ or $MC_{12m}$ is connected to the [(n−1)M+m]-th plate line $PL_{1m}$ or $PL_{2m}$ wherein m=1, 2 ... M. Specifically, the second electrode 23 of the memory cell $MC_{11m}$ in the memory unit $MU_{11}$ is connected to the plate line $PL_{1m}$, and the second electrode 33 of the memory cell $MC_{12m}$ in the memory unit $MU_{12}$ is connected to the plate line $PL_{2m}$.

In Example 1, the two memory units $MU_{11}$ and $MU_{12}$ are stacked through an insulating interlayer 26. The memory unit $MU_{12}$ is covered with an insulation film 36A. The memory unit $MU_{11}$ is formed above a semiconductor substrate 10 through an insulation layer 16. A device-isolation region 11 is formed in the semiconductor substrate 10. The transistor for selection $TR_1$ comprises a gate electrode 13, a gate insulating film 12 and source/drain regions 14. One source/drain region 14 is connected to the bit line $BL_1$ through a contact hole 15. The other source/drain region 14 is connected to the common node $CN_{11}$ through a contact hole 18 made in an opening portion 17 made in the insulation layer 16, and is further connected to the common node $CN_{12}$ through a contact hole 28 made in an opening portion 27 made in the insulating interlayer 26.

The word line $WL_1$ is extending in the direction perpendicular to the paper surface of FIG. 2. The second electrode 23 is common to the memory cells which are adjacent to each other in the direction perpendicular to the paper surface of FIG. 2 and constitute the memory unit $MU_{21}$. The second electrode 23 also works as the plate line $PL_{1m}$. The second electrode 32 is common to the memory cells which are adjacent to each other in the direction perpendicular to the paper surface of FIG. 2 and constitute the memory unit $MU_{22}$. The second electrode 33 also works as the plate line $PL_{2m}$. These plate lines connecting the memory cells are extending in the direction perpendicular to the paper surface of FIG. 2, and are connected through contact holes in a region (not shown). The memory cell $MC_{11M}$ and memory cell $MC_{12M}$ are aligned in the perpendicular direction. In this structure, the area occupied by the memory units can be decreased, and the integration degree can be improved.

The nonvolatile memory $M_2$ shown in FIG. 1 is adjacent to the nonvolatile memory $M_1$ in the direction perpendicular to the paper surface of the schematic partial cross-sectional view of FIG. 2 as described above.

Further, the bit line $BL_1$ is connected to a sense amplifier SA. The bit line $BL_2$ is also connected to the same sense amplifier SA, while the bit line $BL_2$ may be connected to a different sense amplifier SA. Further, the bit lines $BL_1$ and $BL_2$ are also shared by other nonvolatile memories adjacent in the extending direction of the bit lines $BL_1$ and $BL_2$.

And, 1-bit data is stored in each of memory cells $MC_{11m}$ and $MC_{12m}$ (m=1, 2, 3, 4). In an actual nonvolatile memory, sets of memory units storing 8 bits each are arranged in the form of an array as access units.

Figure 3:
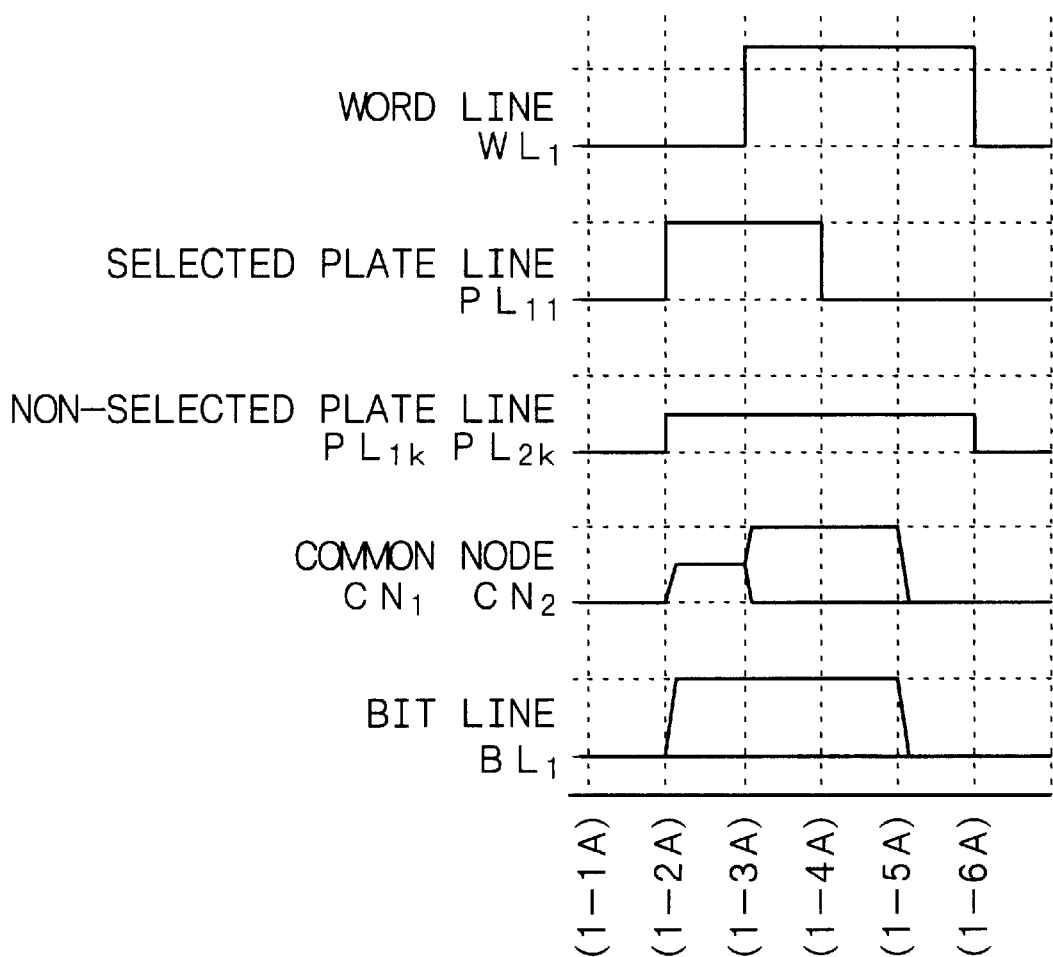
FIG. 3 is a diagram of operation waveforms when data is written into the ferroelectric-type nonvolatile semiconductor memory in Example 1.

One example of the method for writing data into the nonvolatile memory in Example 1 will be explained below. As one example, the data is written into the memory cell $MC_{111}$. FIG. 3 shows operation waveforms. In FIG. 3, parenthesized numbers correspond to Nos. of steps to be explained below.

(1-1A) In a standby state, the bit line $BL_1$, the word line $WL_1$, and all of the plate lines $PL_{1m}$ and $PL_{2m}$ have 0 volt. Further, the common nodes $CN_{11}$ and $CN_{12}$ have 0 volt and are in a floating state.

(1-2A) When writing of data is started, the potential of the selected plate line $PL_{11}$ is brought into $V_{CC}$, and the potential of the non-selected plate lines $PL_{1k}$ (k=2, 3, 4) and $PL_{2k}$ (k=1, 2, 3, 4) is brought into $(1/2)V_{CC}$. As a result, the potential of the common nodes $CN_{11}$ and $CN_{12}$ in a floating state increases near to approximately $(1/2)V_{CC}$ due to coupling of the plate lines $PL_{1M}$ and $PL_{2M}$. When data "1" is written into the selected memory cell $MC_{111}$, the potential of the bit line $BL_1$ is brought into $V_{CC}$, and when data "0" is written, the potential of the bit line $BL_1$ is brought into 0 volt.

(1-3A) Then, the transistor for selection $TR_1$ is brought into an ON-state. As a result, when data "1" is written into the selected memory cell $MC_{111}$, the potential of the common nodes $CN_{11}$ and $CN_{12}$ comes to be $V_{CC}$, and when data "0" is written, it comes to be 0 volt. Since the selected plate line $PL_{11}$ is in a state where $V_{CC}$ is applied thereto, data "0" is written into the selected memory cell $MC_{111}$ when the common nodes $CN_{11}$ and $CN_{12}$ have a potential of 0 volt. On the other hand, no data is written into the selected memory cell $MC_{111}$ when the common nodes $CN_{11}$ and $CN_{12}$ have a potential of $V_{CC}$.

(1-4A) Then, the potential of the selected plate line $PL_{11}$ is brought into 0 volt. When the common nodes $CN_{11}$ and $CN_{12}$ have a potential of $V_{CC}$, data "1" is written into the selected memory cell $MC_{111}$. When data "0" is already written into the selected memory cell $MC_{111}$, no change takes place in the selected memory cell $MC_{111}$.

(1-5A) Then, 0 volt is applied to the bit line $BL_1$.

(1-6A) Further, the non-selected plate lines $PL_{1k}$ and $PL_{2k}$ are brought into 0 volt, and the transistor for selection $TR_1$ is brought into an OFF-state.

When data is written into other memory cells $MC_{11m}$ (m=2, 3, 4) and $MC_{12m}$ (m=1, 2, 3, 4), a similar operation is repeated. In the above writing operation, a disturbance of $(\pm 1/2)V_{CC}$ takes place in the non-selected memory cells $MC_{11K}$ and $MC_{12K}$. However, the destruction of the data in the non-selected memory cells $MC_{11K}$ and $MC_{12K}$ can be reliably prevented by properly setting the value of $V_{CC}$.

Figure 4:
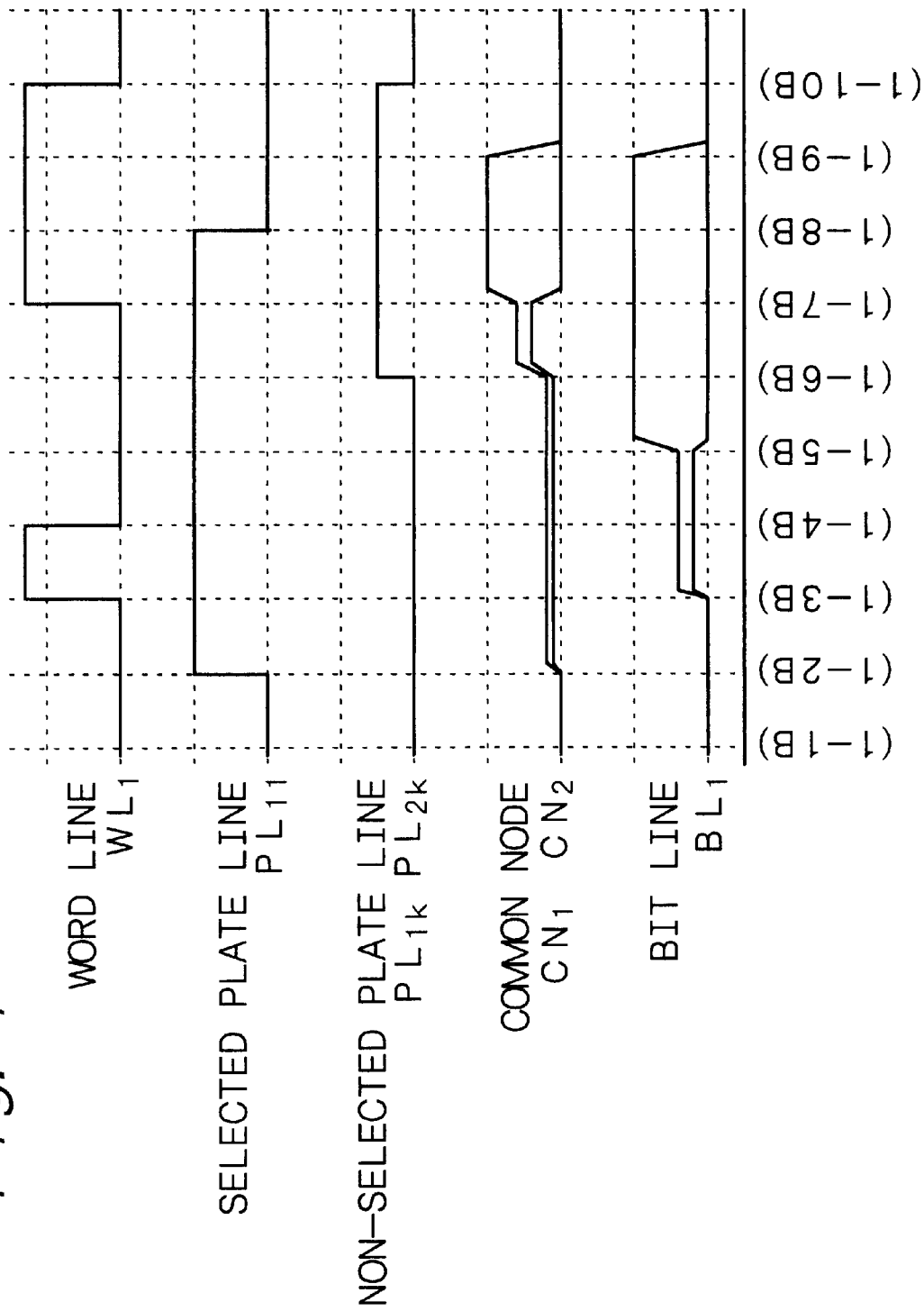
FIG. 4 is a diagram of operation waveforms when data is read out from, and re-written into, the ferroelectric-type nonvolatile semiconductor memory in Example 1.

The operation of reading out data from, and re-writing data into, the nonvolatile memory in Example 1 will be explained below. As an example, data is read out from the memory cell $MC_{111}$ connected to the plate line $PL_{11}$, and data is re-written. FIG. 4 shows operation waveforms.

(1-1B) In a standby state, the bit line $BL_1$, the word line $WL_1$ and all of the plate lines $PL_{1m}$ and $PL_{2m}$ have 0 volt. Further, the common nodes $CN_{11}$ and $CN_{12}$ have 0 volt and are in a floating state.

(1-2B) When data is read out, $V_{CC}$ is applied to the selected plate line $PL_{11}$. When data "1" is already stored in the selected memory cell $MC_{111}$ in this case, polarization inversion takes place in the ferroelectric layer, an accumulated charge increases in amount and the potential of the common nodes $CN_{11}$ and $CN_{12}$ increases. When data "0" is already stored in the selected memory cell $MC_{111}$, no polarization inversion takes place in the ferroelectric layer, and the potential of the common nodes $CN_{11}$ and $CN_{12}$ increases little. That is, since the common nodes $CN_{11}$ and $CN_{12}$ are coupled with the non-selected plate lines $PL_{1k}$ (k=2, 3, 4) and $PL_{2k}$ (k=1, 2, 3, 4) through the ferroelectric layers of the non-selected memory cells, the potential of the common nodes $CN_{11}$ and $CN_{12}$ are maintained at a level relatively close to 0 volt. In the above manner, a change takes place in the potential of the common nodes $CN_{11}$ and $CN_{12}$ depending upon data stored in the selected memory cell $MC_{111}$, so that the selected memory cell $MC_{111}$ can be provided with an electric field sufficient for polarization inversion.

(1-3B) Then, the bit line $BL_1$ is brought into a floating state, and the transistor for selection $TR_1$ is brought into an ON-state, whereby the potential caused in the common first electrode (common nodes $CN_{11}$ and $CN_{12}$) on the basis of the data stored in the selected memory cell $MC_{111}$ causes the bit line $BL_1$ to have a potential.

(1-4B) Then, the transistor for selection $TR_1$ is brought into an OFF-state. And, the potential of the bit line $BL_1$ is latched with the sense amplifier SA, the sense amplifier SA is activated to amplify the data, and the operation of reading out the data is completed.

Since the data stored in the selected memory cell is one destroyed by the above operation, the data is re-written.

(1-5B) For this purpose, first, the bit line $BL_1$ is charged and discharged with the sense amplifier SA, and $V_{CC}$ or 0 volt is applied to the bit line $BL_1$.

(1-6B) Then, the potential of the non-selected plate lines $PL_{1k}$ (k=2, 3, 4) and $PL_{2k}$ (k=1, 2, 3, 4) is brought into $(1/2)V_{CC}$.

(1-7B) Then, the transistor for selection $TR_1$ is brought into an ON-state, whereby the common nodes $CN_{11}$ and $CN_{12}$ come to have a potential equal to the potential of the bit line $BL_1$. That is, when the data stored in the selected memory cell $MC_{111}$ is "1", the common nodes $CN_{11}$ and $CN_{12}$ come to have a potential of $V_{CC}$, and when the data stored in the selected memory cell $MC_{111}$ is "0", the common nodes $CN_{11}$ and $CN_{12}$ come to have a potential of 0 volt. The selected plate line $PL_{11}$ keeps a potential of $V_{CC}$, so that, when the common nodes $CN_{11}$ and $CN_{12}$ have a potential of 0 volt, data "0" is written into the selected memory cell $MC_{111}$.

(1-8B) Then, the potential of the selected plate line $PL_{11}$ is brought into 0 volt, whereby data "1" is re-written when the data stored in the selected memory cell $MC_{111}$ is "1", since the common nodes $CN_{11}$ and $CN_{12}$ have a potential of $V_{CC}$. When data "0" is already re-written into the selected memory cell $MC_{111}$, no change takes place in the selected memory cell $MC_{111}$.

(1-9B) Then, the bit line $BL_1$ is brought into 0 volt.

(1-10B) Finally, the non-selected plate line $PL_{1k}$ and $PL_{2k}$ are brought into 0 volt, and the transistor for selection $TR_1$ is brought into an OFF-state.

When data is read out from, and re-written into, other memory cells $MC_{11m}$ (m=2, 3, 4) and $MC_{12m}$ (m=1, 2, 3, 4), the above procedures are repeated.

In the nonvolatile memory in Example 1, the ferroelectric layer 22 in the memory cells $MC_{11m}$ constituting the memory unit $MU_{11}$ and the ferroelectric layer 32 in the memory cells $MC_{12m}$ constituting the memory unit $MU_{12}$ may be constituted of the same material. Like the nonvolatile memory according to the sixth aspect of the present invention, however, it is preferred to employ a constitution in which the ferroelectric layer 32 constituting the memory cells positioned above has a lower crystallization temperature than the ferroelectric layer 22 constituting the memory cells positioned below. Specifically, the ferroelectric layers 22 and 32 may be constituted of materials shown in the following Table 2.

TABLE 2

|  | Material | Crystallization temperature |
| --- | --- | --- |
| Ferroelectric layer 32 | $Bi_2Sr(Ta_{1.5}Nb_{0.5})O_9$ | 700° C. |
| Ferroelectric layer 22 | $Bi_2SrTa_2O_9$ | 750° C. |

The process for the production of the above-constituted nonvolatile memory will be explained below. Nonvolatile memories in other Examples and variants thereof can be also produced by substantially the same process.

[Step-100]

First, MOS transistors that work as transistors for selection in the nonvolatile memory are formed in the semiconductor substrate 10. For this purpose, a device-isolation region 11 having, for example, a LOCOS structure is formed by a known method. The device-isolation region may have a trench structure or may be formed of a combination of a LOCOS structure and a trench structure. Then, the surface of the semiconductor substrate 10 is oxidized, for example, by a pyrogenic oxidation method to form the gate insulating film 12. Then, an impurity-doped polysilicon layer is formed on the entire surface by a CVD method, and then the polysilicon layer is patterned to form the gate electrode 13. The gate electrode 13 also works as a word line. The gate electrode 13 may be constituted of a polycide or a metal silicide in place of the polysilicon layer. Then, the semiconductor substrate 10 is implanted with an ion to form an LDD structure. Then, an $SiO_2$ layer is formed on the entire surface by a CVD method and then etched back to form a gate sidewall (not shown) on sides of the gate electrode 13. Then, the semiconductor substrate 10 is implanted with an ion, and an impurity implanted is activated by annealing, to form the source/drain regions 14.

[Step-110]

Then, a lower insulation layer made of $SiO_2$ is formed by a CVD method, and then, an opening portion is formed in the lower insulation layer above one source/drain region 14 by an RIE method. Then, a polysilicon layer doped with an impurity is formed on the lower insulation layer and the inside of the opening portion by a CVD method, whereby a contact hole 15 is formed. Then, the polysilicon layer on the lower insulation layer is patterned to form the bit lines BL. Then, an upper insulation layer made of BPSG is formed on the entire surface by a CVD method. After the formation of the upper insulation layer made of BPSG, preferably, the upper insulation layer is re-flowed in a nitrogen atmosphere, for example, at 900° C. for 20 minutes. Further, desirably, the top surface of the upper insulation layer is chemically and mechanically polished by a chemical/mechanical polishing method (CMP method) to flatten the upper insulation layer as required. The lower insulation layer and the upper insulation layer will be together referred to as insulation layer 16.

[Step-120]

Then, an opening portion 17 is made in the insulation layer 16 above the other source/drain region 14 by an RIE method, and then the opening portion 17 is filled with polysilicon doped with an impurity, to complete a contact hole (contact plug) 18. The bit line BL is extending on the lower insulation layer leftward and rightward in the drawing without being in contact with the contact hole 18.

The contact hole 18 may be also formed by filling the opening portion 17 made in the insulation layer 16 with a metal wiring material of a refractory metal or a metal silicide such as tungsten, Ti, Pt, Pd, Cu, TiW, TiNW, $WSi_2$ or $MoSi_2$. The top surface of the contact hole 18 may be present nearly at the level of the surface of the insulation layer 16, or a top portion of the contact hole 18 may be extending on the surface of the insulation layer 16. The following Table 3 shows conditions of filling the opening portion 17 with tungsten to form the contact hole 18. Before filling the opening portion 17 with tungsten, preferably, a Ti layer and a TiN layer are consecutively formed on the insulation layer 16 and the inside of the opening portion 17, for example, by a magnetron sputtering method. The Ti layer and the TiN layer are formed for attaining an ohmic low contact resistance, preventing damage of the semiconductor substrate 10 in the blanket tungsten CVD method and improving the adhesion of tungsten.

TABLE 3

| Sputtering conditions of Ti layer (thickness: 20 nm) | |
|---|---|
| Process gas | Ar = 35 sccm |
| Pressure | 0.52 Pa |
| RF power | 2 kW |
| Heating of substrate | No |
| Sputtering conditions of TiN layer (thickness: 100 nm) | |
| Process gas | $N_2$/Ar = 100/35 sccm |
| Pressure | 1.0 Pa |
| RF power | 6 kW |
| Heating of substrate | No |
| Condition of formation by CVD of tungsten | |
| Gas | $WF_6/H_2$/Ar = 40/400/2250 sccm |
| Pressure | $10.7 \times 10^3$ Pa |
| Forming temperature | 450° C. |
| Conditions of etching tungsten layer and TiN layer and Ti layer | |
| Etching at first stage: Etching of tungsten layer | |
| Gas | $SF_6$/Ar/He = 110/90/5 sccm |
| Pressure | 46 Pa |
| RF power | 275 W |

TABLE 3-continued

| Etching at second stage: Etching of TiN layer/Ti layer | |
|---|---|
| Gas | Ar/$Cl_2$ = 75/5 sccm |
| Pressure | 6.5 Pa |
| RF power | 250 W |

[Step-130]

Then, preferably, an adhesive layer (not shown) made of titanium oxide is formed on the insulation layer 16. Then, a first electrode material layer made of Ir for constituting the first electrode (lower electrode) 21 is formed on the adhesive layer, for example, by a sputtering method, and the first electrode material layer and the adhesive layer are patterned by photolithography and a dry etching method, whereby the first electrode 21 can be formed. In steps to follow, desirably, an adhesive layer is formed on an insulating interlayer before the formation of the first electrode material layer.

[Step-140]

Then, a ferroelectric thin film made of a Bi-containing layer perovskite-type ferroelectric material (specifically, for example, $Bi_2SrTa_2O_9$ having a crystallization temperature of 750° C.) is formed on the entire surface, for example, by a MOCVD method, followed by drying in air at 250° C. and then heat treatment in an oxygen atmosphere at 750° C. for 1 hour, to promote crystallization.

[Step-150]

Then, an $IrO_{2-x}$ layer and a Pt layer are consecutively formed on the entire surface by a sputtering method, and the Pt layer, the $IrO_{2-x}$ layer and the $Bi_2SrTa_2O_9$ layer are consecutively patterned by photolithography and a dry etching method, to form the second electrode 23 and the ferroelectric layer 22. When the etching damages the ferroelectric layer 22, it is sufficient to carry out heat treatment at a temperature necessary for recovery from the damage.

[Step-160]

The above step is followed by;

formation and flattening of an insulating interlayer 26, formation of an opening portion 27 and formation of a contact hole 28, formation of the first electrode 31, the ferroelectric 32 made of $Bi_2Sr(Ta_{1.5}Nb_{0.5})O_9$ having a crystallization temperature of 700° C., and formation of the second electrode 33, and formation of an insulation film 36 A.

For promotion of crystallization, the ferroelectric 32 made of $Bi_2Sr(Ta_{1.5}Nb_{0.5})O_9$ may be heat-treated in an oxygen atmosphere at 700° C. for 1 hour.

Each second electrode is not necessarily required to work as a plate line. In such a case, after completion of the insulation film 36A, the second electrode 23 and the second electrode 33 are connected through a contact hole (via hole), and a plate line being connected to the contact hole is also formed on the insulation film 36A.

The following Table 4 shows a condition of forming the ferroelectric thin film made, for example, of $Bi_2SrTa_2O_9$. In Table 4, "thd" stands for tetramethylheptandione. Further, source materials shown in Table 4 are in the form of a solution thereof in a solvent containing tetrahydrofuran (THF) as a main component.

TABLE 4

| Formation by MOCVD method | |
|---|---|
| Source material | $Sr(thd)_2$-tetraglyme |
|  | $Bi(C_6H_5)_3$ |
|  | $Ta(O-iC_3H_7)_4(thd)$ |
| Forming temperature | 400–700° C. |
| Process gas | $Ar/O_2 = 1000/1000$ cm$^3$ |
| Forming rate | 5–20 nm/minute |

Alternatively, a ferroelectric thin film made of $Bi_2SrTa_2O_9$ may be formed on the entire surface by a pulse laser abrasion method, a sol-gel method or an RF sputtering method. Forming conditions in these cases will be shown below. When a thick ferroelectric thin film is formed by a sol-gel method, spin coating and drying, or spin coating and calcining (or annealing) are repeated as required.

TABLE 5

| Formation by pulse laser abrasion method | |
|---|---|
| Target | $Bi_2SrTa_2O_9$ |
| Laser used | KrF excimer laser |
|  | (wavelength 248 nm, pulse |
|  | width 25 n second, 5 Hz) |
| Forming temperature | 400–800° C. |
| Oxygen concentration | 3 Pa |

TABLE 6

| Formation by sol-gel method | |
|---|---|
| Material | $Bi(CH_3(CH_2)_3CH(C_2H_5)COO)_3$ |
|  | [bismuth-diethylhexanoic acid, |
|  | $Bi(OOc)_3$] |
|  | $Sr(CH_3(CH_2)_3CH(C_2H_5)COO)_2$ |
|  | [strontium-diethylhexanoic acid, |
|  | $Sr(OOc)_2$] |
|  | $Ta(OEt)_5$ [tantalum ethoxide] |
| Spin coating condition | 3000 rpm × 20 seconds |
| Drying | 250° C. × 7 minutes |
| Calcining | 700–800° C. × 1 hour (RTA treatment is added as required) |

TABLE 7

| Formation by RF sputtering method | |
|---|---|
| Target | $Bi_2SrTa_2O_9$ ceramic target |
| RF power | 1.2 W–2.0 W/target 1 cm$^2$ |
| Ambient pressure | 0.2–1.3 Pa |
| Forming temperature | room temperature - 600° C. |
| Process gas | flow rate of $Ar/O_2 = 2/1–9/1$ |

The following Table 8 shows a condition of formation of PZT or PLZT by a magnetron sputtering method when the ferroelectric layer is constituted of PZT or PLZT. Alternatively, PZT or PLZT may be formed by a reactive sputtering method, an electron beam deposition method, a sol-gel method or an MOCVD method.

TABLE 8

| Target | PZT or PLZT |
|---|---|
| Process gas | $Ar/O_2 = 90$ vol%/10 vol% |
| Pressure | 4 Pa |
| Power | 50 W |
| Forming temperature | 500° C. |

Further, PZT or PLZT may be formed by a pulse laser abrasion method. The following Table 9 shows a forming condition thereof.

TABLE 9

| Target | PZT or PLZT |
|---|---|
| Laser used | KrF excimer laser (wavelength 248 nm, pulse width 25 n seconds, 3 Hz) |
| Output energy | 400 mJ (1.1 J/cm$^2$) |
| Forming temperature | 550–600° C. |
| Oxygen concentration | 40–120 Pa |

EXAMPLE 2

Figure 5:
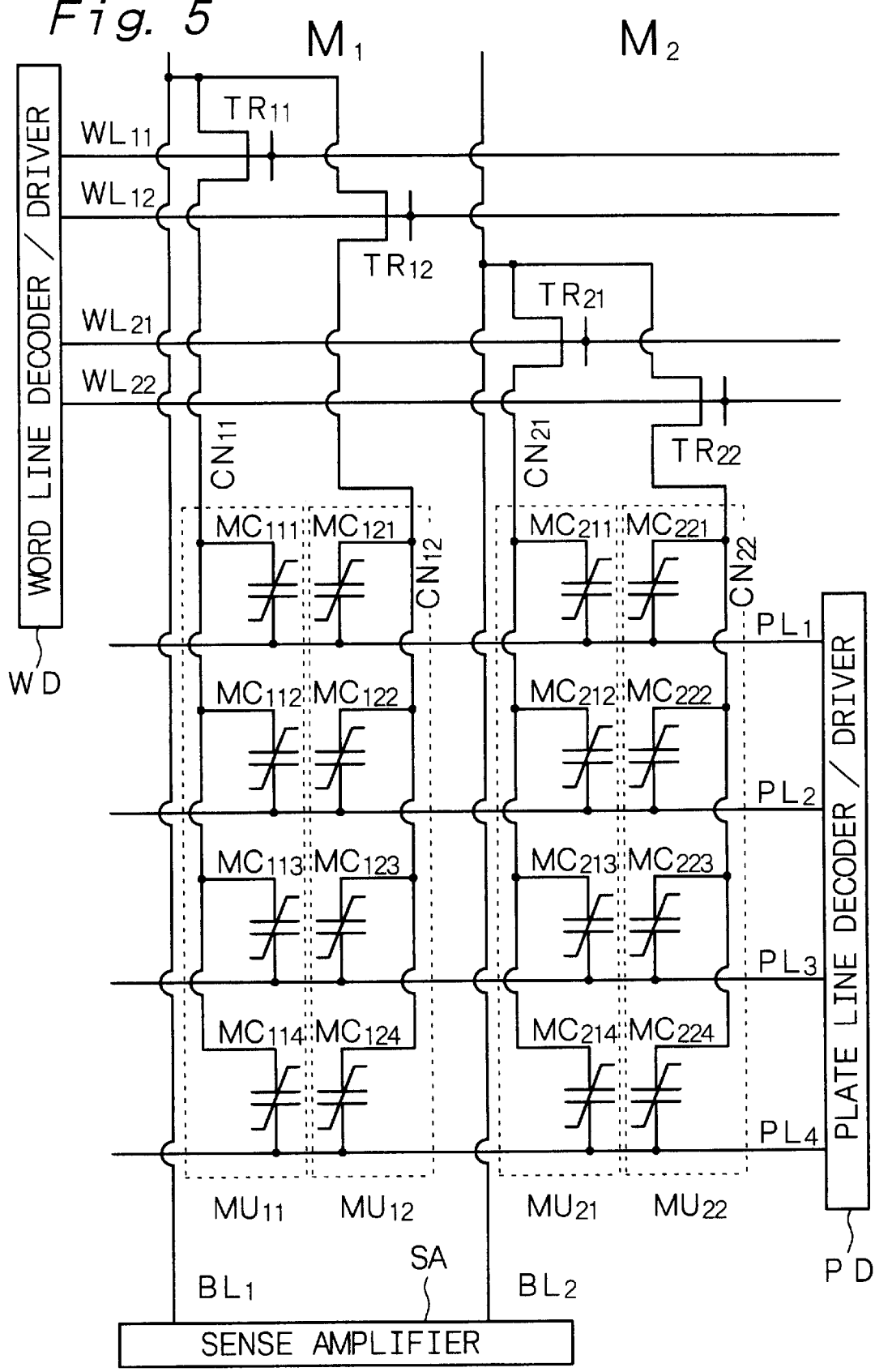
FIG. 5 is a circuit diagram of a ferroelectric-type nonvolatile semiconductor memory in Example 2.
Figure 6:
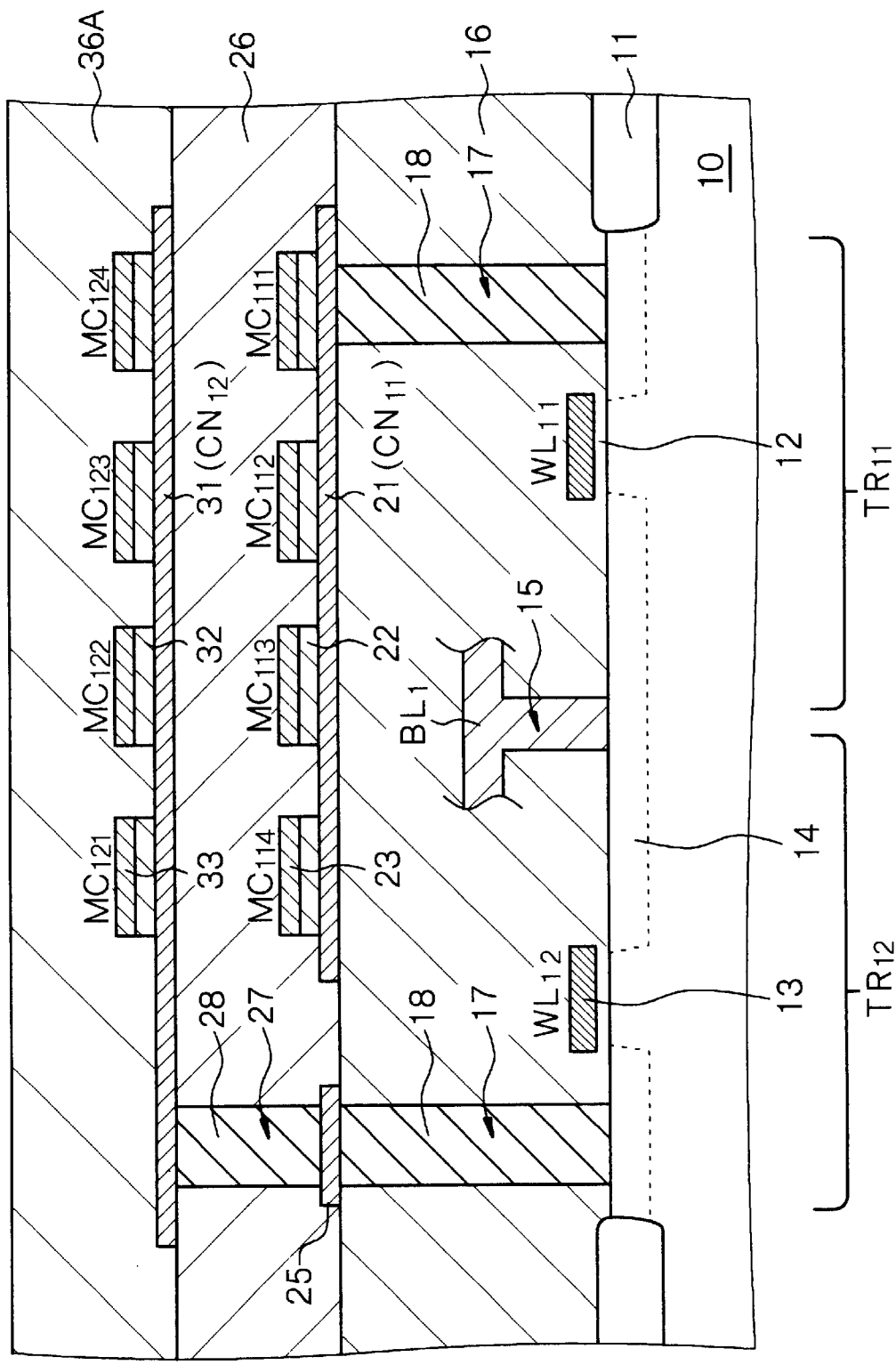
FIG. 6 is a schematic partial cross-sectional view of the ferroelectric-type nonvolatile semiconductor memory in Example 2.

Example 2 is concerned with the nonvolatile memory according to the second aspect of the present invention. FIG. 5 shows a circuit diagram of the nonvolatile memory in Example 2, and FIG. 6 shows a schematic partial cross-sectional view thereof. While FIG. 5 shows two nonvolatile memories $M_1$ and $M_2$, these nonvolatile memories have the same circuits. The following explanation will discuss the nonvolatile memory $M_1$.

The nonvolatile memory $M_1$ comprises a bit line $BL_1$, transistors for selection $TR_{11}$ and $TR_{12}$ made of MOS type FETs in the number of N (provided that $N \geq 2$, and N=2 in Example 2), memory units $MU_{11}$ and $MU_{12}$ in the number of N (provided that N=2 in Example 2) and plate lines. The first memory unit $MU_{11}$ comprises memory cells $MC_{11m}$ (m=1, 2, 3, 4) in the number of M (provided that $M \geq 2$, and M=4 in Example 2). The second memory unit $MU_{12}$ also comprises memory cells $MC_{12m}$ (m=1, 2, 3, 4) in the number of M (M=4). The number of the plate lines is M (4 in Example 2), and the plate lines are indicated by $PL_m$ (m=1, 2, 3, 4). A word line $WL_{11}$ connected to the gate electrode of the first transistor for selection $TR_{11}$ and a word line $WL_{12}$ connected to the gate electrode of the second transistor for selection $TR_{12}$ are connected to a word line decoder/driver WD. Each plate line $PL_m$ is connected to a plate line decoder/driver PD.

Each of the memory cells $MC_{11m}$ constituting the first memory unit $MU_{11}$ comprises a first electrode 21, a ferroelectric layer 22 and a second electrode 23, and each of the memory cells $MC_{12m}$ constituting the second memory unit $MU_{12}$ comprises a first electrode 31, a ferroelectric layer 32 and a second electrode 33. The first electrodes 21 or 31 of the memory cells is in common in the memory unit $MU_{11}$ or $MU_{12}$. The above common first electrode 21 or 31 will be referred to as a common node $CN_{11}$ or $CN_{12}$ for the sake of convenience. The common first electrode 21 (first common node $CN_{11}$) in the first memory unit $MU_{11}$ is connected to the bit line $BL_1$ through the first transistor for selection $TR_{11}$. Further, the common first electrode 31 (second common node $CN_{12}$) in the second memory unit $MU_{12}$ is connected to the bit line $BL_1$ through the second transistor for selection $TR_{12}$. In the n-th memory unit $MU_{1n}$ (provided that n=1, 2 . . . N), the second electrode of the m-th memory cell $MC_{1nm}$ (provided that m=1, 2 . . . M) is connected to the m-th plate line $PL_m$ which is in common in the memory units ($MU_{11}$ and $MU_{12}$). Specifically, in the first memory unit $MU_{11}$, the second electrode 23 of the memory cell $MC_{11m}$ is connected to the plate line $PL_m$. In the second memory unit $MU_{12}$, the second electrode 33 of the memory cell $MC_{12m}$ is connected to the plate line $PL_m$.

In the nonvolatile memory in Example 2, the ferroelectric layer 22 in the memory cells $MC_{11m}$ constituting the first memory unit $MU_{11}$ and the ferroelectric layer 32 in the memory cells $MC_{12m}$ in the second memory unit $MU_{12}$ may be constituted of the same material. Like the nonvolatile memory according to the sixth aspect of the present invention, however, it is preferred to employ a constitution in which the ferroelectric layer 32 constituting the memory cells positioned above has a lower crystallization temperature than the ferroelectric layer 22 constituting the memory cells positioned below. Specifically, the ferroelectric layers 22 and 32 can be constituted of the materials shown in Table 2.

In Example 2, the memory units $MU_{11}$ and $MU_{12}$ are stacked through an insulating interlayer 26. The memory unit $MU_{12}$ is covered with an insulation film 36A. The memory unit $MU_{12}$ is formed above a semiconductor substrate 10 through an insulation layer 16. A device-isolation region 11 is formed in the semiconductor substrate 10. Further, each of the transistors for selection $TR_{11}$ and $TR_{12}$ comprises a gate electrode 13, a gate insulating film 12 and source/drain regions 14. One source/drain region 14 of each of the first transistor for selection $TR_{11}$ and the second transistor for selection $TR_{12}$ is connected to the bit line $BL_1$ through a contact hole 15. The other source/drain region 14 of the first transistor for selection $TR_{11}$ is connected to the first common node $CN_{11}$ through a contact hole 18 made in an opening portion 17 made in the insulation layer 16. The other source/drain region 14 of the second transistor for selection $TR_{12}$ is connected to the second common node $CN_{12}$ through another contact hole 18, a connection portion 25 formed on the insulation layer 16 and a contact hole 28 made in an opening portion 27 made.in the insulating interlayer 26.

The above word line $WL_1$ is extending in the direction perpendicular to the paper surface of FIG. 6. The second electrode 23 is common to memory cells adjacent to each other in the direction perpendicular to the paper surface of FIG. 6 and constituting a memory unit $MU_{21}$ and also works as the plate line $PL_m$. Further, the second electrode 32 is also common to memory cells adjacent to each other in the direction perpendicular to the paper surface of FIG. 6 and constituting a memory unit $MU_{22}$, and also works as the plate line $PL_m$. The plates lines connecting the memory cells are extending in the direction perpendicular to the paper surface of FIG. 6 and are connected through contact holes in region (not shown). The memory cells $MC_{11M}$ and the memory cells $MC_{12M}$ are aligned in the perpendicular direction. Such a structure can serve to decrease the area occupied by the memory units, so that the integration degree can be improved.

The nonvolatile memory $M_2$ shown in FIG. 5 is adjacent to the nonvolatile memory $M_1$ in the direction perpendicular to the paper surface of the schematic partial cross-sectional view of FIG. 6 as described above.

Further, the bit line $BL_1$ is connected to a sense amplifier SA. The bit line $BL_2$ is also connected to the same sense amplifier SA, while the bit line $BL_2$ may be connected to a different sense amplifier SA. The bit lines $BL_1$ and $BL_2$ are also shared by other nonvolatile memories adjacent in the extending direction of the bit lines $BL_1$ and $BL_2$.

And, 1 bit as data is stored in each of the memory cells $MC_{11m}$ and $MC_{12m}$ (m=1, 2, 3, 4). In an actual nonvolatile memory, sets of memory units for storing 8 bits each are arranged in the form of an array as access units.

Figure 7:
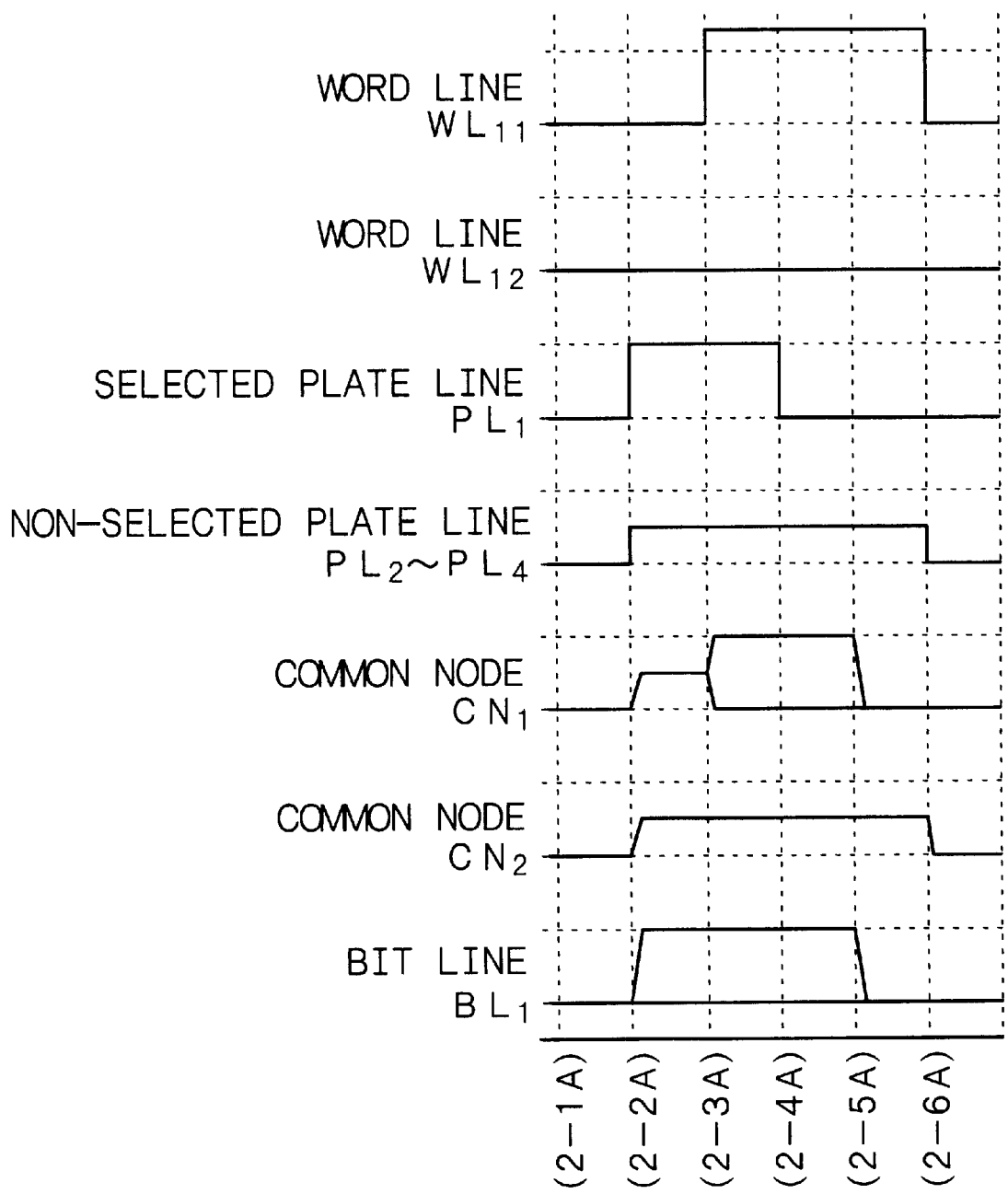
FIG. 7 is a diagram of operation waveforms when data is written into the ferroelectric-type nonvolatile semiconductor memory in Example 2.

One example of the method for writing data into the nonvolatile memory in Example 2 will be explained below. As one example, data is written into the memory cell $MC_{111}$. FIG. 7 shows operation waveforms. In FIG. 7, parenthesized numbers correspond to Nos. of steps to be explained below.

(2-1A) In a standby state, the bit line $BL_1$, the word lines $WL_1$ and $WL_2$ and all of the plate lines $PL_m$ have 0 volt. Further, the common nodes $CN_{11}$ and $CN_{12}$ have 0 volt and are in a floating state.

(2-2A) When writing of data is started, the potential of the selected plate line $PL_1$ is brought into $V_{CC}$, and the potential of the non-selected plate lines $PL_k$ (k=2, 3, 4) is brought into $(1/2)V_{CC}$. As a result, the potential of the common nodes $CN_{11}$ and $CN_{12}$ in a floating state increases near to approximately $(1/2)V_{CC}$ due to coupling of the plate line $PL_M$. When data "1" is written into the selected memory cell $MC_{111}$, the potential of the bit line $BL_1$ is brought into $V_{CC}$, and when data "0" is written, the potential of the bit line $BL_1$ is brought into 0 volt.

(2-3A) Then, the first transistor for selection $TR_{11}$ is brought into an ON-state. As a result, when data "1" is written into the selected memory cell $MC_{111}$, the potential of the first common node $CN_{11}$ comes to be $V_{CC}$, and when data "0" is written, it comes to be 0 volt. Since the selected plate line $PL_1$ is in a state where $V_{CC}$ is applied thereto, data "0" is written into the selected memory cell $MC_{111}$ when the first common node $CN_{11}$ has a potential of 0 volt. On the other hand, no data is written into the selected memory cell $MC_{111}$ when the common node $CN_{11}$ has a potential of $V_{CC}$. Since the potential of the second common node $CN_{12}$ in a floating state is kept around $(1/2)V_{CC}$, no disturbance takes place in the non-selected memory cell $MC_{121}$.

(2-4A) Then, the potential of the selected plate line $PL_1$ is brought into 0 volt. When the first common nodes $CN_{11}$ has a potential of $V_{CC}$, data "1" is written into the selected memory cell $MC_{111}$. When data "0" is already written into the selected memory cell $MC_{111}$, no change takes place in the selected memory cell $MC_{111}$.

(2-5A) Then, 0 volt is applied to the bit line $BL_1$.

(2-6A) Further, the non-selected plate line $PL_k$ is brought into 0 volt, and the first transistor for selection $TR_{11}$ is brought into an OFF-state.

When data is written into other memory cells $MC_{11m}$ (m=2, 3, 4) and $MC_{12m}$ (m=1, 2, 3, 4 ), a similar operation is repeated. In the above writing operation, a disturbance of $(\pm 1/2)V_{CC}$ takes place in the non-selected memory cells $MC_{11K}$ and $MC_{12K}$, and the destruction of the data in the non-selected memory cells $MC_{11K}$ and $MC_{12K}$ can be reliably prevented by properly setting the value of $V_{CC}$.

Figure 8:
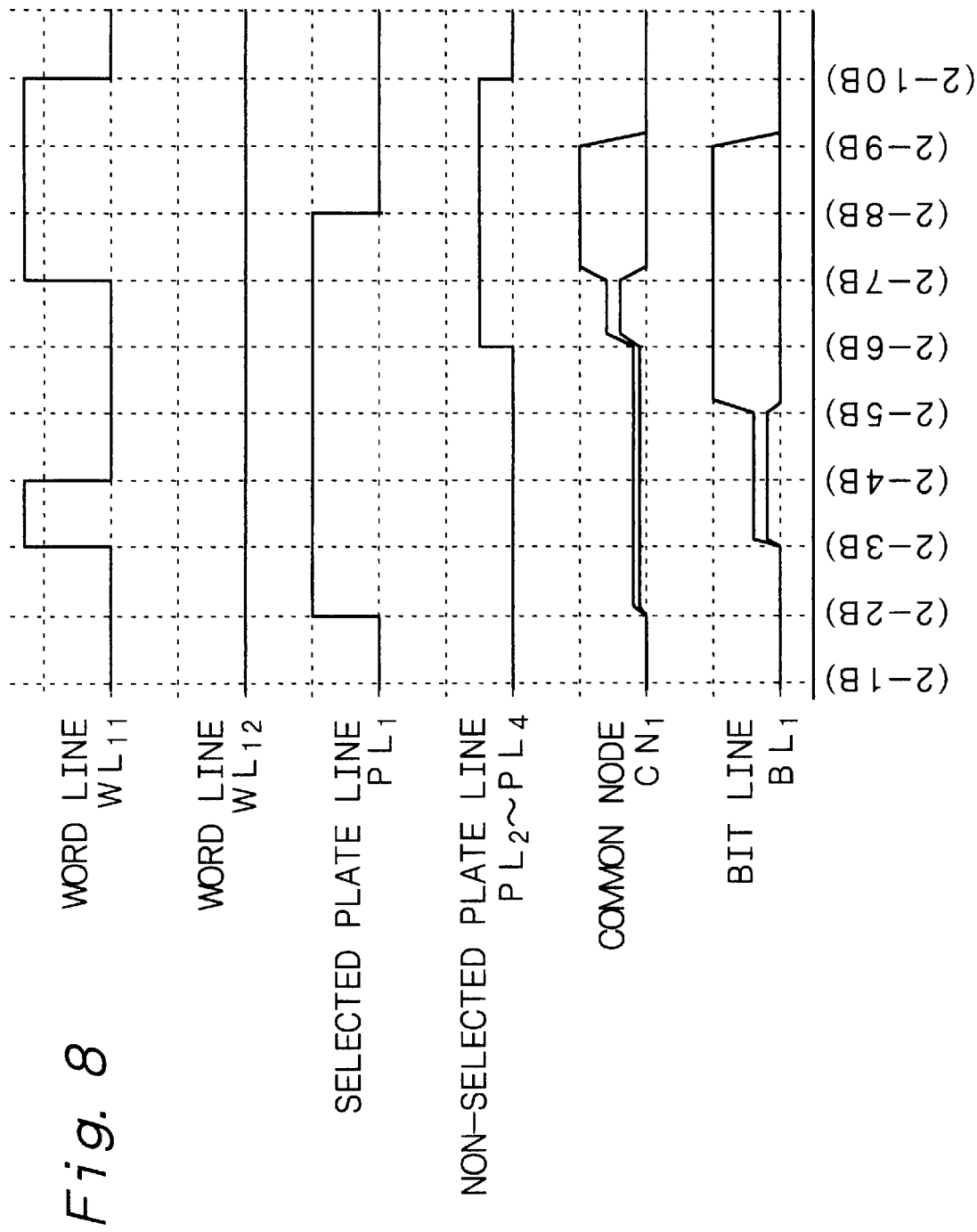
FIG. 8 is a diagram of operation waveforms when data is read out from,. and re-written into, the ferroelectric-type nonvolatile semiconductor memory in Example 2.

The operation of reading out data from, and re-writing data into, the nonvolatile memory in Example 2 will be explained below. As an example, data is read out from the memory cell $MC_{111}$ connected to the plate line $PL_1$, and data is re-written. FIG. 8 shows waveforms.

(2-1B) In a standby state, the bit line $BL_1$, the word lines $WL_1$ and $WL_2$ and all of the plate lines $PL_m$ have 0 volt. Further, the common nodes $CN_{11}$ and $CN_{12}$ also have 0 volt and are in a floating state.

(2-2B) When data is read out, $V_{CC}$ is applied to the selected plate line $PL_1$. When data "1" is already stored in the selected memory cell $MC_{111}$ in this case, polarization inversion takes place in the ferroelectric layer, an accumulated charge increases in amount and the potential of the first common nodes $CN_{11}$ increases. When data "0" is already stored in the selected memory cell $MC_{111}$, no polarization inversion takes place in the ferroelectric layer, and the potential of the first common nodes $CN_{11}$ increases little. That is, since the first common node $CN_{11}$ is coupled with a plurality of the non-selected plate lines $PL_k$ through the ferroelectric layers of the non-selected memory cells, the potential of the first common node $CN_{11}$ is maintained at a level relatively close to 0 volt. In the above manner, a change takes place in the potential of the first common node $CN_{11}$ depending upon the data stored in the selected memory cell $MC_{111}$, so that the ferroelectric layer of the selected memory cell $MC_{111}$ can be provided with an electric field sufficient for polarization inversion.

(2-3B) Then, the bit line $BL_1$ is brought into a floating state, and the first transistor for selection $TR_{11}$ is brought into an ON-state, whereby the potential caused in the common first electrode (first common node $CN_{11}$) on the basis of the data stored in the selected memory cell $MC_{111}$ causes the bit line $BL_1$ to have a potential.

(2-4B) Then, the first transistor for selection $TR_{11}$ is brought into an OFF-state. And, the potential of the bit line $BL_1$ is latched with the sense amplifier SA, the sense amplifier SA is activated to amplify the data, and the operation of reading out the data is completed.

Since the data stored in the selected memory cell is once destroyed by the above operation, the data is re-written.

(2-5B) For this purpose, first, the bit line $BL_1$ is charged and discharged with the sense amplifier SA, and $V_{CC}$ or 0 volt is applied to the bit line $BL_1$.

(2-6B) Then, the potential of the non-selected plate line $PL_k$ (k=2, 3, 4) is brought into $(1/2)V_{CC}$.

(2-7B) Then, the first transistor for selection $TR_{11}$ is brought into an ON-state, whereby the first common node $CN_{11}$ comes to have a potential equal to the potential of the bit line $BL_1$. That is, when the data stored in the selected memory cell $MC_{111}$ is "1", the first common node $CN_{11}$ comes to have a potential of $V_{CC}$, and when the data stored in the selected memory cell $MC_{111}$ is "0", the first common node $CN_{11}$ comes to have a potential of 0 volt. The selected plate line $PL_1$ keeps a potential of $V_{CC}$, so that, when the first common node $CN_{11}$ has a potential of 0 volt, data "0" is re-written into the selected memory cell $MC_{111}$.

(2-8B) Then, the potential of the selected plate line $PL_1$ is brought into 0 volt, whereby data "1" is re-written when the data stored in the selected memory cell $MC_{111}$ is "1", since the first common node $CN_{11}$ has a potential of $V_{CC}$. When data "0" is already re-written into the selected memory cell $MC_{111}$, no change takes place in the selected memory cell $MC_{111}$.

(2-9B) Then, the bit line $BL_1$ is brought into 0 volt.

(2-10B) Finally, the non-selected plate line $PL_k$ is brought into 0 volt, and the first transistor for selection $TR_{11}$ is brought into an OFF-state.

When data is read out from, and re-written into, other memory cells $MC_{11m}$ (m=2, 3, 4) and $MC_{12m}$ (m=1, 2, 3, 4), the above procedures are repeated.

In the nonvolatile memory in Example 2, when the word line $WL_{11}$ or the word line $WL_{12}$ is selected, the memory unit $MU_{11}$ or the memory unit $MU_{12}$ is accessed, and a potential corresponding to the stored data appears in the bit line $BL_1$ alone. At this stage, the bit line $BL_2$ connected to the same sense amplifier SA may be provided with a reference potential at an intermediate level between the potential for reading out data "1" and the potential for reading out data "0". When the word line $WL_{21}$ or the word line $WL_{22}$ is selected, the memory unit $MU_{21}$ or the memory unit $MU_{22}$ is accessed, and a potential corresponding to the stored data appears in the bit line $BL_2$ alone. At this stage, the bit line $BL_1$ connected to the same sense amplifier SA may be provided with a reference potential at an intermediate level between the potential for reading out data "1" and the potential for reading out data "0".

In the nonvolatile memory in Example 2, the signal amount (potential difference) comes to be about a half as compared with Example 5 to be described later, and the operation margin decreases due to fluctuation of the reference potential. However, the integration. degree of the nonvolatile memory is almost doubled.

In the above case, a disturbance takes place in the non-accessed memory cells sharing the plate line $PL_m$, so that it is desirable to access the four memory units $MU_{11}$, $MU_{12}$, $MU_{21}$ and $MU_{22}$ together and continuously. That is, when the word line $WL_{11}$ is accessed, all of the memory cells $MC_{11m}$ in the common node $CN_{11}$ are consecutively accessed and then the word line $WL_{12}$ is accessed. Further, the word line $WL_{21}$ and word line $WL_{22}$ are similarly continuously accessed, whereby data is read out from, and re-written into, all of memory cells $MC_{11m}$, $MC_{12m}$, $MC_{21m}$ and $MC_{22m}$ in the common nodes $CN_{11}$, $CN_{12}$, $CN_{21}$ and $CN_{22}$, to restore the data from deterioration caused by a disturbance.

The marginal dimensions in the constitution of a memory array in Example 2 are defined by the pitch if the word line $WL_{11}$, $WL_{12}$, $WL_{21}$, and $WL_{22}$ or the late line $PL_m$ and a pitch of the bit line $BL_1$ and $BL_2$, and 2 bits are stored in a region surrounded by one plate line and one bit line, so that the marginal dimensions are $2F^2$.

In the nonvolatile memory in Example 2, a row-address is selected through a two-dimensional matrix of the four word lines and the four plate lines. That is, 16 bits in the row direction can be accessed through a combination of the four word lines and the four plate lines, and the number of drivers required for a row-address selection can be 0.5 per address. As compared with a conventional memory cell structure, the number of driving signal lines can be remarkably decreased, and the number of peripheral circuits can be remarkably decreased.

EXAMPLE 3

Figure 9:
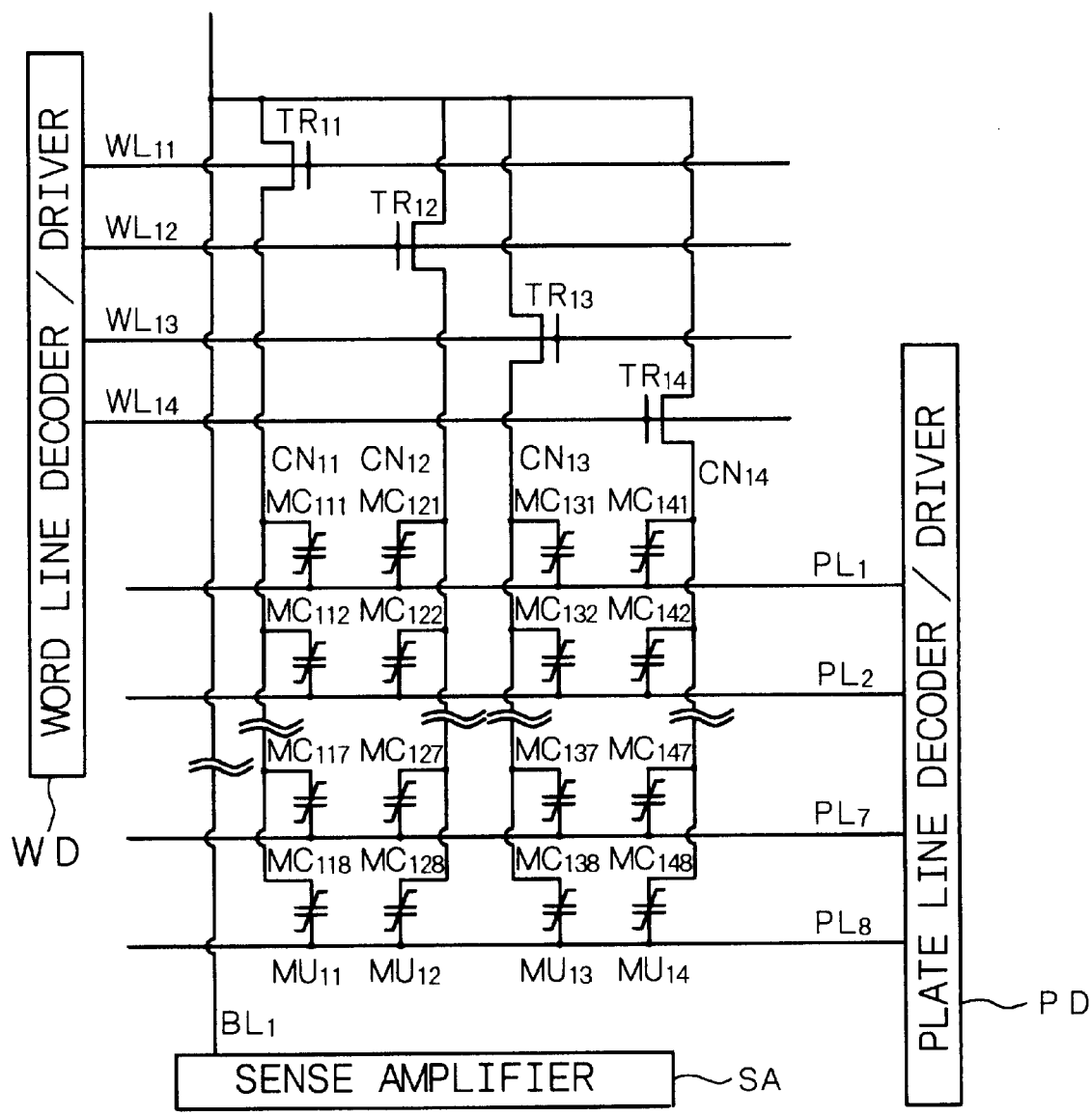
FIG. 9 is a circuit diagram of a ferroelectric-type nonvolatile semiconductor memory in Example 3.
Figure 10:
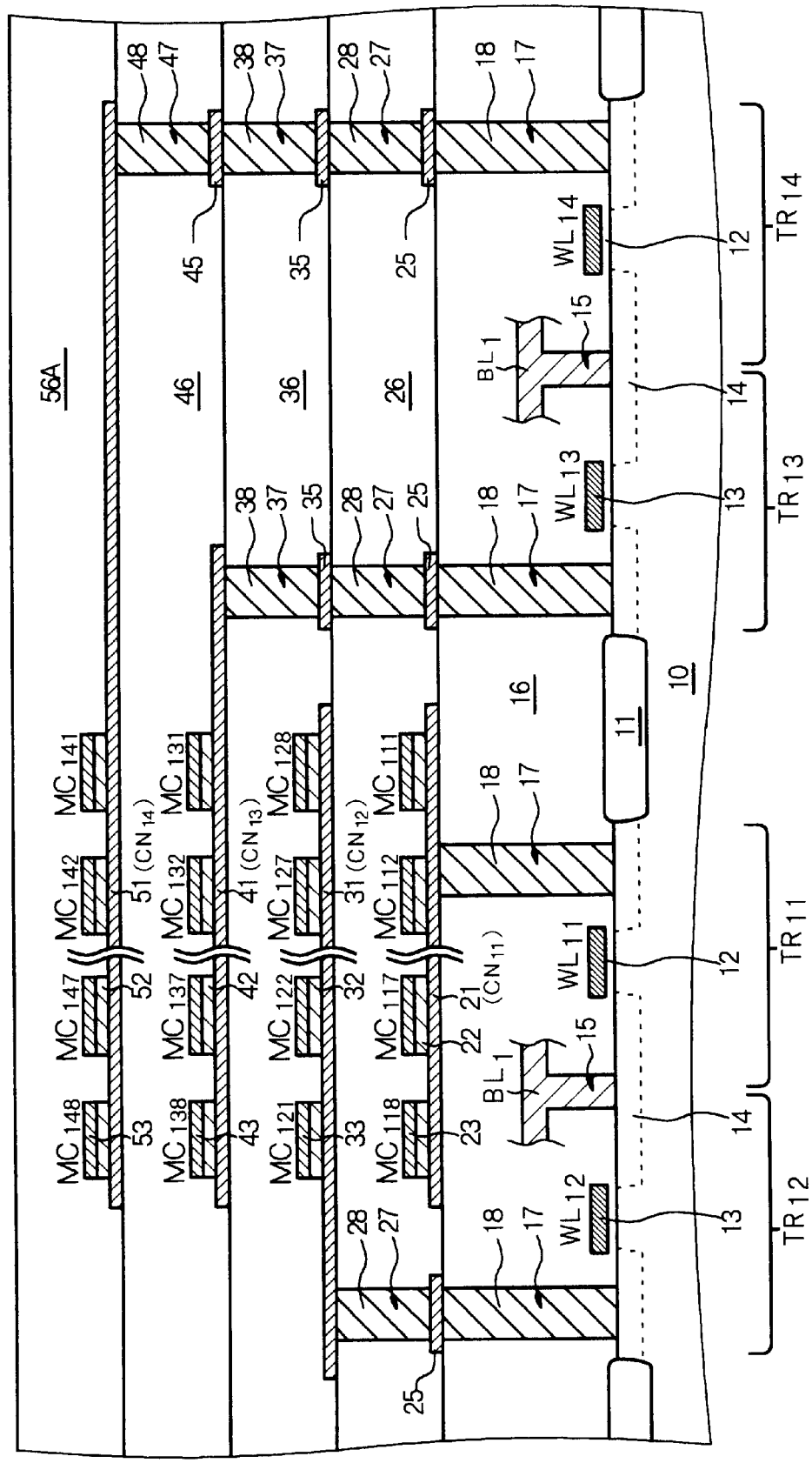
FIG. 10 is a schematic partial cross-sectional view of the ferroelectric-type nonvolatile semiconductor memory in Example 3.

Example 3 is directed to a variant of the nonvolatile memory in Example 2. FIG. 9 shows a circuit diagram thereof, and FIG. 10 shows a schematic partial cross-sectional view thereof. In the nonvolatile memory in Example 3, the number N of memory units is four. That is, the nonvolatile memory comprises a bit line $BL_1$, 4 transistors for selection $TR_{1N}$, 4 memory units $MU_{1N}$ each of which comprises 8 memory cells $MC_{1NM}$ and 8 plate lines $PL_M$.

Each memory cell $MC_{1nm}$ comprises a first electrode 21, 31, 41 or 51, a ferroelectric layer 22, 32, 42 or 52 and a second electrode 23, 33, 43 or 53. In each memory unit $MU_{1n}$, the first electrodes of the memory cells $MC_{1nm}$ is in common. That is, they constitute a common node $CN_{1n}$.

The common first electrode (common node $CN_{1n}$) in the memory unit $MU_{1n}$ is connected to the bit line $BL_1$ through the transistor for selection $TR_{1n}$. In the memory unit $MU_{1n}$, further, the second electrode of the memory cell $MC_{1nm}$ is connected to a plate line $PL_m$ common in the memory units ($MU_{11}$, $MU_{12}$, $MU_{13}$ and $MU_{14}$).

In Example 3, the four memory units $MU_{11}$, $MU_{12}$, $MU_{13}$ and $MU_{14}$ are stacked through an insulating interlayer 26, 36 or 46. The memory unit $MU_{14}$ is covered with an insulation film 56A. The memory unit $MU_{11}$ is formed above a semiconductor substrate 10 through an insulation layer 16. A device-isolation region 11 is formed in the semiconductor substrate 10. Each of the transistors for selection $TR_{11}$, $TR_{12}$, $TR_{13}$ and $TR_{14}$ constituted of MOS type FETs comprises a gate electrode 13, a gate insulating film 12 and source/drain regions 14. One source/drain region 14 of each of the first transistor for selection $TR_{11}$, the second transistor for selection $TR_{12}$, the third transistor for selection $TR_{13}$ and the fourth transistor for selection $TR_{14}$ is connected to the bit line $BL_1$ through a contact hole 15. The other source/drain region 14 of the first transistor for selection $TR_{11}$ is connected to the first common node $CN_{11}$ through a contact hole 18 made in an opening portion 17 made in the insulation layer 16. Further, the other source/drain region 14 of the second transistor for selection $TR_{12}$ is connected to the second common node $CN_{12}$ through another contact hole 18, a connection portion 25 formed on the insulation layer 16 and a contact hole 28 made in an opening portion 27 made in the insulating interlayer 26. The other source/drain region 14 of the third transistor for selection $TR_{13}$ is connected to the third common node $CN_{13}$ through another contact hole 18, another connection portion 25, another contact hole 28, a connection portion 35 formed on the insulating interlayer 26 and a contact hole 38 made in an opening portion 37 made in the insulating interlayer 36. Further, the other source/drain region 14 of the fourth transistor for selection $TR_{14}$ is connected to the fourth common node $CN_{14}$ through another contact hole 18, another connection portion 25, another contact hole 28, another connection portion 35, another contact hole 38, a connection portion 45 formed on the insulating interlayer 36 and a contact hole 48 made in an opening portion 47 made in the insulating interlayer 46.

The word lines $WL_{11}$, $WL_{12}$, $WL_{13}$ and $WL_{14}$ are extending in the direction perpendicular to the paper surface of FIG. 10. The second electrode 23 is common to memory cells $MC_{21m}$ adjacent to each other in the direction perpendicular to the paper surface of FIG. 10 and also works as a plate line $PL_m$. Further, the second electrode 33, 43 or 53 is also common to memory cells $M_{22m}$, $MC_{23m}$ or $MC_{24m}$ adjacent to each other in the direction perpendicular to the paper surface of FIG. 10 and also works as a plate line $PL_m$. Each plate line $PL_m$ connecting memory cells $MC_{11m}$, $MC_{12m}$, $MC_{13m}$, $MC_{14m}$, $MC_{21m}$, $MC_{22m}$, $MC_{23m}$ or $MC_{24m}$ is extending in the direction perpendicular to the paper surface of FIG. 10, and one is connected to another in a region (not shown) through contact holes. Further, the memory units $MU_{1n}$ are aligned in the perpendicular direction. In such a structure, the area occupied by the memory cells can be further decreased, and the integration degree can be further improved.

The nonvolatile memory in Example 3 can be operated substantially in the same manner as in the operation of the nonvolatile memory in Example 2, so that the detailed explanation thereof is omitted. In each memory cell $MC_{1nm}$ (n=1–4, m=1–8), 1 bit is stored as data. In an actual nonvolatile memory, sets of memory units for storing 32 bits each are arranged in the form an array as access units. In the above array structure, the minimum pitch of the plate lines $PL_m$ defines the dimension in the row direction, and 4 bits are stored in a region surrounded by one plate line and two bit lines, so that the marginal cell area in the array constitution is $2F^2$. Further, it is constituted that a row address is selected through a two-dimensional matrix of the four word lines $WL_{11}$ to $WL_{14}$ and the eight plate lines $PL_m$ (m=1–8). That is, 32 bits in the row direction can be accessed through a combination of the four word lines and the eight plate lines, and the number of drivers required for a row-address selection is as small as 0.375 per address. As compared with a conventional cell selection, therefore, the number of driving signal lines can be decreased, and the number of peripheral circuits can be remarkably decreased.

In the nonvolatile memory in Example 3, the ferroelectric layer 22 in the memory cells $MC_{11m}$ constituting the first memory unit $MU_{11}$, the ferroelectric layer 32 in the memory cells $MC_{12m}$ constituting the second memory unit $MU_{12}$, the ferroelectric layer 42 in the memory cells $MC_{13m}$ constituting the third memory unit $MU_{13}$ and the ferroelectric layer 52 in the memory cells $MC_{14m}$ constituting the fourth memory unit $MU_{14}$ may be constituted of the same material. Like the nonvolatile memory according to the sixth aspect of the present invention, however, it is preferred to employ a constitution in which the ferroelectric layer constituting the memory cells existing in an upper position has a lower crystallization temperature than the ferroelectric layer constituting the memory cells existing in a lower position. Specifically, the ferroelectric layers 22, 32, 42 and 52 can be constituted of materials shown in the following Table 10 or 11.

TABLE 10

|  | Material | Crystallization temperature |
| --- | --- | --- |
| Ferroelectric layer 52 | $Bi_2Sr(Ta_{1.5}Nb_{0.5})O_9$ | 700° C. |
| Ferroelectric layer 42 | $Bi_2Sr(Ta_{1.65}Nb_{0.35})O_9$ | 715° C. |
| Ferroelectric layer 32 | $Bi_2Sr(Ta_{1.8}Nb_{0.2})O_9$ | 730° C. |
| Ferroelectric layer 22 | $Bi_2SrTa_2O_9$ | 750° C. |

TABLE 11

|  | Material | Crystallization temperature |
| --- | --- | --- |
| Ferroelectric layer 52 | $PBTiO_3$ | 600° C. |
| Ferroelectric layer 42 | $Pb(Zr_{0.48}Ti_{0.52})O_3$ | 650° C. |
| Ferroelectric layer 32 | $Bi_2Sr(Ta_{1.5}Nb_{0.5})O_9$ | 700° C. |
| Ferroelectric layer 22 | $Bi_2SrTa_2O_9$ | 750° C. |

For example, when $Bi_2Sr(Ta_{1.8}Nb_{0.2})O_9$ is used as a material for constituting the ferroelectric thin film, the heat treatment for promoting crystallization is carried out in an oxygen atmosphere at 730° C. for 1 hour, and when $Bi_2Sr(Ta_{1.5}Nb_{0.5})O_9$ is used, the heat treatment for promoting crystallization is carried out in an oxygen atmosphere at 700° C. for 1 hour. For example, when $Bi_2Sr(Ta_{1.65}Nb_{0.35})O_9$ is used as a material for constituting the ferroelectric thin film, the heat treatment for promoting crystallization is carried out in an oxygen atmosphere at 715° C. for 1 hour, when $Pb(Zr_{0.48}Ti_{0.52})O_3$ is used, the heat treatment for promoting crystallization is carried out in an oxygen atmosphere at 650° C. for 1 hour, and when $PbTiO_3$ is used, the heat treatment for promoting crystallization is carried out in an oxygen atmosphere at 600° C. for 1 hour.

EXAMPLE 4

Figure 11:
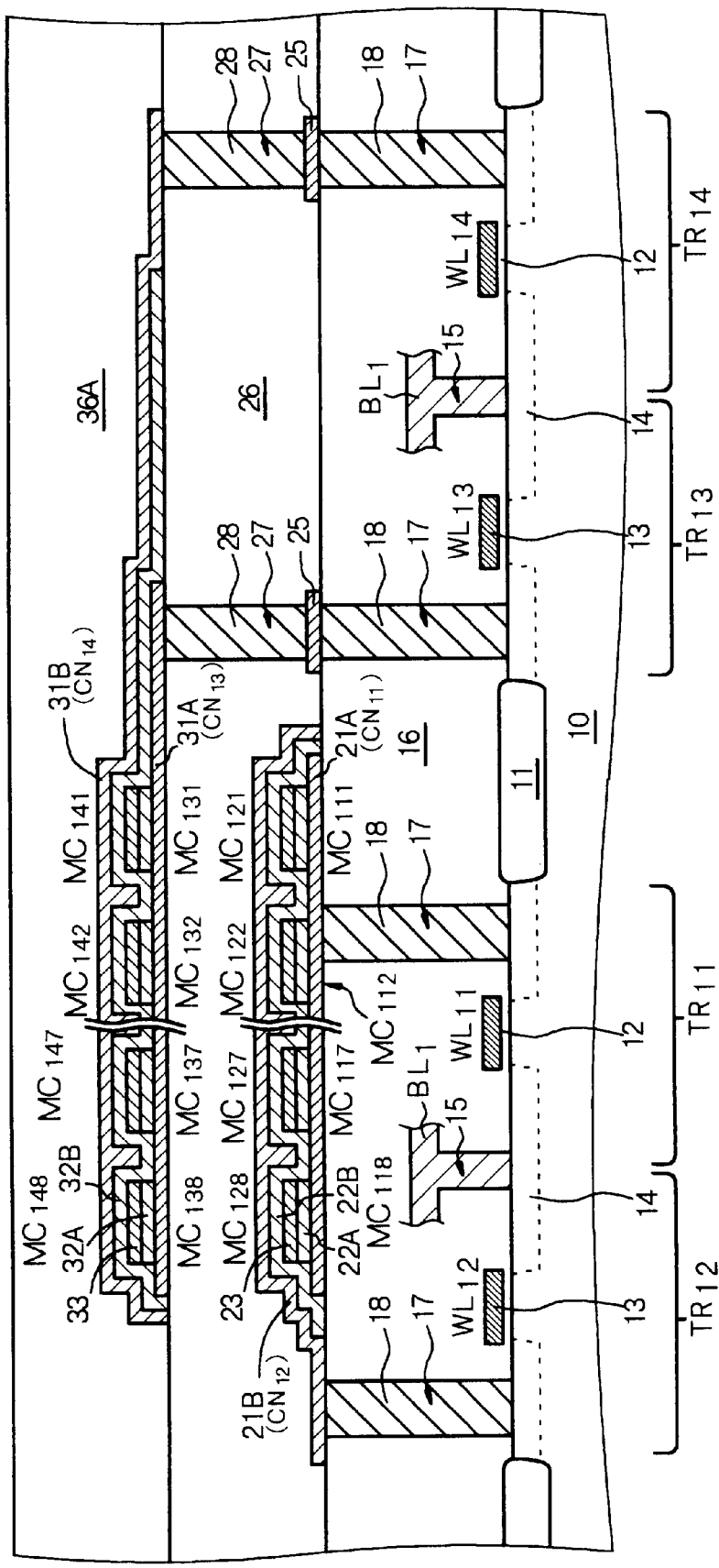
FIG. 11 is a schematic partial cross-sectional view of a ferroelectric-type nonvolatile semiconductor memory in Example 4.

Example 4 is concerned with the nonvolatile memory according to the third aspect of the present invention. FIG. 11 shows a schematic partial cross-sectional view of the nonvolatile memory in Example 4. The nonvolatile memory in Example 4 has a circuit diagram similar to that shown in FIG. 9.

The nonvolatile memory comprises a bit line $BL_1$ connected to a sense amplifier SA, transistors for selection ($TR_{11}$, $TR_{12}$, $TR_{13}$ and $TR_{14}$) in the number of 2N (provided that $N \geq 1$, and N=2 in Example 4), each transistor being constituted of a MOS type FET, memory units ($MU_{11}$, $MU_{12}$, $MU_{13}$ and $MU_{14}$) in the number of 2N, and plate lines. The first memory unit $MU_{11}$ comprises memory cells $MC_{11m}$ (m=1, 2 ... 8) in the number of M (provided that M≧2, and M=8 in Example 4). The second memory unit $MU_{12}$ also comprises memory cells $MC_{12m}$ (m=1, 2 ... 8) in the number of M (M=8). Further, the third memory unit $MU_{13}$ also comprises memory cells $MC_{13m}$ (m=1, 2 ... 8) in the number of M (M=8), and the fourth memory unit $MU_{14}$ also comprises memory cells $MC_{14m}$ (m=1, 2 ... 8) in the number of M (M=8). The number of the plate lines is M (8 in Example 4), and the plate lines are expressed by $PL_m$ (m=1, 2 ... 8). A word line $WL_{1n}$ connected to the gate electrode of the transistor for selection $TR_{1n}$ is connected to a word line decoder/driver WD. Each plate line $PL_m$ is connected to a plate line decoder/driver PD.

Each memory cell $MC_{11m}$ constituting the first memory unit $MU_{11}$ comprises a first electrode 21A, a ferroelectric layer 22A and a second electrode 23, each memory cell $MC_{12m}$ constituting the second memory unit $MU_{12}$ comprises a first electrode 21B, a ferroelectric layer 22B and the second electrode 23, each memory cell $MC_{13m}$ constituting the third memory unit $MU_{13}$ comprises a first electrode 31A, a ferroelectric layer 32A and a second electrode 33, and each memory cell $MC_{14m}$ constituting the fourth memory unit $MU_{14}$ comprises a first electrode 31B, a ferroelectric layer 32B and the second electrode 33. In each memory unit $MU_{11}$, $MU_{12}$, $MU_{13}$ or $MU_{14}$, the first electrodes 21A, 21B, 31A or 31B of the memory cells are in common. The common first electrodes 21A, 21B, 31A and 31B will be referred to as common nodes $CN_{11}$, $CN_{12}$, $CN_{13}$ and $CN_{14}$.

The above common first electrode 21A (first common node $CN_{11}$) in the first memory unit $MU_{11}$ is connected to the bit line $BL_1$ through the first transistor for selection $TR_{11}$. The above common first electrode 21B (second common node $CN_{12}$) in the second memory unit $MU_{12}$ is connected to the bit line $BL_1$ through the second transistor for selection $TR_{12}$. Further, the above common first electrode 31A (third common node $CN_{13}$) in the third memory unit $MU_{13}$ is connected to the bit line $BL_1$ through the third transistor for selection $TR_{13}$. The above common first electrode 31B (fourth common node $CN_{14}$) in the fourth memory unit $MU_{14}$ is connected to the bit line $BL_1$ through the fourth transistor for selection $TR_{14}$.

Further, the memory cell $MC_{11m}$ constituting the first memory unit $MU_{11}$ and the memory cell $MC_{12m}$ constituting the second memory unit $MU_{12}$ share the second electrode 23, and the so-shared m-th second electrode 23 is connected to the plate line $PL_m$. Further, the memory cell $MC_{13m}$ constituting the third memory unit $MU_{13}$ and the memory cell $MC_{14m}$ constituting the fourth memory unit $MU_{14}$ share the second electrode 33, and the so-shared m-th second electrode 33 is connected to the plate line $PL_m$.

In the nonvolatile memory in Example 4, the memory units $MU_{11}$ and $MU_{12}$ and the memory units $MU_{13}$ and $MU_{14}$ are stacked through an insulating interlayer 26. The memory unit $MU_{14}$ is covered with an insulation film 36A. Further, the memory unit $MU_{11}$ is formed above a semiconductor substrate 10 through an insulation layer 16. A device-isolation region 11 is formed in the semiconductor substrate 10. Each of the transistors for selection $TR_{11}$, $TR_{12}$, $TR_{13}$ and $TR_{14}$ comprises a gate electrode 13, a gate insulating film 12 and source/drain regions 14. And, one source/drain region 14 of each of the first transistor for selection $TR_{11}$, the second transistor for selection $TR_{12}$, the third transistor for selection $TR_{13}$ and the fourth transistor for selection $TR_{14}$ is connected to the bit line $BL_1$ through a contact hole 15.

Further, the other source/drain region 14 of the first transistor for selection $TR_{11}$ is connected to the first common node $CN_{11}$ through a contact hole 18 made in an opening portion 17 made in the insulation layer 16. Further, the other source/drain region 14 of the second transistor for selection $TR_{12}$ is connected to the first common node $CN_{12}$ through another contact hole 18. Further, the other source/drain region of the third transistor for selection $TR_{13}$ is connected to the third common node $CN_{13}$ through another contact hole 18, a connection portion 25 formed on the insulation layer 16 and a contact hole 28 made in an opening portion 27 made in the insulating interlayer 26. Further, the other source/drain region 14 of the fourth transistor for selection $TR_{14}$ is connected to the fourth common node $CN_{14}$ through another contact hole 18, another connection portion 25 and another contact hole 28.

The nonvolatile memory in Example 4 can be operated in the same manner as in the operation of the nonvolatile memory in Example 2, so that the detailed explanation thereof is omitted. In each memory cell $MC_{1nm}$ (n=1–4, m=1–8), 1 bit is stored as data. In an actual nonvolatile memory, sets of memory units for storing 32 bits each are arranged in the form an array as access units.

In the nonvolatile memory in Example 4, the ferroelectric layer 22A in the memory cells $MC_{11m}$ constituting the first memory unit $MU_{11}$, the ferroelectric layer 22B in the memory cells $MC_{12m}$ constituting the second memory unit $MU_{12}$, the ferroelectric layer 32A in the memory cells $MC_{13m}$ constituting the third memory unit $MU_{13}$ and the ferroelectric layer 32B in the memory cells $MC_{14m}$ constituting the fourth memory unit $MU_{14}$ may be constituted of the same material. Like the nonvolatile memory according to the sixth aspect of the present invention, however, it is preferred to employ a constitution in which the ferroelectric layer of the memory cells existing in an upper position has a lower crystallization temperature than the ferroelectric layer of the memory cells existing in a lower position. Specifically, the ferroelectric layers 22A and 22B can be constituted of the material for the ferroelectric layer 22 shown in Table 2 and the ferroelectric layers 32A and 32B can be constituted of the material for the ferroelectric layer 32 shown in Table 2.

EXAMPLE 5

Example 5 is directed to a variant of the nonvolatile memory in Example 2. In Example 5, in the two nonvolatile memories memory $M_1$ and $M_2$ adjacent to each other in the extending direction of the plate lines, unlike Example 2, the gate electrode of each of the first transistors for selection $TR_{11}$ and $TR_{21}$ is connected to the word line $WL_1$ and the gate electrode of each of the second transistors for selection $TR_{12}$ and $TR_{22}$ is connected to the word line $WL_2$ as shown in a circuit diagram of FIG. 12. Further, the bit lines line $BL_1$ and $BL_2$ are connected to the sense amplifier SA. The other constitutions are similar to those of the nonvolatile memory in Example 2.

In the thus-constituted nonvolatile memory in Example 5, complementary data is written into a pair of memory cells $MC_{11m}$ and $MC_{21m}$ or a pair of memory cells $MC_{12m}$ and $MC_{22m}$, whereby 1 bit is stored. Further, four transistors for selection $TR_{11}$, $TR_{12}$, $TR_{21}$ and $TR_{22}$ and 16 memory cells $MC_{11m}$, $MC_{21m}$, $MC_{12m}$ and $MC2_{22m}$ constitute one memory unit (access unit), and 8 bits are stored. In an actual nonvolatile memory, sets of memory units for storing 8 bits each are arranged in the form of an array as access units.

Figure 13:
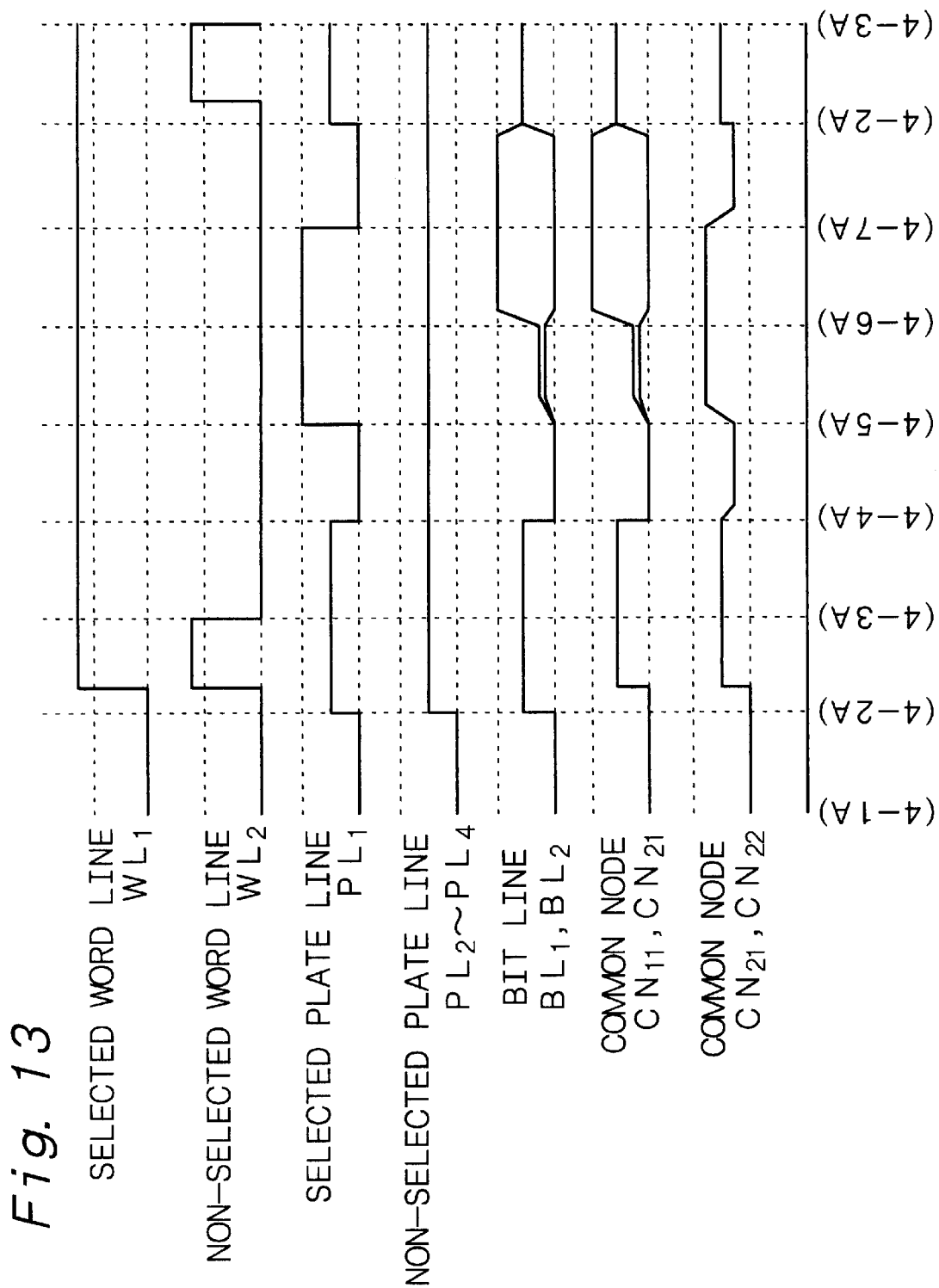
FIG. 13 is a diagram of operation waveforms when data is read out from, and re-written into, the ferroelectric-type nonvolatile semiconductor memory in Example 5.

The method of reading out data from, and re-writing data into, the nonvolatile memory in Example 5 will be explained below. As an example, data is read out from a pair of the memory cells $MC_{111}$ and $MC_{211}$, and data "1" is stored in the memory cell $MC_{111}$ and data "0" is stored in the memory cell $MC_{211}$. FIG. 13 shows waveforms. In FIG. 13, parenthesized numbers correspond to Nos. of steps to be explained below.

(4-1A) In a standby state, all the bit lines, all the word lines and all the plate lines are grounded.

(4-2A) When readout of data is started, first, all the plate lines $PL_m$ (M=1, 2, 3, 4) in a selected memory unit (access unit) are pre-charged to $(1/2)V_{CC}$ ($V_{CC}$ is a power source voltage), and further, the bit lines $BL_1$ and $BL_2$ are pre-charged to $(1/2)V_{CC}$. Then, the word lines $WL_1$ and $WL_2$ are brought to a high level, to bring the transistors for selection $TR_{11}$, $TR_{12}$, $TR_{21}$ and $TR_{22}$ into an ON-state, whereby the common first electrodes (common nodes $CN_{11}$, $CN_{12}$, $CN_{21}$, $CN_{22}$) are connected to the bit lines $BL_1$ and $BL_2$ and the common nodes $CN_{11}$, $CN_{12}$, $CN_{21}$ and $CN_{22}$ come to have a potential of $(1/2)V_{CC}$.

(4-3A) Then, the non-selected word line $WL_2$ is brought to a low level, to bring the transistors for selection $TR_{12}$ and $TR_{22}$ into an OFF-state, whereby the non-selected common nodes $CN_{12}$ and $CN_{22}$ come into a floating state while having a potential of $(1/2)V_{CC}$.

(4-4A) Then, the selected plate line $PL_1$ and the bit lines $BL_1$ and $BL_2$ are discharged through a grounding line (not shown) until they have 0 volt. In this case, the common nodes $CN_{11}$ and $CN_{21}$ connected to the bit lines $BL_1$ and $BL_2$ come to have 0 volt. After completion of discharging of the bit lines $BL_1$ and $BL_2$, the grounding line and the bit lines $BL_1$ and $BL_2$ are electrically disconnected, to bring the bit lines $BL_1$ and $BL_2$ into a floating state.

(4-5A) Then, $V_{CC}$ is applied to the selected plate line $PL_1$, whereby an inversion charge is released from the memory cell $MC_{111}$ storing the data "1". As a result, there is caused a potential difference between the bit lines $BL_1$ and $BL_2$. Then, the sense amplifier SA is activated to read out the potential difference between the bit lines $BL_1$ and $BL_2$ as data.

(4-6A) Then, the bit lines $BL_1$ and $BL_2$ are charged and discharged with the sense amplifier SA, $V_{CC}$ is applied to the bit line $BL_1$, and 0 volt is applied to the bit line $BL_2$. As a result, data "0" is re-written into the memory cell $MC_{211}$.

(4-7A) Then, the selected plate line $PL_1$ is brought into 0 volt, whereby data "1" is re-written into the memory cell $MC_{111}$.

(4-8A) For terminating readout of data, then, the bit lines $BL_1$ and $BL_2$ are discharged until they have 0 volt. After the plate line $PL_m$ (m=1, 2, 3, 4) is discharged until it has 0 volt, the non-selected word line $WL_2$ is again brought to a high level, to bring the transistors for selection $TR_{12}$ and $TR_{22}$ into an ON-state, and all the common nodes $CN_{11}$, $CN_{12}$, $CN_{21}$ and $CN_{22}$ of the memory units (access units) are brought into 0 volt.

When data in a subsequent pair of memory cells is read out, all the plate lines $PL_m$ (m=1, 2, 3, 4) are pre-charged up to $(1/2)V_{CC}$, and the above operations (4-2A) to (4-7A) are repeated.

According to the above sequence, the disturbance exerted on the non-selected memory cells is constantly prevented such that the disturbance is $(1/2)V_{CC}$ or lower.

The potential of the common nodes $CN_{21}$ and $CN_{22}$ which are in a non-selected state and in a floating state varies depending upon a coupling ratio of the selected plate line $PL_1$ and the non-selected plate lines $PL_m$ (m=2, 3, 4) fixed at $(1/2)V_{CC}$, while the coupling capacity on the non-selected plate line side is greater. Therefore, the potential fluctuation of the common nodes $CN_{12}$ and $CN_{22}$ is controlled to be in the range of $(1/2)V_{CC}$ and $V_{CC}$, and the disturbance to be exerted on the memory cells $MC_{12m}$ and $MC_{22m}$ (m=1–4) is $(1/2)V_{CC}$ or smaller.

In the above circuit constitution, it is preferred to employ a constitution in which all the memory cells sharing the plate line or the common node are accessed together and continuously serially for limiting the times of disturbance to times of a finite number. That is, when the word line $WL_1$ is accessed, all of the memory cells $MC_{11m}$ and $MC_{21m}$ (m=1, 2, 3, 4) related to the common nodes $CN_{11}$ and $CN_{21}$ are consecutively accessed. Then, the word line $WL_2$ is accessed, and all of the memory cells $MC_{12m}$ and $MC_{22m}$ (m=1, 2, 3, 4) related to the common nodes $CN_{12}$ and $CN_{22}$ are consecutively accessed. In this manner, data is read out from all the memory cells in the memory unit (access unit) and then data is re-written, to recover data from deterioration caused by the disturbance. In the above constitution, the upper limit of the times of disturbance is the number of times obtained by deducting 1 from the number of bits stored in the memory unit (access unit), so that the reliability is ensured. The number of times of disturbance in Example 5 explained above is seven.

In the memory array in Example 5, the marginal dimensions in the constitution thereof are determined by pitches of the plate lines $PL_m$ and the bit lines $BL_1$ and $BL_2$. And, 2 bits are stored in a region surrounded by the plate line and the bit lines $BL_1$ and $BL_2$, so that the marginal dimensions are $4F^2$.

In Example 5, further, a row address is selected through a two-dimensional matrix of the two word lines $WL_1$ and $WL_2$ and the four plate lines $PL_m$ (m=1, 2, 3, 4). That is, 8 bits in the row direction can be accessed through a combination of the two word lines and the four plate lines, and the number of drivers required for a row-address selection is as small as 0.75 per address. As compared with conventional cell selection, therefore, the number of driving signal lines can be decreased, and the number of peripheral circuits can be remarkably decreased.

Example 5 has explained the nonvolatile memory storing complementary data with a pair of the memory cells $MC_{11m}$ and $MC_{21m}$, while 1 bit can be stored in each memory cell by employing a dummy cell and providing a bit line on a reference side with a reference potential at an intermediate level between a potential for reading out data "1" and a potential for reading out data "0".

In nonvolatile memory explained in each of Examples 2 to 4, there may be employed a constitution in which memory cells are combined to form a pair (for example, a combination of the memory cell $MC_{11m}$ and the memory cell $MC_{21m}$ or a combination of the memory cell $MC_{12m}$ and the memory cell $MC_{22m}$) and complementary data is stored.

Figure 14:
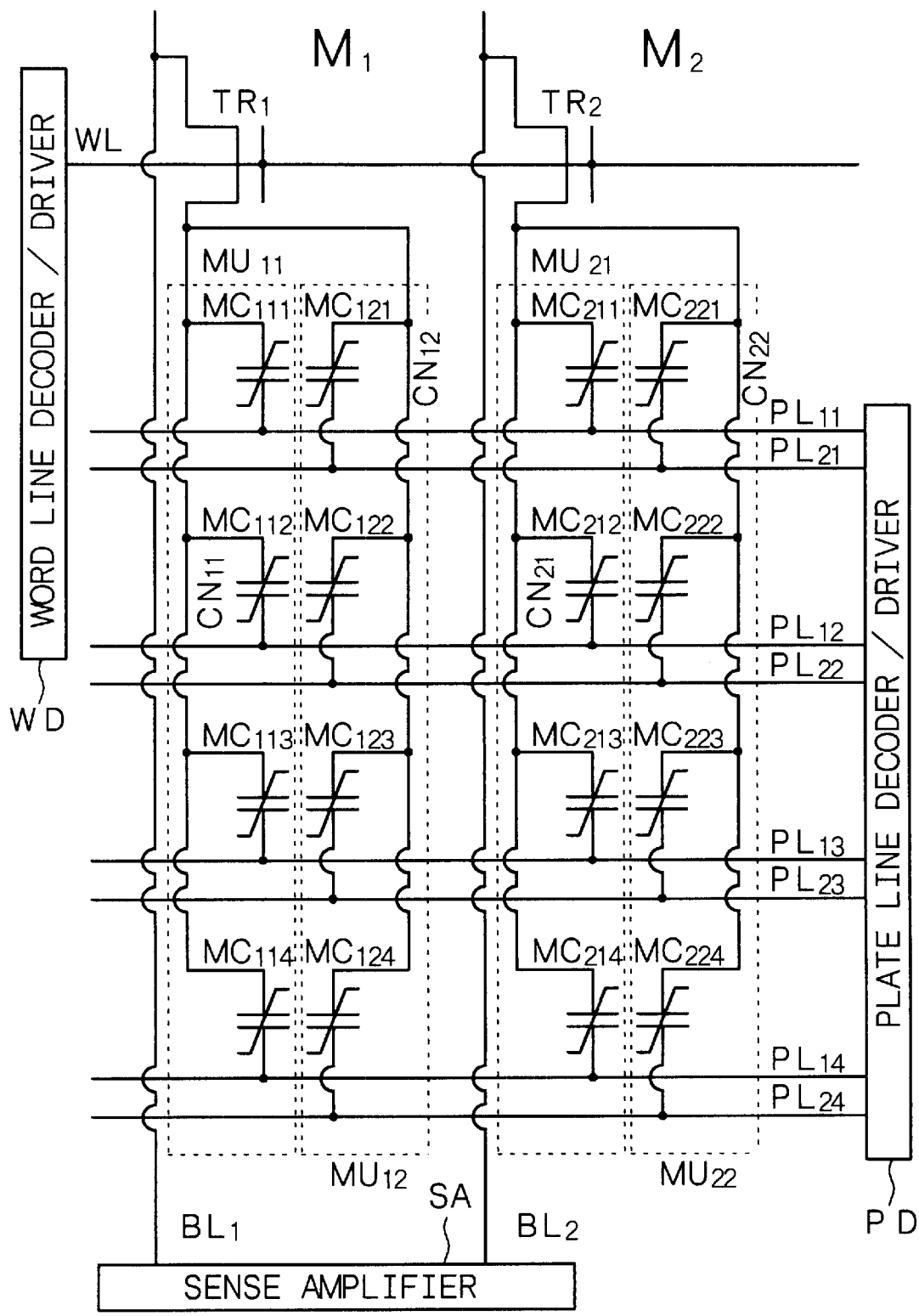
FIG. 14 is a circuit diagram when the ferroelectric-type nonvolatile semiconductor memory to be explained in Example 1 is applied to the ferroelectric-type nonvolatile semiconductor memory in Example 5.

Further, the nonvolatile memory in Example 5 can be applied to the nonvolatile memory explained in Example 1, and the circuit diagram in this case is as shown in FIG. 14. Further, in the nonvolatile memory in Example 1, which has the equivalent circuits shown in FIGS. 1 and 14, complementary data can be stored like Example 5.

EXAMPLE 6

Figure 15:
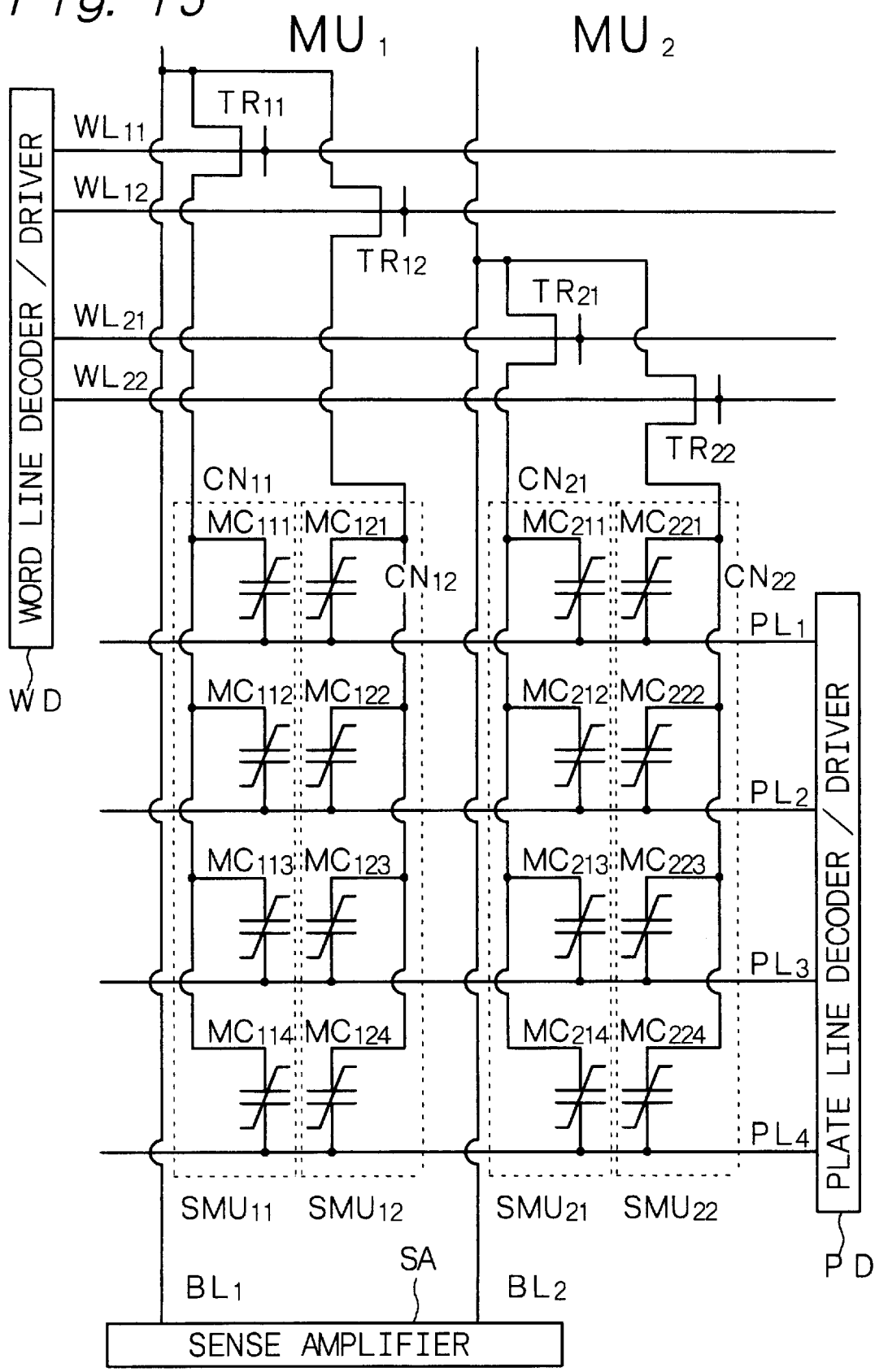
FIG. 15 is a circuit diagram of a ferroelectric-type nonvolatile semiconductor memory in Example 6.
Figure 16:
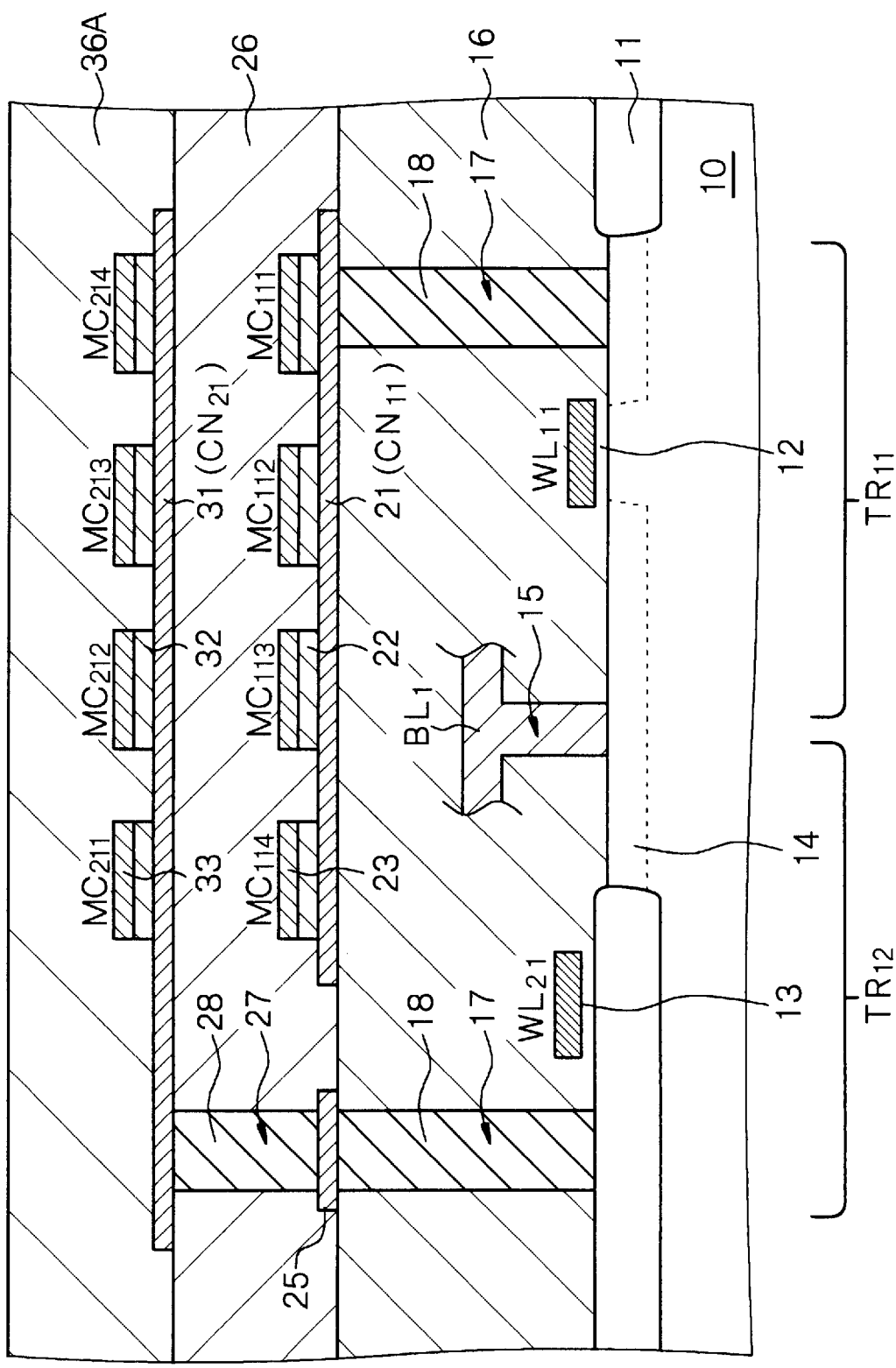
FIG. 16 is a schematic partial cross-sectional view of the ferroelectric-type nonvolatile semiconductor memory in Example 6.

Example 6 is concerned with the nonvolatile memory according to the fourth aspect of the present invention. FIG. 15 shows a circuit diagram of the nonvolatile memory in Example 6, and FIG. 16 shows a schematic partial cross-sectional view thereof.

The nonvolatile memory in Example 6 comprises a first memory unit $MU_1$ and a second memory unit $MU_2$.

The first memory unit $MU_1$ comprises;

(A-1) a first bit line $BL_1$, (B-1) first transistors for selection $TR_{11}$ and $TR_{12}$ in the number of N (provided that $N \geq 1$, and N=2 in Example 6), (C-1) first sub-memory units $SMU_{1N}$ in the number of N, each first sub-memory unit comprising first memory cells $MC_{1NM}$ in the number of M (provided that $M \geq 2$, and M=4 in Example 6), and (D-1) plate lines $PL_m$ in the number of M, each of the plate lines being common to the first memory cells $MC_{1nm}$ in the first sub-memory units ($SMU_{11}$, $SMU_{12}$) in the number of N.

Further, the second memory unit $MU_2$ comprises;

(A-2) a second bit line $BL_2$, (B-2) second transistors for selection $TR_{21}$ and $TR_{22}$ in the number of N (N=2 in Example 6), (C-2) second sub-memory units $SMU_{21}$ and $SMU_{22}$ in the number of N, each second sub-memory unit comprising second memory cells $MC_{2NM}$ in the number of M (M=4 in Example 6), and (D-2) the plate lines $PL_m$ in the number of M, each of the plate lines being common to the second memory cells $MC_{2nm}$ constituting the second sub-memory units ($SMU_{21}$, $SMU_{22}$) in the second sub-memory units ($SMU_{21}$, $SMU_{22}$) in the number of N, the plate lines $PL_m$ constituting the second memory unit $MU_2$ being common to the plates line $PL_M$ constituting the first memory unit $MU_1$.

The first sub-memory unit $SMU_{11}$ and the second sub-memory units $SMU_{21}$ are stacked through an insulating interlayer 26, and the first sub-memory unit $SMU_{12}$ and the second sub-memory units $SMU_{22}$ are stacked through the insulating interlayer 26.

The memory cell $MU_{1nm}$ or $MC_{2nm}$ comprises a first electrode 21 or 31, a ferroelectric layer 22 or 32 and a second electrode 23 or 33.

In the first memory unit $MU_1$, further, the first electrodes 21 of the first memory cells $MC_{11m}$ constituting the first-place first sub-memory unit $SMU_{11}$ are in common in the first-place first sub-memory unit $SMU_{11}$, and the common first electrode 21 (common node $CN_{11}$) is connected to the first bit line $BL_1$ through the first-place first transistor for selection $TR_{11}$. The second electrode 23 of the m-th-place, first memory cell $MC_{11m}$ (provided that m=1, 2 ... M) is, connected to the common m-th plate line $PL_m$.

In the first memory unit $MU_1$, further, the first electrodes 21 of the first memory cells $MC_{12m}$ constituting the second-place first sub-memory unit $SMU_{12}$ are in common, in the second-place first sub-memory unit $SMU_{12}$, and the common first electrode 21 (common node $CN_{12}$) is connected to the first bit line $BL_1$ through the second-place first transistor for selection $TR_{12}$. The second electrode 23 of the m-th-place first memory cell $MC_{12m}$ (provided that m=1, 2 ... M) is connected to the common m-th plate line $PL_m$. These are provided adjacent to each other in the direction perpendicular to the paper surface of FIG. 16 although not shown.

In the second memory unit $MU_2$, the first electrodes 31 of the second memory cells $MC_{21m}$ constituting first-place second sub-memory unit $SMU_{21}$ are in common in the first-place second sub-memory unit $SMU_{21}$, and the common first electrode 31 (common node $CN_{21}$) is connected to the second bit line $BL_2$ through the first-place second transistor for selection $TR_{21}$. The second electrode 33 of the m-th-place second memory cell $MC_{21m}$ is connected to the common m-th plate line $PL_m$.

In the second memory unit $MU_2$, further, the first electrodes 31 of the second memory cells $MC_{22m}$ constituting the second-place second sub-memory unit $SMU_{22}$ are in common in the second-place second sub-memory unit $SMU_{22}$, and the common first electrode 31 (common node $CN_{22}$) is connected to the second bit line $BL_2$ through the second-place second transistor for selection $TR_{22}$. The second electrode 33 of the m-th-place second memory cell $MC_{22m}$ is connected to the common m-th plate line $PL_m$. These are provided adjacent to each other in the direction perpendicular to the paper surface of FIG. 16 although not shown.

Word lines $WL_{11}$, $WL_{12}$, $WL_{21}$ and $WL_{22}$ connected to the gate electrodes of the transistors for selection are connected to a word line decoder/driver WD. Each plate line $PL_m$ is connected to a plate line decoder/driver PD. The bit lines $BL_1$ and $BL_2$ are connected to a sense amplifier SA. The bit line $BL_2$ may be connected to the same sense amplifier SA or connected to a different sense amplifier SA. The bit lines $BL_1$ and $BL_2$ are also shared by other nonvolatile memory adjacent thereto in the extending direction of the bit lines $BL_1$ and $BL_2$.

The above word lines $WL_{11}$, $WL_{12}$, $WL_{21}$ and $WL_{22}$ are extending in the direction perpendicular to the paper surface of FIG. 16. Further, the second electrodes 23 and 33 are in common in the memory cells which constitute the sub-memory unit $SMU_{12}$ and $SMU_{22}$ and are adjacent to each other in the direction perpendicular to the paper surface of FIG. 16, and they also work as the plate lines $PL_m$. Each plate line connecting these memory cells is extending in the direction perpendicular to the paper surface of FIG. 16 and connected to the others in a region (not shown) through contact holes. The sub-memory unit $SMU_{11}$ and the sub-memory unit $SMU_{21}$ are aligned in the perpendicular direction. In such a structure, the area occupied by the memory units can be decreased, and the integration degree can be improved.

In the nonvolatile memory in Example 6, the ferroelectric layer 22 of the memory cells $MC_{11m}$ constituting the first-place first sub-memory unit $SMU_{11}$ in the first memory unit $MU_1$ and the ferroelectric layer 32 of the memory cells $MC_{21m}$ constituting the first-place second sub-memory unit $SMU_{21}$ in the second memory unit $MU_2$ may be constituted of the same material. However, like the nonvolatile memory according to the sixth aspect of the present invention, it is preferred to employ a constitution in which the ferroelectric layer 32 of the memory cells positioned above has a lower crystallization temperature than the ferroelectric layer 22 of the memory cells positioned below. Specifically, the ferroelectric layers 22 and 32 can be constituted of the materials shown in Table 2.

In Example 6, the two sub-memory units $SMU_{11}$ and $SMU_{21}$ are stacked through the insulating interlayer 26. Further, the two sub-memory units $SMU_{12}$ and $SMU_{22}$ are also stacked through the insulating interlayer 26. The sub-memory units $SMU_{21}$ and $SMU_{22}$ are covered with an insulation film 36A. Further, the sub-memory unit $SMU_{11}$ and $SMU_{12}$ are formed above the semiconductor substrate 10 through an insulation layer 16. A device-isolation region 11 is formed in the semiconductor substrate 10. Each of the transistors for selection $TR_{11}$, $TR_{12}$, $TR_{21}$ and $TR_{22}$ constituted of MOS type FETs comprises a gate electrode 13, a gate insulating film 12 and source/drain regions 14. One source/drain region 14 of each of the first transistors for selection $TR_{11}$ and $TR_{21}$ is connected to the bit line $BL_1$ through a contact hole 15. One source/drain region of the second transistors for selection $TR_{21}$ and $TR_{22}$ is connected to the bit line $BL_2$ through another contact hole 15.

Further, the other source/drain region 14 of each of the first transistors for selection $TR_{11}$ and $TR_{12}$ is connected to the first common node $CN_{11}$ and $CN_{12}$ through a contact hole 18 made in an opening portion 17 made in the insulation layer 16, respectively. The other source/drain region 14 of each of the second transistors for selection $TR_{12}$, $TR_{22}$ is connected to the second common node $CN_{21}$ and $CN_{22}$ through another contact hole 18, a connection portion 25 formed on the insulation layer 16 and a contact hole 28 made in an opening portion 27 made in an insulating interlayer 26, respectively. The contact hole 18, the connection portion 25 and the contact hole 28 for the second transistors for selection $TR_{12}$ and $TR_{22}$ are not present in the same plane as that of the contact hole 18 for the first transistors for selection $TR_{11}$ and $TR_{12}$ and are positioned in portions that are virtually not seen in FIG. 16. However, they are show in FIG. 16.

In the nonvolatile memory in Example 6, the sub-memory units $SMU_{12}$ and $SMU_{22}$ are adjacent to the sub-memory units $SMU_{11}$ and $SMU_{21}$ in the direction perpendicular to the paper surface of the schematic partial cross-sectional view of FIG. 16.

In each of the memory cells $MC_{11m}$, $MC_{12m}$, $MC_{21m}$ and $MC_{22m}$ (m=1, 2, 3, 4), 1 bit is stored as data. Alternatively, complementary data is stored in a pair of the memory cells $MC_{11m}$ and $MC_{21m}$ and a pair of the memory cells $MC_{12m}$ and $MC_{22m}$.

The nonvolatile memory in Example 6 can be operated in the same manner as in the operation explained in Example 2 or 5, so that the detailed explanation thereof is omitted.

Figure 12:
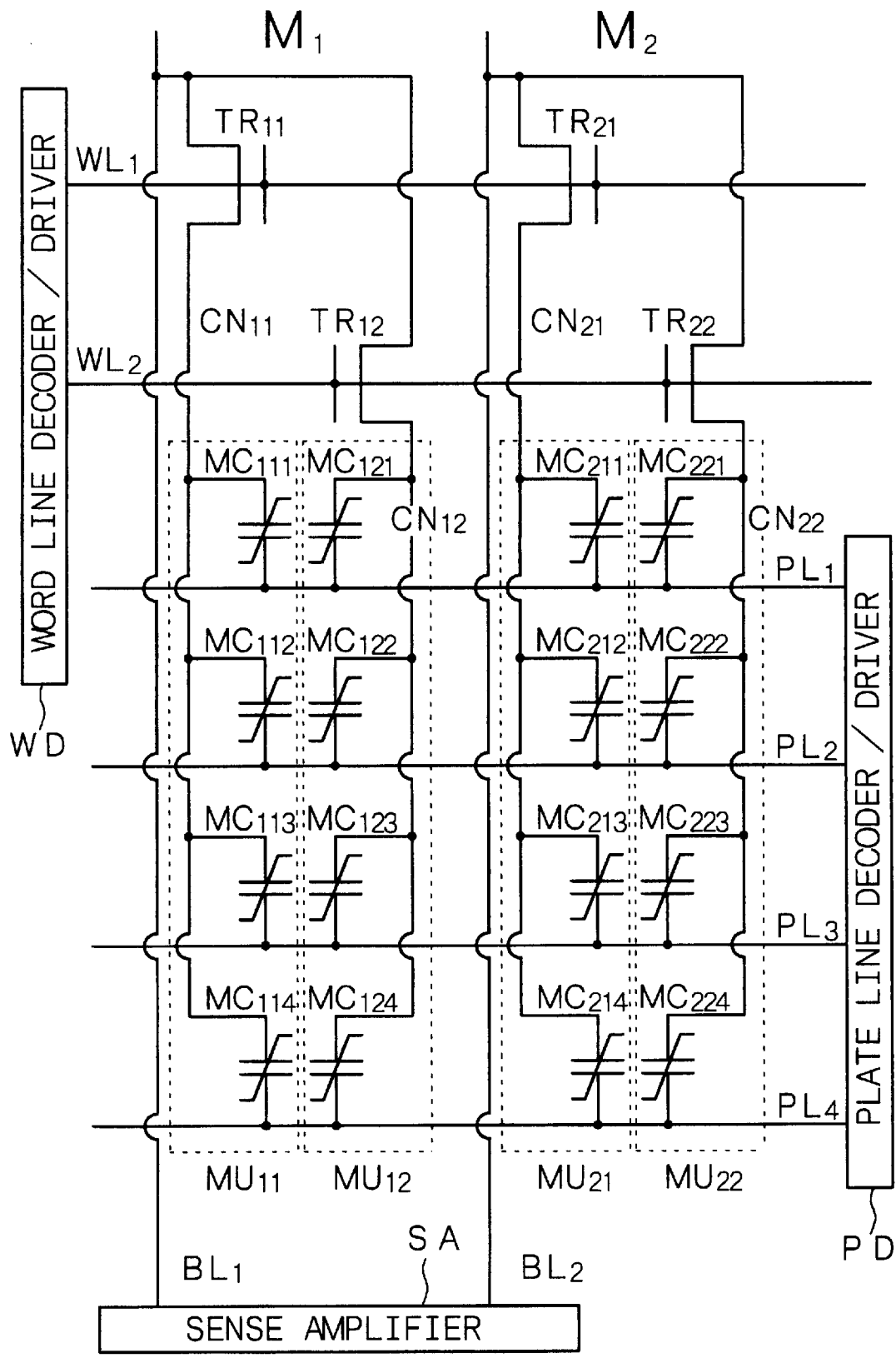
FIG. 12 is a circuit diagram of a ferroelectric-type nonvolatile semiconductor memory in Example 5.

The nonvolatile memory in Example 6 may be altered so as to have an equivalent circuit similar to the equivalent circuit shown in FIG. 12.

Figure 17:
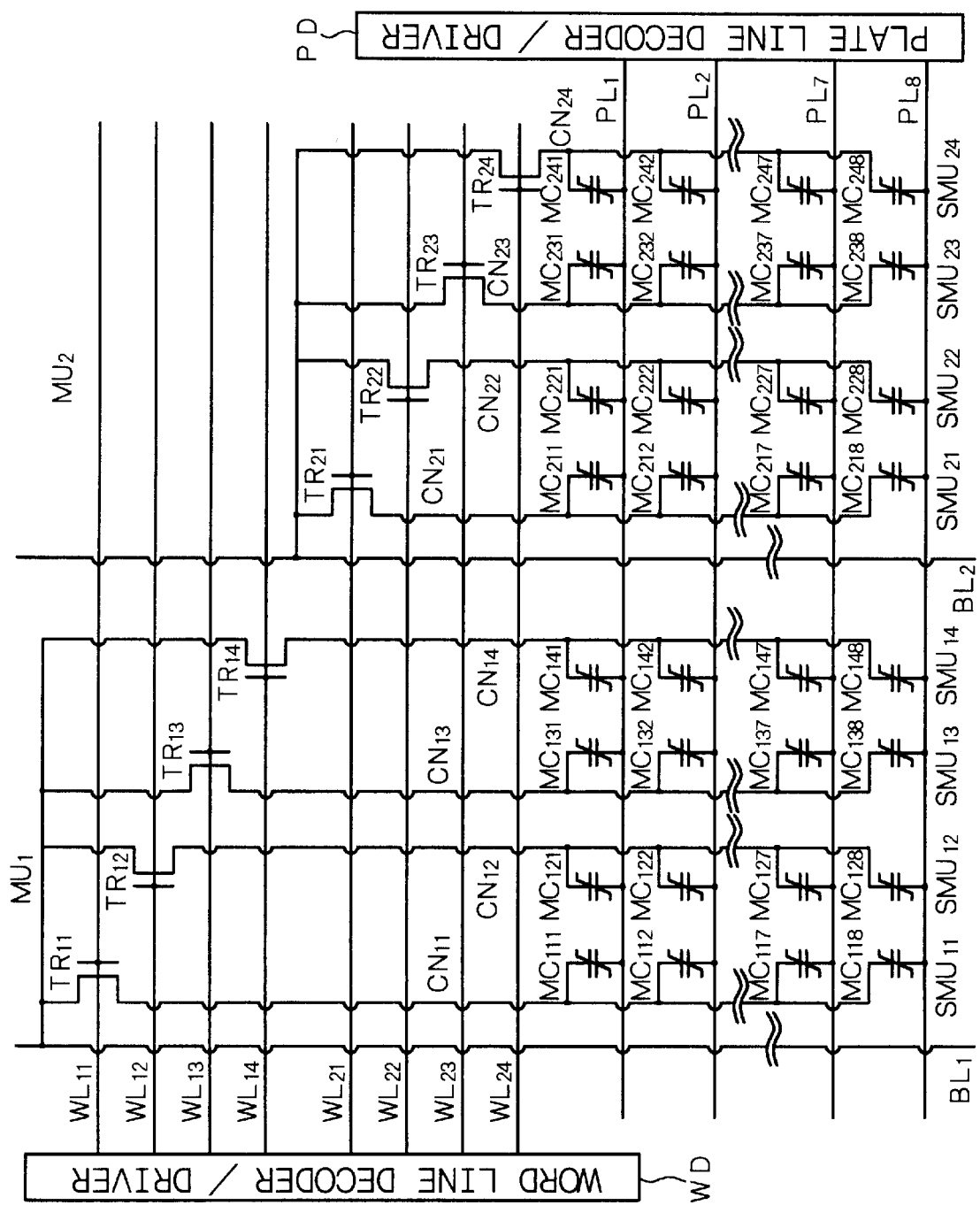
FIG. 17 is a circuit diagram of variant (N=4) of the ferroelectric-type nonvolatile semiconductor memory in Example 6.
Figure 18:
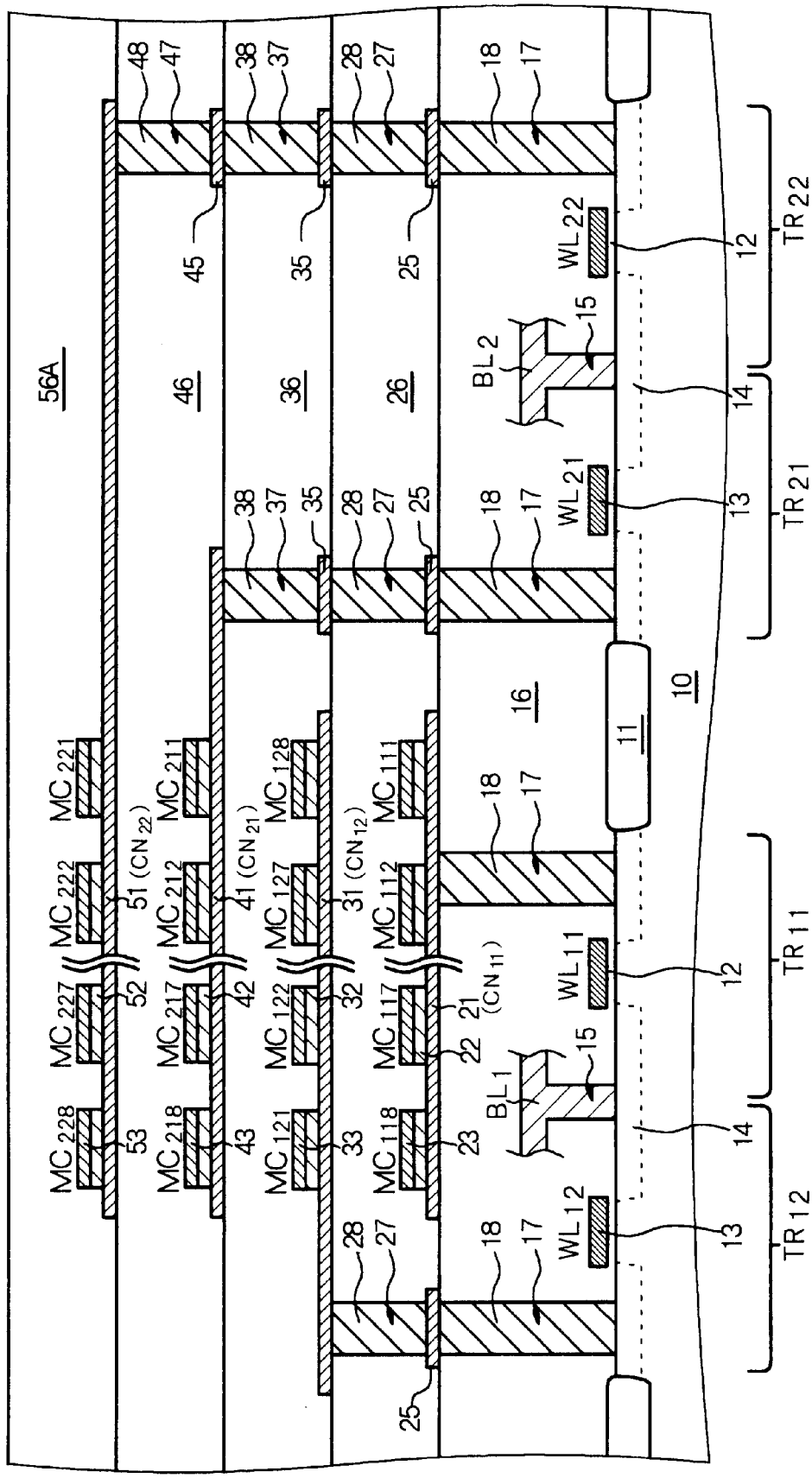
FIG. 18 is a schematic partial cross-sectional view of variant (N=4) of the ferroelectric-type nonvolatile semiconductor memory of which the circuit diagram is shown in FIG. 16.

FIG. 17 shows a circuit diagram of an embodiment in which N=4, and FIG. 18 shows a schematic partial cross-sectional view thereof. In this embodiment, when a word line $WL_{11}$ to a word line $WL_{14}$ are selected, a sub-memory unit $SMU_{11}$ to a sub-memory unit $SMU_{14}$ are accessed, and a voltage (potential) corresponding to the stored data appears in the bit line $BL_1$ alone. A reference potential at an intermediate level between a voltage (potential) for reading out data "1" and a voltage (potential) for reading out data "0" is provided to the bit line $BL_2$ connected to the same sense amplifier SA. When a word line $WL_{21}$ to a word line $WL_{24}$ are selected, a sub-memory unit $SMU_{21}$ to a sub-memory unit $SMU_{24}$ are accessed, and a voltage (potential) corresponding to the stored data appears in the bit line $BL_2$ alone. A reference potential at an intermediate level between a voltage (potential) for reading out data "1" and a voltage (potential) for reading out data "0" is provided to the bit line $BL_1$ connected to the same sense amplifier SA. In this case, as compared with a case of a nonvolatile memory to be explained with reference to FIG. 19, the signal amount (potential difference) comes to be approximately a half, and the operation margin decreases due to a fluctuation of the reference potential. However, the integration degree is approximately doubled. When, for example, the word line $WL_{11}$ and the word line $WL_{21}$ are selected at the same time, complementary data can be read out from a pair of the memory cells $MC_{111}$ and $MC_{211}$. A variant of the nonvolatile memory in Example 6 can be applied to the structure of a nonvolatile memory in Example 7 to be discussed below.

Figure 19:
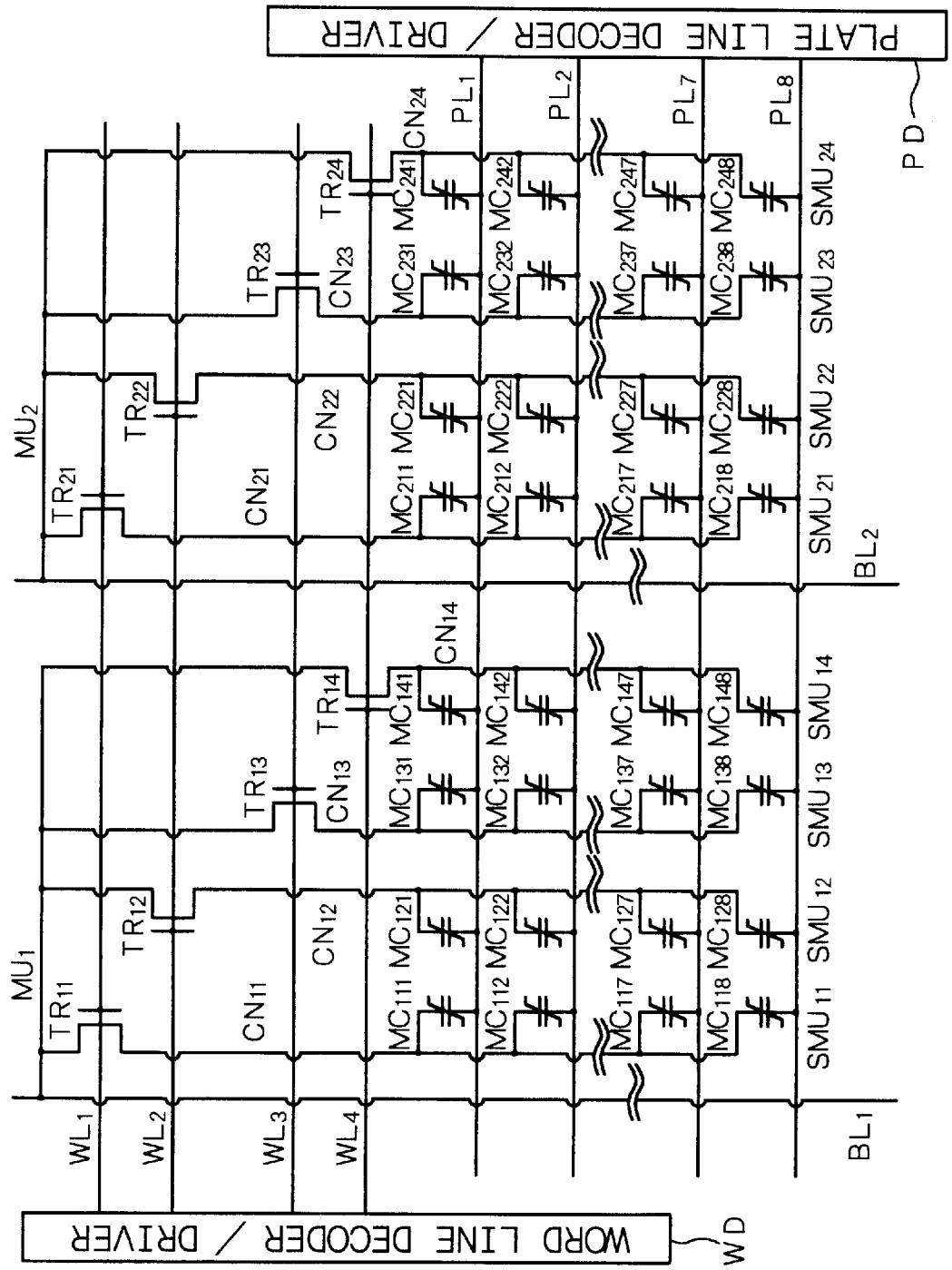
FIG. 19 is a circuit diagram of another variant (N=4) of the ferroelectric-type nonvolatile semiconductor memory in Example 6.

In FIG. 17, the layout of the transistors for selection $TR_{21}$ to $TR_{24}$ is altered, whereby there can be employed a constitution of which the circuit diagram is shown in FIG. 19. In this case, 1 bit is stored by writing complementary data into a pair of the memory cells $MC_{11m}$ and $MC_{21m}$, a pair of the memory cells $MC_{12m}$ and $MC_{22m}$, a pair of the memory cells $MC_{13m}$ and $MC_{23m}$ or a pair of the memory cells $MC_{14m}$ and $MC_{24m}$. That is, one memory unit (access unit) is constituted by eight transistors for selection $TR_{11}$ to $TR_{14}$ and $TR_{21}$ to $TR_{24}$ and 64 memory cells $MC_{11m}$ to $MC_{14m}$ and $MC_{21m}$ to $MC_{24m}$, and 32 bits are stored. In marginal dimensions in the constitution of the above memory array, the dimension in the row direction is defined by the minimum pitch of the plate lines $PL_m$, and 4 bits are stored in a region surrounded by one plate line and the bit lines $BL_1$ and $BL_2$. The marginal dimensions are therefore $2F^2$. Further, a row address is selected through a two-dimensional matrix of four word lines $WL_1$, $WL_2$, $WL_3$ and $WL_4$ and eight plate lines $PL_m$. That is, 32 bits in the row direction can be accessed through four word lines and eight plate lines, and the number of drivers required for row-address selection can be 0.375 per address. As compared with a conventional cell structure, therefore, the number of driving signal lines can be decreased, and the number of peripheral circuits can be remarkably decreased.

EXAMPLE 7

Figure 20:
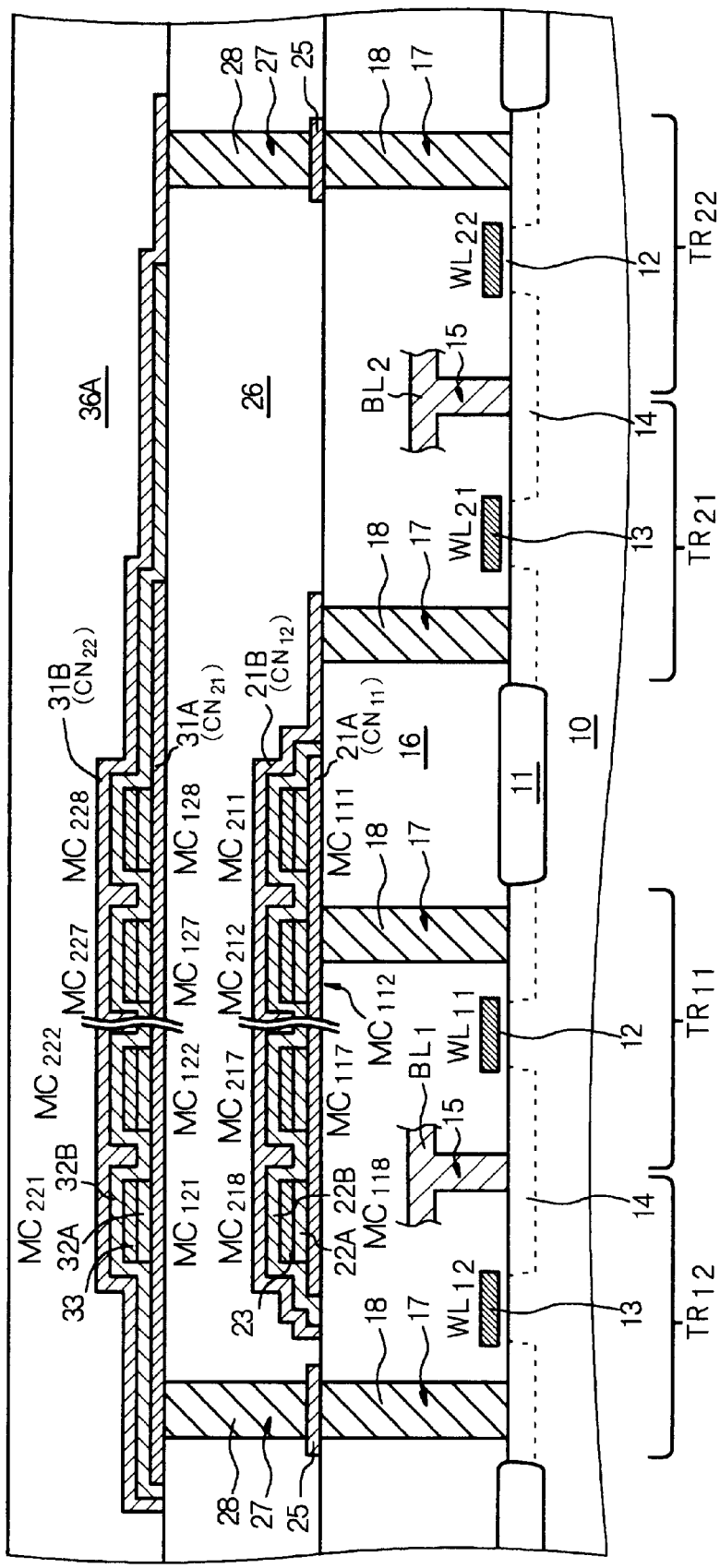
FIG. 20 is a schematic partial cross-sectional view of a ferroelectric-type nonvolatile semiconductor memory in Example 7.

Example 7 is concerned with the nonvolatile memory according to the fifth aspect of the present invention. FIG. 20 shows a schematic partial cross-sectional view of the nonvolatile memory in Example 7. The nonvolatile memory has a circuit diagram similar to that shown in FIG. 17. Example 7 employs N=4, while the value of N shall not be limited thereto.

The nonvolatile memory in Example 7 comprises a first memory unit $MU_1$ and a second memory unit $MU_2$.

The first memory unit $MU_1$ comprises;

(A-1) a first bit line $BL_1$, (B-1) first transistors for selection $TR_{1N}$ in the number of N (provided that N≧1, and N=4 in Example 7), (C-1) first sub-memory units $SMU_{1N}$ in the number of N, each first sub-memory unit comprising first memory cells $MC_{1NM}$ in the number of M (provided that M≧2, and M=8 in Example 7), and (D-1) plate lines $PL_m$ in the number of M, each of the plate lines being common to the first memory cells $MC_{1NM}$ constituting the first sub-memory units $SMU_{1nm}$ in the number of N.

The second memory unit $MU_2$ comprises;

(A-2) a second bit line $BL_2$, (B-2) second transistors for selection $TR_{2N}$ in the number of N (N=4 in Example 7), (C-2) second sub-memory units $SMU_{2N}$ in the number of N, each second sub-memory unit comprising second memory cells $MC_{2NM}$ in the number of M (M=8 in Example 7), and (D-2) the plate lines $PL_m$ in the number of M, each of the plate lines being common to the second memory cells $MC_{2nm}$ constituting the second sub-memory units $SMU_{2n}$ in the number of N, the plate lines $PL_M$ constituting the second memory unit $MU_2$ being common to the plate lines $PL_M$ constituting the first memory unit $MU_1$.

Each of the memory cells $MC_{11m}$ and $MC_{13m}$ comprises a first electrode 21A, a ferroelectric layer 22A and a second electrode 23, and each of the memory cell $MC_{21m}$ and $MC_{23m}$ comprises a first electrode 21B, a ferroelectric layer 22B and a second electrode 23. Further, each of the memory cells $MC_{12m}$ and $MC_{14m}$ comprises a first electrode 31A, a ferroelectric layer 32A and a second electrode 33, and each of the memory cells $MC_{22m}$ and $MC_{24m}$ comprises a first electrode 31B, a ferroelectric layer 32B and a second electrode 33.

In the first memory unit $MU_1$, further, the first electrodes 21A, 31A of the first memory cells $MC_{1nm}$ constituting the n-th-place first sub-memory unit $SMU_{1n}$ are in common in the n-th-place first sub-memory unit $SMU_{1n}$, and the common first electrode 21A, 31A (common node $CN_{1n}$) is connected to the first bit line $BL_1$ through the n-th-place first transistor for selection $TR_{1n}$.

In the second memory unit $MU_2$, further, the first electrodes 21B, 31B of the second memory cells $MC_{2nm}$ constituting the n-th-place second sub-memory unit $SMU_{2n}$ are in common in the n-th-place second sub-memory unit $SMU2_n$, and the common first electrode 21B, 31B (common node $CN_{1n}$) is connected to the second bit line $BL_2$ through the n-th-place second transistor for selection $TR_{2n}$.

Further, the m-th-place first memory cell $MC_{1nm}$ constituting the n-th-place first sub-memory unit $SMU_{1n}$ in the first memory unit $MU_1$ and the m-th-place second memory cell $MC_{2nm}$ constituting the n-th-place second sub-memory unit $SMU_{2n}$ in the second memory unit $MU_2$ share the second electrode 23, 33, and the shared second electrode 23, 33 is connected to the m-th plate line $PL_m$.

The word lines $WL_{11}$ to $WL_{14}$ and $WL_{21}$ to $WL_{24}$ connected to gate electrodes of the transistors for selection are connected to a word line decoder/driver WD. Each plate line $PL_m$ is connected to a plate line decoder/driver PD. Further, the bit lines $BL_1$ and $BL_2$ are connected to a sense amplifier SA. The bit line $BL_2$ may be connected to the same sense amplifier SA or connected to a different sense amplifier SA. Further, the bit lines $BL_1$ and $BL_2$ are also shared by other nonvolatile memory extending in the extending direction of the bit lines $BL_1$ and $BL_2$.

The above word lines $WL_{11}$ to $WL_{14}$ and $WL_{21}$ to $WL_{24}$ are extending in the direction perpendicular to the paper surface of FIG. 20. Further, the second electrodes 23 and 33 are common to the memory cells which are adjacent to each other in the direction perpendicular to the paper surface of FIG. 20 and constitute the sub-memory units $SMU_{13}$, $SMU_{14}$, $SMU_{23}$ and $SMU_{24}$, and the second electrodes 23 and 33 also work as the plate lines $PL_m$. These plate lines connecting the memory cells are extending in the direction perpendicular to the paper surface of FIG. 20, and are connected in a region (not shown) through contact holes. Further, the sub-memory units $SMU_{11}$ and $SMU_{12}$ and the sub-memory units $SMU_{21}$ and $SMU_{22}$ are aligned in the perpendicular direction. In such a structure, the area occupied by the memory units can be decreased, and the integration degree can be improved.

In the nonvolatile memory in Example 7, the ferroelectric layers 22A and 32A of the memory cells $MC_{1nm}$ constituting the first sub-memory unit $SMU_{1n}$ in the first memory unit $MU_1$ and the ferroelectric layers 22B and 32B of the memory cells $MC_{2nm}$ constituting the second sub-memory unit $SMU_{2n}$ in the second memory unit $MU_2$ may be constituted of the same material. Like the nonvolatile memory according to the sixth aspect of the present invention, however, it is preferred to employ a constitution in which the ferroelectric layers 32A and 32B of the memory cells constituting the sub-memory unit positioned above have a lower crystallization temperature than the ferroelectric layers 22A and 22B of the memory cells constituting the sub-memory unit positioned below. Specifically, the ferroelectric layers 22A and 22B can be constituted of the material shown in the ferroelectric layer 22 of Table 2, and the ferroelectric layers 32A and 32B can be constituted of the material shown in the ferroelectric layer 32 of Table 2.

In Example 7, the sub-memory units $SMU_{21}$ and $SMU_{22}$ are stacked on the sub-memory units $SMU_{11}$ and $SMU_{12}$ through the insulating interlayer 26, and the sub-memory units $SMU_{23}$ and $SMU_{24}$ are stacked on the sub-memory units $SMU_{13}$ and $SMU_{14}$ through the insulating interlayer 26. The sub-memory units $SMU_{22}$ and $SMU_{24}$ are covered with an insulation film 36A. Further, the sub-memory units $SMU_{11}$ and $SMU_{13}$ are formed above a semiconductor substrate 10 through the insulation layer 16. A device-isolation region 11 is formed in the semiconductor substrate 10. Each of the transistors for selection $TR_{11}$ to $TR_{14}$ and $TR_{21}$ to $TR_{24}$ comprises a gate electrode 13, a gate insulating film 12 and source/drain regions 14. One source/drain region 14 of each of the first transistors for selection $TR_{11}$ to $TR_{14}$ is connected to the bit line $BL_1$ through a contact hole 15. One source/drain region 14 of each of the second transistors for selection $TR_{21}$ to $TR_{24}$ is connected to the bit line $BL_2$ through another contact hole 15.

Further, the other source/drain region 14 of each of the first transistors for selection $TR_{11}$ and $TR_{13}$ or the other source/drain region 14 of each of the second transistors for selection $TR_{21}$ and $TR_{23}$ is connected to the common node $CN_{11}$, $CN_{13}$, $CN_{21}$ or $CN_{23}$ through a contact hole 18 made in an opening portion 17 made in the insulation layer 16. Further, the other source/drain region 14 of each of the first transistors. for selection $TR_{12}$ and $TR_{14}$ or the other source/drain region 14 of the second transistors for selection $TR_{22}$ and $TR_{24}$ is connected to the common node $CN_{12}$, $CN_{14}$, $CN_{22}$ or $CN_{24}$ through another contact hole 18, a connection portion 25 formed on the insulation layer 16 and a contact hole 28 made in an opening portion 27 made in the insulating interlayer 26.

In the nonvolatile memory in Example 7, the sub-memory units $SMU_{13}$, $SMU_{14}$, $SMU_{23}$ and $SMU_{24}$ are adjacent to the sub-memory units $SMU_{11}$, $SMU_{12}$, $SMU_{21}$, and $SMU_{22}$ in the direction perpendicular to the paper surface of the schematic partial cross-sectional view of FIG. 20.

In each of the memory cells $MC_{1nm}$ and $MC_{2nm}$ (n=1 to 4, m=1 to 8), 1 bit is stored as data. In this case, when the word line $WL_{1n}$ is selected, the sub-memory unit $SMU_{1n}$ is accessed, and a potential corresponding to the stored data appears in the bit line $BL_1$ alone. A reference potential at an intermediate level between a potential for reading out data "1" and a potential for reading out data "0" is provided to the bit line $BL_2$ connected to the same sense amplifier SA. When the word line $WL_{2n}$ is selected, the sub-memory unit $SMU_{2n}$ is accessed, and a potential corresponding to the stored data appears in the bit line $BL_2$ alone. A reference potential at an intermediate level between a potential for reading out data "1" and a potential for reading out data "0" is provided to the bit line $BL_1$ connected to the same sense amplifier SA. In the above constitution, the signal amount (potential difference) comes to be approximately a half as compared with a constitution to be explained below, and the operation margin decreases due to a fluctuation of the reference potential. However, the integration degree is approximately doubled.

Alternatively, complementary data is stored in pairs of memory cells ($MC_{11m}$, $MC_{21m}$), ($MC_{12m}$, $MC_{22m}$), ($MC_{13m}$, $MC_{23m}$) and ($MC_{14m}$, $MC_{24m}$). That is, eight transistors for selection $TR_{11}$ to $TR_{14}$ and $TR_{21}$ to $TR_{24}$ and 64 memory cells $MC_{1nm}$ and $MC_{2nm}$ constitute one memory unit (access unit), and 32 bits are stored.

In an actual nonvolatile memory, sets of nonvolatile memories for storing 32 bits or 64 bits each are arranged as access units in the form of an array.

The nonvolatile memory in Example 7 can be operated in the same manner as in the operation explained in Example 2 or 5, so that the detailed explanation thereof is omitted.

The memory cells $MC_{11M}$, $MC_{12M}$, $MC_{13M}$, $MC_{14M}$, $MC_{21M}$, $MC_{22M}$, $MC_{23M}$ and $MC_{24M}$ can be obtained, for example, by the steps of;

forming a first electrode material layer for constituting the first electrode 21A, forming a ferroelectric thin film for constituting the ferroelectric layer 22A, patterning the first electrode material layer for constituting the first electrode 21A and the ferroelectric thin film for constituting the ferroelectric layer 22A, forming and patterning a second electrode material layer for constituting the second electrode 23, forming a ferroelectric thin film for constituting the ferroelectric layer 22B, carrying out heat treatment for promoting crystallization of the ferroelectric thin films for constituting the ferroelectric layer 22A and the ferroelectric layer 22B, and forming and patterning a first electrode material layer for constituting the first electrode 21B, to form the memory cells $MC_{11M}$, $MC_{13M}$, $MC_{21M}$ and $MC_{23M}$, and then, by the steps of;

forming the insulating interlayer 26, forming a first electrode material layer for constituting the first electrode 31A, forming a ferroelectric thin film for constituting the ferroelectric layer 32A, patterning the first electrode material layer for constituting the first electrode 31A and the ferroelectric thin film for constituting the ferroelectric layer 32A, forming and patterning a second electrode material layer for constituting the second electrode 33, forming a ferroelectric thin film for constituting the ferroelectric layer 32B, carrying out heat treatment for promoting the ferroelectric thin films for constituting the ferroelectric layer 32A and the ferroelectric layer 32B, and forming and patterning a first electrode material layer for constituting the first electrode 31B, to form the memory cells $MC_{12M}$, $M_{14M}$, $MC_{22M}$ and $MC_{24M}$.

The nonvolatile memory in Example 7 may be altered as shown in the equivalent circuit of FIG. 19. In marginal dimensions in the constitution of the memory array in this case, the dimension in the row direction is defined by the minimum pitch of the plate lines $PL_m$, and 4 bits are stored in a region surrounded by one plate line and the bit lines $BL_1$ and $BL_2$. The marginal dimensions are therefore $2F^2$. Further, a row address is selected through a two-dimensional matrix of four word lines $WL_1$ to $WL_4$ and eight plate lines $PL_M$. That is, 32 bits in the row direction can be accessed through four word lines and eight plate lines, and the number of drivers required for row address selection can be 0.375 per address. As compared with a conventional memory cell structure, therefore, the number of driving signal lines can be decreased, and the number of peripheral circuits can be remarkably decreased.

EXAMPLE 8

Figure 21:
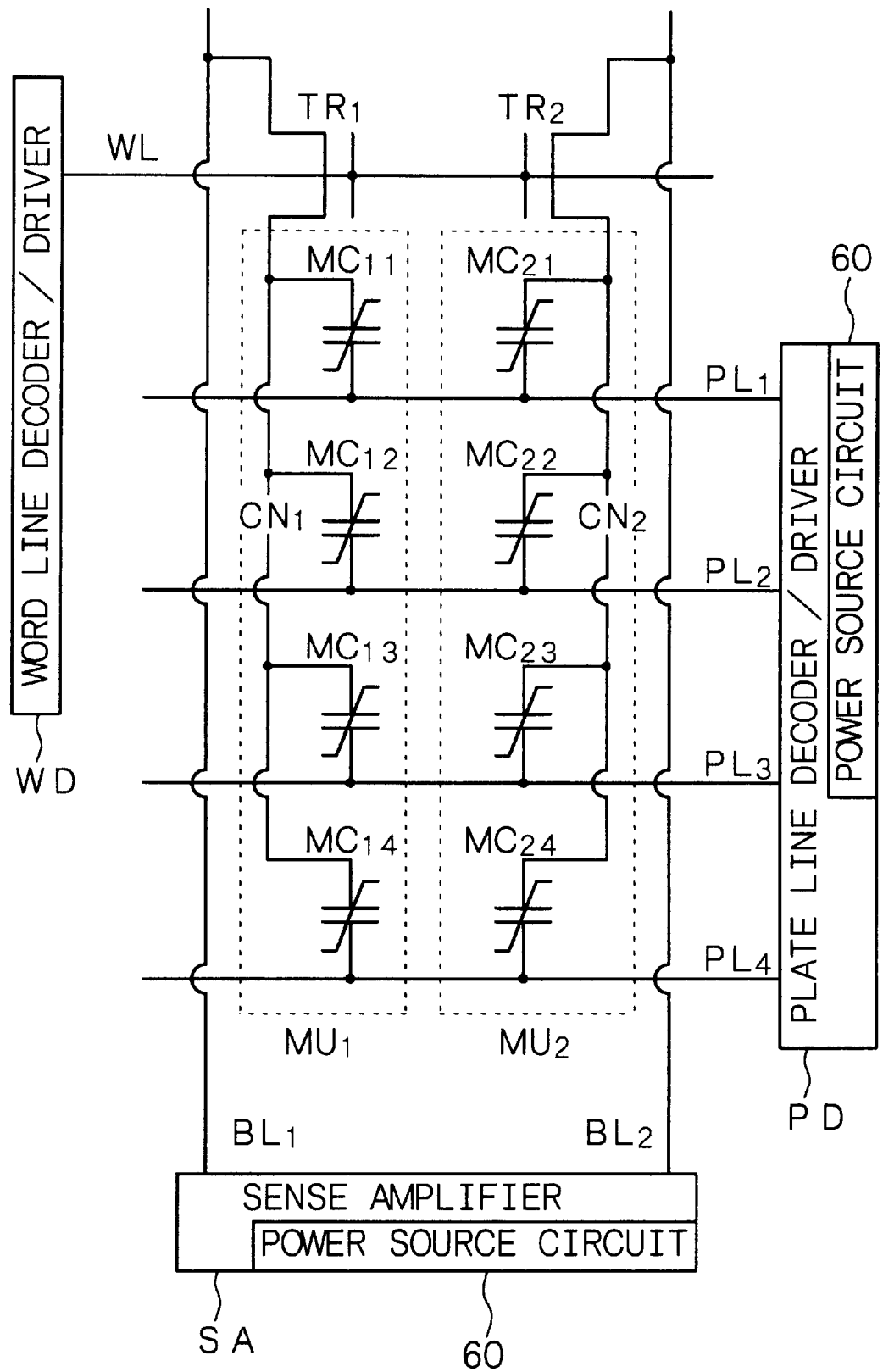
FIG. 21 is a circuit diagram of a ferroelectric-type nonvolatile semiconductor memory in Example 8.
Figure 22:
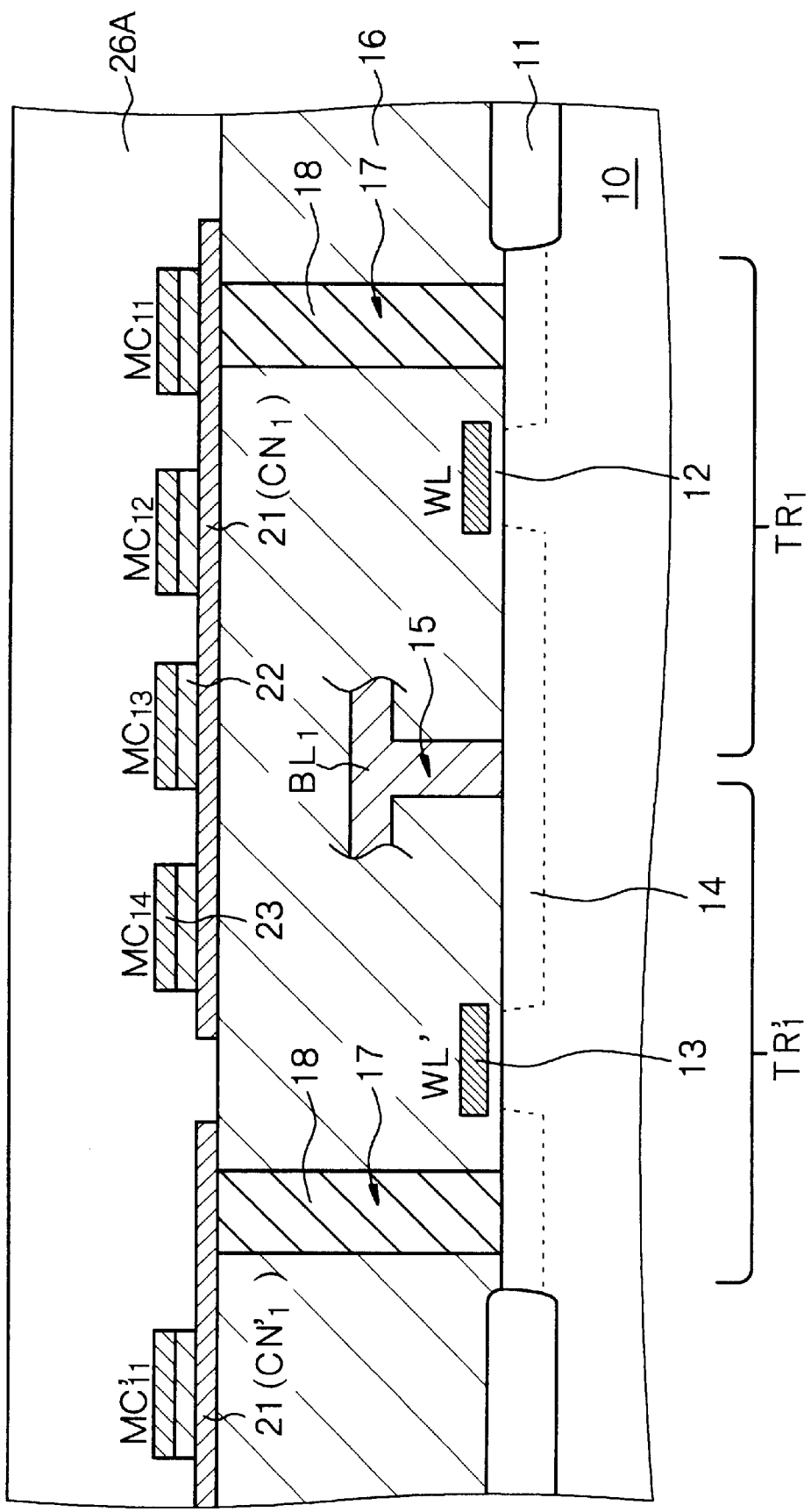
FIG. 22 is a schematic partial cross-sectional view of the ferroelectric-type nonvolatile semiconductor memory in Example 8.

Example 8 is concerned with the nonvolatile memory according to the seventh aspect of the present invention. Specifically, the memory unit of the nonvolatile memory in Example 8 has a structure disclosed in JP-A-121032/1997. FIG. 21 shows a circuit diagram of the nonvolatile memory in Example 8, and FIG. 22 shows a schematic partial cross-sectional view thereof.

The nonvolatile memory in Example 8 has a memory unit $MU_1$ or $MU_2$ formed by arranging a plurality of memory cells $MC_{1M}$ or $MC_{2M}$ (for example, M=4) having a capacitor member having a ferroelectric layer and has a structure in which a disturbance takes place in non-selected memory cells when a selected memory cell is accessed. Further, the nonvolatile memory has a power source circuit 60 which is connected to the capacitor member and whose output has a negative temperature characteristic. The above "output has a negative temperature characteristic" means a characteristic that the output voltage decreases (lowers) as the operation temperature of the nonvolatile memory increases. Specifically, one end of each of the capacitor members constituting the memory cells $MC_{1M}$ and $MC_{2M}$ is connected to a bit line $BL_1$ or $BL_2$, the other end is connected to a plate line $PL_M$ (M=4), the power source circuit 60 (specifically, that is included in a sense amplifier SA) is connected to the bit line $BL_1$ and $BL_2$, and another power source circuit 60 (specifically, that is included in a plate line decoder/driver PD) is connected to the plate line $PL_M$.

The nonvolatile memory in Example 8 comprises a bit line $BL_1$, a transistor for selection $TR_1$, memory cells $MC_{1m}$ (m=1, 2, 3, 4) in the number of M (provided that M=4 in Example 8) and plate lines $PL_m$ (m=1, 2, 3, 4) in the number of M. Each of the memory cells $MC_{1m}$ comprises a first electrode (lower electrode) 21, a ferroelectric layer 22 and a second electrode (upper electrode) 23. The first electrodes 21 of the memory cells $MC_{1m}$ are in common in the memory unit $MU_1$, and the common first electrode 21 (to be sometimes referred to as common node $CN_1$) is connected to the bit line $BL_1$ through the transistor for selection $TR_1$. The second electrode 23 is connected to the plate line $PL_m$. The memory cells $MC_{1m}$ are covered with an insulation film 26A.

Further, the nonvolatile memory in Example 8 comprises a bit line $BL_2$, a transistor for selection $TR_2$, memory cells $MC_{2m}$ (m=1, 2, 3, 4) in the number of M (provided that M=4 in Example 8) and the plate lines $PL_m$ (m=1, 2, 3, 4) in the number of M. Each of the memory cells $MC_{2m}$ comprises a first electrode 21 (lower electrode), a ferroelectric layer 22 and a second electrode (upper electrode) 23. The first electrodes 21 of the memory cells $MC_{2m}$ are in common in the memory unit $MU_2$, and the common first electrode 21 (to be sometimes referred to as common node $CN_2$) is connected to the bit line $BL_2$ through the transistor for selection $TR_2$. The second electrode 23 is connected to the plate line $PL_m$. In the schematic partial cross-sectional view of FIG. 22, the bit line $BL_2$, the transistor for selection $TR_2$ and the memory cells $MC_{2m}$ are adjacent to the bit line $BL_1$, the transistor for selection $TR_1$ and the memory cells $MC_{1m}$ in the direction perpendicular to the paper surface of FIG. 22.

The plate line $PL_m$ for the memory cells $MC_{2m}$ is common to the plate line $PL_m$ for the memory cells $MC_{1m}$, and is connected to a plate line decoder/driver PD. Further, the gate electrodes of the transistors for selection $TR_1$ and $TR_2$ are connected to a common word line WL, and the word line WL is connected to a word line decoder/driver WD. Further, the bit lines $BL_1$ and $BL_2$ are connected to a sense-amplifier SA.

FIG. 22 shows the transistor for selection $TR_1$ and the memory cells $MC_{1m}$ together with the transistor for selection $TR'_1$ and part of memory cells $MC'_{1m}$ adjacent in the extending direction of the bit line $BL_1$. The memory cells $MC_{1m}$, $MC'_{1m}$ . . . adjacent in the extending direction of the bit line $BL_1$ share the bit line $BL_1$.

And, complementary data is stored in a pair of the memory cells $MC_{1m}$ and $MC_{2m}$ (m=1, 2, 3, 4).

Figure 23:
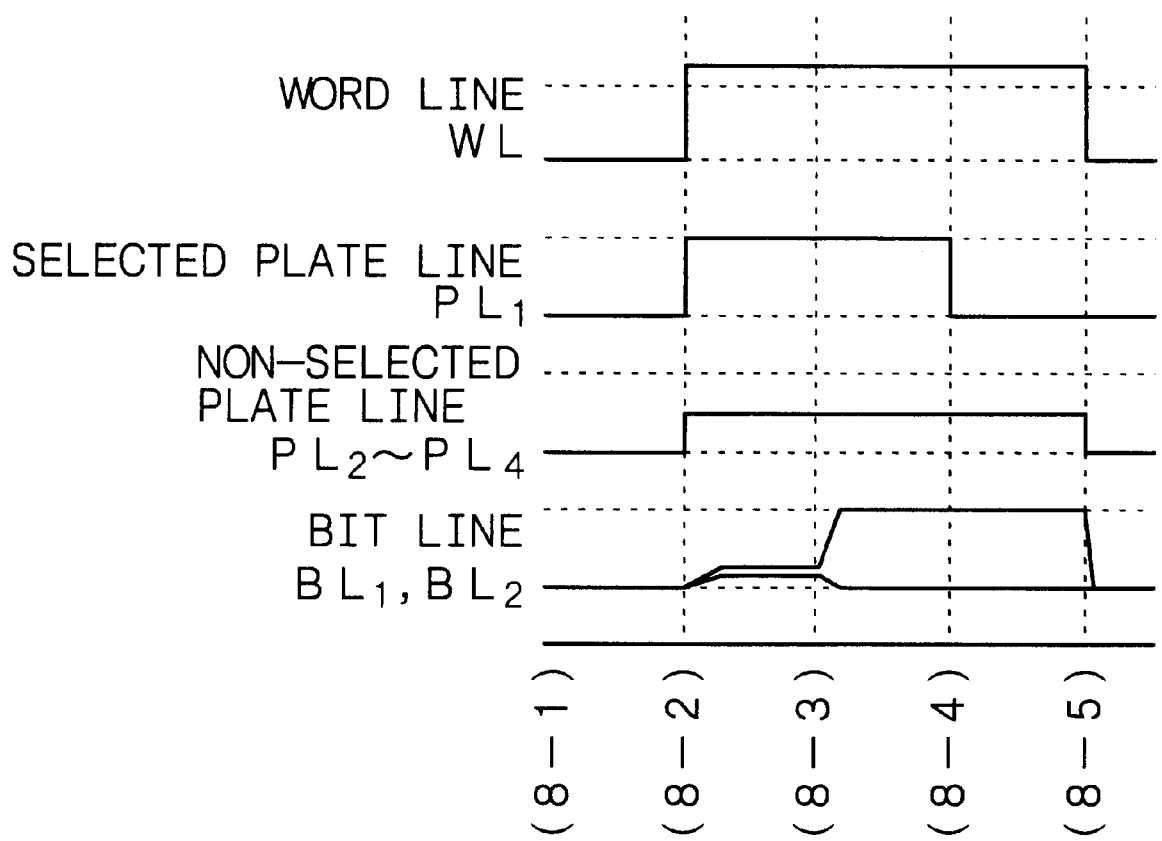
FIG. 23 is a diagram of operation waveforms of the ferroelectric-type nonvolatile semiconductor memory in Example 8.

One example of reading out data from the nonvolatile memory in Example 8 will be explained below. It is supposed, for example, that data is read out from a pair of the memory cell $MC_{11}$ and $MC_{21}$, that data "1" is stored in the memory cell $MC_{11}$ and that data "0" is stored in the memory cell $MC_{21}$. FIG. 23 shows operation waveforms. In FIG. 23, parenthesized numbers correspond to Nos. of steps to be explained below.

(8-1) In a standby state, all the bit lines, all the word lines and all the plate lines are grounded. Then, a grounding line (not shown) and the bit lines $BL_1$ and $BL_2$ are electrically disconnected to bring the bit lines $BL_1$ and $BL_2$ into a floating state.

(8-2) When data is read out, the word line WL is brought to a high level, to bring the transistors for selection $TR_1$ and $TR_2$ into an ON-state. At the same time, $V_{CC}$ is applied to a selected plate line $PL_1$, and $(1/2)V_{CC}$ is applied to non-selected plate lines $PL_m$ (m=2, 3, 4), whereby an inversion discharge is released from the memory cell $MC_{11}$ already storing data "1", and as a result, a potential difference takes place between the bit lines $BL_1$ and $BL_2$. Then, the sense amplifier SA is activated to read out the potential difference between the bit lines $BL_1$ and $BL_2$ as data.

(8-3) Then, the bit lines $BL_1$ and $BL_2$ are charged and discharged with the sense amplifier SA, $V_{CC}$ is applied to the bit line $BL_1$, and 0 volt is applied to the bit line $BL_2$. As a result, data "0" is re-written into the memory cell $MC_{21}$.

(8-4) Then, the plate line $PL_1$ is brought to 0 volt, whereby data "1" is re-written into the memory cell $MC_{11}$.

(8-5) When readout of data is finished, the bit lines $BL_1$ and $BL_2$ are then discharged until they have 0 volt, and the plate lines $PL_m$ (m=2, 3, 4) are discharged until they have 0 volt.

According to the above sequence, a disturbance exerted on the capacitor member in the non-selected memory cells $MC_{1m}$ and $MC_{2m}$ (m=2, 3, 4) is constantly controlled to be $(1/2)V_{CC}$ or lower.

In the power source circuit 60 for applying the voltage to the bit lines $BL_1$ and $BL_2$, included in the sense amplifier SA, and another power source circuit 60 for applying the voltage to the plate lines $PL_M$, included in the plate line decoder/driver PD, the outputs therefrom have a negative temperature characteristic. An example of constitution of these power source circuits 60 will be explained below.

Figure 24A:
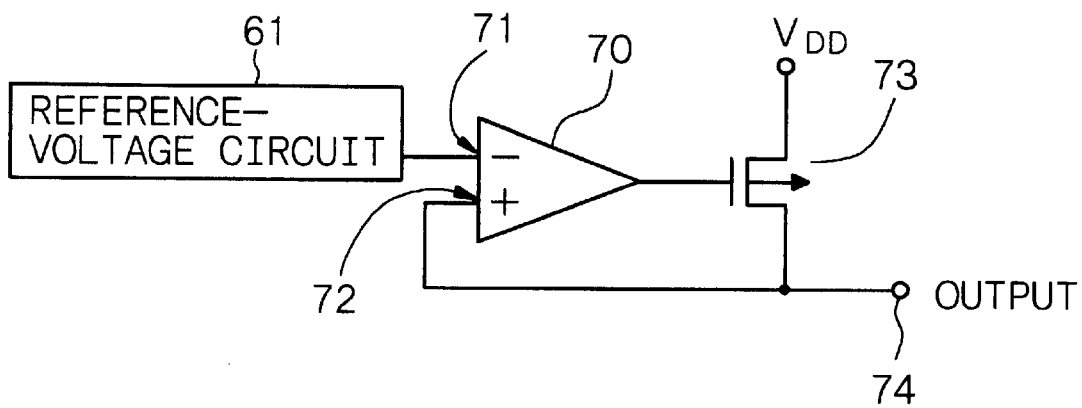
FIGS. 24A and 24B are circuit diagrams of examples of a power source circuit and a reference-voltage circuit in the ferroelectric-type nonvolatile semiconductor memory in Example 8, respectively.

As shown in a circuit diagram of FIG. 24A, the power source circuit 60 comprises a reference-voltage circuit 61, a comparator 70, for detecting a potential difference between a reference voltage [for example, $V_{CC}$ or $(1/2)V_{CC}$] outputted from the reference-voltage circuit 61 and an output voltage, and a circuit for applying a negative feedback to the output voltage from the comparator 70 depending upon the output voltage from the comparator 70, for example, a feedback loop for controlling a PMOS type FET 73 depending upon a comparison result. Specifically, the power source circuit 60 comprises the reference-voltage circuit 61, the comparator 70 having a first input portion into which the reference voltage outputted from the reference-voltage circuit 61 is to be inputted, and the PMOS type FET 73 having a gate portion into which the output voltage from the comparator 70 is to be inputted and a drain region connected to a second input portion of the comparator 70 and the capacitor member. Specifically, the drain region of the PMOS type FET 73 is connected to the bit line $BL_1$ or $BL_2$ or the plate line $PL_m$. The comparator 70 can be constituted, for example, of a current mirror differential amplifier.

When excess current is about to flow from a $V_{DL}$ terminal 74 to ground, the PMOS type FET 73 acts as a kind of an impedance, and the drain voltage of the PMOS type FET 73 varies to minus side. When the output voltage starts to be lower than the reference voltage, the gate voltage of the PMOS type FET 73 comes to be lower, and the PMOS type FET 73 comes into an ON-state to start charge the output with supplying a current to the load. When charging reaches a certain level and the output voltage comes to be higher than the reference voltage, the gate voltage of the PMOS type FET 73 in turn increases, and the PMOS type FET 73 comes into an OFF-state to terminate the charging, whereby the output voltage [for example, $V_{CC}$ or $(1/2)V_{CC}$] from the PMOS type FET 73 can be stabilized.

Figure 24B:
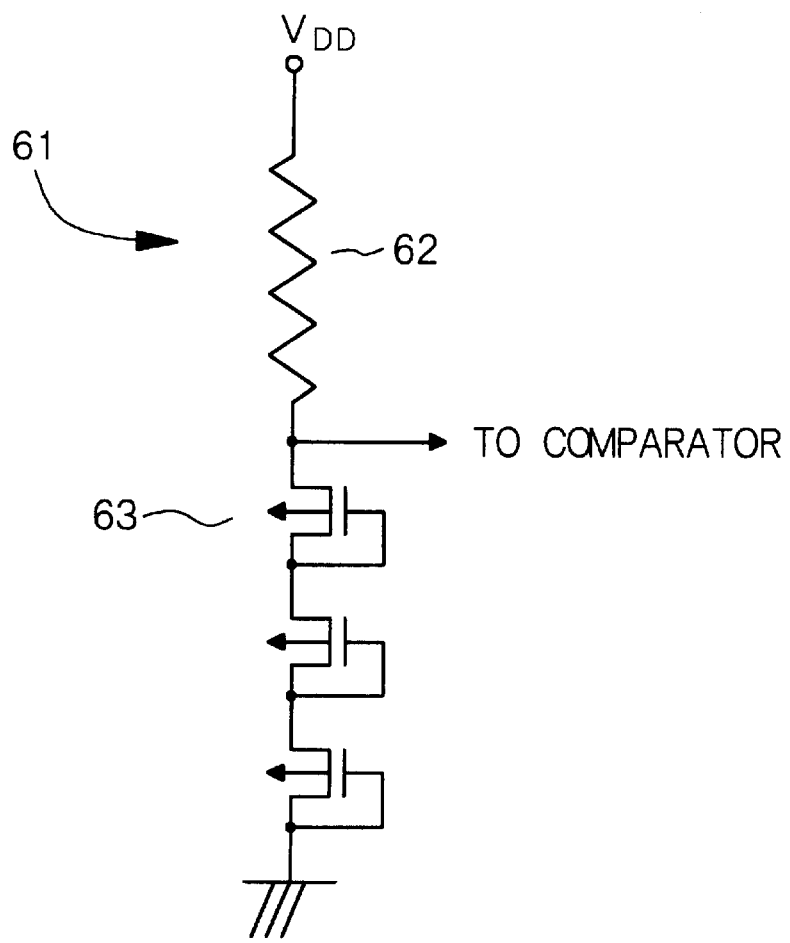

As shown in a circuit diagram of FIG. 24B, the reference-voltage circuit 61 comprises a first resistance element 62 whose one end is connected to a power source $V_{DD}$ and a second resistance element 63 whose one end is connected to the other end of the first resistance element 62 and whose other end is grounded. The reference voltage is outputted from a connection portion of the first resistance element 62 and the second resistance element 63. The first resistance element 62 is formed of a resistance material, and the second resistance element 63 is formed of at least one PMOS type FET whose drain portion and gate portion are short-circuited.

In the embodiment shown in FIG. 24B, the second resistance element 63 has a structure in which three PMOS type FETs are connected in series, and when each PMOS type FET has a threshold voltage of $V_{th}$, the reference voltage that is outputted when the first resistance element 62 has a sufficiently high value is $3V_{th}$. The threshold voltage $V_{th}$ of the MOS type FET generally has a negative temperature characteristic (that is, the resistance value decreases with an increase in temperature). The stage number of the PMOS type FETs constituting the second resistance element 63 and the impurity concentration of various semiconductor regions constituting the PMOS type FETs are adjusted, whereby the second resistance element 63 can be imparted with a desired resistance value and a desired negative temperature characteristic.

Figure 25A:
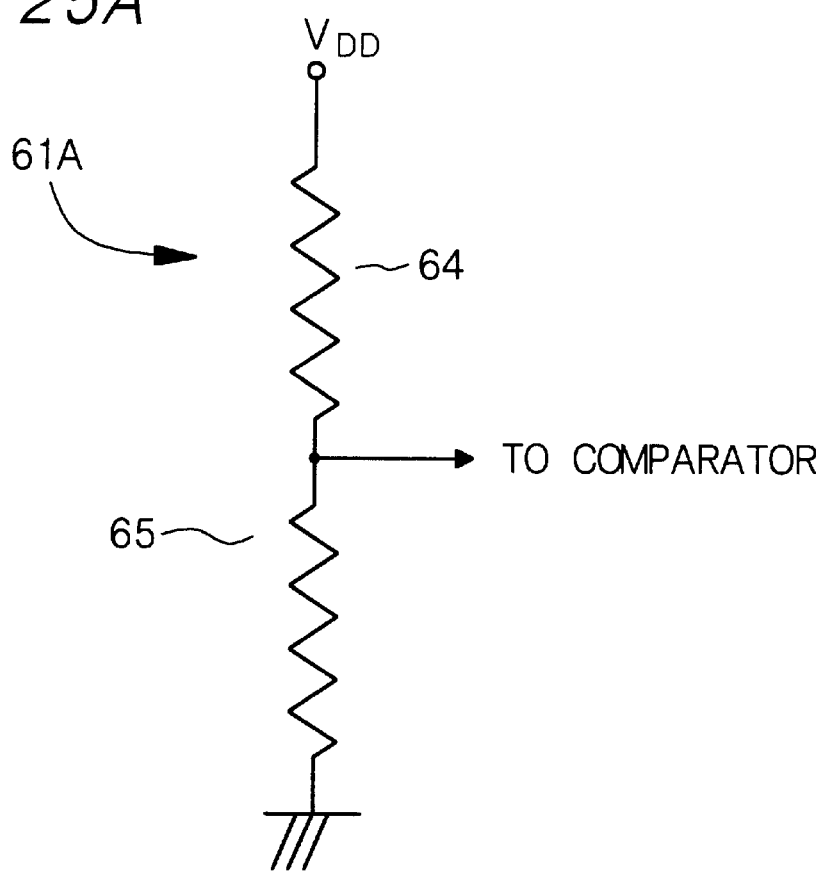
FIGS. 25A and 25B are circuit diagrams of variant of the reference-voltage circuit in the ferroelectric-type nonvolatile semiconductor memory in Example 8.
Figure 25B:
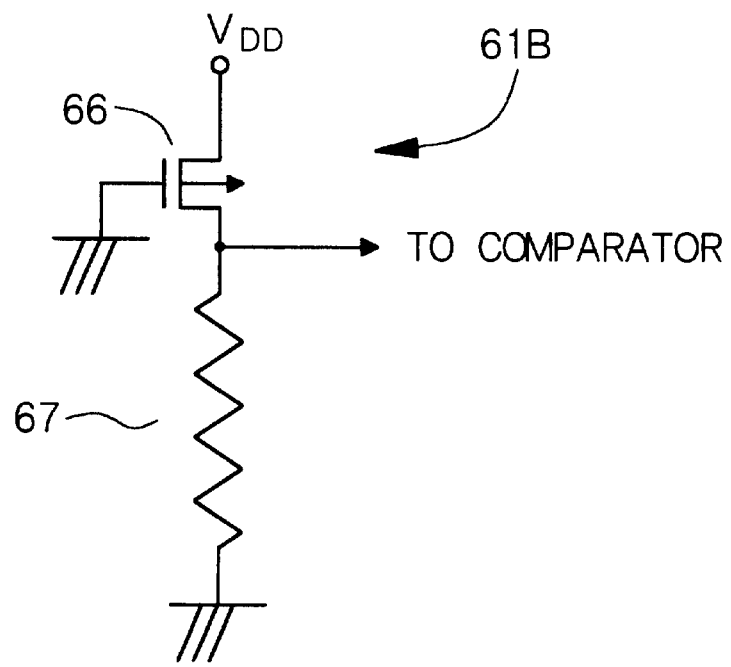

FIG. 25B shows a reference-voltage circuit 61A of another type. In the reference-voltage circuit 61A, a first resistance element 64 and a second resistance element 65 have a negative temperature characteristic (that is, the resistance value decreases with an increase in temperature), and the absolute value of a change in the resistance value of the second resistance element 65 based on the temperature change is greater than the absolute value of a change in the resistance value of the first resistance element 64 based on the temperature change. Specifically, the first resistance element 64 and the second resistance element 65 are formed of resistance materials. More specifically, there may be employed a constitution, for example, in which the first resistance element 64 is formed of a semiconductor layer (for example, polysilicon layer) doped with an impurity, and the second resistance element 65 is formed of a semiconductor layer (for example, polysilicon layer) doped with an impurity having a lower concentration than the impurity concentration of the semiconductor layer constituting the first resistance element 64. Alternatively, the reference-voltage circuit 61A can be also constituted of a first resistance element 64 formed of an Si—Ge semiconductor layer in which a change amount of the resistance value based on the temperature change is decreased by narrowing a band gap by ion-implanting a polysilicon layer with Ge and a second resistance element 65 formed of an Si semiconductor layer (specifically, a polysilicon layer). In such a constitution, when the operation temperature of the nonvolatile memory increases, the voltage drop in the second resistance element 65 comes to be smaller than that found before the operation temperature increases, and as a result, the reference voltage to be outputted from the reference-voltage circuit 61A decreases.

FIG. 25B shows a reference-voltage circuit 61B of a still another type. In the reference-voltage circuit 61B, a first resistance element 66 has a positive temperature characteristic (that is, the resistance value increases with an increase in temperature), and a second resistance element 67 has a negative temperature characteristic (that is, the resistance value decreases with an increase in temperature). Specifically, the first resistance element 66 is formed of a PMOS type FET whose gate portion is grounded, and the second resistance element 67 is made of a resistance material formed of a semiconductor layer doped with an impurity. Such a first resistance element 66 has a resistance value (specifically, the channel resistance value) which is not dependent upon a voltage and changes like a straight line, and has a positive temperature characteristic. In such a constitution, therefore, when the operation temperature of the nonvolatile memory increases, the voltage drop in the second resistance element 67 comes to be smaller than that found before the operation temperature increases, and as a result, the reference voltage to be outputted from the reference-voltage circuit 61B decreases.

When it is assumed that the output voltage from the power source circuit is 1.5 volt at a nonvolatile memory operation temperature of 20° C. and 1.0 volt at a nonvolatile memory operation temperature of 105° C., the capacitor member in the memory cells can retain a signal charge of at least 6 $\mu C/cm^2$ at any operation temperature, and no data in non-selected memory cells can be destroyed.

The above-explained power source circuits and the above-explained reference-voltage circuits of various types can be made by known methods. The power source circuit may be constituted of any one of the reference-voltage circuits 61, 61A and 61B in some cases. The power source circuit may be included in the sense amplifier SA alone, or it may be included in the plate line decoder/driver PD alone. There may be employed a constitution in which the output voltage from the power source circuit is supplied to the sense amplifier SA and/or the plate line decoder/driver PD. The above description may be applicable to nonvolatile memories to be explained in Examples to be described hereinafter.

Figure 26:
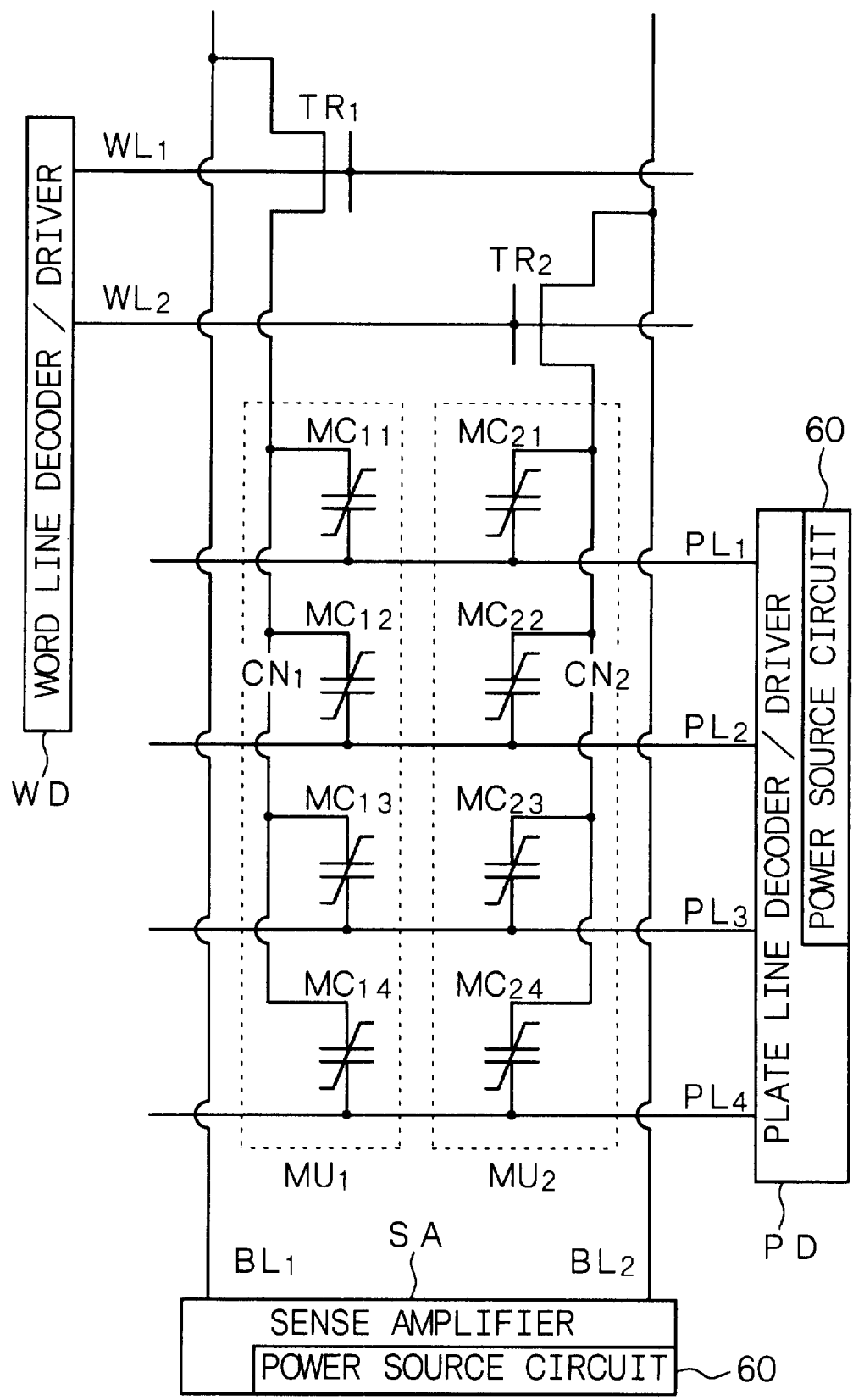
FIG. 26 is a circuit diagram of variant of the ferroelectric-type nonvolatile semiconductor memory in Example 8.

In the nonvolatile memory in Example 8, it is explained that complementary data is stored in a pair of the memory cells $MC_{1m}$ and $MC_{2m}$. However, 1 bit can be stored per memory cell by providing a reference-side bit line with a reference potential at an intermediate level between a potential for reading out data "1" and a potential for reading out data "0" with a dummy cell. FIG. 26 shows a circuit diagram in this case. Unlike the constitution shown in FIG. 21, in this variant of the nonvolatile memory, the transistors for selection $TR_1$ and the transistor for selection $TR_2$ are connected to word lines $WL_1$ and $WL_2$, respectively, and these word lines $WL_1$ and $WL_2$ are connected to a word line decoder/driver WD.

The structure of the memory unit or sub-memory unit of the nonvolatile memory explained in any one of Examples 1 to 7 can be applied to the nonvolatile memory explained in Example 8.

EXAMPLE 9

Example 9 is concerned with the nonvolatile memory according to the eighth aspect of the present invention. The nonvolatile memory in Example 9 has memory units that are, specifically, similar to the memory units explained in Example 8, and the memory units have a schematic partial cross-sectional view as shown in FIG. 22, so that the detailed explanation of the memory units is omitted.

Figure 27:
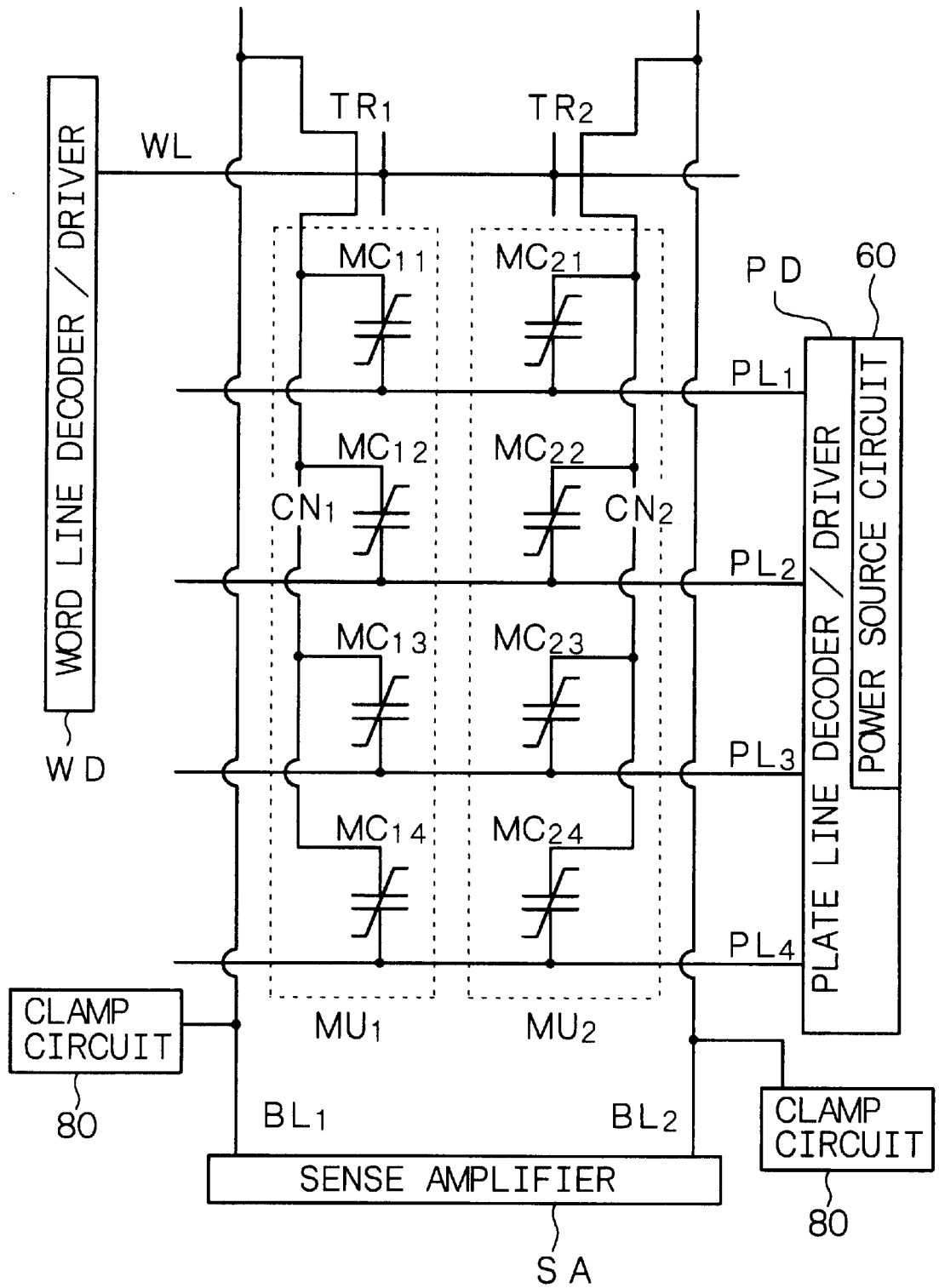
FIG. 27 is a circuit diagram of a ferroelectric-type nonvolatile semiconductor memory in Example 9.

FIG. 27 shows a circuit diagram of the nonvolatile memory in Example 9. In the nonvolatile memory in Example 9, one end of each of capacitor members constituting the memory cells $MC_{1M}$ or $MC_{2M}$ is connected to a bit line $BL_1$ or $BL_2$, and the other end thereof is connected to a plate line $PL_m$. And, clamp circuits 80 whose clamp voltage (clamp potential) has a negative temperature characteristic are connected to the bit lines $BL_1$ and $BL_2$. In such a constitution, the sense amplifier SA is not required to include the power source circuit 60 explained in Example 8. When the power source circuit 60 explained in Example 8 is included in the sense amplifier SA, a useless noise occurs when the capability of the power source circuit supplying an electric current is insufficient, so that an error may take place in reading out data. In such a case, a conventional sense amplifier SA is used as the sense amplifier SA, and the clamp circuits 80 for clamping the voltage (potential) in the bit lines $BL_1$ and $BL_2$ can be connected to the bit line $BL_1$ and $BL_2$.

Figure 28:
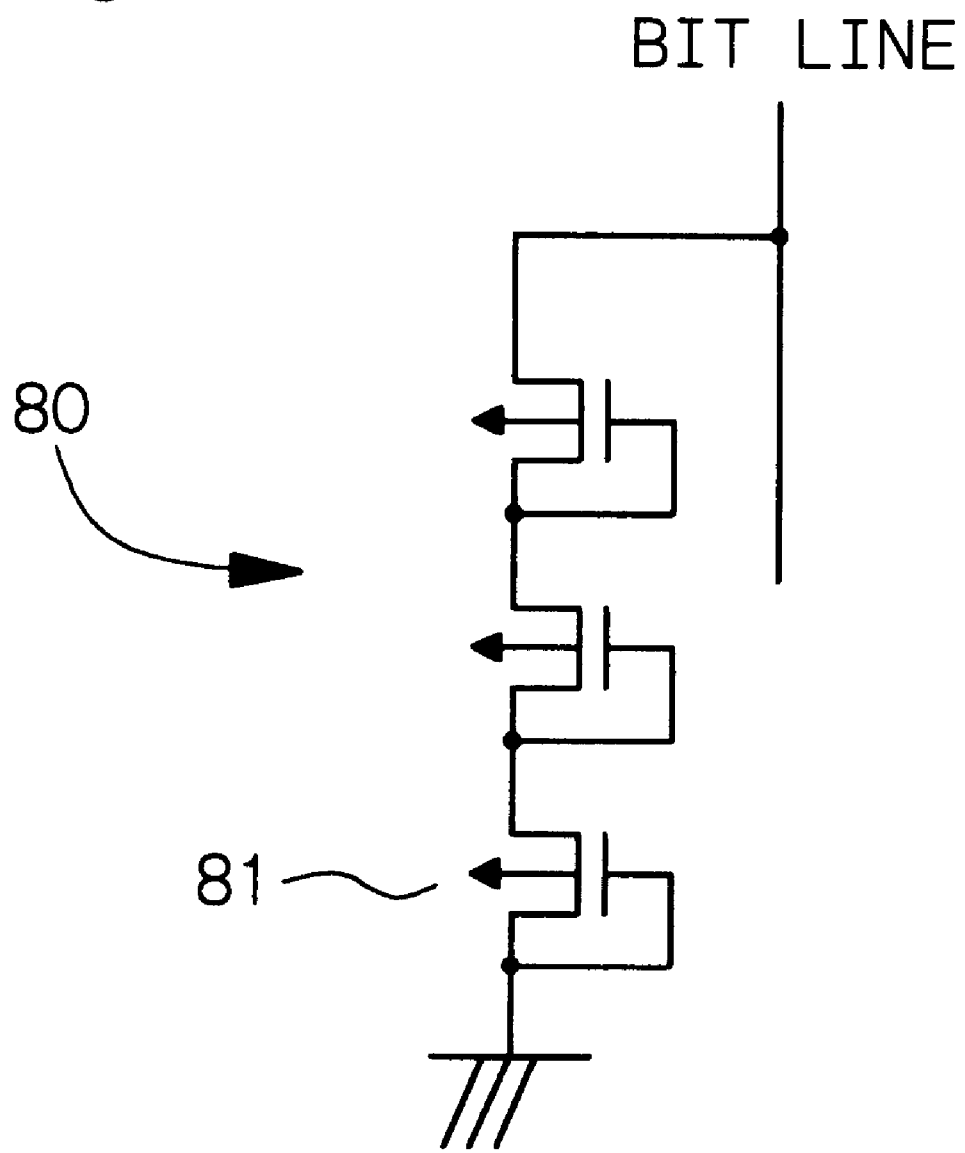
FIG. 28 is a circuit diagram of a clamp circuit in the ferroelectric-type nonvolatile semiconductor memory in Example 9.

The clamp circuit 80 whose clamp voltage has a negative temperature characteristic can be constituted of a conventional clamp circuit having a structure in which PMOS type FETS 81 whose drain portions and gate portions are short-circuited are connected in series as shown in the circuit diagram of FIG. 28. The clamp circuit 80 can be imparted with a desired clamp voltage value and a desired negative temperature characteristic by adjusting the stage number of the PMOS type FETs constituting the clamp circuit 80 and the impurity concentration of various semiconductor regions constituting the PMOS type FETS.

The above clamp circuits 80 whose clamp voltage has a negative temperature characteristic are connected to the bit lines $BL_1$ and $BL_2$, whereby the bit lines are clamped to a low voltage (potential) when the operation temperature of the nonvolatile memory is high, and the bit lines are clamped to a high voltage (potential) when the operation temperature of the nonvolatile memory is low. Therefore, even if the operation temperature of the nonvolatile memory comes to be high and the coercive voltage decreases, the voltage (potential) of the bit lines can be clamped to a low voltage (potential). As a result, the charge inversion of the capacitor members in non-selected memory cells can be prevented.

Preferably, a power source circuit for applying a voltage to the plate lines has an output that has a negative temperature characteristic. Specifically, the power source circuit 60 and the various reference-voltage circuits 61, 61A and 61B explained in Example 8 are preferably provided to the nonvolatile memory in Example 9.

The nonvolatile memory in Example 9 can be altered so as to have a constitution of the variant of the nonvolatile memory in Example 8.

The structure of the memory units or sub-memory units in the nonvolatile memory explained in any one of Examples 1 to 7 can be applied to the nonvolatile memory explained in Example 9.

EXAMPLE 10

Figure 29:
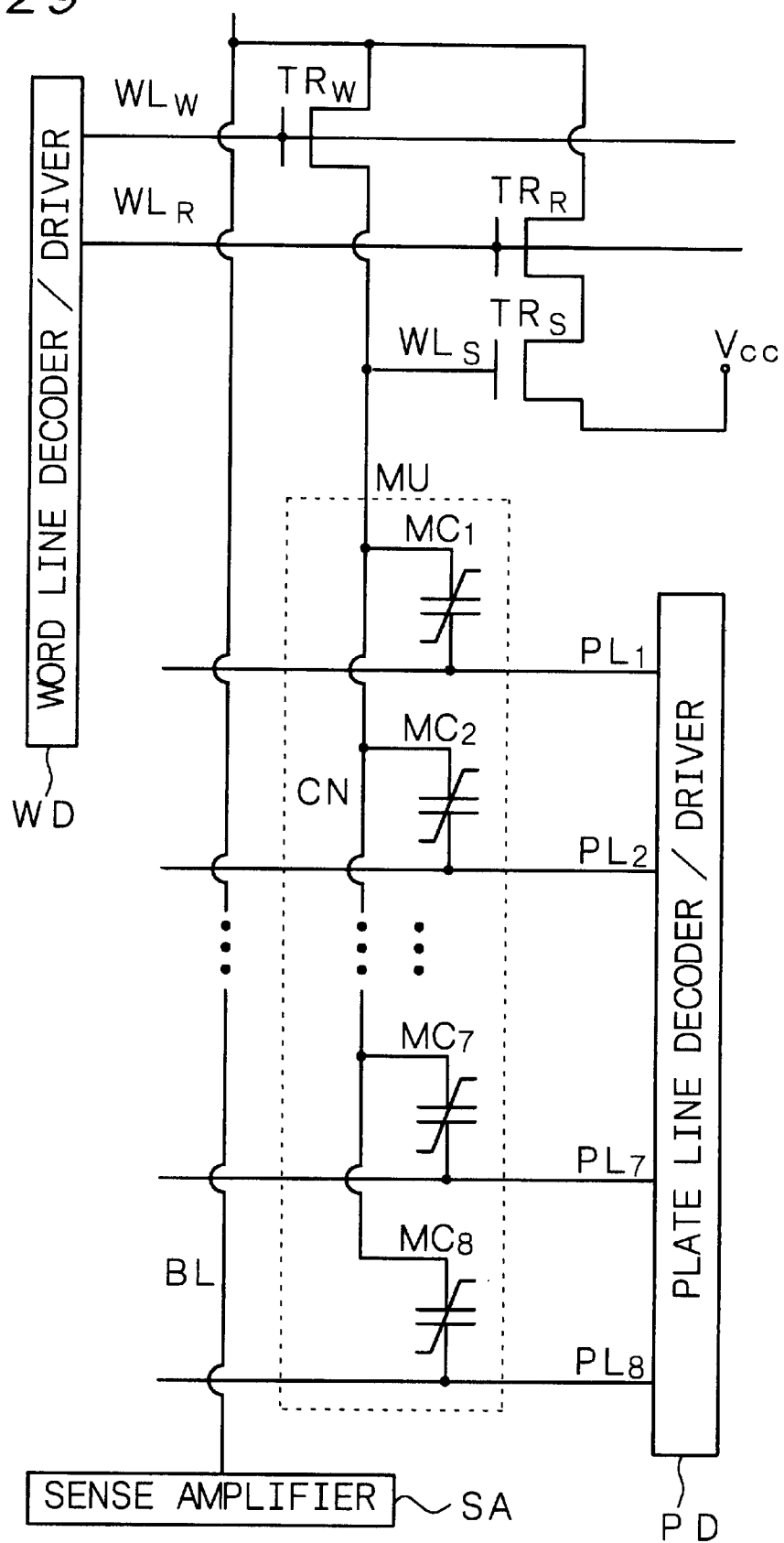
FIG. 29 is a circuit diagram of a ferroelectric-type nonvolatile semiconductor memory in Example 10.
Figure 30:
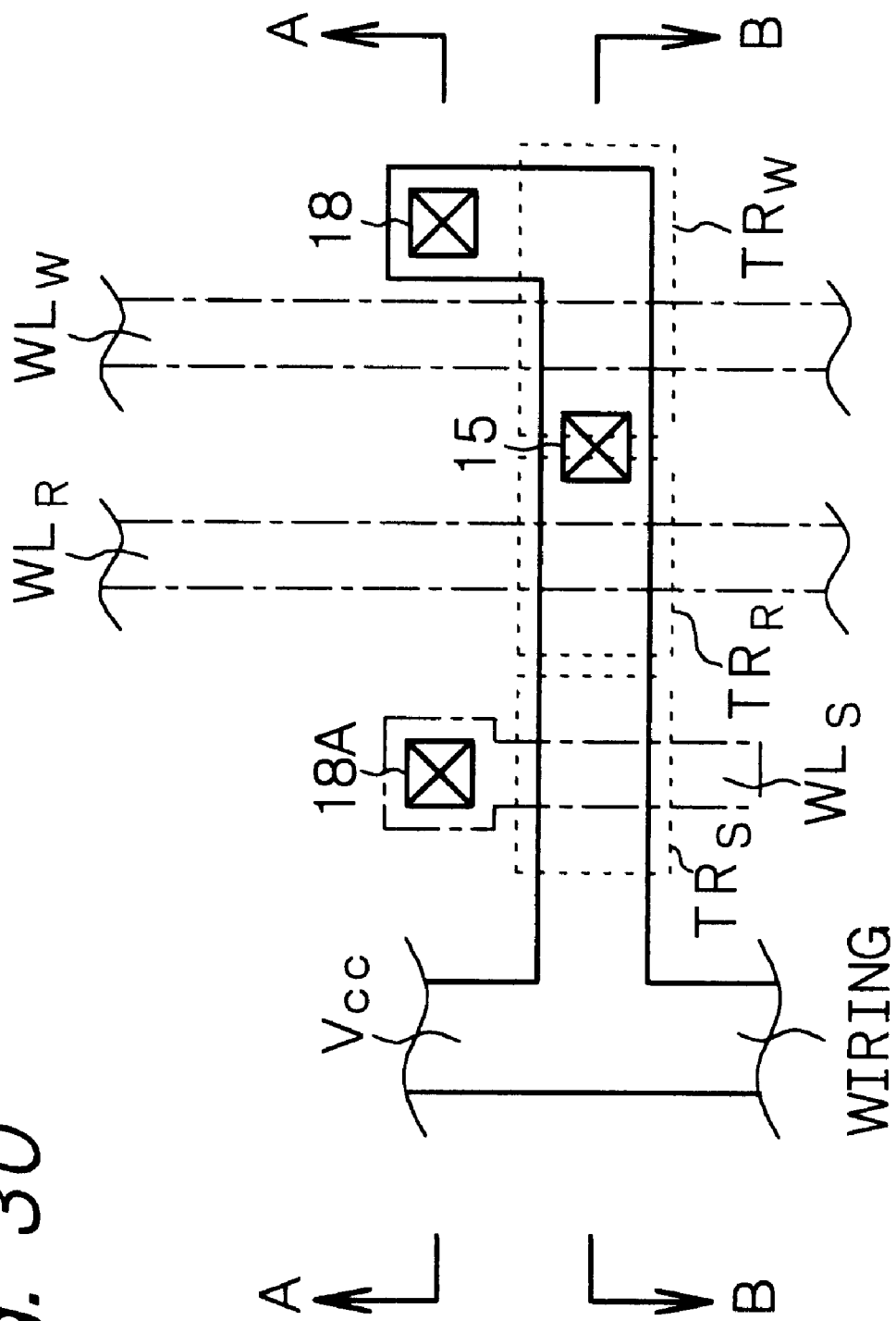
FIG. 30 is a layout of the ferroelectric-type nonvolatile semiconductor memory in Example 10.
Figure 31:
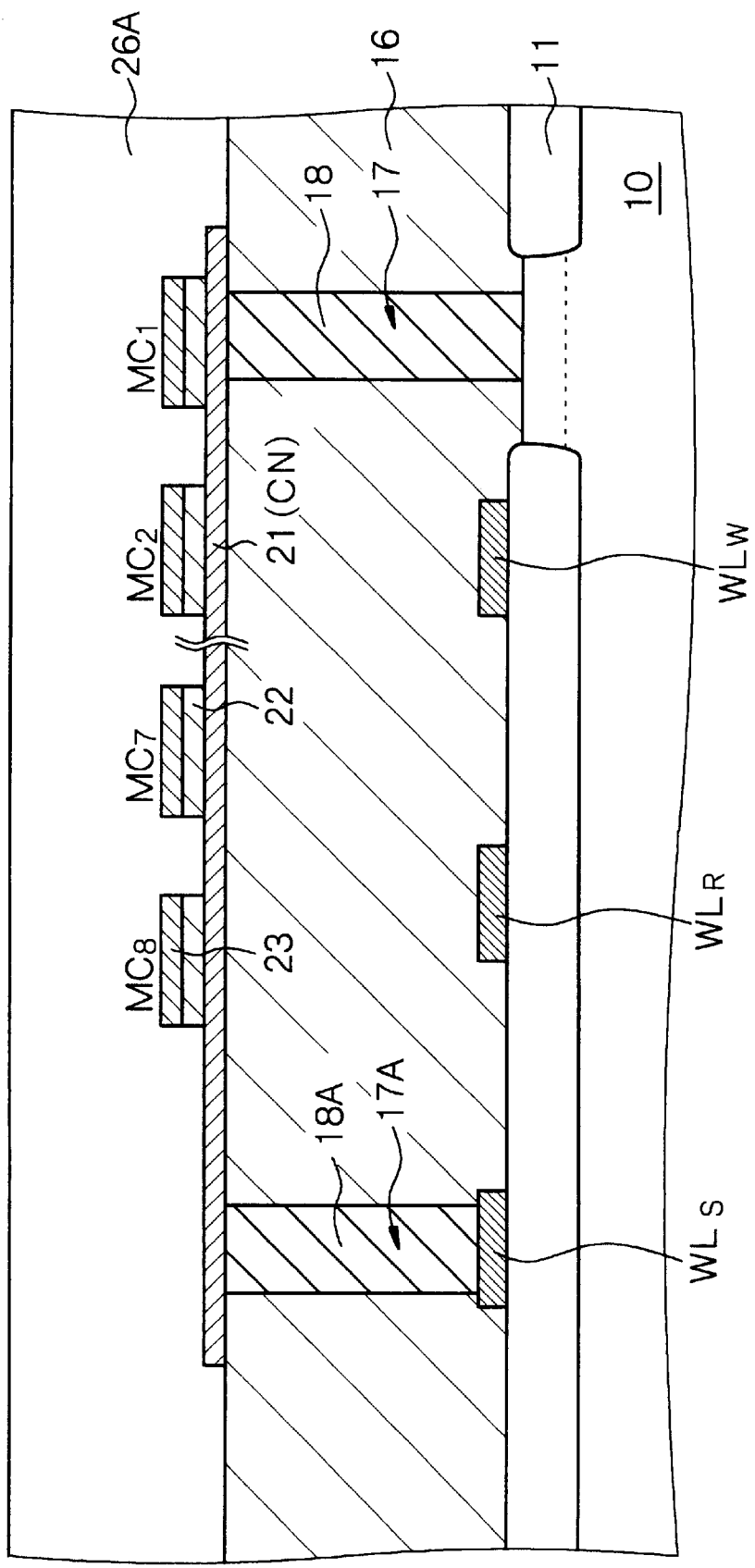
FIG. 31 is a schematic partial cross-sectional view of the ferroelectric-type nonvolatile semiconductor memory in Example 10.
Figure 32:
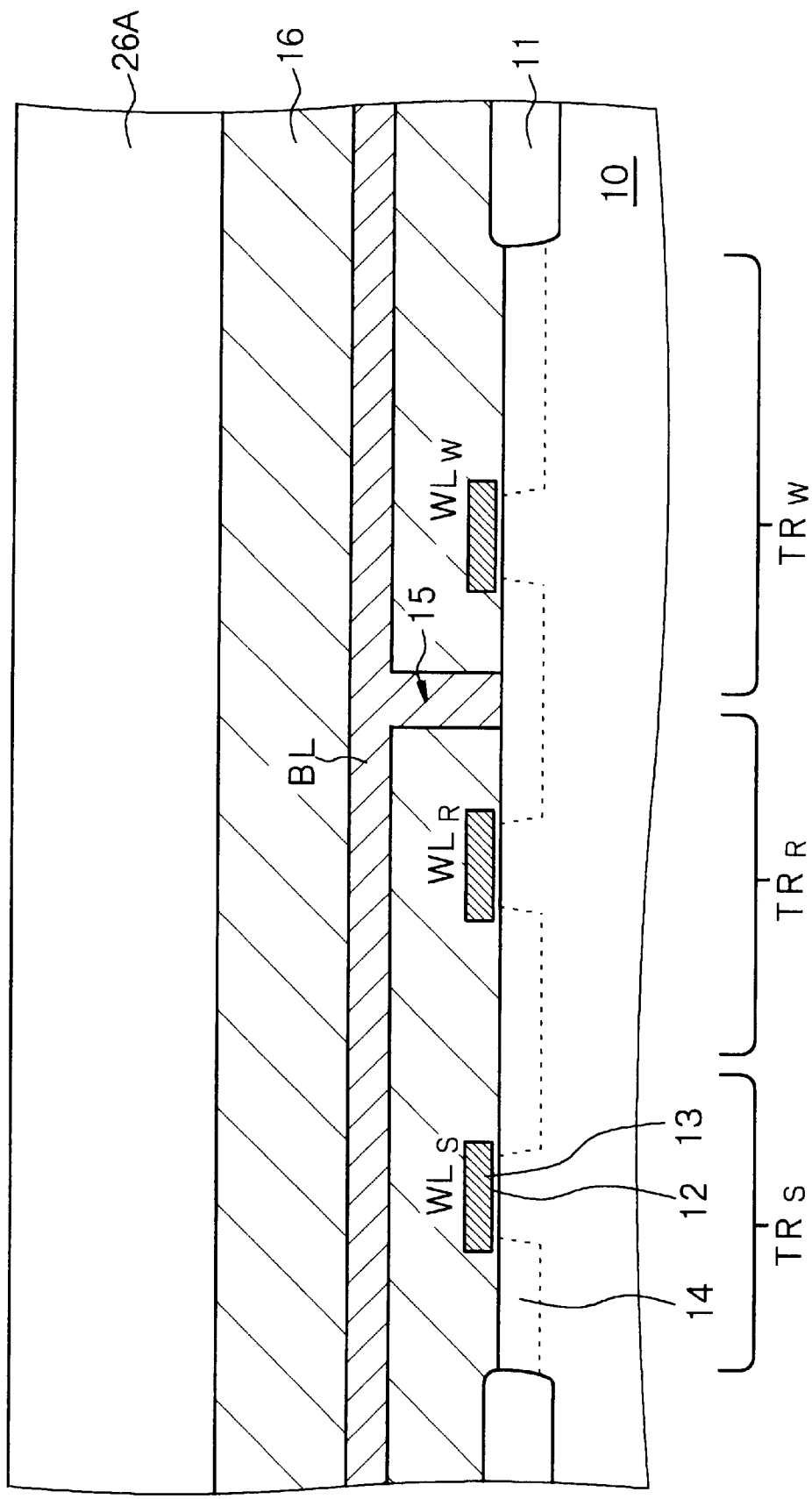
FIG. 32 is a schematic partial cross-sectional view of the ferroelectric-type nonvolatile semiconductor memory in Example 10 when a cross section different from that in FIG. 31 is taken.

Example 10 is concerned with the nonvolatile memory according to the ninth and tenth aspects of the present invention. FIG. 29 shows a circuit diagram of the nonvolatile memory in Example 10, FIG. 30 shows a schematic layout of various transistors constituting the nonvolatile memory, and FIGS. 31 and 32 show schematic partial cross-sectional views of the nonvolatile memory. In FIG. 30, a region of the various transistors is surrounded by a dotted line, an active region and a wiring are indicated by a solid line, and a gate electrode or a word line is indicated by a chain line. The schematic partial cross-sectional view of the nonvolatile memory shown in FIG. 31 is taken along a line A—A in FIG. 30, and the schematic partial cross-sectional view of the nonvolatile memory shown in FIG. 32 is taken along a line B—B in FIG. 30.

The nonvolatile memory in Example 10 is a so-called gain cell type nonvolatile memory, and comprises a bit line BL, a transistor for writing-in (an element in the nonvolatile memory according to the tenth aspect of the present invention and corresponding to a transistor for selection in the nonvolatile memory according to the ninth aspect of the present invention) $TR_W$, a memory unit MU comprising memory cells $MC_M$ in the number of M (provided that $M \geq 2$, and M=8 in Example 10), and plate lines $PL_M$ in the number of M. Each of the memory cells $MC_M$ comprises a first electrode 21, a ferroelectric layer 22 and a second electrode 23. The first electrodes 21 of the memory cells $MC_M$ constituting the memory unit MU are in common in the memory unit MU. The common first electrode (common node CN) is connected to the bit line BL through the transistor for writing-in $TR_W$. The second electrode 23 constituting the memory cell $MC_m$ is connected to the plate line $PL_m$. Each memory cell $MC_M$ is covered with an insulation film 26A. The number (M) of the memory cells constituting the memory unit MU of the nonvolatile memory shall not be limited to eight (8), and it is any number so long as it satisfies $M \geq 2$. The above number is preferably an exponent of 2 (M=2, 4, 8, 16 . . . ).

Further, the nonvolatile memory in Example 10 has a signal detective circuit for detecting a potential change in the common first electrode and transmitting the detection result to the bit line as a current or a voltage. In other words, it has a transistor for detection $TR_S$ and a transistor for read-out $TR_R$. The signal detective circuit comprises the transistor for detection $TR_S$ and the transistor for read-out $TR_R$. And, one end of the transistor for detection $TR_S$ is connected to a wiring having a predetermined potential $V_{CC}$ (for example, power source line formed of an impurity layer), and the other end is connected to the bit line BL through the transistor-for read-out $TR_R$. When data stored in each memory cell $MC_m$ is read out, the transistor for read-out $TR_R$ is brought into a continuity state, and the operation of the transistor for detection $TR_S$ is controlled by a potential generated in the first electrode (common node CN) according to data stored in each memory cell $MC_m$.

Specifically, the various transistors are constituted of MOS type FETs, one source/drain region of the transistor for writing-in $TR_W$ (transistor for selection) is connected to the bit line BL through a contact hole 15 made in an insulation layer 16, and the other source/drain region is connected to the first electrode (common node CN) trough a contact hole 18 made in an opening portion 17 made in the insulation layer 16. Further, one source/drain region of the transistor for detection $TR_S$ is connected to the wiring having a predetermined potential $V_{CC}$, and the other source/drain region thereof is connected to one source/drain region of the transistor for read-out $TR_R$. More specifically, the other source/drain region of the transistor for detection $TR_S$ and the one source/drain region of the transistor for read-out $TR_R$ occupy (share) one source/drain region, and further, the other source/drain region of the transistor for read-out $TR_R$ is connected to the bit line BL through the contact hole 15. Further, the common first electrode (common node CN or the other source/drain region of the transistor for writing-in $TR_W$) is connected to the gate electrode of the transistor for detection $TR_S$ through a contact hole 18A made in an opening portion 17A and the word line $WL_S$. Further, the word line $WL_W$ connected to the gate electrode of the transistor for writing in $TR_W$ and the word line $WL_R$ connected to the gate electrode of the transistor for read-out $TR_R$ are connected to a word line decoder/driver WD. Each plate line $PL_m$ is connected to a plate line decoder/driver PD. Further, the bit line BL is connected to a sense amplifier SA.

Figure 33:
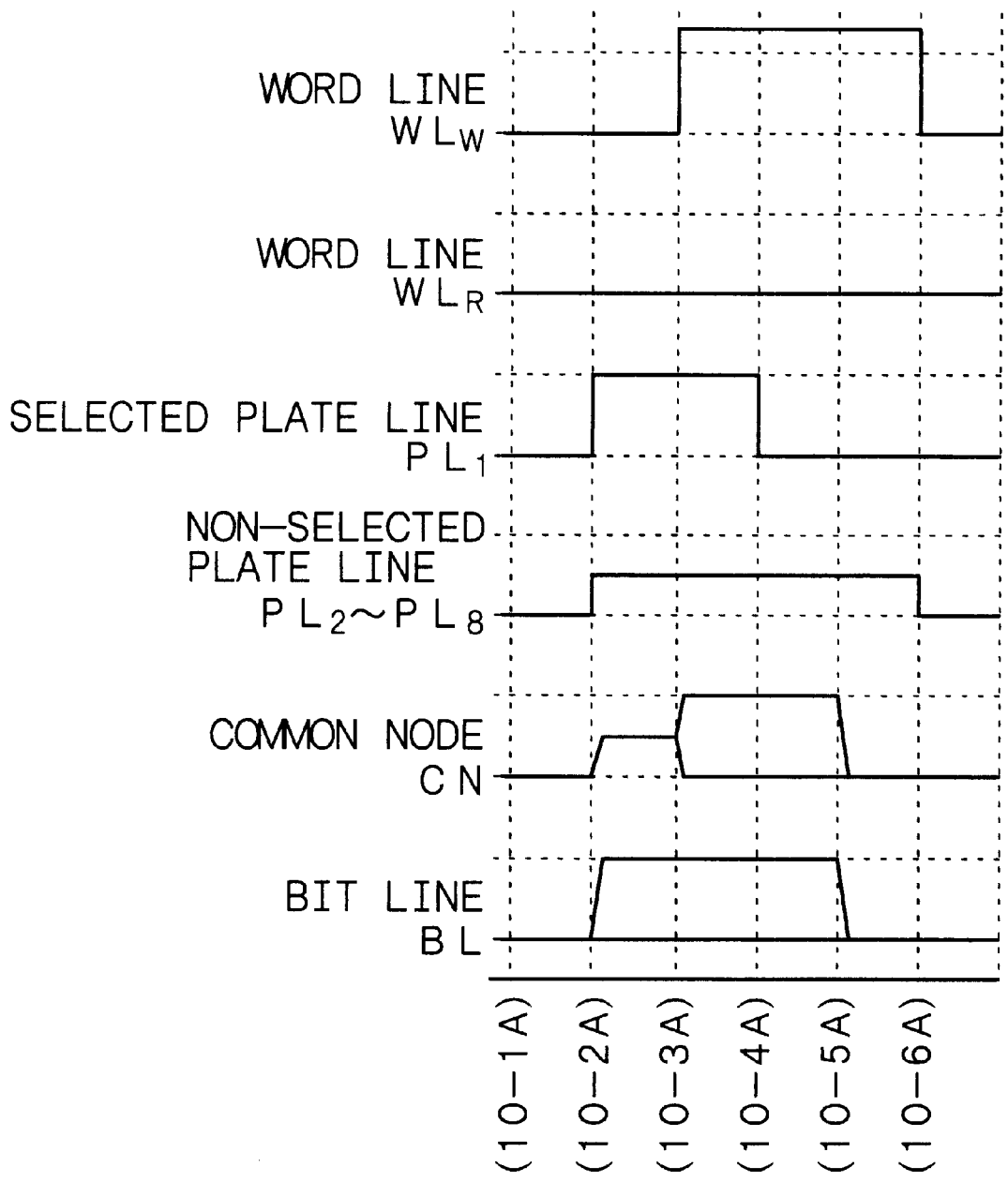
FIG. 33 is a diagram of operation waveforms in the operation of writing data into the ferroelectric-type nonvolatile semiconductor memory in Example 10.
Figure 34:
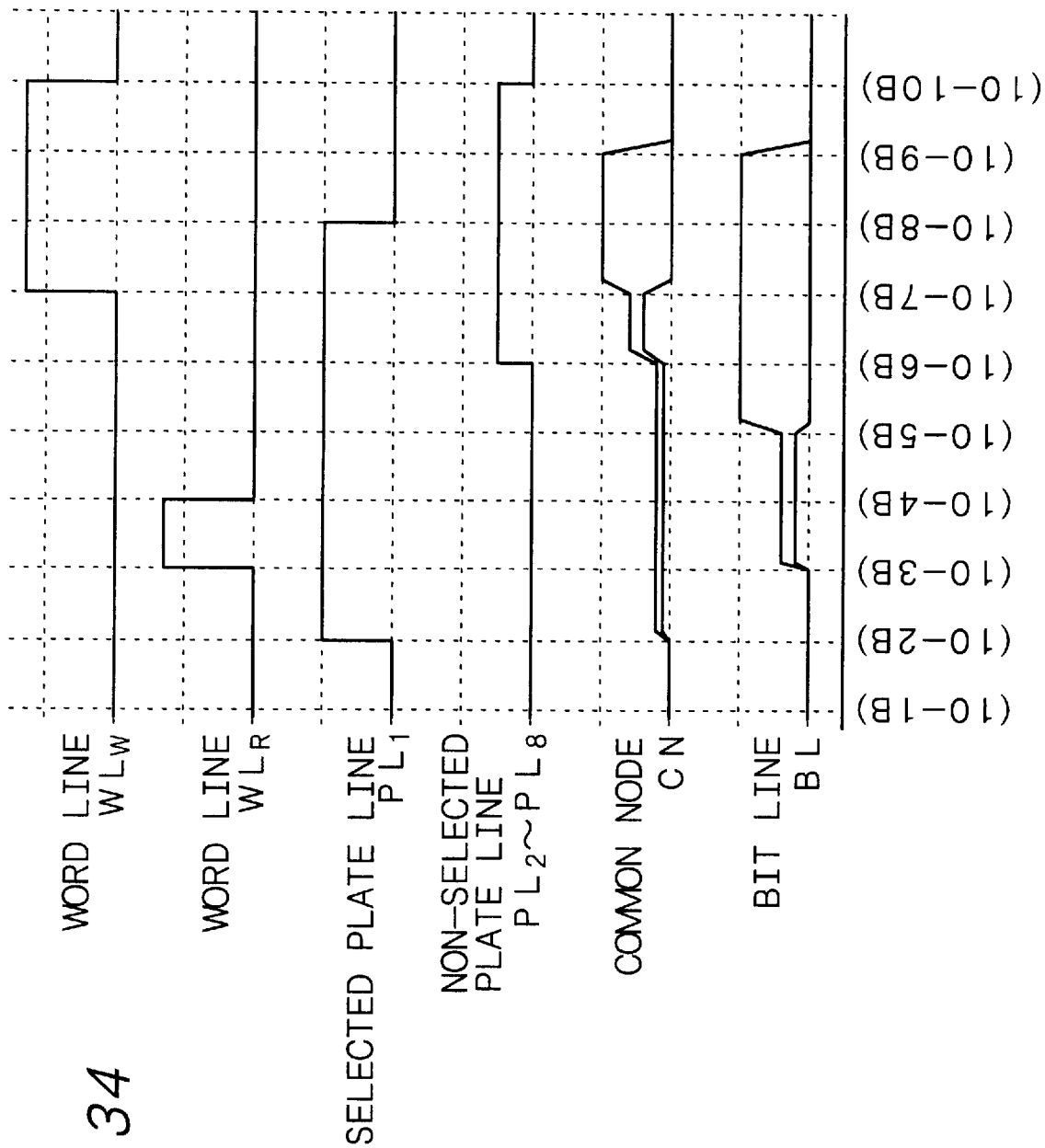
FIG. 34 is a diagram of operation waveforms in the operation of reading out data from, and re-writing data into, the ferroelectric-type nonvolatile semiconductor memory in Example 10.

First, the operation of writing data into the nonvolatile memory in Example 10 will be explained below. As one example, it is assumed that data is written into the memory cell $MC_1$ connected to the plate line $PL_1$. FIG. 33 shows operation waveforms. In FIG. 33 and FIG. 34 to be discussed later, parenthesized numbers correspond to Nos. of steps to be explained below.

(10-1A) In a standby state, the bit line, the word line and all the plate lines have 0 volt. Further, the common node CN also has 0 volt and is in a floating state.

(10-2A) When writing of data is started, the selected plate line $PL_1$ is allowed to have a potential of $V_{CC}$, and the non-selected plate lines $PL_k$ (k=2, 3 . . . 8) are allowed to have a potential of $(1/2)V_{CC}$, whereby the potential of the common node CN in a floating state increases close to $(1/2)V_{CC}$ due to its coupling with the plate lines $PL_M$. When data "1" is written into the selected memory cell, the bit line BL is allowed to have a potential of $V_{CC}$, and when data "0" is written, the bit line BL is allowed to have a potential of 0 volt.

(10-3A) Then, the transistor for writing-in $TR_W$ is brought into an ON-state, whereby the potential of the common node comes to be $V_{CC}$ when data "1" is written into the selected memory cell or comes to be 0 volt when data "0" is written. Since the selected plate line $PL_1$ is in a state where $V_{CC}$ is applied, data "0" is written into the selected memory cell when the common node has a potential of 0 volt, therefore. On the other hand, when the common node has a potential of $V_{CC}$, no data is written into the selected memory cell.

(10-4A) Then, the selected plate line $PL_1$ is allowed to have a potential of 0 volt. When the common node has a potential of $V_{CC}$, data "1" is written into the selected memory cell. When data "0" is already written into the selected memory cell, no change takes place in the selected memory cell.

(10-5A) Then, 0 volt is applied to the bit line BL.

(10-6A) Further, the non-selected plate lines $PL_k$ are allowed to have 0 volt, and the transistor for writing-in $TR_W$ is brought into an OFF-state.

When data is written into each of other memory cells $MC_m$ (m=2, 3 . . . 8), the above procedures are repeated. In the above writing operation, a disturbance of $(\pm 1/2)V_{CC}$ takes place in the non-selected memory cells. However, the destruction of data in the non-selected memory cell $MC_k$ can be reliably prevented by properly setting the value of $V_{CC}$.

The operation of reading out data from, and re-writing data into, the nonvolatile memory in Example 10 will be explained below. As an example, it is assumed that data is read out from, and data is written into, the memory cell $MC_1$ connected to the plate line $PL_1$. FIG. 34 shows operation waveforms.

(10-1B) In a standby state, the bit line, the word line and all the plate lines have 0 volt. Further, the common node CN has 0 volt and is in a floating state.

(10-2B) When data is read out, $V_{CC}$ is applied to the selected plate line $PL_1$. In this case, when data "1" is already stored in the selected memory cell $MC_1$, polarization inversion takes place in the ferroelectric layer, and an accumulated charge amount increases, so that the potential of the common node CN increases. On the other hand, when data "0" is stored in the selected memory cell $MC_1$, no polarization inversion takes place, and there is no or little increase in the potential of the common node CN. That is, since the common node CN is coupled with a plurality of non-selected plate lines $PL_k$ through the ferroelectric layer, the potential of the common node CN is maintained at a level relatively close to 0 volt. In this manner, a change takes place in the potential of the common node CN depending upon the data stored in the selected memory cell $MC_1$, so that the ferroelectric layer of the selected memory cell can be provided with an electric field sufficient for polarization inversion thereof.

(10-3B) Then, the bit line BL is brought into a floating state, and the transistor for read-out $TR_R$ is brought into an ON-state. On the other hand, the operation of the transistor for detection $TR_S$ is controlled by the potential that takes place in the common first electrode (common node CN) on the basis of the data stored in the memory cell $MC_1$. Specifically, if a high potential takes place in the common first electrode (common node CN) on the basis of the data stored in the selected memory cell $MC_1$, the transistor for detection $TR_S$ comes into a continuity state. Since one source/drain region of the transistor for detection $TR_S$ is connected to the wiring having a potential of $V_{CC}$, an electric current flows from the wiring to the bit line BL through the transistor for detection $TR_S$ and the transistor for read-out $TR_R$, and the potential of the bit line BL increases. That is, the first electrode (common node CN) is detected for a change in potential with the signal detective circuit, and the detection result is transmitted to the bit line BL as a voltage (potential). In this case, the bit line BL has a potential of approximately $(V_g-V_{th})$, in which $V_{th}$ is a threshold voltage of the transistor for detection $TR_S$ and $V_g$ is a potential of the transistor for detection $TR_S$ (i.e., potential of the common node CN). When the transistor for detection $TR_S$ is a depression type NMOS-FET, the threshold voltage $V_{th}$ comes to be a negative value. In this manner, a stable sense signal amount can be ensured regardless of whether the load on the bit line BL is large or small. The transistor for detection $TR_S$ may be formed of a PMOS-FET.

(10-4B) Then, the transistor for read-out $TR_R$ is brought into an OFF-state. Then, the potential of the bit line BL is latched with the sense amplifier SA connected to the bit line BL, and the sense amplifier SA is activated to amplify the data, whereby the readout of the data is completed.

In the above operation, data already stored in the selected memory cell is once destroyed, so that the data will be re-written.

(10-5B) For this purpose, first, the bit line BL is charged and discharged with the sense amplifier SA, and $V_{CC}$ or 0 volt is applied to the bit line BL.

(10-6B) Then, the non-selected plates line $PL_k$ (k=2, 3 . . . 8) is allowed to have a potential of $(1/2)V_{CC}$.

(10-7B) Then, the transistor for writing-in $TR_W$ is brought into an ON-state, whereby the potential of the common node CN comes to be equal to the potential of the bit line BL. That is, when the data stored in the selected memory cell $MC_1$ is "1", the common node CN comes to have a potential of $V_{CC}$, and when the data stored in the selected memory cell $MC_1$ is "0", the common node CN comes to have a potential of 0 volt. The potential of the selected plate line $PL_1$ continues to be $V_{CC}$, so that, data "0" is re-written into the selected memory cell $MC_1$ when the common node CN has 0 volt.

(10-8B) Then, the selected plate line $PL_1$ is allowed to have a potential of 0 volt. Therefore, when the data already stored in the selected memory cell $MC_1$ is "1", data "1" is re-written since the common node CN has a potential of $V_{CC}$. When data "0" is already re-written into the selected memory cell $MC_1$, no change takes place in the memory cell.

(10-9B) Then, the bit line BL is allowed to have 0 volt.

(10-10B) Finally, the non-selected plate lines $PL_k$ are allowed to have 0 volt, and the transistor for writing-in $TR_W$ is brought into an OFF-state.

When data is read out from, and re-written into, each of other memory cells $MC_m$ (m=2, 3 . . . 8), the above operation is repeated.

In the above step (10-2B), the number (M) of the memory cells constituting the memory unit MU is required to be such a number for providing the ferroelectric layer of the selected memory cell with a sufficiently great electric field so that polarization inversion reliably takes place in the ferroelectric layer. That is, when the value of M is too small, the potential of the first electrode in a floating state increases to a great extent due to a coupling of the second electrode with the first electrode when $V_{CC}$ is applied to the selected plate line $PL_1$ in the step (10-2B), and no sufficient electric field is formed between the second electrode and the first electrode, so that polarization inversion not longer takes place in the ferroelectric layer. The potential (called "signal potential") that appears in the first electrode is a value obtained by dividing the accumulated charge amount by a load capacity. Therefore, when the value of M is too large, the potential that appears in the first electrode is too low.

Figure 35:
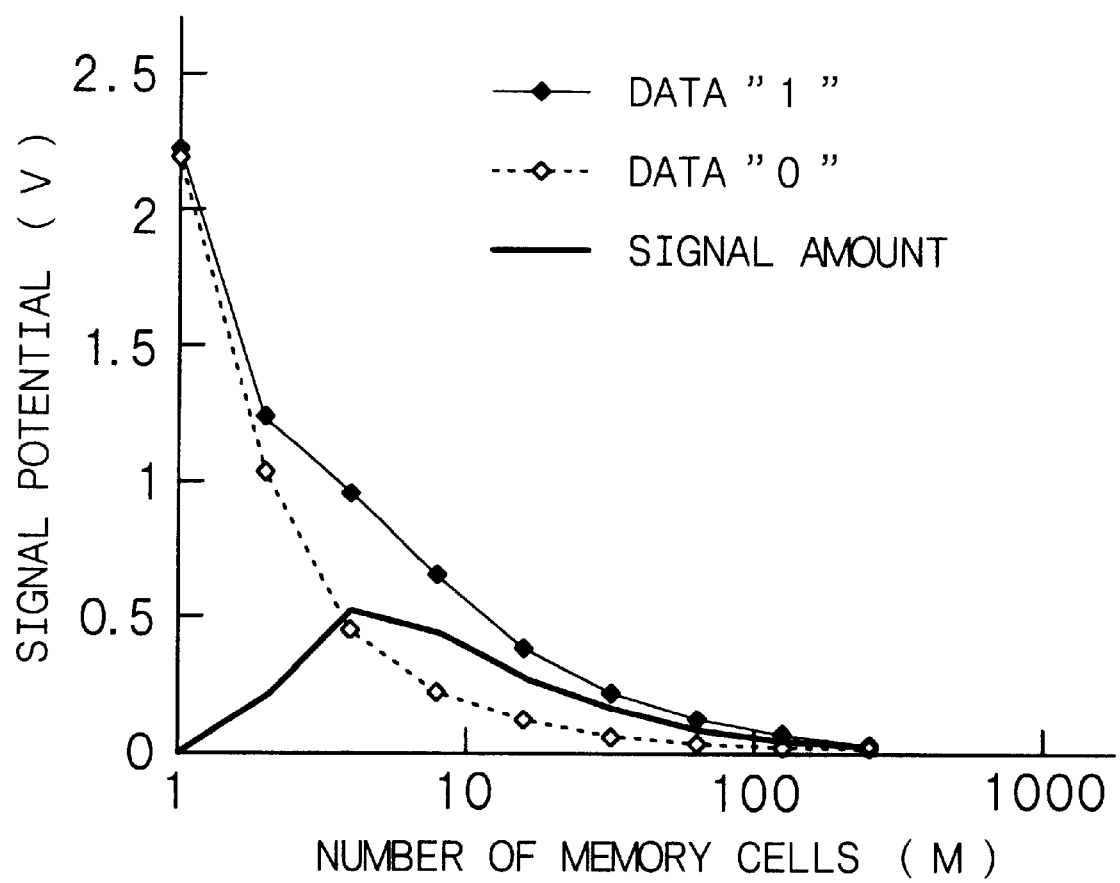
FIG. 35 is a graph showing simulation results of a relationship between the value of the number (M) of memory cells constituting a sub-memory unit and a signal potential in Example 10.

FIG. 35 shows simulation results of a relationship between the value of M and the signal potential. In the simulation, the relationship between the number (M) of the memory cells and the signal potential in the circuit shown in FIG. 29 was determined on the basis of found values of hysteresis of the ferroelectric layer in the memory cells. Each of the ferroelectric layers constituting the memory cells had an area of 0.5 $\mu m^2$, the common node (CN) other than the memory cells had a load capacity (mainly, a gate capacity of the transistor for detection $TR_S$) of 2 fF, and the power source had a voltage $V_{CC}$ of 2.5 volts.

When $V_{CC}$ is applied to the selected plate line $PL_1$, and when data "1" is already stored in the selected memory cell, an electric field is generated between the first electrode and the second electrode in such a direction that the polarization of the ferroelectric is inverted. Therefore, the signal potential from the above selected memory cell (a potential that appears in the first electrode in a floating state and a potential $V_g$ that is applied to the gate electrode of the transistor for detection $TR_S$) comes to be higher than that when data "0" is already stored. With an increase in the difference between a signal potential when data "1" is already stored and a signal potential when data "0" is already stored, the reliably in readout of data is improved.

Figure 57A:
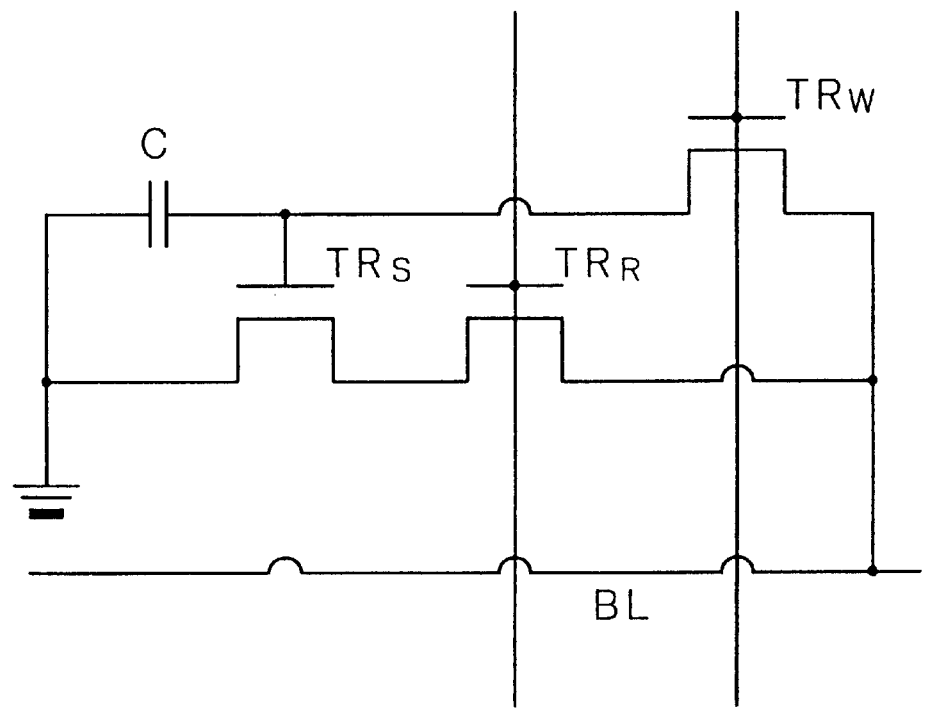
FIGS. 57A and 57B are a circuit diagram of a gain cell in DRAM and a circuit diagram when the gain cell is applied to the conventional ferroelectric-type nonvolatile semiconductor memory disclosed in U.S. Pat. No. 4,873,664, respectively.
Figure 57B:
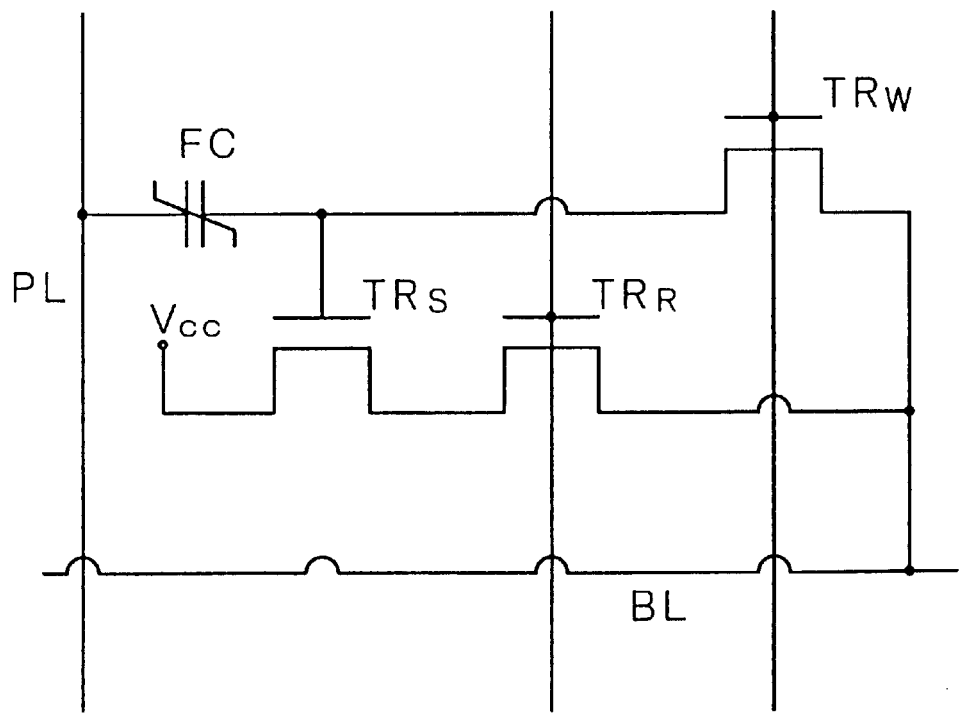

When the value of M is 1, the circuit in this case is equivalent to the circuit shown in FIG. 57B, and the load capacity in the common node CN is too small. As a result, both the potential when data "1" is already stored and the potential when data "0" is already stored increase up to approximately 2.2 volts, and the potential difference from the $V_{CC}$(=2.5 volts) applied to the selected plate line $PL_1$ is only approximately 0.3 volt. The polarization inversion of the ferroelectric layer is therefore insufficient, and it is difficult to read out data from the selected memory cell.

When the value of M is 2 or more, the potential difference (shown as "signal amount" in FIG. 35) between $V_{CC}(=2.5$ volts) applied to the selected plate line $PL_1$ and the signal potential is sufficiently large in the selected memory cell, so that data can be reliably read out from the selected memory cell. With an increase in the value of M, the load capacity of the common node CN increases. When the value of M exceeds a certain level, the value of the signal amount that is a potential difference between $V_{CC}$ applied to the selected plate line $PL_1$ and the signal potential starts to decrease.

As explained above, the value of M has an optimum value, and it has been found that the optimum value of M is in the range of $2 \leq M \leq 128$, preferably $4 \leq M \leq 32$.

The structure of the memory unit explained in Example 1 can be applied to the nonvolatile memory in Example 10, and the nonvolatile memory explained in Example 8 or 9 can be also applied to Example 10.

EXAMPLE 11

Figure 36:
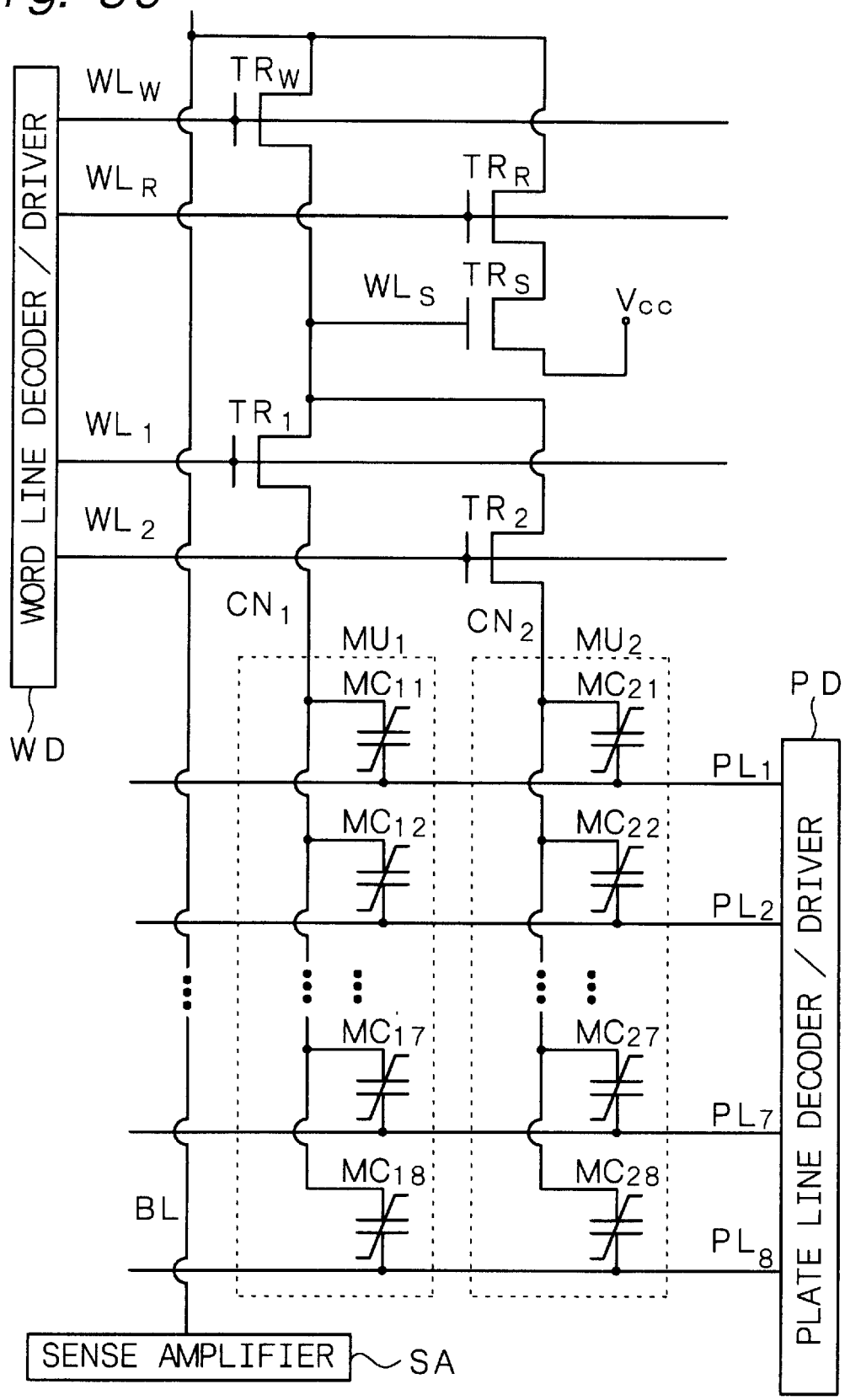
FIG. 36 is a circuit diagram of a ferroelectric-type nonvolatile semiconductor memory in Example 11.
Figure 37:
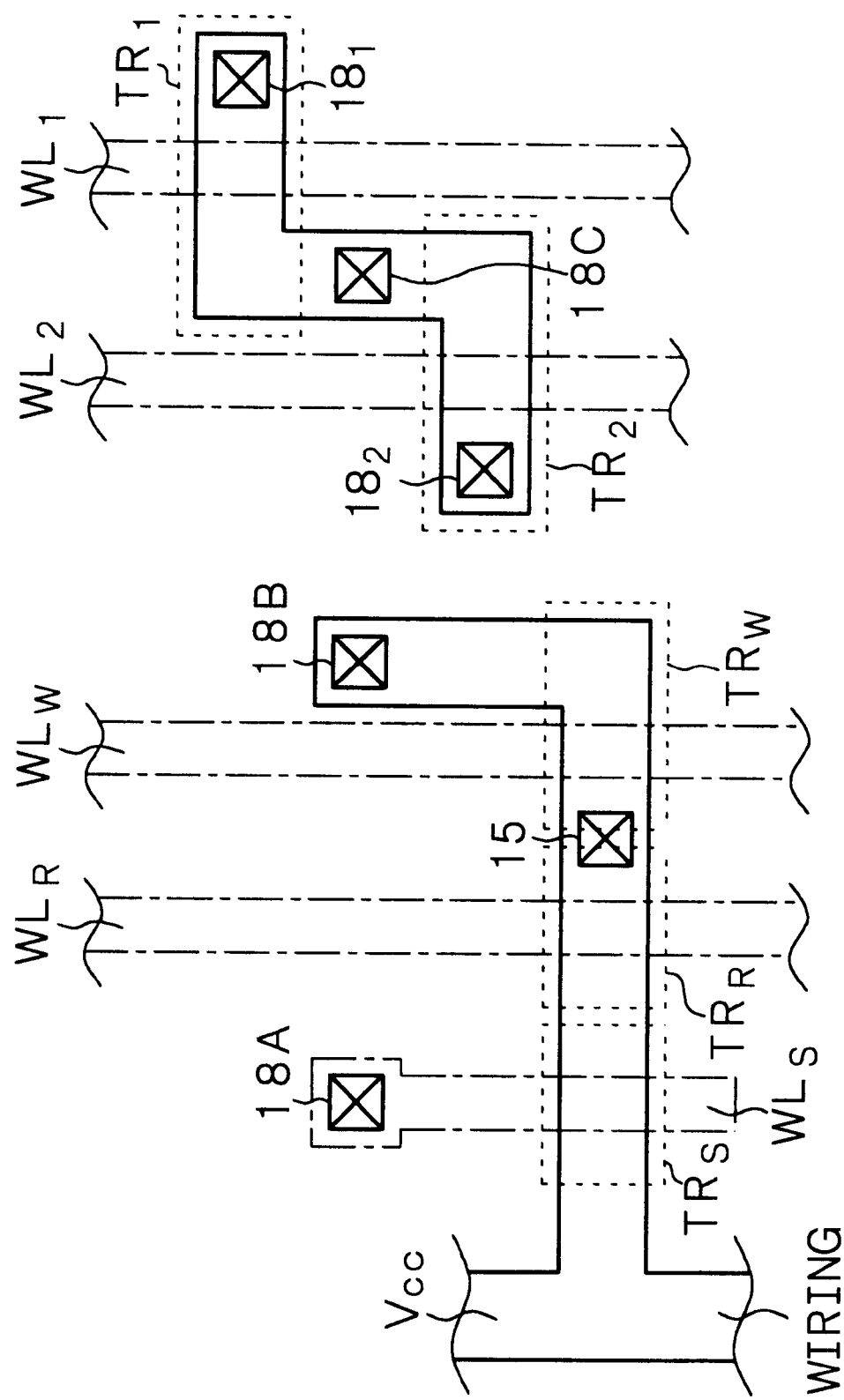
FIG. 37 is a layout of the ferroelectric-type nonvolatile semiconductor memory in Example 11.
Figure 38:
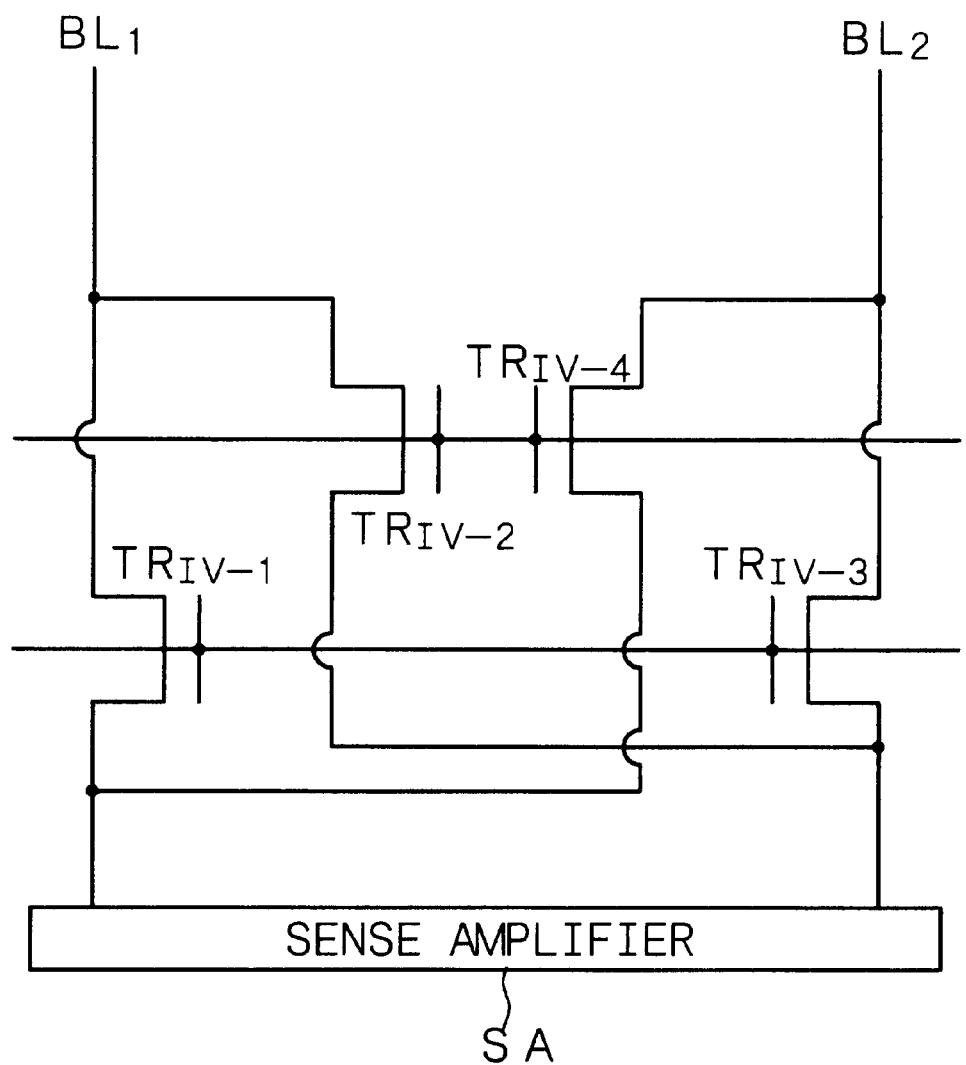
FIG. 38 is a circuit diagram of kind of a switch circuit provided between bit lines when the potential of a wiring to which one end of a transistor for selection is connected is at 0 volt.

Example 11 is concerned with the nonvolatile memory according to the eleventh aspect of the present invention. FIG. 36 shows a circuit diagram of a nonvolatile memory in Example 11, and FIG. 37 shows a schematic layout of various transistors constituting the nonvolatile memory. In FIG. 37, a region of the various transistors is surrounded by a solid line, an active region and a wiring are indicated by a solid line, and a gate electrode or a word line is indicated by a chain line.

The nonvolatile memory of Example 11 is also a so-called gain cell type nonvolatile memory, and it comprises a bit line BL, a transistor for writing-in $TR_W$, memory units $MU_1$ and $MU_2$ in the number of N (provided that $N \geq 2$, and N=2 in Example 11), each memory unit comprising memory cells $MC_{NM}$ in the number of M (provided that $M \geq 2$, and M=8 in Example 11), transistors for selection $TR_1$ and $TR_2$ in the number of N, and plate lines $PL_m$ in the number of M. The plate line $PL_m$ constituting the memory cell $MC_{1m}$ in the memory unit $MU_1$ is common to the plate line $PL_m$ constituting the memory cell $MC_{2m}$ in the memory unit $MU_2$.

Each of the memory cells $MC_{nm}$ comprises a first electrode 21, a ferroelectric layer 22 and a second electrode 23. The first electrodes 21 of the memory cells $MC_{1M}$ or $MC_{2M}$ constituting the n-th memory unit $MU_1$ or $MU_2$ (n=1, 2 ... N, and n=1 and 2 in Example 11) are in common in the n-th memory unit $MU_1$ or $MU_2$, and the common first electrode (common node $CN_1$ or $CN_2$) is connected to the bit line BL through the n-th transistor for selection $TR_1$ or $TR_2$ and the transistor for writing-in $TR_W$. The second electrode is connected to the common plate line $PL_m$. The number (M) of the memory cells constituting the memory units $MU_1$ and $MU_2$ of the nonvolatile memory shall not be limited to eight (8), and it can be generally any number so long as it satisfies $M \geq 2$. The above number is preferably an exponent of 2 (M=2, 4, 8, 16 ...). The number of N is not limited to 2, either, and it can be an exponent of 2 (2, 4, 8 ...).

Further, the nonvolatile memory in Example 11 has a transistor for detection $TR_S$ and a transistor for read-out $TR_R$. One end of the transistor for detection $TR_S$ is connected to a wiring (power source line formed of an impurity layer) having a predetermined potential $V_{CC}$, and the other end thereof is connected to the bit line BL through the transistor for read-out $TR_R$. When data stored in the memory cell $MC_{1m}$ or $MC_{2m}$ constituting the n-th memory unit $MU_1$ or $MU_2$ is read out, the n-th transistor for selection $TR_1$ or $TR_2$ and the transistor for read-out $TR_R$ are brought into a continuity state, and the operation of the transistor for detection $TR_S$ is controlled by a potential generated in the common first electrode (common node $CN_1$ or $CN_2$) on the basis of the data stored in the memory cells $MC_{1m}$ or $MC_{2m}$.

Specifically, the various transistors are formed of MOS type FETs, and one source/drain region of the transistor for writing-in $TR_W$ is connected to the bit line BL through a contact hole 15, and other source/drain region thereof is connected to one source/drain region of each of the transistors for selection $TR_1$ and $TR_2$ through a contact hole 18B, an auxiliary bit line (not shown) and a contact hole 18C. The other source/drain region of each of the transistors for selection $TR_1$ and $TR_2$ is connected to the common first electrode (common node $CN_1$ or $CN_2$) constituting the memory unit $MU_1$ or $MU_2$ through a contact hole $18_1$ or $18_2$. One source/drain region of the transistor for detection $TR_S$ is connected to the wiring having a predetermined potential $V_{CC}$, and the other source/drain region thereof is connected to one source/drain region of the transistor for read-out $TR_R$. The other source/drain region of the transistor for read-out $TR_R$ is connected to the bit line BL through the contact hole 15. Further, the common first electrodes (common node $CN_1$ and $CN_2$ or the other source/drain region of the transistor for writing-in $TR_W$) constituting the memory unit $MU_1$ and $MU_2$ are connected to the gate electrode of the transistor for detection $TR_S$ through an auxiliary bit line and a contact hole 18A. The other source/drain region of the transistor for detection $TR_S$ and the one source/drain region of the transistor for read-out $TR_R$ occupy (share) one source/drain region. Further, the word line $WL_W$ connected to the gate electrode of the transistor for writing-in $TR_W$, the word line $WL_R$ connected to the gate electrode of the transistor for read-out $TR_R$ and the word lines $WL_1$ and $WL_2$ connected to the gate electrodes of the transistors for selection $TR_1$ and $TR_2$ are connected to a word line decoder/driver WD. Each plate line $PL_m$ is connected to a plate line decoder/driver PD. Further, the bit line BL is connected to a sense amplifier SA.

Each of the memory units $MU_1$ and $MU_2$ can have substantially the same structure as that of the memory unit MU explained in Example 10, so that the detailed explanation thereof is omitted. The common first electrode (common node $CN_1$) constituting the memory unit $MU_1$ is connected to the other source/drain region of the transistor for selection $TR_1$ through the contact hole $18_1$ made in an insulation layer 16. The common first electrode (common node $CN_2$) constituting the memory unit $MU_2$ is connected to the other source/drain region of the transistor for selection $TR_2$ through the contact hole $18_2$ made in the insulation layer 16. Further, the one source/drain region of the transistor for writing-in $TR_W$ and the other source/drain region of the transistor for read-out $TR_R$ are connected to the bit line BL formed on a lower insulation layer through the contact hole 15 made in a lower insulating layer. Further, one source/drain region of each of the transistors for selection $TR_1$ and $TR_2$, the other source/drain region of the transistor for writing-in $TR_W$ and the gate electrode (word line $WL_S$) of the transistor for detection $TR_S$ are connected to an auxiliary bit line (not shown) formed on the lower insulation layer through contact holes 18C, 18B and 18A made in the lower insulation layer. The above auxiliary bit line extends on the lower layer and is connected to the bit line BL.

Since the nonvolatile memory of Example 11 has a plurality of memory units, the cell area per bit can be further decreased as compared with the nonvolatile memory explained in Example 10. That is, the size (occupation area) of the nonvolatile memory in Example 11 is in principle determined depending upon the pitch and the number (value of M) of the plate lines $PL_M$ in one direction and depending upon the pitch and the number (value of N) of the common nodes in the direction perpendicular to the above direction. The area (size) of the region that the nonvolatile memory occupies in the semiconductor substrate is determined depending upon the area (size) that the transistors for selection $TR_1$ and $TR_2$ occupy. The transistor for writing-in $TR_W$, the transistor for read-out $TR_R$ and the transistor for detection $TR_S$ can be formed in an empty region of the semiconductor substrate, and the area of the empty region increases with an increase in the number (N) of the memory units and the number (M) of the memory cells constituting the memory units. When the transistor for writing-in $TR_W$, the transistor for read-out $TR_R$ and the transistor for detection $TR_S$ are formed in the empty region of the semiconductor substrate, therefore, the semiconductor substrate can be remarkably effectively utilized.

The operation of writing data into the nonvolatile memory in Example 11 and the operation of reading out data from, and re-writing data into, the nonvolatile memory in Example 11 can be performed in the same manner as in the operation of writing data into the nonvolatile memory explained in Example 11 and the operation of reading out data from, and re-writing data into, the nonvolatile memory explained in Example 11 in a state where the memory units $MU_1$ and $MU_2$ are additionally selected as required with the transistors for selection $TR_1$ and $TR_2$, so that the detailed explanation thereof is omitted.

The number (N) of the memory units shall not be limited to 2. The structure of the memory units in the nonvolatile memory when N=4 can be same as that shown, for example, in FIG. 6. The structure of the memory unit explained in any one of Examples 2 to 7 can be applied to the nonvolatile memory in Example 11, and the nonvolatile memory explained in Example 8 or 9 can be also applied to the nonvolatile memory in Example 11.

In Example 10 or 11, the predetermined voltage of the wiring to which one end of the transistor for detection is connected shall not be limited to $V_{CC}$, and for example, the wiring may be grounded. That is, the predetermined voltage of the wiring to which one end of the transistor for detection is connected may be 0 volt. In this case, however, when the voltage ($V_{CC}$) appears in the bit line when data is read out from a selected memory cell, the bit line is required to have 0 volt when re-writing is performed, and when 0 volt appears in the bit line when data is read out from a selected memory cell, the bit line is required to have a potential of $V_{CC}$ when re-writing is performed. For this purpose, there can be employed a constitution in which a kind of switch circuit (inversion circuit) constituted of transistors $TR_{IV-1}$, $TR_{IV-2}$, $TR_{IV-3}$ and $TR_{IV-4}$ is provided between the bit lines, the transistors $TR_{IV-2}$ and $TR_{IV-4}$ are brought into an ON-state when data is read out, and the transistors $TR_{IV-1}$ and $TR_{IV-3}$ are brought into an ON-state when data is re-written.

EXAMPLE 12

Figure 39:
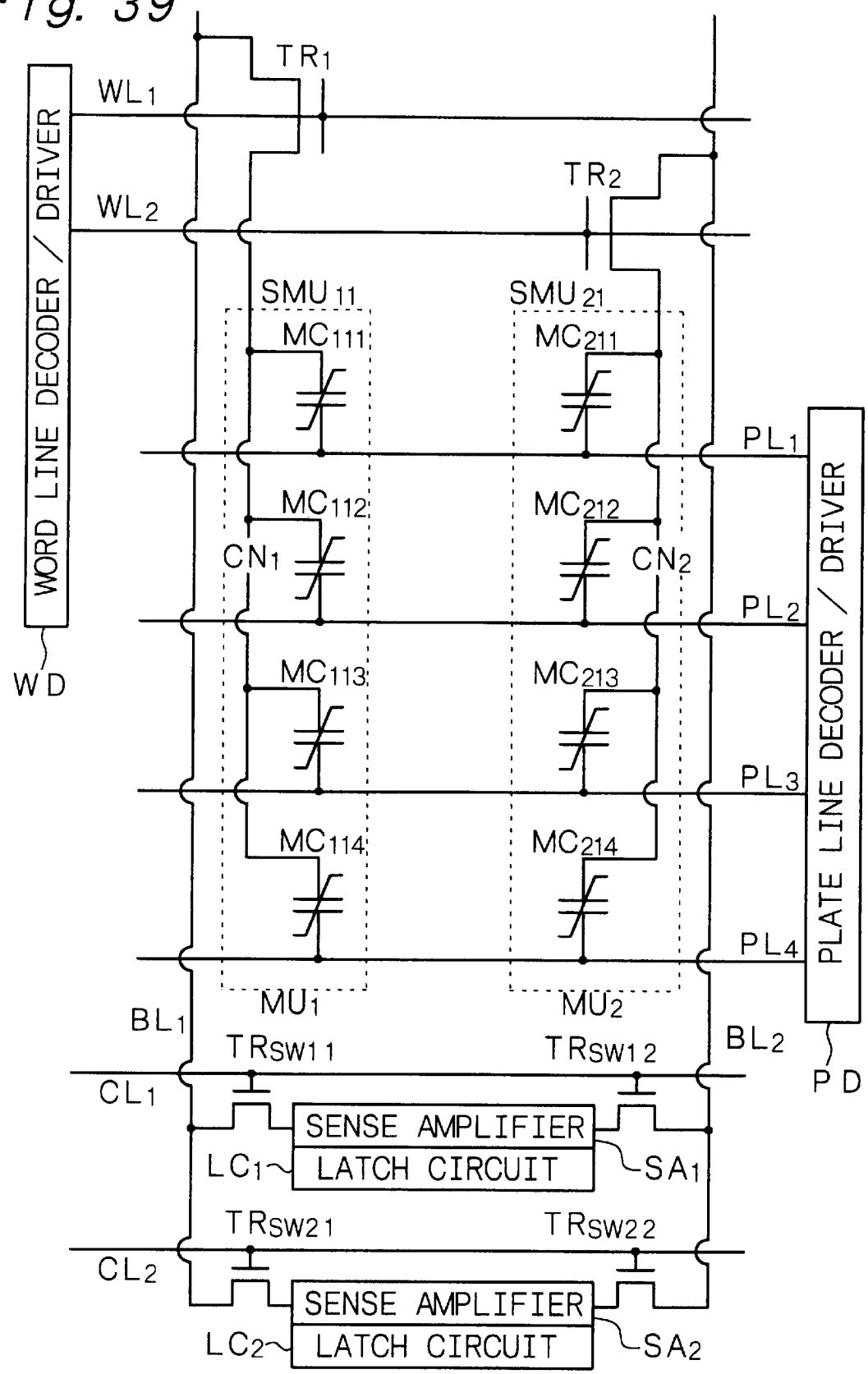
FIG. 39 is a circuit diagram of a ferroelectric-type nonvolatile semiconductor memory in Example 12.
Figure 40:
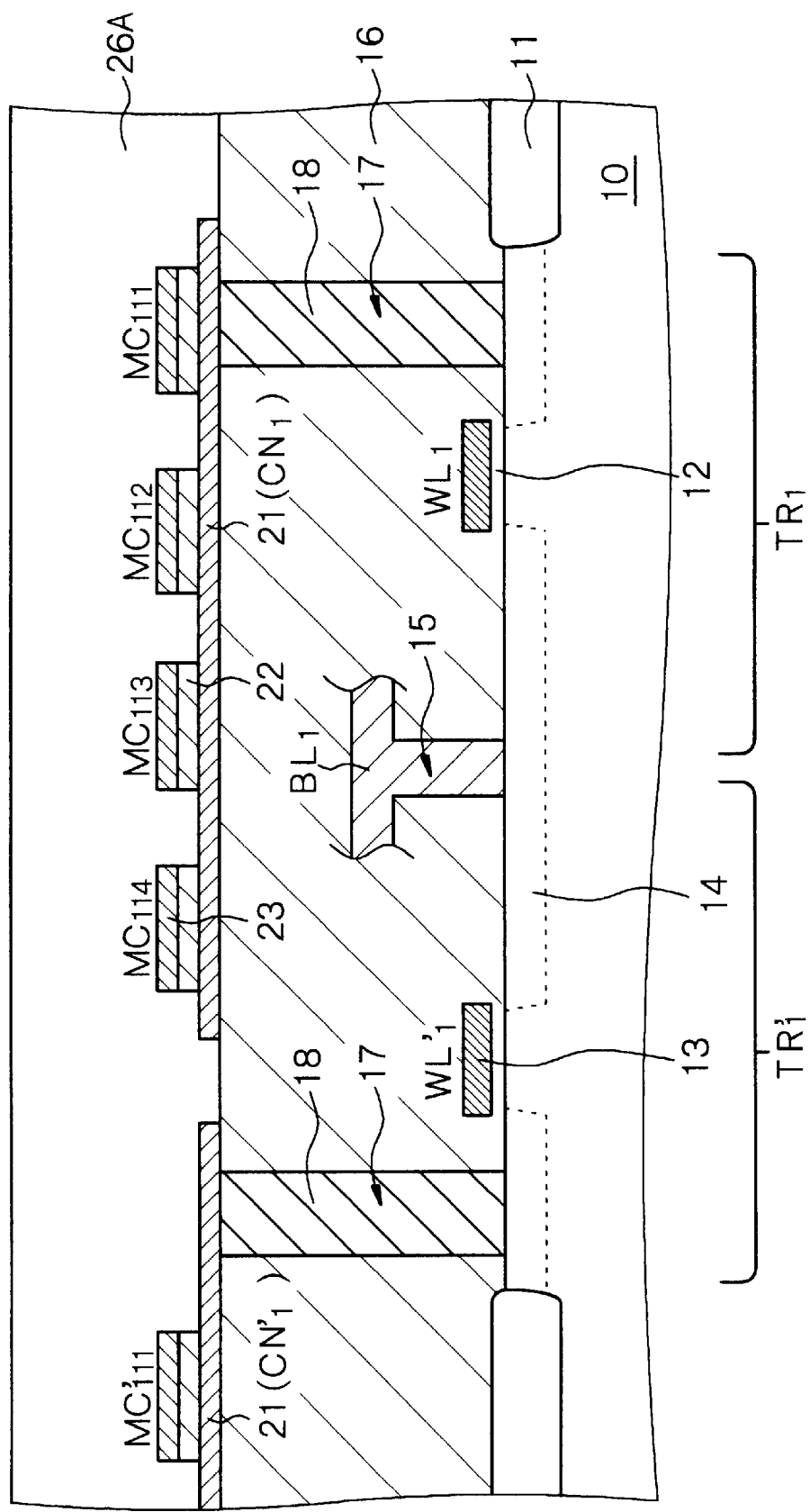
FIG. 40 is a schematic partial cross-sectional view of the ferroelectric-type nonvolatile semiconductor memory in Example 12.

Example 12 is concerned with the nonvolatile memory according to the twelfth-A aspect of the present invention and the operation method according to the first constitution of the present invention. FIG. 39 shows a circuit diagram of the nonvolatile memory in Example 12, and FIG. 40 shows a schematic partial cross-sectional view thereof.

The nonvolatile memory in Example 12 comprises a first memory unit $MU_1$ and a second memory unit $MU_2$.

The first memory unit $MU_1$ comprises;

(A-1) a first bit line $BL_1$, (B-1) first transistor or transistors for selection $TR_{1N}$ in the number of N (provided that $N \geq 1$ and specifically, N=1 in Example 12), (C-1) first sub-memory unit or units $SMU_{1N}$ in the number of N, each first sub-memory unit comprising first memory cells $MC_{1nm}$ (m=1, 2 . . . M, n=1, 2 . . . N) in the number of M (provided that $M \geq 2$, and M=4 in Example 12), and (D-1) plate lines $PL_m$ in the number of M, each of the plate lines $PL_m$ being common to the first memory cells $MC_{1nm}$ (m=1, 2 . . . M) constituting the first sub-memory unit or units $SMU_{1n}$ in the number of N.

The second memory unit $MU_2$ comprises;

(A-2) a second bit line $BL_2$, (B-2) second transistor or transistors for selection $TR_{2N}$ in the number of N, (C-2) second sub-memory unit or units $SMU_{2N}$ in the number of N, each second sub-memory unit comprising second memory cells $MC_{2nm}$ in the number of M, and (D-2) the plate lines $PL_m$ in the number of M, each of the plate lines being common to the first memory cells $MC_{2nm}$ constituting the second sub-memory unit or units $SMU_{2n}$, the plate lines constituting the second memory unit $MU_2$ being common to the plate lines constituting first memory unit $MU_1$.

In Examples 12 to 15, N=1. Therefore, subscripts "N" and "n" are omitted, the first transistor for selection $TR_{1N}$ is expressed as first transistor for selection $TR_1$, the first memory cells $MC_{1nM}$ and $MC_{1nm}$ are expressed as first memory cells $MC_{1M}$ and $MC_{1m}$, the first sub-memory unit $SMU_{1N}$ is expressed as sub-memory unit $SMU_1$, the second transistor for selection $TR_{2N}$ is expressed as second transistor for selection $TR_2$, the second memory cells $MC_{2nM}$ and $MC_{2nm}$ are expressed as second memory cells $MC_{2M}$ and $MC_{2m}$, and the second sub-memory unit $SMU_{2N}$ is expressed as second sub-memory unit $SMU_2$.

In a schematic partial cross-sectional view of FIG. 40, the second bit line $BL_2$, the second transistor for selection $TR_2$ and the second memory cells $MC_{2m}$ are adjacent to the first bit line $BL_1$, the first transistor for selection $TR_1$ and the first memory cells $MC_{1m}$ in the direction perpendicular to the paper surface of the drawing. The first transistor for selection $TR_1$ and the first memory cells $MC_{1m}$ and part of a first transistor for selection $TR'_1$ and first memory cells $MC'_{1m}$ which are adjacent to each other in the extending direction of the bit line $BL_1$ are shown together in FIG. 40. The bit line $BL_1$ is common to first memory cells $MC_{1m}$, $MC'_{1m}$ . . . which extend in the direction of the bit line $BL_1$.

Each of the memory cells $MC_{1m}$ and $MC_2$. comprises a first electrode 21 (lower electrode), a ferroelectric layer 22 and a second electrode 23 (upper electrode). In the first memory unit $MU_1$, the first electrodes 21 of first memory cells $MC_{1m}$ constituting the n-th-place first sub-memory unit $SMU_1$ are in common in the n-th-place first sub-memory unit $SMU_1$ wherein n=1, 2 . . . N and n=1 in Example 12, and the common first electrode 21 (common node $CN_1$) is connected to the first bit line $BL_1$ through the n-th-place first transistor for selection $TR_1$. The second electrode 23 of the first memory cell $MC_{1m}$ is connected to the common plate line $PL_m$. In the second memory unit $MU_2$, the first electrodes 21 of the second memory cells $MC_{2m}$ constituting the n-th-place second sub-memory unit $SMU_2$ (n=1 in Example 12) are in common in the n-th-place second sub-memory unit $SMU_1$, and the common first electrode 21 (common node $CN_2$) is connected to the second bit line $BL_2$ through the n-th-place second transistor for selection $TR_2$. The second electrode 23 of the second memory cell $MC_{2m}$ is connected to the common plate line $PL_m$.

The plate lines $PL_m$ in the memory cells $MC_{2m}$ are common to the plate lines $PL_m$ in the memory cells $MC_{1m}$, and are connected to a plate line decoder/driver PD. The gate electrode of the first transistor for selection $TR_1$ is connected to a word line $WL_1$ and the gate electrode of the second transistor for selection $TR_2$ is connected to a second word line $WL_2$. The word lines $WL_1$ and $WL_2$ are connected to a word line decoder/driver WD.

The number (M) of the memory cells constituting the sub-memory unit of the nonvolatile memory shall not be limited to four (4), and it is any number so long as it satisfies $M \geq 2$. The above number is preferably an exponent of 2 (M=2, 4, 8, 16 . . . ).

In the nonvolatile memory of Example 12, latch circuits in the number of P for latching the data stored in the first memory cell $MC_{1m}$ and the data stored in the second memory cell $MC_{2m}$ are provided between the first bit line $BL_1$ and the second bit line $BL_2$. In Example 12, N=1, and P=2N is satisfied. The (2n−1)-th latch circuit latches the data stored in the first memory cell constituting the n-th-place first sub-memory unit, and the 2n-th latch circuit latches the data stored in the second memory cell constituting the n-th-place second sub-memory unit. In the nonvolatile memory of Example 12, 1 bit is stored, as data, in each of the memory cells $MC_{1m}$ and $MC_{2m}$ (m=1, 2. . . M) which memory cells share the plate line, that is, in a paired memory cells.

Specifically, the first latch circuit $LC_1$ for latching the data stored in the first memory cell $MC_{1m}$ and the second latch circuit $LC_2$ for latching the date stored in the second memory cell $MC_{2m}$ are provided between the first bit line $BL_1$ and the second bit line $BL_2$. A transistor for switching $TR_{SW11}$ is provided between the first latch circuit $LC_1$ and the first bit line $BL_1$, and a transistor for switching $TR_{SW12}$ is provided between the first-latch circuit $LC_1$ and the second bit line $BL_2$. A transistor for switching $TR_{SW21}$ is provided between the second latch circuit $LC_2$ and the first bit line $BL_1$, and a transistor for switching $TR_{SW22}$ is provided between the second latch circuit $LC_2$ and the second bit line $BL_2$. A first sense amplifier $SA_1$ comprises the first latch circuit $LC_1$ and a second sense amplifier $SA_2$ comprises the second latch circuit $LC_2$, while the constitution of the sense amplifiers shall not be limited thereto. The gate electrodes of the transistors for switching $TR_{SW11}$ and $TR_{SW12}$ are connected to a first latch control line $CL_1$, and the gate electrodes of the transistors for switching $TR_{SW21}$ and $TR_{SW22}$ are connected to a second latch control line $CL_2$.

Data is re-written into the first memory cell $MC_{1m}$ constituting the n-th-place first sub-memory unit $SMU_1$ on the basis of the data latched in the (2n−1)-th latch circuit (specifically, the first latch circuit $LC_1$ in Example 12 ), and data is re-written into the second memory cell $MC_{2m}$ constituting the n-th-place second sub-memory unit $SMU_2$ on the basis of the data latched in the 2n-th latch circuit (specifically, the second latch circuit $LC_2$ in Example 12). When the data stored in the first memory cell $MC_{1m}$ is read out, the first transistor for selection $TR_1$ is brought into an ON-state, the second transistor for selection $TR_2$ is brought into an OFF-state, and a reference potential is applied to the second bit line $BL_2$. When the data stored in the second memory cell $MC_{2m}$ is read out, the second transistor for selection $TR_2$ is brought into an ON-state, the first transistor for selection $TR_1$ is brought into an OFF-state, and a reference potential is applied to the first bit line $BL_1$.

Figure 41:
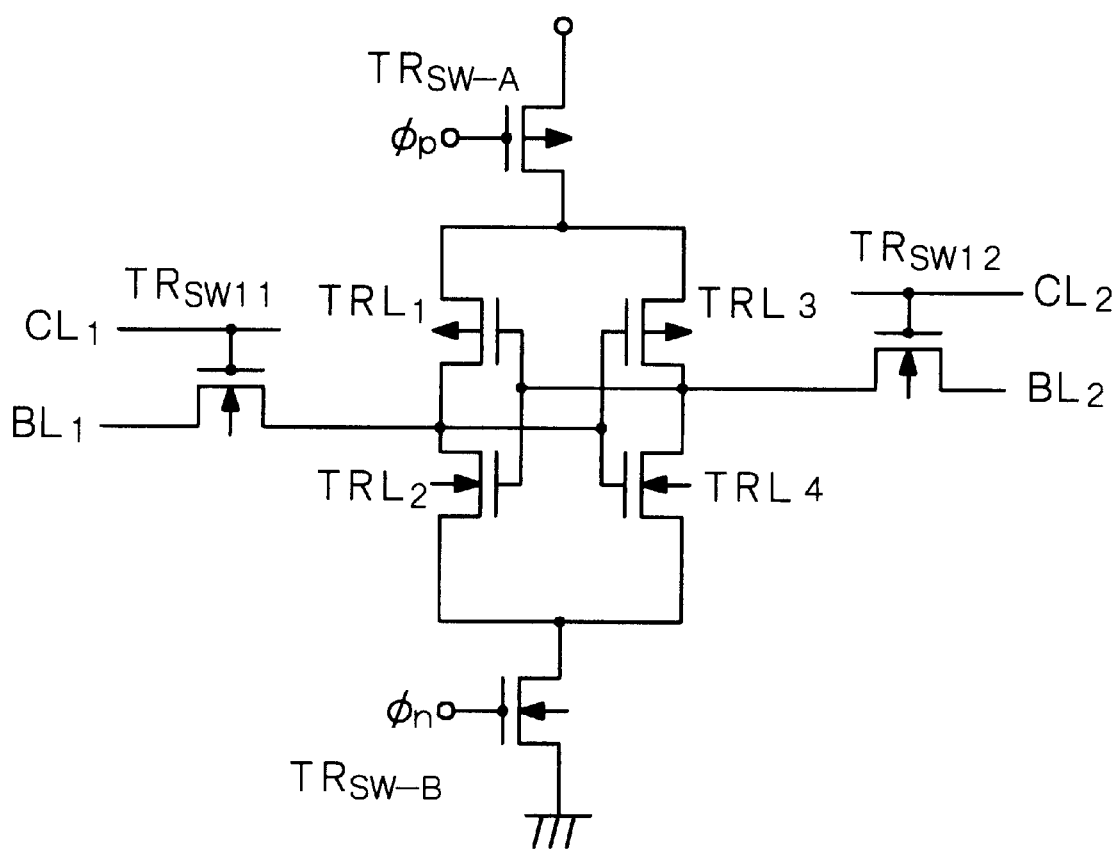
FIG. 41 is a circuit diagram of a latch circuit.

FIG. 41 shows a circuit diagram of the latch circuit $LC_1$. The latch circuit comprises two CMOS inverters. Each CMOS inverter comprises a p-channel type MOS transistor $TRL_1$, an n-channel type MOS transistor $TRL_2$, a p-channel type MOS transistor $TRL_3$ and an n-channel type MOS transistor $TRL_4$. Further, the latch circuit has a transistors for switching $TR_{SW11}$, $TR_{SW12}$, $TR_{SW-A}$ and $TR_{SW-B}$. The latch circuit $LC_1$ is activated by receiving sense enable signals $\phi_p$ and $\phi_n$ to compare a bit line potential of the bit line $BL_1$ and a bit line potential of the bit line $BL_2$, whereby the latch circuit $LC_1$ converts analog potentials of the bit lines to a binary data (for example, $V_{CC}$ or 0 volt) and can maintain (latch) such a binary data. The latch circuit $LC_2$ may have the same structure.

Figure 42:
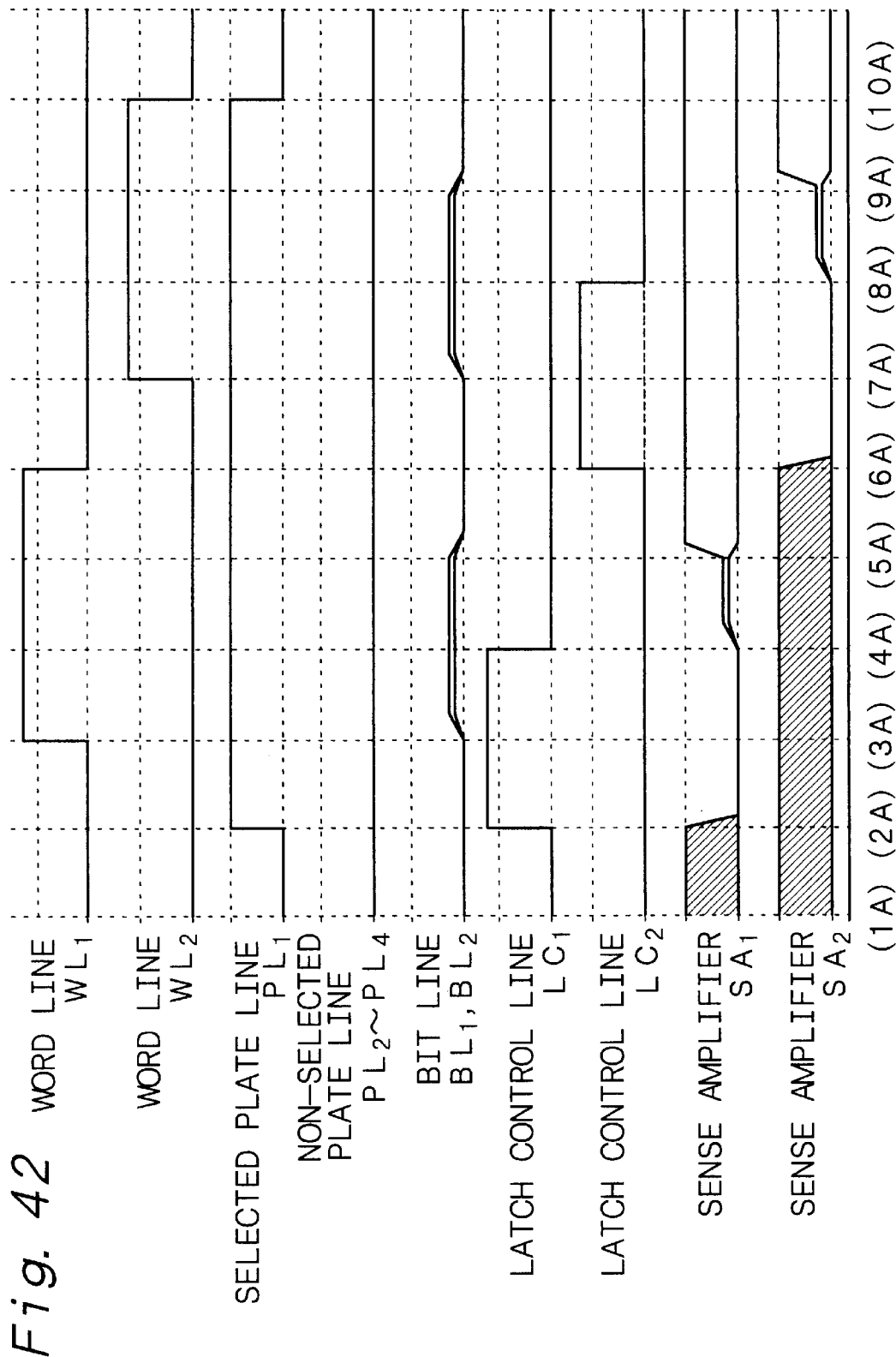
FIG. 42 is a diagram of operation waveforms of the ferroelectric-type nonvolatile semiconductor memory in Examples 12 and 16.
Figure 43:
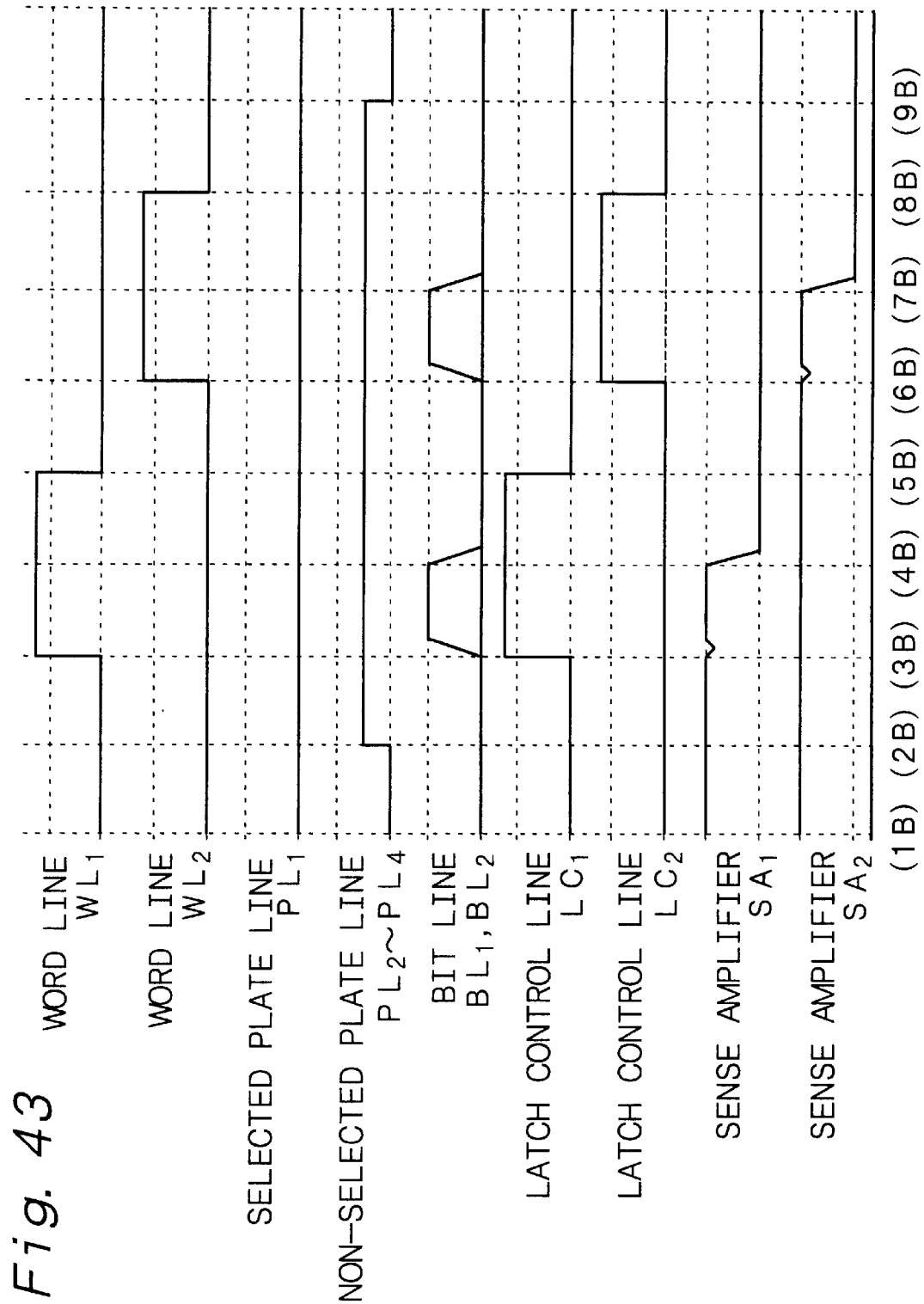
FIG. 43 is a diagram of operation waveforms of the ferroelectric-type nonvolatile semiconductor memory in Examples 12 and 16.

The operation method for reading out data from, and re-writing data into, the nonvolatile memory in Example 12 will be explained below. As an example, it is assumed that data is read out from, and data is re-written into, the memory cells $MC_{11}$ and $MC_{21}$ sharing a plate line $PL_1$ (i.e., a paired memory cells), that data "1" is already stored in the memory cell $MC_{11}$ and that data "0" is already stored in the memory cell $MC_{21}$. FIGS. 42 and 43 show operation waveforms. In FIGS. 42 and 43, parenthesized numbers correspond to Nos. of steps to be explained below. In these drawings showing the waveforms, "sense amplifier $SA_1$" and "sense amplifier $SA_2$" mean potentials in the output portions of these sense amplifiers.

First, data in the selected first memory cell $MC_{11}$ and second memory cell $MC_{21}$ will be read out (see FIG. 42).

(1A) In a standby state, all the bit lines, all the word lines and all the plate lines have 0 volt. Further, the common nodes $CN_1$ and $CN_2$ also have 0 volt and are in a floating state.

(2A) When it is started to read out data, the potential rising (voltage rising) of the selected plate line $PL_1$ is performed, that is, $V_{PL-H}(=V_{CC})$ is applied to the selected plate line $PL_1$, while the non-selected plate lines $PL_m$ (m=2, 3 . . . M) are maintained at $V_{PL-L}$ (=0 volt). In this case, the common nodes $CN_1$ and $CN_2$ come to have a value close to 0 volt since their coupling with non-selected plate lines $PL_m$ (m=2, 3 . . . M) is intense. As a result, the polarization inversion takes place in the ferroelectric layer of the first memory cell $MC_{11}$ in which data "1" is already stored, and the potential of the common node $CN_1$ increases. Further, the transistors for switching $TR_{SW11}$ and $TR_{SW12}$ are also brought into an ON-state through the first latch control line $CL_1$, whereby the first latch circuit $LC_1$ is selected. Moreover, the potential of each end of the first sense amplifier $SA_1$ is equalized to be 0 volt. Then, a grounding line (not shown) and the bit lines $BL_1$ and $BL_2$ are electrically disconnected, to bring the bit line $BL_1$ and $BL_2$ into a floating state.

(3A) Then, the word line $WL_1$ is brought to a high level to bring the first transistor for selection $TR_1$ into an ON-state, whereby the common node $CN_1$ of the first sub-memory unit $SMU_1$ is connected to the first bit line $BL_1$. On the other hand, a dummy cell is used to provide the second bit line $BL_2$ with a reference potential at an intermediate level between a bit line potential of data "1" and a bit line potential of data "0". In this case, the potential of the first bit line $BL_1$ (bit line potential) is higher than the potential of the second bit line $BL_2$ (bit line potential).

(4A) Then, the transistors for switching $R_{SW11}$ and $TR_{SW12}$ are brought into an OFF-state through the first latch control line $CL_1$, and the first latch circuit $LC_1$ is disconnected from the bit lines $BL_1$ and $BL_2$.

(5A) Then, the first latch circuit $LC_1$ is activated to determine the data, and such data (data "1" in this example)

is latched in the first latch circuit $LC_1$ in the first sense amplifier $SA_1$. The bit lines $BL_1$ and $BL_2$ are equalized to have 0 volt, whereby data "0" is written into the selected first memory cell $MC_{11}$.

(6A) Then, the word line $WL_1$ is brought to a low level, to bring the first transistor for selection $TR_1$ into an OFF-state, whereby the common node $CN_1$ of the first sub-memory unit $SMU_1$ and the first bit line $BL_1$ are disconnected. At the same time, the transistors for switching $TR_{SW21}$ and $TR_{SW22}$ are brought into an ON-state through the second latch control line $CL_2$, whereby the second latch circuit $LC_2$ is selected. Further, the potential of each end of the sense amplifier $SA_2$ is equalized to be 0 volt. Then, the grounding line (not shown) and the bit lines $BL_1$ and $BL_2$ are electrically disconnected, to bring the bit lines $BL_1$ and $BL_2$ into a floating state.

(7A) Then, the word line $WL_2$ is brought to a high level to bring the second transistor for selection $TR_2$ into an ON-state, whereby the common node $CN_2$ of the second sub-memory unit $SMU_2$ is connected to the second bit line $BL_2$. No polarization inversion takes place in the ferroelectric layer of the second memory cell $MC_{21}$ in which data "0" is already stored, so that the potential that is generated in the second bit line $BL_2$ (bit line potential) is low. On the other hand, a dummy cell is used to provide the first bit line $BL_1$ with a reference potential at an intermediate level between a bit line potential of data "1" and a bit line potential of data "0". In this case, the potential of the first bit line $BL_1$ (bit line potential) is higher than the potential of the second bit line $BL_2$ (bit line potential).

(8A) Then, the transistors for switching $TR_{SW21}$ and $TR_{SW22}$ are brought into an OFF-state through the second latch control line $CL_2$, and the second latch circuit $LC_2$ is disconnected from the bit lines $BL_1$ and $BL_2$.

(9A) And, the-second latch circuit $LC_2$ is activated to determine the data, and such data (data "0" in this example) is latched in the second latch circuit $LC_2$ in the second sense amplifier $SA_2$. On the other hand, the bit lines $BL_1$ and $BL_2$ are equalized to have 0 volt, whereby data "0" is written into the selected second memory cell $MC_{21}$.

(10A) Then, the word line $WL_2$ is brought into a low level, to bring the transistor for selection $TR_2$ into an OFF-state, whereby the common node $CN_2$ of the second sub-memory unit $SMU_2$ and the second bit line $BL_2$ are disconnected. At the same time, the potential falling (voltage falling) of the selected plate line $PL_1$ is performed. That is, the potential of the selected plate line $PL_1$ is brought back to $V_{PL-L}(=0$ volt).

By the above operation, readout of data in the first memory cell $MC_{11}$ and the second memory cell $MC_{21}$ is completed. In this state, the first memory cell $MC_{11}$ and the second memory cell $MC_{21}$ have data "0" written therein. Further, the first latch circuit $LC_1$ and the second latch circuit $LC_2$ have data that are latched therein and have been stored in the first memory cell $MC_{11}$ and the second memory cell $MC_{21}$.

Then, re-writing of data, specifically, re-writing of data "1" will be performed in the selected first memory cell $MC_{11}$ and second memory cell $MC_{21}$ (see FIG. 43).

(1B) In an initial state, all the bit lines, all the word lines and all the plate lines have 0 volt. Further, the common nodes $CN_1$ and $CN_2$ also have 0 volt and are in a floating state.

(2B) Then, $(1/2)V_{PL-H}[=(1/2)V_{CC}]$ is applied to the non-selected plate lines $PL_m$ (m=2, 3 ... M). The selected plate line $PL_1$ continues to have $V_{PL-L}(=0$ volt).

(3B) Then, the word line $WL_1$ is brought to a high level, to bring the first transistor for selection $TR_1$ into an ON-state, whereby the common node $CN_1$ of the first sub-memory unit $SMU_1$ is connected to the first bit line $BL_1$. At the same time, the transistors for switching $TR_{SW11}$ and $TR_{SW12}$ are brought into an ON-state through the first latch control line $CL_1$, to connect the first latch circuit $LC_1$ to the bit lines $BL_1$ and $BL_2$, whereby the potential of the first bit line $BL_1$ is increased up to $V_{BL-H}(=V_{CC})$ due to the data latched in the first latch circuit $LC_1$ (data "1" in this example). As a result, the selected first memory cell $MC_{11}$ undergoes re-inversion of polarization in its polarization state, to re-write data "1".

(4B) Then, the bit lines $BL_1$ and $BL_2$ are equalized to have 0 volt, to bring the potential of the common node $CN_1$ back to 0 volt.

(5B) Then, the word line $WL_1$ is brought to a low level, to bring the first transistor for selection $TR_1$ into an OFF-state, whereby the common node $CN_1$ of the first sub-memory unit $SMU_1$ and the first bit line $BL_1$ are disconnected. At the same time, the transistors for switching $TR_{SW11}$ and $TR_{SW12}$ are brought into an OFF-state through the first latch control line $CL_1$, to disconnect the first latch circuit $LC_1$ from the bit line $BL_1$ and $BL_2$.

(6B) Then, the word line $WL_2$ is brought to a high level, to bring the second transistor for selection $TR_2$ into an ON-state, whereby the common node $CN_2$ of the second sub-memory unit $SMU_2$ is connected to the second bit line $BL_2$. At the same time, the transistors for switching $TR_{SW21}$, and $TR_{SW22}$ are brought into an ON-state through the second latch control line $CL_2$, to connect the second latch circuit $LC_2$ to the bit lines $BL_1$ and $BL_2$. In this manner, the potential of the first bit line $BL_1$ is increased up to $V_{BL-H}$ $(=V_{CC})$ due to the data latched in the second latch circuit $LC_2$ (data "0" in this example), while the second bit line $BL_2$ continues to have a potential of $V_{BL-L}(=0$ volt). As a result, the selected second memory cell $MC_{21}$ undergoes no change in its polarization state and retains data "0".

(7B) Then, the bit lines $BL_1$ and $BL_2$ are equalized, and the potential of the common node $CN_2$ is brought back to 0 volt.

(8B) Then, the word line $WL_2$ is brought to a low level, to bring the second transistor for selection $TR_2$ into an OFF-state, whereby the second sub-memory unit $SMU_2$ and the second bit line $BL_2$ are disconnected. At the same time, the transistors for switching $TR_{SW21}$ and $TR_{SW22}$ are brought into an OFF-state through the second latch control line $CL_2$, and the second latch circuit $LC_2$ is disconnected from the bit lines $BL_1$ and $BL_2$.

(9B) Then, the potential of the non-selected plates line $PL_m$ (m=2, 3 ... M) is brought back to $V_{PL-L}(=0$ volt).

The above operation completes re-writing of data "1". Readout and re-writing of data stored in the first memory cell $MC_{11}$ and the second memory cell $MC_{21}$ sharing the plate line $PL_1$ are performed by carrying out the potential rising $(V_{PL-L} \rightarrow V_{PL-H})$ of the plate line [Step (2A)] and the potential falling $(V_{PL-H} \rightarrow V_{PL-L})$ [Step (10A)] once each.

Thereafter, the above steps (1A) to (10A) and the steps (1B) to (9B) are consecutively carried out with regard to the first memory cell $MC_{12}$ and the second memory cell $MC_{22}$ sharing the plate line $PL_2$, the first memory cell $MC_{13}$ and the second memory cell $MC_{23}$ sharing the plate line $PL_{31}$, and the first memory cell $MC_{14}$ and the second memory cell $MC_{24}$ sharing plate line $PL_4$.

When new data is written, first, the operations in the steps (1A) to (10A) may be carried out, then, a desired value corresponding to the new data is latched in the latch circuit relating to a memory cell into which new data is to be written (i.e., the first latch circuit for the first memory cells or the second latch circuit for the second memory cells) and the operation in the steps (1B) to (9B) may be carried out.

The present Applicant has also proposed a similar nonvolatile memory in Japanese Patent Application No. 158632/1999 filed Jun. 4, 1999. In the nonvolatile memory proposed in the above Application, readout and re-writing of data are carried out in the first memory cells $MC_{1M}$ of the first memory unit $MU_1$ in the order of $MC_{11} \rightarrow MC_{12} \rightarrow MC_{13} \rightarrow MC_{14}$, and then readout and re-writing of data are carried out in the second memory cells $MC_{2M}$ of the second memory unit $MU_2$ in the order of $MC_{21} \rightarrow MC_{22} \rightarrow MC_{23} \rightarrow MC_{24}$. That is, readout and re-writing of data stored in the first memory cell $MC_{11}$ and the second memory cell $MC_{21}$ sharing the plate line $PL_1$ are performed by carrying out the potential rising and the potential falling twice each instead of once each.

Meanwhile, the plate line connected to a plurality of memory cells has a large load capacity, so that driving speed is slow (that is, charging and discharging take a lot of time). Further, it consumes a large amount of power. As compared with the operation method of a nonvolatile memory proposed in Japanese Patent Application No. 158632/1999 in which the potential rising and the potential falling of the plate line are carried out twice to read out and re-write data stored in the first memory cell $MC_{11}$ and the second memory cell $MC_{21}$ sharing the plate line $PL_1$, therefore, the operation method of the nonvolatile memory in Example 12 in which the potential rising and the potential falling are carried out once is advantageous in view of driving speed and power consumption.

In the operation method of a nonvolatile memory proposed in Japanese Patent Application No. 158632/1999, when data stored in the selected first memory cell $MC_{11}$ is read out and re-written, the second memory cell $MC_{21}$ sharing the plate line $PL_1$ may be disturbed to deteriorate the data. This "disturbed" (disturbance) refers to a phenomenon that an electric field is exerted on the ferroelectric layer constituting the capacitor of the non-selected memory cell in the direction in which the polarization is inverted, that is, the data stored is deteriorated or destroyed.

In the operation method of the nonvolatile memory in Example 12, the readout and re-writing of data are performed in the order of $(MC_{11}, MC_{21}) \rightarrow (MC_{12}, MC_{22})$ $(MC_{13}, MC_{23}) \rightarrow (MC_{14}, MC_{24})$, so that no disturbance is exerted on the first memory cell $MC_{1m}$ and the second memory cell $MC_{2m}$ which share the plate line $PL_m$ and in which data is read out and re-written.

In the steps of (1A) to (10A), the non-selected plate lines $PL_m$ (m=2, 3 ... M) are fixed at $V_{PL-L}$(=0 volt). Further, the potentials in the bit lines $BL_1$ and $BL_2$ vary between 0 volt and a bit line potential (reading signal amount). The above bit line potential (reading signal amount) is generally approximately 0.5 volt or lower. In the steps (1A) to (10A), therefore, no or little disturbance takes place in the memory cells $MC_{1m}$ and $MC_{2m}$ (m=2, 3 ... M) connected to the non-selected plate lines $PL_m$ (m=2, 3 ... M).

In the steps (1B) to (9B), the potential of the selected plate line $PL_1$ is fixed at $V_{PL-L}$(=0 volt), and the potential of the non-selected plate lines $PL_m$ (m=2, 3 ... M) is fixed at $(1/2)V_{PL-H}[=(1/2)V_{CC}]$. Further, one of the bit lines $BL_1$ and $BL_2$ has a potential of $V_{BL-L}$ (=0 volt), and the other has a potential of $V_{BL-H}$(=$V_{CC}$). Although disturbance of $\pm(1/2)$ $V_{CC}$ is therefore exerted on the memory cells connected to the non-selected plate lines $PL_m$ (m=2, 3 ... M), the potential exerted on these memory cells is stable, and no polarization inversion takes place so long as the coercive voltage is set at a level higher than the above value. Further, no effective disturbance is exerted on the memory cells $MC_{11}$ and $MC_{21}$ connected to the selected plate line $PL_1$.

EXAMPLE 13

Figure 44:
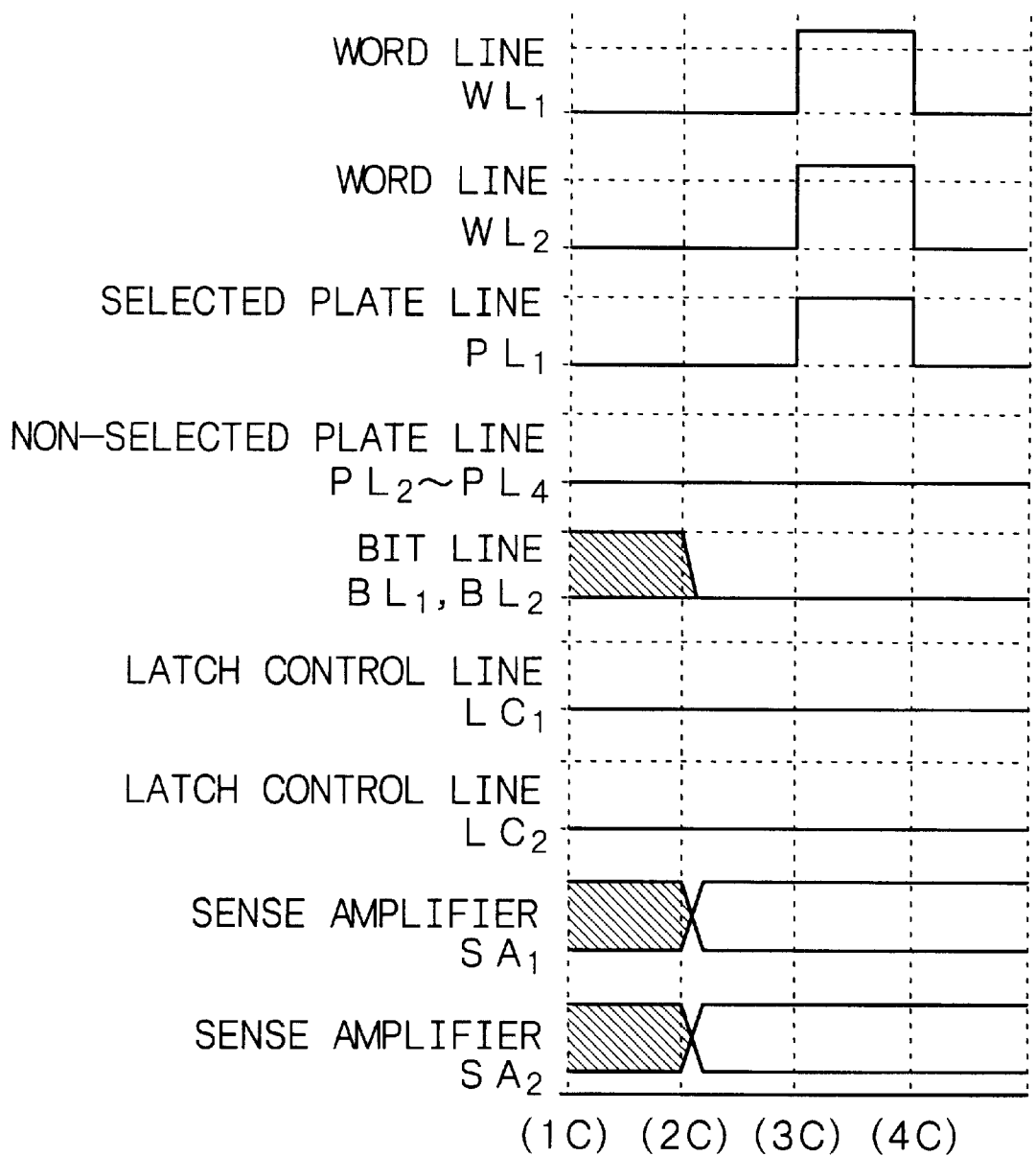
FIG. 44 is a diagram of operation waveforms of a ferroelectric-type nonvolatile semiconductor memory in Examples 13 and 17.

Example 13 is a variant of Example 12. In Example 12, "page" re-writing is performed in memory cells connected to a selected plate line like a so-called flash memory. In this case, the operation of reading for re-writing can be omitted, so that the operation can be simplified and faster re-writing can be attained. The nonvolatile memory in Example 13 can be structured in the same manner as in the structuring of the nonvolatile memory in Example 12. The operation method of the novolatile memory in Example 13 will be explained below with reference to waveform shown in FIG. 44. In FIG. 44, parenthesized numbers correspond to Nos. of steps to be explained below. As an example, it is assumed that data is written into the memory cells $MC_{11}$ and $MC_{21}$ connected to the plate line $PL_1$ (i.e., paired memory cell), that data "1" is already stored in the memory cell $MC_{11}$ and that data "0" is already stored in the memory cell $MC_{21}$.

(1C) In a standby state, all the bit lines, all the word lines and all the plate lines have 0 volt. Further, the common nodes $CN_1$ and $CN_2$ have 0 volt and are in a floating state. Further, the transistors for switching $TR_{SW11}$ and $TR_{SW12}$ are brought into, and maintained at, an OFF-state through the first latch control line $CL_1$, and the transistors for switching $TR_{SW21}$ and $TR_{SW22}$ are brought into, and maintained at, an OFF-state through the second latch control line $CL_2$.

(2C) Then, the bit lines $BL_1$ and $BL_2$ are equalize to have 0 volt.

(3C) Then, the potential rising of the selected plate line $PL_1$ is carried out. That is, $V_{PL-H}$(=$V_{CC}$) is applied to the selected plate line $PL_1$, and $V_{PL-L}$(=0 volt) is applied to the non-selected plate lines $PL_m$ (m=2, 3 ... M). At the same time, the word lines $WL_1$ and $WL_2$ are brought to a high level, to bring the first transistor for selection $TR_1$ and the second transistor for selection $TR_2$ into an ON-state, whereby the common node $CN_1$ of the first sub-memory unit $SMU_1$ is connected to the first bit line $BL_1$ and the common node $CN_2$ of the second sub-memory unit $SMU_2$ is connected to the common node $CN_2$. As a result, data "0" is written into the selected first memory cell $MC_{11}$ and the selected second memory cell $MC_{21}$.

(4C) Then, the word lines $WL_1$ and $WL_2$ are brought into a low level, to bring the first transistor for selection $TR_1$ and the second transistor for selection $TR_2$ into an OFF-state. At the same time, the potential falling of the plate line $PL_1$ is carried out. That is, the selected plate line $PL_1$ is allowed to have $V_{PL-L}$(=0 volt).

In the above operation, data "0" is written into the memory cells $MC_{11}$ and $MC_{21}$ connected to the selected plate line $PL_1$. During the above operation, desired data to be written are transmitted to the first latch circuit $LC_1$ and the second latch circuit $LC_2$ in advance.

(5C) Then, the same operation as that in the steps (1B) to (9B) in Example 12 is carried out, whereby data "1" is written and the writing is completed.

Thereafter, the steps (1C) to (4C) and the steps (1B) to (9B) are consecutively carried out with regard to the first memory cell $MC_{12}$ and the second memory cell $MC_{22}$ sharing the plate line $PL_2$, the first memory cell $MC_{13}$ and the second memory cell $MC_{23}$ sharing the plate line $PL_3$, and the first memory cell $MC_{14}$ and the second memory cell $MC_{24}$ sharing the plate line $PL_4$.

EXAMPLE 14

Example 14 is also a variant of Example 12. In Example 14, $(2/3)V_{CC}$ is applied to the non-selected plate lines $PL_m$ (m=2, 3 ... M) when data is re-written. Further, the bit lines $BL_1$ and $BL_2$ are equalized to have $(1/3)V_{CC}$ instead of 0 volt. The nonvolatile memory in Example 14 can be structured in the same manner as in the structuring of the nonvolatile memory in Example 12. For reading out data, the same steps as the steps (1A) to (10A) in Example 12 can be carried out. The operation of re-writing data in the operation method of the nonvolatile memory in Example 14 will be explained below with reference to waveforms shown in FIG. 45. It is assumed that data is re-written into the selected first memory cell $MC_{11}$ and the selected second memory cell $MC_{21}$. Parenthesized numbers correspond to Nos. of steps to be explained below.

(1-D) In an initial state, all the bit lines, all the word lines and all the plate lines have 0 volt. Further, the common nodes $CN_1$ and $CN_2$ have 0 volt and are in a floating state. In the first latch circuit $LC_1$ and the second latch circuit $LC_2$, data concerning the first memory cell $MC_{11}$ and the second memory cell $MC_{21}$ are latched.

(2D) Then, $(2/3)V_{PL-H}[=(2/3)V_{CC}]$ is applied to the non-selected plate lines $PL_m$ (m=2, 3 ... M). The selected plate line $PL_1$ continues to have $V_{PL-L}(=0$ volt). At the same time, the bit lines $BL_1$ and $BL_2$ are equalized to have $V_{BL-L}[=(1/3)V_{CC}]$. A ground driving line of a latch circuit (not shown) is disconnected.

(3D) Then, the word line $WL_1$ is brought to a high level, to bring the first transistor for selection $TR_1$ into an ON-state, whereby the common node $CN_1$ of the first sub-memory unit $SMU_1$ is connected to the first bit line $BL_1$. At the same time, the transistors for switching $TR_{SW11}$ and $TR_{SW12}$ are brought into an ON-state through the first latch control line $CL_1$, and the first latch circuit $LC_1$ is connected to the bit lines $BL_1$ and $BL_2$, whereby the potential of the first bit line $BL_1$ is increased up to $V_{BL-H}(=V_{CC})$ depending upon the data latched in the first latch circuit $LC_1$. As a result, the selected first memory cell $MC_{11}$, undergoes re-inversion of polarization in its polarization state to write data "1" therein. Since the ground driving line of the latch circuit has been disconnected, the second bit line $BL_2$ continues to have a potential of $V_{BL-L}[=(1/3)V_{CC}]$.

(4D) Then, the bit lines $BL_1$ and $BL_2$ are equalized to have $V_{BL-L}[=(1/3)V_{CC}]$, whereby the potential of the common node $CN_1$ is brought back to $V_{BL-L}[=(1/3)V_{CC}]$.

(5D) Then, the word line $WL_1$ is brought to a low level, to bring the first transistor for selection $TR_1$ into an OFF-state, whereby the common node $CN_1$ of the first sub-memory unit $SMU_1$ and the first bit line $BL_1$ are disconnected. At the same time, the transistors for switching $TR_{SW11}$ and $TR_{SW12}$ are brought into an OFF-state through the first latch control line $CL_1$, and the first latch circuit $LC_1$ is disconnected from the bit lines $BL_1$ and $BL_2$.

(6D) Then, the word line $WL_2$ is brought to a high level, to bring the second transistor for selection $TR_2$ into an ON-state, whereby the common node $CN_2$ of the second sub-memory unit SMU2 is connected to the second bit line $BL_2$. At the same time, the transistors for switching $TR_{SW21}$ and $TR_{SW22}$ are brought into an ON-state through the second latch control line $CL_2$, and the second latch circuit $LC_2$ is connected to the bit lines $BL_1$ and $BL_2$, whereby the potential of the first bit line $BL_1$ is increased up to $V_{BL-H}$ $(=V_{CC})$ depending upon the data latched in the second latch circuit $LC_2$. Since the ground driving line of the latch circuit has been disconnected, the second bit line $BL_2$ continues to have a potential of $V_{BL-L}=(1/3)V_{CC}$. As a result, the selected second memory cell $MC_{21}$ undergoes no change in polarization state, and data "0" is maintained.

(7D) Then, the bit lines $BL_1$ and $BL_2$ are equalized to have $V_{BL-L}[=(1/3)V_{CC}]$, whereby the potential of the common node $CN_2$ is brought back to $V_{BL-L}[=(1/3)V_{CC}]$.

(8D) Then, the word line $WL_2$ is brought into a low level, to bring the second transistor for selection $TR_2$ into an OFF-state, whereby the common node $CN_2$ of the second sub-memory unit $SMU_2$ is disconnected from the second bit line $BL_2$. At the same time, the transistors for switching $TR_{SW21}$ and $TR_{SW22}$ are brought into an OFF-state through the second latch control line $CL_2$, and the latch circuit $LC_2$ is disconnected from the bit lines $BL_1$ and $BL_2$.

(9D) Then, the potential of the non-selected plate lines $PL_m$ (m=2, 3 ... M) is brought back to $V_{PL-L}(=0$ volt), and the potential of the bit lines $BL_1$ and $BL_2$ is brought back to 0 volt.

The above operation completes the re-writing of data "1".

Thereafter, the steps of (1A) to (10A) and the steps (1D) to (9D) are consecutively carried out with regard to the first memory cell $MC_{12}$ and the second memory cell $MC_{22}$ sharing the plate line $PL_2$, the first memory cell $MC_{13}$ and the second memory cell $MC_{23}$ sharing the plate line $PL_3$, and the first memory cell $MC_{14}$ and the second memory cell $MC_{24}$ sharing the plate line $PL_4$.

In Example 14, when data is re-written, the non-selected plate lines $PL_m$ (m=2, 3 ... M) are fixed at $(2/3)V_{PL-H}[=(2/3)V_{CC}]$. The bit line $BL_1$ is driven to $V_{BL-H}(=V_{CC})$, and the bit line $BL_2$ is driven to $V_{BL-L}[=(1/3)V_{CC}]$. Therefore, only disturbance of $(1/3)V_{CC}$ is exerted on the memory cells $MC_{1m}$ and $MC_{2m}$ (m=2, 3 ... M) connected to the non-selected plate lines $PL_m$ (m=2, 3 ... M). Example 14 differs from Example 12 in that disturbance of $(1/3)V_{CC}$ is exerted also on the second memory cell $MC_{21}$ connected to the selected plate line $PL_1$. However, the disturbance to the above degree causes no problem.

In Example 14, two intermediate potentials $[(1/3)V_{CC}$ and $(2/3)V_{CC}]$ are required during the operation of the circuit. However, the maximum level of the disturbance is greatly lowered from $\pm(1/2)V_{CC}$ in Example 12, and stable readout of data can be attained.

EXAMPLE 15

Figure 46:
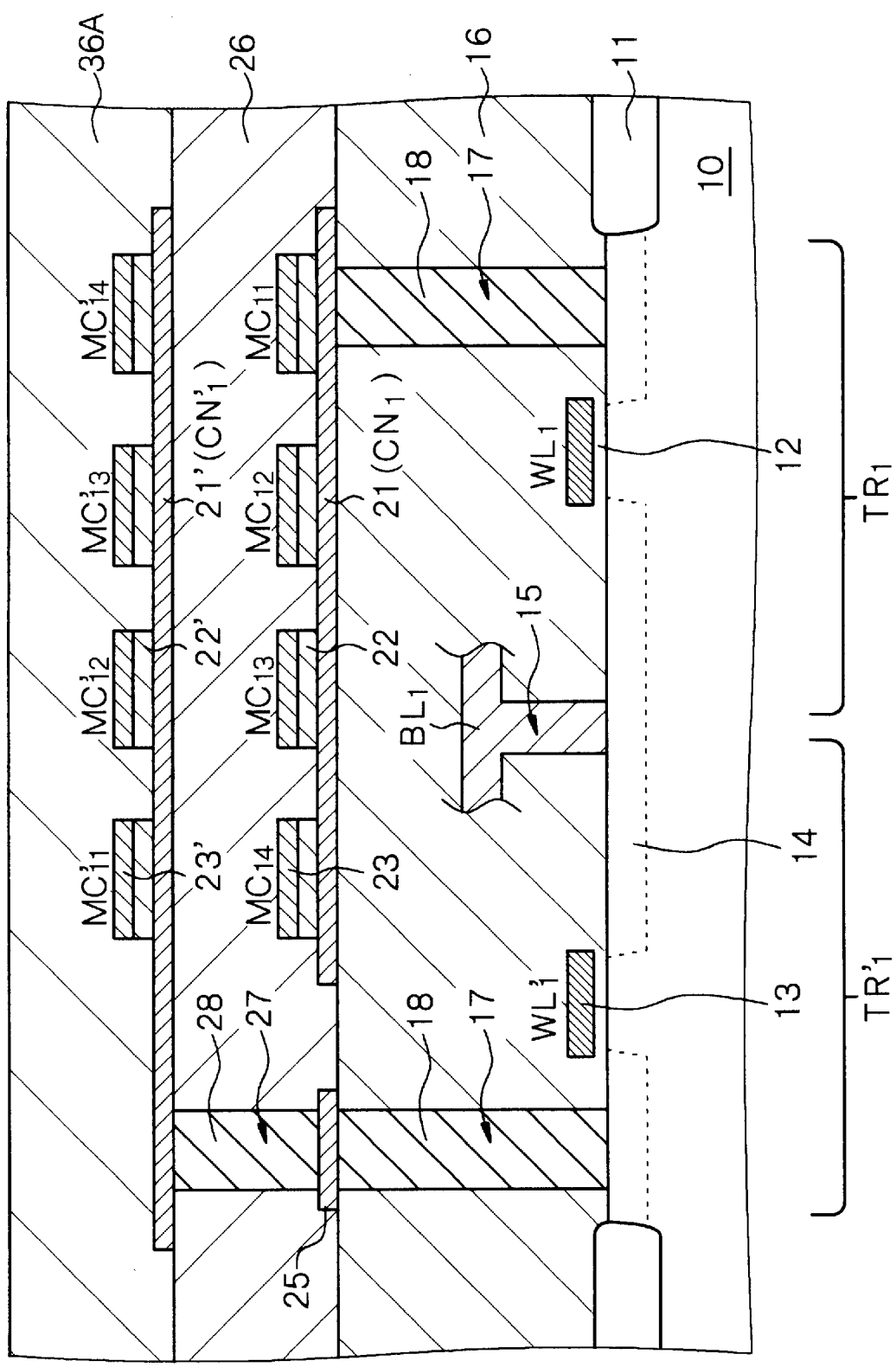
FIG. 46 is a schematic partial cross-sectional view of a ferroelectric-type nonvolatile semiconductor memory in Example 15.

Example 15 is also a variant of Example 12. The nonvolatile memory of Example 15 has a constitution in which a first memory unit $MU_1$ constituting a nonvolatile memory and a first memory unit $MU'_1$ constituting another nonvolatile memory which nonvolatile memories are adjacent to each other in the extending direction of the first bit lines $BL_1$ are stacked through an insulating interlayer 26, and a second memory unit $MU_2$ constituting a nonvolatile memory and a second memory unit $MU'_2$ constituting another nonvolatile memory which nonvolatile memories are adjacent to each other in the extending direction of the second bit lines $BL_2$ are stacked through the insulating interlayer 26. FIG. 46 shows a schematic partial cross-sectional view of the nonvolatile memory of Example 15. FIG. 46 shows only the first memory units $MU_1$ and $MU'_1$. The second memory units $MU_2$ and $MU'_2$ are adjacent to the first memory units $MU_1$ and $MU'_1$ in the direction perpendicular to the paper surface of the schematic partial cross-sectional view of FIG. 46. Single quotation marks "'" are added to reference numerals standing for the constituting elements of the first memory unit $MU'_1$.

Specifically, in the nonvolatile memory shown in FIG. 46, transistors for selection $TR_1$ and $TR'_1$ constituted of MOS FETs are formed in an active region surrounded by a device-isolation region 11 having a LOCOS structure, a shallow-trench structure or a combination of a LOCOS structure and a shallow-trench structure formed in a p-type silicon semiconductor substrate 10. Each of the transistors for selection $TR_1$ and $TR'_1$ comprises a gate insulating layer 12 composed, for example, of silicon oxide and formed on the surface of the silicon semiconductor substrate 10, a gate electrode 13 formed on the gate insulating layer 12 which also works as a word line $WL_1$ or $WL'_1$, and source/drain regions 14 which is formed in the active region in the silicon semiconductor substrate 10 and has an impurity of $n^+$-type.

A lower insulation layer is formed on the whole surface, and the bit line $BL_1$ is formed on the lower insulation layer. The bit line $BL_1$ is connected to one source/drain region 14 of each of the transistors for selection $TR_1$ and $TR'_1$ through a contact hole 15 made in the lower insulation layer. An upper insulation layer is formed on the lower insulation layer and the bit line $BL_1$. The lower insulation layer and the upper insulation layer will be together referred to as insulation layer 16 in the drawing. The bit line $BL_1$ is extending on the lower insulation layer leftward and rightward in FIG. 46 without being in contact with a contact hole 18 described later.

First electrode (lower electrodes) 21 are formed on the insulating layer 16, a ferroelectric layer 22 is formed on the first electrode 21, and a second electrode (upper electrode) 23 is formed on the ferroelectric layer 22. These elements constitute the memory cells $MC_{1M}$. The first electrodes 21 are in common in the memory cell $MC_{1M}$. The common first electrode 21 is referred to as a common node $CN_1$. The common first electrode 21 (common node $CN_1$) has a plane form of a stripe and is connected to the other source/drain region 14 of the transistor for selection $TR_1$ through a contact hole 18 made in an opening portion 17 made in the insulating layer 16. The ferroelectric layer 22 is formed so as to have almost the same pattern as that of the second electrode 23.

The insulating interlayer 26 is formed on the memory cells $MC_{1M}$ and the insulation layer 16. First electrodes (lower electrodes) 21' are formed on the insulating interlayer 26, a ferroelectric layer 22' is formed on the first electrode 21', and a second electrode (upper electrode) 23' is formed on the ferroelectric layer 22'. These elements constitute the memory cell $MC'_{1M}$. The first electrodes 21' are in common in the memory cell $MC'_{1M}$. The common first electrode 21' is referred to as a common node $CN'_1$. The common first electrode 21' (common node $CN'_1$) has a plane form of a stripe and is connected to the other source/drain region 14 of the transistor for selection $TR'_1$ through a contact hole 28 made in an opening portion 27 made in the insulating interlayer 26, a connection portion 25 formed on the insulation layer 16 and another contact hole 18. The ferroelectric layer 22' is formed so as to have almost the same pattern as that of the second electrode 23'. An insulation film 36A is formed on the memory cell $MC'_{1M}$ and the insulating interlayer 26.

The word lines $WL_1$ and $WL'_1$ are extending in the direction perpendicular to the paper surface of FIG. 46. The second electrodes 23 and 23' are in common in the memory cells $MC_{2m}$ and $MC'_{2m}$ which are adjacent to each other in the direction perpendicular to the paper surface of FIG. 46, and work as the plate lines $PL_m$. The memory cells $MC_{1M}$ and memory cells $MC'_{1M}$ are aligned in the perpendicular direction. In this structure, the area occupied by the memory cells can be decreased, and the integration degree can be improved.

It is preferred to employ a constitution in which the ferroelectric layer of the memory cells constituting the memory unit positioned above has a lower crystallization temperature than the ferroelectric layer of the memory cells constituting the memory unit positioned below as shown in Table 2.

EXAMPLE 16

Figure 47:
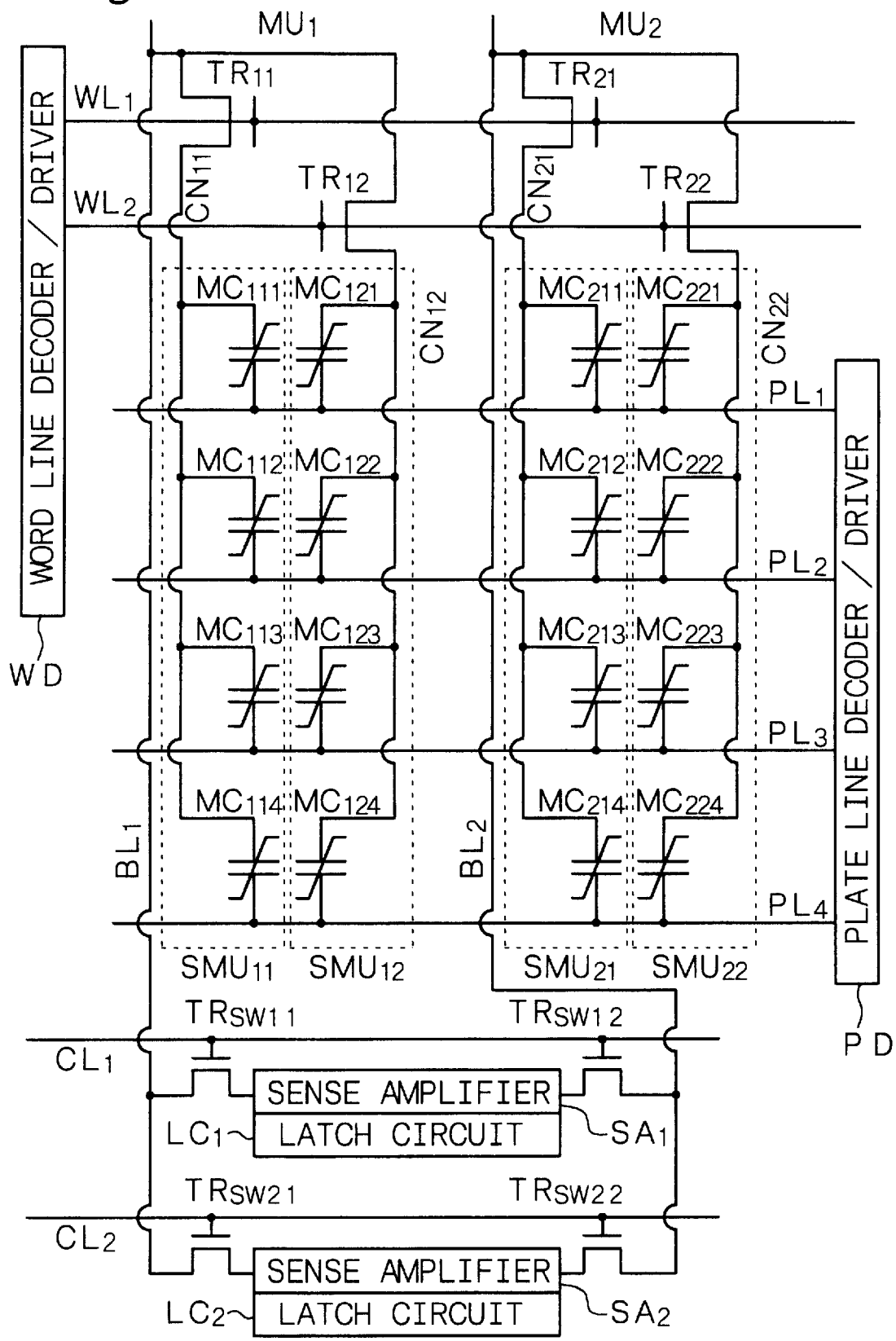
FIG. 47 is a circuit diagram of a ferroelectric-type nonvolatile semiconductor memory in Example 16.

Example 16 is concerned with the nonvolatile memory according to the twelfth-B aspect of the present invention and the operation method of the nonvolatile memory according to the second aspect of the present invention. FIG. 47 shows a circuit diagram of the nonvolatile memory in Example 16. The cross-sectional structure of the nonvolatile memory is the same as that shown in FIG. 6.

The nonvolatile memory of Example 16 comprises a first memory unit $MU_1$ and a second memory unit $MU_2$.

The first memory unit $MU_1$ comprises;

(A-1) a first bit line $BL_1$, (B-1) first transistors for selection $TR_{1N}$ in the number of N wherein $N \geq 2$ and specifically, N=2 in Example 16, (C-1) first sub-memory units $SMU_{1N}$ in the number of N ($N \geq 2$ and specifically, N=2 in Example 16), each first sub-memory unit comprising first memory cells $MC_{1nm}$ in the number of M wherein $M \geq 2$, specifically M=4 in Example 16, m=1, 2 . . . M and n=1, 2 . . . N, and (D-1) plate lines $PL_m$ in the number of M, each of the plate lines being common to the first memory cells $MC_{1nm}$ (m=1, 2 . . . M) constituting the first sub-memory unit $SMU_{1N}$ in the number of N.

The second memory unit $MU_2$ comprises;

(A-2) a second bit line $BL_2$, (B-2) second transistors for selection $TR_{2N}$ in the number of N, (C-2) second sub-memory units $SMU_{2N}$ in the number of N, each second sub-memory unit comprising second memory cells $MC_{2nm}$ in the number of M, and (D-2) the plate lines $PL_m$ in the number of M, each of the plate lines being common to the second memory cells $MC_{2nm}$ constituting the second sub-memory units $SMU_{2N}$ in the number of N, the plate lines constituting the second memory unit $SMU_{2N}$ being common to the plate lines constituting the first memory unit $SMU_{1N}$.

The second bit line $BL_2$, the second transistor for selection $TR_{2N}$ and the second memory unit $MU_2$ are adjacent to the first bit line $BL_1$, the first transistor for selection $TR_{1N}$ and the first memory unit $MU_1$.

Each of the memory cells $MC_{1nm}$ (m=1, 2 . . . M, n =1, 2 . . . N, m=1, 2, 3 and 4, and n=1 and 2 in Example 16) comprises a first electrode (lower electrode) 21 or 31, a ferroelectric layer 22 or 32, and a second electrode (upper electrode) 23 or 33. In the first memory unit $MU_{1n}$, the first electrodes 21 or 31 of the first memory cell $MC_{1nm}$ constituting the n-th-place first sub-memory unit $SMU_{1n}$ (n=1, 2 . . . N) are in common in the n-th-place first sub-memory unit $SMU_{1n}$, and the common first electrode 21 or 31 (common node $CN_{1n}$) is connected to the first bit line $BL_1$ through the n-th-place first transistor for selection $TR_1$. The second electrode 23 or 33 of the first memory cell $MC_{1nm}$ is connected to the common plate line $PL_m$. In the second memory unit $MU_2$, the first electrodes 21 or 31 of the second memory cell $MC_{2nm}$ constituting the n-th-place second sub-memory unit $SMU_{2n}$ are in common in the n-th-place second sub-memory unit $SMU_{2n}$, and the common first electrode 21 or 31 (common node $CN_{2n}$) is connected to the second bit line $BL_2$ through the n-th-place second transistor for selection $TR_{2n}$. The second electrode 23 or 33 of the second memory cell $MC_{2nm}$ is connected to the common plate line $PL_m$.

It is preferred to employ a constitution in which the ferroelectric layer of the memory cells constituting the sub-memory unit positioned above has a lower crystallization temperature than the ferroelectric layer of the memory cells constituting the sub-memory unit positioned below as shown in Table 2.

The number (M) of the memory cells constituting the memory unit of the nonvolatile memory shall not be limited to four (4), and it is any number so long as it satisfies $M \geq 2$. The above number is preferably an exponent of 2 (M=2, 4, 8, 16 . . . ).

In the nonvolatile memory of Example 16, latch circuits in the number of P for latching the data stored in the first memory cell $MC_{1nm}$ and the data stored in the second memory cell $MC_{2nm}$ are provided between the first bit line $BL_1$ and the second bit line $BL_2$. In Example 16, N=2, and P=N is satisfied. The n-th latch circuit latches the data stored in the first memory cell $MC_{1nm}$ constituting the n-th-place first sub-memory unit $SMU_{1n}$ and the second memory cell $MC_{2nm}$ constituting the n-th-place second sub-memory unit $SMU_{2n}$. In the nonvolatile memory of Example 16, the m-th-place first memory cell $MC_{1nm}$ (m=1, 2 . . . M) constituting the n-th-place first sub-memory unit $SMU_{1n}$ (n=1, 2 . . . N) and m-th-place second memory cell $MC_{2nm}$ constituting the n-th-place second sub-memory unit $SMU_{2n}$ are paired and store complementary data.

Specifically, the latch circuits in the number of P=N for latching the data stored in the first memory cell $MC_{1nm}$ and the second memory cell $MC_{2nm}$ are provided between the first bit line $BL_1$ and the second bit line $BL_2$. In Example 16, the first latch circuit $LC_1$ is provided for latching the data stored in the first memory cell $MC_{11m}$ or $MC_{21m}$, and the second latch circuit $LC_2$ is provided for latching the data stored in the second memory cell $MC_{12m}$ or $MC_{22m}$. A transistor for switching $TR_{SW11}$ is provided between the first latch circuit $LC_1$ and the first bit line $BL_1$, and a transistor for switching $TR_{SW12}$ is provided between the first latch circuit $LC_1$ and the second bit line $BL_2$. Further, a transistor for switching $TR_{SW21}$ is provided between the second latch circuit $LC_2$ and the first bit line $BL_1$, and a transistor for switching $TR_{SW22}$ is provided between the second latch circuit $LC_2$ and the second bit line $BL_2$. A first sense amplifier $SA_1$ comprises the first latch circuit $LC_1$, and a second sense amplifier $SA_2$ comprises the second latch circuit $LC_2$, while the constitution of the sense amplifiers shall not be limited thereto. Gate electrodes of the transistors for switching $TR_{SW11}$ and $TR_{SW12}$ are connected to a first latch control line $CL_1$, and gate electrodes of the transistors for switching $TR_{SW21}$ and $TR_{SW22}$ are connected to a second latch control line $CL_2$.

Data is re-written into the first memory cell constituting the n-th-place first sub-memory unit and the second memory cell constituting the n-th-place second sub-memory unit on the basis of the data latched in the n-th latch circuit. Specifically, data is re-written into the first memory cell $MC_{11m}$ constituting the first-place first sub-memory unit $SMU_{11}$ and the second memory cell $MC_{21m}$ constituting the first-place second sub-memory unit $SMU_{21}$ on the basis of the data latched in the first latch circuit $LC_1$. Further, date is re-written into the first memory cell $MC_{12m}$ constituting the second-place first sub-memory unit $SMU_{12}$ and the second memory cell $MC_{22m}$ constituting the second-place second sub-memory unit $SMU_{22}$ on the basis of the data latched in the second latch circuit $LC_2$.

The plate lines $PL_m$ in the memory cells $MC_{11m}$, $MC_{12m}$, $MC_{21m}$ and $MC_{22m}$ are in common, and connected to a plate line decoder/driver PD. The gate electrode of the first transistor for selection $TR_{11}$ and the gate electrode of the second transistor for selection $TR_{21}$ are connected to a word line $WL_1$, and the gate electrode of the first transistor for selection $TR_{12}$ and the gate electrode of the second transistor for selection $TR_{22}$ are connected to a word line $WL_2$. The word lines $WL_1$ and $WL_2$ are connected to a word line decoder/driver WD.

In the nonvolatile memory of Example 16, the first sub-memory unit $SMU_{11}$ and the first sub-memory unit $SMU_{12}$ which units constitute the first memory unit $MU_1$ are stacked through an insulating interlayer 26, and the second sub-memory unit $SMU_{21}$ and the second sub-memory unit $SMU_{22}$ which units constitute the second memory unit $MU_2$ are stacked through the insulating interlayer 26. In this structure, high integration degree can be obtained.

The operation method of the nonvolatile memory for reading out data from, and re-writing data into, the nonvolatile memory in Example 16 will be explained below. As an example, it is assumed that data is read out from, and data is re-written into, memory cells ($MC_{111}$ and $MC_{211}$) and memory cells ($MC_{121}$ and $MC_{221}$) sharing the plate line $PL_1$ (i.e., forming pairs), that the first memory cells $MC_{111}$ and $MC_{121}$ have data "1" stored therein and that the second memory cells $MC_{211}$ and $MC_{221}$ have data "0" stored therein. Waveforms are as shown in FIGS. 42 and 43. In FIGS. 42 and 43, parenthesized numbers correspond to Nos. of steps to be explained below. In FIGS. 42 and 43, alphabets "A" and "B" parenthesized together with numbers correspond to alphabets "E" and "F" parenthesized together with Nos. of steps to be explained below.

First, data is read out from the selected memory cells ($MC_{111}$ and $MC_{211}$) and the memory cells ($MC_{121}$ and $MC_{221}$) (see FIG. 42).

(1E) In a standby state, all the bit lines, all the word lines and all the plate lines have 0 volt. Further, the common nodes $CN_1$ and $CN_2$ also have 0 volt and are in a floating state.

(2E) When readout of data is started, the potential rising (voltage rising) of the selected plate line $PL_1$ is performed. That is, $V_{PL-H}(=V_{CC})$ is applied to the selected plate line $PL_1$, and $V_{PL-L}(=0$ volt) is applied to the non-selected plate lines $PL_m$ (m=2, 3 . . . M). In this case, the common nodes $CN_{11}$, $CN_{12}$, $CN_{21}$ and $CN_{22}$ have a value close to 0 volt since the intensity of their coupling with the non-selected plate lines $PL_m$ (m=2, 3 . . . M) is high. As a result, polarization inversion takes place in the ferroelectric layer in the first memory cells $MC_{111}$ and $MC_{121}$ in which data "1" is already stored, and the potential of the common nodes $CN_{11}$ and $CN_{12}$ increases. No polarization inversion takes place in the ferroelectric layer in the second memory cells $MC_{211}$ and $MC_{221}$ in which data "0" is already stored, and there is no change in the potential of the common nodes $CN_{21}$ and $CN_{22}$. At the same time, the transistors for switching $TR_{SW11}$ and $TR_{SW12}$ are brought into an ON-state through the first latch control line $CL_1$, the first latch circuit $LC_1$ is selected, and the potential of each end of the first sense amplifier $SA_1$ is equalized to be 0 volt. Then, a grounding line (not shown) and the bit lines $BL_1$ and $BL_2$ are electrically disconnected, to bring the bit lines $BL_1$ and $BL_2$ into a floating state.

(3E) Then, the word line $WL_1$ is brought to a high level, to bring the first-place first transistor for selection $TR_{11}$ and the first-place second transistor for selection $TR_{21}$ into an ON-state, whereby the common node $CN_{11}$ of the first sub-memory unit $SMU_{11}$ is connected to the first bit line $BL_1$ and the common node $CN_{21}$ of the second sub-memory unit $SMU_{21}$ is connected to the second bit line $BL_2$. As a result, the potential of the common node $CN_{11}$ of the first sub-memory unit $SMU_{11}$ decreases close to 0 volt, and in the first memory cell $MC_{111}$ in which data "1" is already stored, the polarization inversion in the ferroelectric layer further proceeds. In this manner, a potential difference is generated between the first bit line $BL_1$ and the second bit line $BL_2$.

(4E) Then, the transistors for switching $TR_{SW11}$ and $TR_{SW12}$ are brought into an OFF-state through the first latch control line $CL_1$, whereby the first latch circuit $LC_1$ is disconnected from the bit lines $BL_1$ and $BL_2$.

(5E) Then, the first latch circuit $LC_1$ is activated to determine the data, and such data (data "1" in this example) is latched in the first latch circuit $LC_1$ in the first sense amplifier $SA_1$. The bit lines $BL_1$ and $BL_2$ are equalized to have 0 volt, where by data "0" is written into the selected first memory cell $MC_{111}$ and second memory cell $MC_{211}$.

(6E) Then, the word line $WL_1$ is brought into a low level, to bring the first-place first transistor for selection $TR_{11}$ and the first-place second transistor for selection $TR_{21}$ into an OFF-state, whereby the common node $CN_{11}$ of the first sub-memory unit $SMU_{11}$ is disconnected from the first bit line $BL_1$ and the common node $CN_{21}$ of the second sub-memory unit $SMU_{21}$ is disconnected from the second bit line $BL_2$. At the same time, the transistors for switching $TR_{SW21}$, and $TR_{SW22}$ are brought into an ON-state through the second latch control line $CL_2$, the second latch circuit $LC_2$ is selected, and the potential of each end of the second sense amplifier $SA_2$ is equalized to be 0 volt. Then, a grounding line (not shown) is electrically disconnected from the bit lines $BL_1$ and $BL_2$, and the bit lines $BL_1$ and $BL_2$ are brought into a floating state.

(7E) Then, the word line $WL_2$ is brought to a high level, to bring the second-place first transistor for selection $TR_{12}$ and the second-place second transistor for selection $TR_{22}$ into an ON-state, whereby the common node $CN_{12}$ of the first sub-memory unit $SMU_{12}$ is connected to the first bit line $BL_1$ and the common node $CN_{22}$ of the second sub-memory unit $SMU_{22}$ is connected to the second bit line $BL_2$. In the first memory cell $MC_{121}$ in which data "1" is already stored, polarization inversion has taken place in the ferroelectric layer, and the common node $CN_{12}$ has a high potential. On the other hand, in the second memory cell $MC_{221}$ in which data "0" is stored, no polarization inversion takes place in the ferroelectric layer, and the common node $CN_{22}$ has a low potential.

(8E) Then, the transistors for switching $TR_{SW21}$ and $TR_{SW22}$ are brought into an OFF-state through the second latch control line $CL_2$, whereby the second latch circuit $LC_2$ is disconnected from the bit lines $BL_1$ and $BL_2$.

(9E) Then, the second latch circuit $LC_2$ is activated to determine the data, and such data (data "1" in this Example) is latched in the second latch circuit $LC_2$ in the second sense amplifier $SA_2$. The bit lines $BL_1$ and $BL_2$ are equalized to have 0 volt, whereby data "0" is written into the selected first memory cell $MC_{121}$.

(10E) Then, the word line $WL_2$ is brought to a low level to bring the second-place first transistor for selection $TR_{12}$ and the second-place second transistor for selection $TR_{22}$ into an OFF-state, whereby the common node $CN_{12}$ of the first sub-memory unit $SMU_{12}$ is disconnected from the first bit line $BL_1$ and the common node $CN_{22}$ of the second sub-memory unit $SMU_{22}$ is disconnected from the second bit line $BL_2$. At the same time, the potential falling (voltage falling) of the selected plate line $PL_1$ is performed. That is, the potential of the selected plate line $PL_1$ is brought back to $V_{PL-L}$(=0 volt).

The above operation completes the readout of data in the memory cells ($MC_{111}$ and $MC_{211}$) and the memory cells ($MC_{121}$ and $MC_{221}$). In this state, the first memory cell $MC_{111}$ and the memory cell $MC_{121}$ have data "0" written therein. Further, in the first latch circuit $LC_1$ and the second latch circuit $LC_2$, data stored in the memory cells ($MC_{111}$ and $MC_{211}$) and data stored in the memory cells ($MC_{121}$ and $MC_{221}$) are latched, respectively.

Then, re-writing of data into the selected memory cells ($MC_{111}$ and $MC_{211}$) and the selected memory cells ($MC_{121}$ and $MC_{221}$) is performed. Specifically, data "1" is re-written (see FIG. 43).

(1F) In an initial state, all the bit lines, all the word lines and all the plate lines are grounded. Further, the common nodes $CN_{11}$, $CN_{12}$, $CN_{21}$ and $CN_{22}$ also have 0 volt and are in a floating state.

(2F) Then, $(1/2)V_{PL-H}[=(1/2)V_{CC}]$ is applied to the non-selected plate lines $PL_m$ (m=2, 3 . . . M). The selected plate line $PL_1$ continues to have $V_{PL-L}$(=0 volt).

(3F) Then, the word line $WL_1$ is brought to a high level, to bring the first-place first transistor for selection $TR_{11}$ and the first-place second transistor for selection $TR_{21}$ into an ON-state, whereby the common node $CN_{11}$ of the first sub-memory unit $SMU_{11}$ is connected to the first bit line $BL_1$ and the common node $CN_{21}$ of the second sub-memory unit $SMU_{21}$ is connected to the second bit line $BL_2$. At the same time, the transistors for switching $TR_{SW11}$ and $TR_{SW12}$ are brought into an ON-state through the first latch control line $CL_1$, and the first latch circuit $LC_1$ is connected to the bit lines $BL_1$ and $BL_2$, whereby the potential of the first bit line $BL_1$ is increased up to $V_{BL-H}$(=$V_{CC}$) due to the data (data "1" in this example) latched in the first latch circuit $LC_1$. As a result, the selected first memory cell $MC_{111}$ undergoes re-inversion of polarization in its polarization state, and data "1" is written. In the selected second memory cell $MC_{211}$, its polarization state continues, and data "0" is retained.

(4F) Then, the bit lines $BL_1$ and $BL_2$ are equalized to have 0 volt, whereby the potential of the common nodes $CN_{11}$ and $CN_{21}$ is brought back to 0 volt.

(5F) Then, the word line $WL_1$ is brought to a low level, to bring the first-place first transistor for selection $TR_{11}$ and the first-place second transistor for selection $TR_{21}$ into an OFF-state, whereby the common node $CN_{21}$ of the first sub-memory unit $SMU_{21}$ is disconnected from the first bit line $BL_1$ and the common node $CN_{11}$ of the second sub-memory unit $SMU_{11}$ is disconnected from the second bit line $BL_2$. At the same time, the transistors for switching $TR_{SW11}$ and $TR_{SW12}$ are brought into an OFF-state through the first latch control line $CL_1$, and the first latch circuit $LC_1$ is disconnected from the bit lines $BL_1$ and $BL_2$.

(6F) Then, the word line $WL_2$ is brought to a high level, to bring the second-place first transistor for selection $TR_{12}$ and the second-place second transistor for selection $TR_{22}$ into an ON-state, whereby the common node $CN_{12}$ of the first sub-memory unit $SMU_{12}$ is connected to the first bit line $BL_1$ and the common node $CN_{22}$ of the second sub-memory unit $SMU_{22}$ is connected to the second bit line $BL_2$. At the same time, the transistors for switching $TR_{SW21}$ and $TR_{SW22}$ are brought into an ON-state through the second latch control line $CL_2$, and the second latch circuit $LC_2$ is connected to the bit lines $BL_1$ and $BL_2$, whereby the potential of the first bit line $BL_1$ is increased up to $V_{BL-H}$(=$V_{CC}$) due to the data (data "0" in this example) latched in the second latch circuit $LC_2$, while the potential of the second bit line $BL_2$ continues to be $V_{BL-L}$(=0 volt). As a result, the selected first memory cell $MC_{121}$ undergoes re-inversion of polarization in its polarization state, and data "1" is written. In the selected second memory cell $MC_{221}$, the polarization state thereof continues, and data "0" is retained.

(7F) Then, the bit lines $BL_1$ and $BL_2$ are equalized to have 0 volt, whereby the potential of the common nodes $CN_{12}$ and $CN_{22}$ is brought back to 0 volt.

(8F) Then, the word line $WL_2$ is brought to a low level, to bring the second-place first transistor for selection $TR_{12}$ and the second-place second transistor for selection $TR_{22}$ into an OFF-state, whereby the common node $CN_{12}$ of the first sub-memory unit $SMU_{12}$ is disconnected from the first bit line $BL_1$, and the common node $CN_{22}$ of the second sub-memory unit $SMU_{22}$ is disconnected from the second bit line $BL_2$. At the same time, the transistors for switching $TR_{SW21}$ and $TR_{SW22}$ are brought into an OFF-state through the second latch control line $CL_2$, and the second latch circuit $LC_2$ is disconnected from the bit lines $BL_1$ and $BL_2$.

(9F) Then, the potential of the non-selected plate lines $PL_m$ (m=2, 3 . . . M) is brought back to $V_{PL-L}$(=0 volt).

The above operation completes the re-writing of data "1". The readout and re-writing of data stored in the first memory cells $MC_{111}$ and $MC_{121}$ and the second memory cells $MC_{211}$ and $MC_{221}$ sharing the plate line $PL_1$ are performed by carrying out the potential rising of the plate line ($V_{PL-L} \rightarrow V_{PL-H}$)[step (2E)] and the potential falling thereof ($V_{PL-H} \rightarrow V_{PL-L}$) [step (10E)] once each.

Thereafter, the steps (1E) to (10E) and steps (1F) to (9F) are consecutively carried out with regard to the first memory cells $MC_{112}$ and $MC_{122}$ and the second memory cells $MC_{212}$ and $MC_{222}$ sharing the plate line $PL_2$, the first memory cells $MC_{113}$ and $MC_{123}$ and the second memory cell $MC_{213}$ and $MC_{223}$ sharing the plate line $PL_3$, and the first memory cells $MC_{114}$ and $MC_{124}$ and the second memory cells $MC_{214}$ and $MC_{224}$ sharing the plate line $PL_4$.

When new data is written, it is sufficient to employ a constitution in which the operation in the steps (1E) to (10E) is carried out first, then, a desired value is latched in the latch circuits relating to the memory cells where new data is to be written, and the steps (1F) to (9F) are carried out.

EXAMPLE 17

Example 17 is a variant of Example 16. In Example 17, "page" re-writing is performed in memory cells connected to a selected plate line like a so-called flash memory. In this case, the operation of reading for re-writing can be omitted, so that the operation can be simplified and faster re-writing can be attained. The nonvolatile memory in Example 17 can be structured in the same manner as in the structuring of the nonvolatile memory in Example 16. The operation waveforms in this Example are as shown in FIG. 44. In FIG. 44, parenthesized numbers correspond to Nos. of steps to be explained below. In FIG. 44, alphabet "C" parenthesized together with numbers corresponds to alphabet "G" parenthesized together with Nos. of steps to be explained below. The following explanation employs an assumption that data is written into the memory cells ($MC_{111}$ and $MC_{211}$) and the memory cells ($MC_{121}$ and $MC_{221}$) sharing the plate line $PL_1$ (i.e., forming pairs), that data "1" is stored in the memory cells $MC_{111}$ and $MC_{121}$ and that data "0" is stored in the memory cells $MC_{211}$ and $MC_{221}$.

(1G) In a standby state, all the bit lines, all the word lines and all the plate lines have 0 volt. Further, the common nodes $CN_{11}$, $CN_{12}$, $CN_{21}$ and $CN_{22}$ also have 0 volt and are in a floating state. Further, the transistors for switching $TR_{SW11}$ and $TR_{SW12}$ are already brought into an OFF-state through the first latch control line $CL_1$, and the transistors for switching $TR_{SW21}$ and $TR_{SW22}$ are already brought into an OFF-state through the second latch control line $CL_2$.

(2G) Then, the bit lines $BL_1$ and $BL_2$ are equalized to have 0 volt.

(3G) Then, the potential rising of the selected plate line $PL_1$ is performed. That is, $V_{PL-H}$(=$V_{CC}$) is applied to the selected plate line $PL_1$, and $V_{PL-L}$(=0 volt) is applied to the non-selected plate lines $PL_m$ (m=2, 3 . . . M). At the same time, the word lines $WL_1$ and $WL_2$ are brought to a high level, to bring the first-place first transistor for selection $TR_{11}$ and the first-place second transistor for selection $TR_{21}$ into an ON-state, whereby the common nodes $CN_{11}$ and $CN_{12}$ of the first sub-memory units $SMU_{11}$ and $SMU_{12}$ are connected to the first bit line $BL_1$, and the common nodes $CN_{21}$ and $CN_{22}$ of the second sub-memory units $SMU_{21}$ and $SMU_{22}$ are connected to the second bit line $BL_2$. As a result, data "0" is written into the selected first memory cells $MC_{111}$ and $MC_{12}$ and second memory cells $MC_{211}$ and $MC_{221}$.

(4G) Then, the word lines $WL_1$ and $WL_2$ are brought to a low level, to bring the first-place first transistor for selection $TR_{11}$ and the first-place second transistor for selection $TR_{21}$ into an OFF-state. At the same time, the potential falling of the selected plate line $PL_1$ is performed. That is, the selected plate line $PL_1$ is allowed to have $V_{PL-L}$(=0 volt).

By the above operation, data "0" is written into the memory cells $MC_{111}$, $MC_{121}$, $MC_{211}$ and $MC_{221}$ connected to the selected plate line $PL_1$. During the above operation, desired data are already transmitted to the first latch circuit $LC_1$ and the second latch circuit $LC_2$.

(5G) Then, the same operation as that in the steps (1F) to (9F) in Example 16 is performed, whereby data "1" is written and the writing is completed.

Thereafter, the steps (1G) to (4G) and the steps (1F) to (9F) are consecutively carried out with regard to the first memory cells $MC_{112}$ and $MC_{122}$ and the second memory cells $MC_{212}$ and $MC_{222}$ sharing the plate line $PL_2$, the first memory cells $MC_{113}$ and $MC_{123}$ and the second memory cell $MC_{213}$ and $MC_{223}$ sharing the plate line $PL_3$, and the first memory cells $MC_{114}$ and $MC_{124}$ and the second memory cells $MC_{214}$ and $MC_{224}$ sharing the plate line $PL_4$.

EXAMPLE 18

Figure 45:
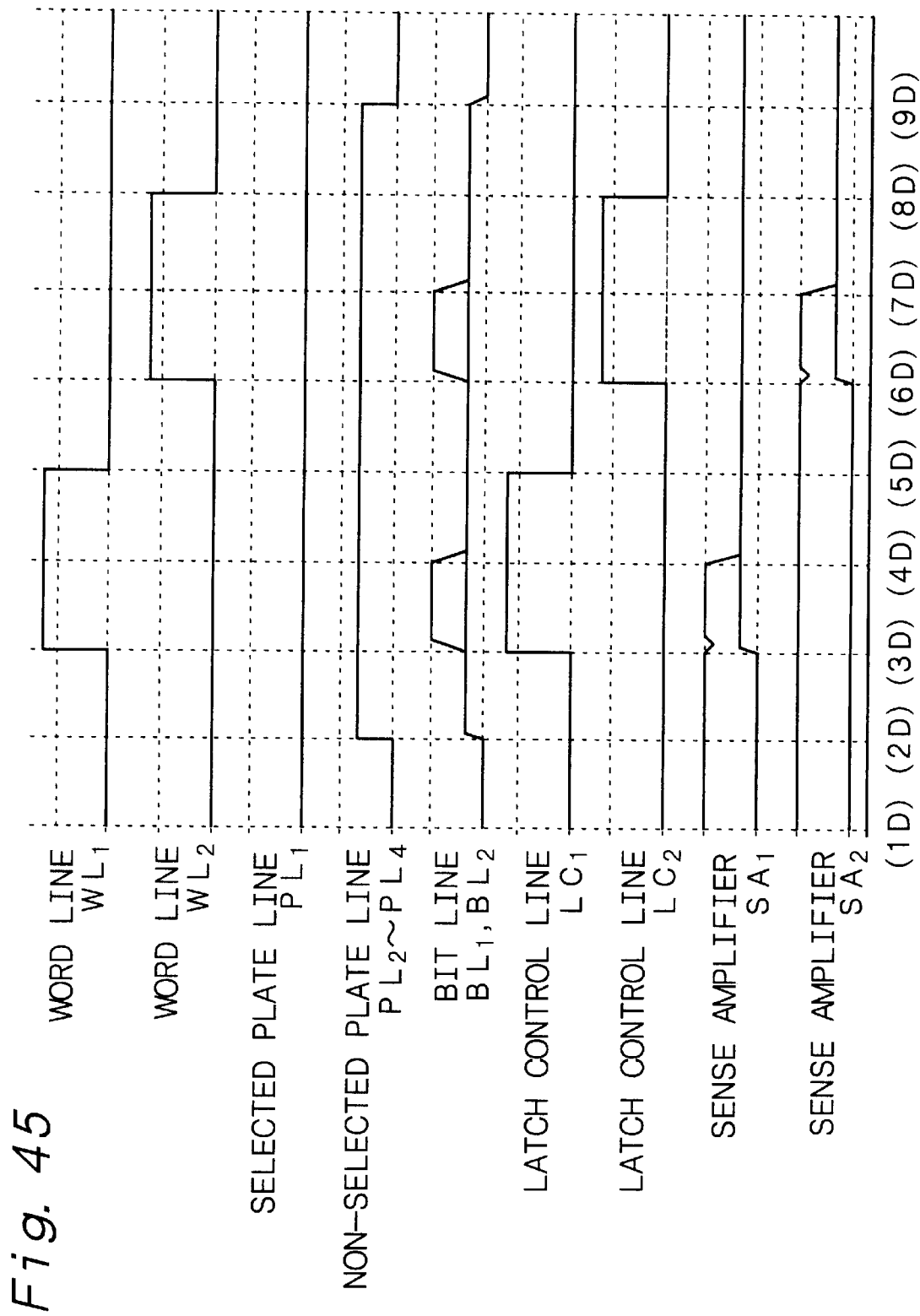
FIG. 45 is a diagram of operation waveforms of a ferroelectric-type nonvolatile semiconductor memory in Examples 14 and 18.

Example 18 is another variant of Example 16. In Example 18, (2/3)$V_{CC}$ is applied to the non-selected plate lines $PL_m$ (m=2, 3 . . . M) when data is re-written. Further, the bit lines $BL_1$ and $BL_2$ are equalized to have (1/3)$V_{CC}$ instead of 0 volt. The structure of the nonvolatile memory in Example 18 can be the same as that of the nonvolatile memory in Example 16. For reading out data, the same steps as the steps (1E) to (10E) in Example 16 can be performed. Waveforms in Example 18 are as shown in FIG. 45. In FIG. 45, parenthesized numbers correspond to Nos. of steps to be explained below. In FIG. 45, alphabet "D" parenthesized together with numbers corresponds to alphabet "H" parenthesized together with Nos. of steps to be explained below. The following explanation employs an assumption that data is written into the memory cells ($MC_{111}$ and $MC_{211}$) and the memory cells ($MC_{121}$ and $MC_{221}$) sharing the plate line $PL_1$ (i.e., forming pairs), that data "1" is stored in the memory cells $MC_{111}$ and $MC_{121}$ and that data "0" is stored in the memory cells $MC_{211}$ and $MC_{221}$.

(1H) In an initial state, all the bit lines, all the word lines and all the plate lines have 0 volt. Further, the common nodes $CN_{11}$, $CN_{12}$, $CN_{21}$ and $CN_{22}$ also have 0 volt and are in a floating state. In the first latch circuit $LC_1$ and the second latch circuit $LC_2$, data for the memory cells ($MC_{111}$ and $MC_{211}$) and the memory cells ($MC_{121}$ and $MC_{221}$) are latched, respectively.

(2H) Then, $(2/3)V_{PL-H}[=(2/3)V_{CC}]$ is applied to the non-selected plate lines $PL_m$ (m=2, 3 . . . M). The selected plate line $PL_1$ continues to have $V_{PL-L}(=0$ volt). At the same time, the bit lines $BL_1$ and $BL_2$ are equalized to have $V_{BL-L}[=(1/3)V_{CC}]$. A ground driving line (not shown) of the latch circuit is disconnected in advance.

(3H) Then, the word line $WL_1$ is brought to a high level, to bring the first-place first transistor for selection $TR_{11}$ and the first-place second transistor for selection $TR_{21}$ into an ON-state, whereby the common node $CN_{11}$ of the first sub-memory unit $SMU_{11}$ is connected to the first bit line $BL_1$ and the common node $CN_{21}$ of the second sub-memory unit $SMU_{21}$ is connected to the second bit line $BL_2$. At the same time, the transistors for switching $TR_{SW11}$ and $TR_{SW12}$ are brought into an ON-state through the first latch control line $CL_1$, and the first latch circuit $LC_1$ is connected to the bit lines $BL_1$ and $BL_2$, whereby the potential of the first bit line $BL_1$ is increased up to $V_{BL-H}(=V_{CC})$ due to the data latched in the first latch circuit $LC_1$. As a result, the selected first memory cell $MC_{111}$ undergoes re-inversion of polarization in its polarization state and data "1" is written therein. Since the ground driving line of the latch circuit is already disconnected, the second bit line $BL_2$ continues to have a potential of $V_{BL-L}[=(1/3)V_{CC}]$, and the selected second memory cell $MC_{211}$ undergoes no change in the polarization state, so that data "0" is retained.

(4H) Then, the bit lines $BL_1$ and $BL_2$ are equalized to have $V_{BL-L}[=(1/3)V_{CC}]$, whereby the potential of the common nodes $CN_{11}$ and $CN_{21}$ is brought back to $V_{BL-L}[=(1/3)V_{CC}]$.

(5H) Then, the word line $WL_1$ is brought to a low level, to bring the first-place first transistor for selection $TR_{11}$ and the first-place second transistor for selection $TR_{21}$ into an OFF-state, whereby the common node $CN_{11}$ of the first sub-memory unit $SMU_{11}$ is disconnected from the first bit line $BL_1$, and the common node $CN_{21}$ of the second sub-memory unit $SMU_{21}$ is disconnected from the second bit line $BL_2$. At the same time, the transistors for switching $TR_{SW11}$ and $TR_{SW12}$ are brought into an OFF-state through the first latch control line $CL_1$, and the first latch circuit $LC_1$ is disconnected from the bit lines $BL_1$ and $BL_2$.

(6H) Then, the word line $WL_2$ is brought to a high level, to bring the second-place first transistor for selection $TR_{12}$ and the second-place second transistor for selection $TR_{22}$ into an ON-state, whereby the common node $CN_{12}$ of the first sub-memory unit $SMU_{12}$ is connected to the first bit line $BL_1$, and the common node $CN_{22}$ of the second sub-memory unit $SMU_{22}$ is connected to the second bit line $BL_2$. At the same time, the transistors for switching $TR_{SW21}$ and $TR_{SW22}$ are brought into an ON-state through the second latch control line $CL_2$, and the second latch circuit $LC_2$ is connected to the bit lines $BL_1$ and $BL_2$, whereby the potential of the first bit line $BL_1$ is increased up to $V_{BL-H}(=V_{CC})$ due to the data latched in the second latch circuit $LC_2$. As a result, the selected first memory cell $MC_{121}$ undergoes re-inversion of polarization in the polarization state, and data "1" is written therein. Since the ground driving line of the latch circuit is disconnected in advance, the second bit line $BL_2$ continues to have a potential of $V_{BL-L}[=(1/3)V_{CC}]$, and the selected second memory cell $MC_{221}$ undergoes no change in the polarization state, so that data "0" is retained.

(7H) Then, the bit lines $BL_1$ and $BL_2$ are equalized to have $V_{BL-L}[=(1/3)V_{CC}]$, whereby the potential of the common nodes $CN_{12}$ and $CN_{22}$ is brought back to $V_{BL-L}[=(1/3)V_{CC}]$.

(8H) Then, the word line $WL_2$ is brought to a low level, to bring the second-place first transistor for selection $TR_{12}$ and the second-place second transistor for selection $TR_{22}$ into an OFF-state, whereby the common node $CN_{12}$ of the first sub-memory unit $SMU_{12}$ is disconnected from the first bit line $BL_1$, and the common node $CN_{22}$ of the second sub-memory unit $SMU_{22}$ is disconnected from the second bit line $BL_2$. At the same time, the transistors for switching $TR_{SW21}$ and $TR_{SW22}$ are brought into an OFF-state through the second latch control line $CL_2$, and the second latch circuit $LC_2$ is disconnected from the bit lines $BL_1$ and $BL_2$.

(9H) Then, the potential of the non-selected plate lines $PL_m$ (m=2, 3 . . . M) is brought back to $V_{PL-L}(=0$ volt), and the potential of the bit lines $BL_1$ and $BL_2$ is brought back to 0 volt.

The above operation complete the re-writing of data "1".

Thereafter, the steps (1E) to (10E) and the steps (1H) to (9H) are consecutively carried out with regard to the first memory cells $MC_{112}$ and $MC_{122}$ and the second memory cells $MC_{212}$ and $MC_{222}$ sharing the plate line $PL_2$, the first memory cells $MC_{113}$ and $MC_{123}$ and the second memory cells $MC_{213}$ and $MC_{223}$ sharing the plate line $PL_3$, and the first memory cells $MC_{114}$ and $MC_{124}$ and the second memory cells $MC_{214}$ and $MC_{224}$ sharing the plate line $PL_4$.

In Example 18, when data is re-written, the non-selected plate lines $PL_m$ (m=2, 3 . . . M) are fixed at a potential of $(2/3)V_{PL-H}[=(2/3)V_{CC}]$. On the other hand, the bit line $BL_1$ is driven to $V_{BL-H}(=V_{CC})$, and the bit line $BL_2$ is driven to $V_{BL-L}[=(1/3)V_{CC}]$. Therefore, only disturbance of $\pm(1/3)V_{CC}$ is exerted on the memory cells $MC_{11m}$, $MC_{12m}$, $MC_{21m}$ and $MC_{22m}$ (m=2, 3 . . . M), connected to the non-selected plate lines $PL_m$ (m=2, 3 . . . M). Example 18 differs from Example 16 in that disturbance of $\pm(1/3)V_{CC}$ is also exerted on the second memory cells $MC_{211}$ and $MC_{221}$ connected to the selected plate line $PL_1$. However, the disturbance to such a degree causes no problem.

In Example 18, two intermediate potentials $[(1/3)V_{CC}$ and $(2/3)V_{CC}]$ are required during the operation of the circuit. However, the maximum level of the disturbance is remarkably lowered from the $\pm(1/2)V_{CC}$ in Example 16, and stable readout of data can be attained.

EXAMPLE 19

A nonvolatile memory of Example 19 is also a variant of the nonvolatile memory of Example 16. The cross-sectional structure of the nonvolatile memory of Example 19 is the same as that shown in FIG. 10, and an equivalent circuit is the same as that shown in FIG. 19 except that latch circuits $LC_n$ (n=1, 2 . . . N and specifically, N=4 in Example 19) are provided on the bit lines $BL_1$ and $BL_2$ and that the transistors for switching $TR_{SWn1}$ and $TR_{SWn2}$, the latch control lines CLn and the sense amplifiers $SA_n$ are provided as shown in FIG. 39.

In the nonvolatile memory of Example 19, the sub-memory units $SMU_{11}$, $SMU_{12}$, $SMU_{13}$ and $SMU_{14}$ constituting the first memory unit $MU_1$ are stacked four stories. The sub-memory units $SMU_{21}$, $SMU_{22}$, $SMU_{23}$ and $SMU_{24}$ (not shown) constituting the second memory unit $MU_2$ are also stacked four stories.

The nonvolatile memory of Example 19 comprises a first memory unit $MU_1$ and a second memory unit $MU_2$.

The first memory unit $MU_1$ comprises;

(A-1) a first bit line $BL_1$, (B-1) first transistors for selection $TR_{1N}$ ($TR_{11}$, $TR_{12}$, $TR_{13}$ and $TR_{14}$) in the number of N (N≧2 and specifically, N=4 in Example 19), (C-1) first sub-memory units $SMU_{1N}$ ($SMU_{11}$, $SMU_{12}$, $SMU_{13}$ and $SMU_{14}$) in the number of N, each first sub-memory unit comprising first memory cells $MC_{1nM}$ ($MC_{11M}$, $MC_{12M}$, $MC_{13M}$ and $MC_{14M}$) in the number of M (M≧2 and specifically, M=8 in Example 19), and (D-1) plate lines $PL_m$ in the number of M, each of the plate lines $PL_m$ being common to the first memory cells $MC_{1nm}$ ($MC_{11m}$, $MC_{12m}$, $MC_{12m}$ and $MC_{14m}$) constituting the first sub-memory unit $SMU_{1n}$ in the number of N.

The second memory unit $MU_2$ comprises;

(A-2) a second bit line $BL_2$, (B-2) second transistors for selection $TR_{2N}$ ($TR_{21}$, $TR_{22}$, $TR_{23}$ and $TR_{24}$) in the number of N, (C-2) second sub-memory units $SMU_{2N}$ ($SMU_{21}$, $SMU_{22}$, $SMU_{23}$ and $SMU_{24}$) in the number of N, each second sub-memory unit comprising second memory cells $MC_{2nM}$ ($MC_{21M}$, $MC_{22M}$, $MC_{23M}$ and $MC_{24M}$) in the number of M, and (D-2) the plate lines $PL_m$ in the number of M, each of the plate lines being common to the second memory cells $MC_{2nm}$ ($MC_{21m}$, $MC_{22m}$, $MC_{22m}$, $MC_{24m}$) constituting the second sub-memory units $SMU_{2N}$ in the number of N, the plate lines constituting the second memory unit $MU_{2N}$ being common to the plate lines constituting the first memory unit $MU_{1N}$.

That is, the nonvolatile memory of Example 19 has the sub-memory units of four stories constituting the memory unit. The number (M) of the memory cells constituting the sub-memory unit shall not be limited to eight (8), and the number of the memory cells constituting the memory unit shall not be limited to 32.

Each memory cell comprises a first electrode, a ferroelectric layer and a second electrode. Specifically, each of the memory cells $MC_{11M}$ and the memory cells $MC_{21M}$ comprises the first electrode 21, the ferroelectric layer 22 and the second electrode 23. Each of the memory cells $MC_{12M}$ and the memory cells $MC_{22M}$ comprises the first electrode 31, the ferroelectric layer 32 and the second electrode 33. Further, each of the memory cells $MC_{13M}$ and the memory cells $MC_{23M}$ comprises the first electrode 41, the ferroelectric layer 42 and the second electrode 43. Each of the memory cells $MC_{14M}$ and the memory cells $MC_{24M}$ comprises the first electrode 51, the ferroelectric layer 52 and the second electrode 53.

It is preferred to employ a constitution in which the ferroelectric layer of the memory cells constituting the sub-memory unit positioned above has a lower crystallization temperature than the ferroelectric layer of the memory cells constituting the sub-memory unit positioned below as shown in Tables 10 and 11.

In the first memory unit $MU_1$, the first electrodes 21, 31, 41 and 51 of the first memory cells $MC_{1nm}$ constituting the n-th-place first sub-memory unit $SMU_{1n}$ (n=1, 2 . . . N) are in common in the n-th-place first sub-memory unit $SMU_{1n}$, and each of the common first electrodes 21, 31, 41 and 51 is connected to the first bit line $BL_1$ through the n-th-place first transistor for selection $TR_{1n}$. The second electrode 23, 33, 43 or 53 is connected to the common plate line $PL_m$.

In the second memory unit $MU_2$, the first electrode 21, 31, 41 and 51 of the second memory cell $MC_{2nm}$ constituting the n-th-place second sub-memory unit $SMU_{2n}$ are in common in the n-th-place second sub-memory unit $SMU_{2n}$, and each of the common first electrodes 21, 31, 41 and 51 is connected to the second bit line $BL_2$ through the n-th-place second transistor for selection $TR_{2n}$. The second electrode 23, 33, 43 or 53 is connected to the common plate line $PL_m$.

The first latch circuit $LC_1$, the second latch circuit $LC_2$, the third latch circuit $LC_3$ and the fourth latch circuit $LC_4$ are provided between the first bit line $BL_1$ and the second bit line $BL_2$. The first latch circuit $LC_1$ latches the data stored in the first memory cell $MC_{11m}$ and the second memory cell $MC_{21m}$. The second latch circuit $LC_2$ latches the data stored in the first memory cell $MC_{12m}$ and the second memory cell $MC_{22m}$. The third latch circuit $LC_3$ latches the data stored in the first memory cell $MC_{13m}$ and the second memory cell $MC_{23m}$. The fourth latch circuit $LC_4$ latches the data stored in the first memory cell $MC_{14m}$ and the second memory cell $MC_{24m}$.

1 bit is stored by writing complementary data into the memory cells $MC_{11m}$ and $MC_{21m}$ sharing the plate line $PL_1$, into the memory cells $MC_{12m}$ and $MC_{22m}$ sharing the plate line $PL_2$, into the memory cells $MC_{13m}$ and $MC_{23m}$ sharing the plate line $PL_3$, or into memory cells $MC_{14m}$ and $MC_{24m}$ sharing the plate line $PL_4$. One memory unit (access unit) is constituted by eight transistors for selection $TR_{11}$ to $TR_{14}$ and $TR_{21}$ to $TR_{24}$ and 64 memory cells $MC_{11m}$ to $MC_{14m}$ and $MC_{21m}$ to $MC_{24m}$, and 32 bits are stored.

The sense amplifiers $SA_1$, $SA_2$, $SA_3$ and $SA_4$ comprise the latch circuits $LC_1$, $LC_2$, $LC_3$ and $LC_4$, respectively.

In an actual nonvolatile memory, sets of memory units storing 32 bits each are arranged in the form of an array as access units.

The method of reading out the data from the nonvolatile memory of Example 19 can be the same as that explained in Example 16, so that the detailed explanation thereof is omitted.

In marginal dimensions in the constitution of the above memory array of Example 19, the dimension in the row direction is defined by the minimum pitch of the plate lines $PL_m$, and 4 bits are stored in a region surrounded by one plate line and the bit lines $BL_1$ and $BL_2$. The marginal dimensions are therefore $2F^2$. Further, a row address is selected through a two-dimensional matrix of the four word lines $WL_1$, $WL_2$, $WL_3$ and $WL_4$ and the eight plate lines $PL_M$. That is, 32 bits in the row direction can be accessed through the four word lines and the eight plate lines, and the number of drivers required for row-address selection can be 0.375 per address. As compared with a conventional memory cell structure, therefore, the number of driving signal lines can be decreased, and the number of peripheral circuits can be remarkably decreased.

EXAMPLE 20

In Example 20, the structure of the nonvolatile memory of Example 19 is altered to a structure which is the same as that described in Example 12. That is, the gate electrodes of the transistors for selection $TR_{21}$, $TR_{22}$, $TR_{23}$ and $TR_{24}$ connected to the sub-memory unit $SMU_{21}$, $SMU_{22}$, $SMU_{23}$ and $SMU_{24}$ are connected to word lines $WL_{21}$, $WL_{22}$, $WL_{23}$ and $WL_{24}$ in place of the word lines $WL_1$, $WL_2$, $WL_3$ and $WL_4$, respectively, similar to the equivalent circuit shown in FIG. 17. The latch circuits are provided between the first bit line $BL_1$ and the second bit line $BL_2$. The number of the latch circuits agrees with the number of the first memory cells and the second memory cells which memory cells share the plate line $PL_m$.

That is, the latch circuits $LC_P$, the transistors for switching $TR_{SWP1}$ and $TR_{SWP2}$, the latch control lines $CL_P$ and the sense amplifiers $SA_P$ (P=2N and specifically, P=8 in Example 20) as shown in FIG. 39 are provided between the first bit line $BL_1$ and the second bit line $BL_2$, while these are omitted in FIG. 17.

In the nonvolatile memory of Example 20, when the word lines $WL_{11}$ to $WL_{14}$ are selected, the sub-memory units $SMU_{11}$ to $SMU_{14}$ are accessed, and a voltage (bit line voltage) corresponding to the data stored appears in the bit line $BL_1$ alone. At this stage, the bit line $BL_2$ connected to the same sense amplifiers $SA_1$ to $SA_8$ is provided with a reference potential at an intermediate level between the voltage (bit line voltage) for reading out data "1" and the voltage (bit line voltage) for reading out data "0". When the word lines $WL_{21}$ to $WL_{24}$ are selected, the sub-memory units $SMU_{21}$ to $SMU_{24}$ are accessed, and a voltage (bit line voltage) corresponding to the data stored appears in the bit line $BL_2$ alone. At this stage, the bit line $BL_1$ connected to the same sense amplifiers $SA_1$ to $SA_8$ is provided with a reference potential at an intermediate level between the voltage (bit line voltage) for reading out data "1" and the voltage (bit line voltage) for reading out data "0".

The (2n-1)-th latch circuit latches the data stored in the first memory cell constituting the n-th-place first sub-memory unit, and the 2n-th latch circuit latches the data stored in the second memory cell constituting the n-th-place second sub-memory unit. Specifically, the first latch circuit $LC_1$ latches the data stored in the first memory cell $MC_{11m}$ constituting the first-place first sub-memory unit $SMU_{11}$. The second latch circuit $LC_2$ latches the data stored in the second memory cell $MC_{21m}$ constituting the first-place second sub-memory unit $SMU_{21}$. The third latch circuit $LC_3$ latches the data stored in the first memory cell $MC_{12m}$ constituting the second-place first sub-memory unit $SMU_{12}$. The fourth latch circuit $LC_4$ latches the data stored in the second memory cell $MC_{22m}$ constituting the second-place second sub-memory unit $SMU_{22}$. Further, the fifth latch circuit $LC_5$ latches the data stored in the first memory cell $MC_{13m}$ constituting the third-place first sub-memory unit $SMU_{13}$. The sixth latch circuit $LC_6$ latches the data stored in the second memory cell $MC_{23m}$ constituting the third-place second sub-memory unit $SMU_{23}$. The seventh latch circuit $LC_7$ latches the data stored in the first memory cell $MC_{14m}$ constituting the fourth-place first sub-memory unit $SMU_{14}$. The eighth latch circuit $LC_8$ latches the data stored in the second memory cell $MC_{24m}$ constituting the fourth-place second sub-memory unit $SMU_{24}$.

In the nonvolatile memory in Example 20, the signal amount (potential difference) comes to be about a half as compared with Example 19, and the operation margin decreases due to fluctuation of the reference potential. However, the integration degree of the nonvolatile memory is almost doubled. In the nonvolatile memory in Example 20, when, for example, the word line $WL_{11}$ and the word line $WL_{21}$ are selected at the same time, data can be read out from the memory cells $MC_{1nm}$ and $MC_{2nm}$ which memory cells share the plate line $PL_m$ (that is, paired memory cells), so that substantially the same operation of the nonvolatile memory as that described in Example 19 can be achieved.

The structure of the nonvolatile memory of Example 16 can be altered to a structure which is the same as that described in Example 20, whereby the structure of the nonvolatile memory similar to Example 12 can be obtained. That is, the gate electrodes of the transistors for selection $TR_{21}$ and $TR_{22}$ connected to the sub-memory units $SMU_{21}$ and $SMU_{22}$ are connected to the word lines $WL_{21}$ and $WL_{22}$ in place of the word line $WL_1$ and $WL_2$, respectively, as shown in FIG. 5. In this case, the latch circuits $LC_P$, the transistors for switching $TR_{SWP1}$ and $TR_{SWP2}$, the latch control lines $CL_P$ and the sense amplifiers $SA_P$ (P=2N and specifically, P=4) may be provided between the first bit line $BL_1$ and the second bit. line $BL_2$, as shown in FIG. 39. And, the (2n-1)-th latch circuit latches the data stored in the first memory cell constituting the n-th-place first sub-memory unit, and the 2n-th latch circuit latches the data stored in the second memory cell constituting the n-th-place second sub-memory unit. Specifically, the first latch circuit $LC_1$ latches the data stored in the first memory cell $MC_{11m}$ constituting the first-place first sub-memory unit $SMU_{11}$. The second latch circuit $LC_2$ latches the data stored in the second memory cell $MC_{21m}$ constituting the first-place second sub-memory unit $SMU_{21}$. The third latch circuit $LC_3$ latches the data stored in the first memory cell $MC_{12m}$ constituting the second-place first sub-memory unit $SMU_{12}$. The fourth latch circuit $LC_4$ latches the data stored in the second memory cell $MC_{22m}$ constituting the second-place second sub-memory unit $SMU_{22}$.

There may be employed a constitution in which the sub-memory units $SMU_{11}$, $SMU_{12}$, $SMU_{21}$ and $SMU_{22}$ are formed on the insulation layer 16, insulating interlayer 26 is formed on the whole surface and the sub-memory units $SMU_{13}$, $SMU_{14}$, $SMU_{23}$ and $SMU_{24}$ are formed on the insulating interlayer 26, although disadvantageous in area.

The structure of the memory unit described in any one of Examples 1 to 11 can be applied to the nonvolatile memory described in any one of Examples 12 to 20.

EXAMPLE 21

Figure 48:
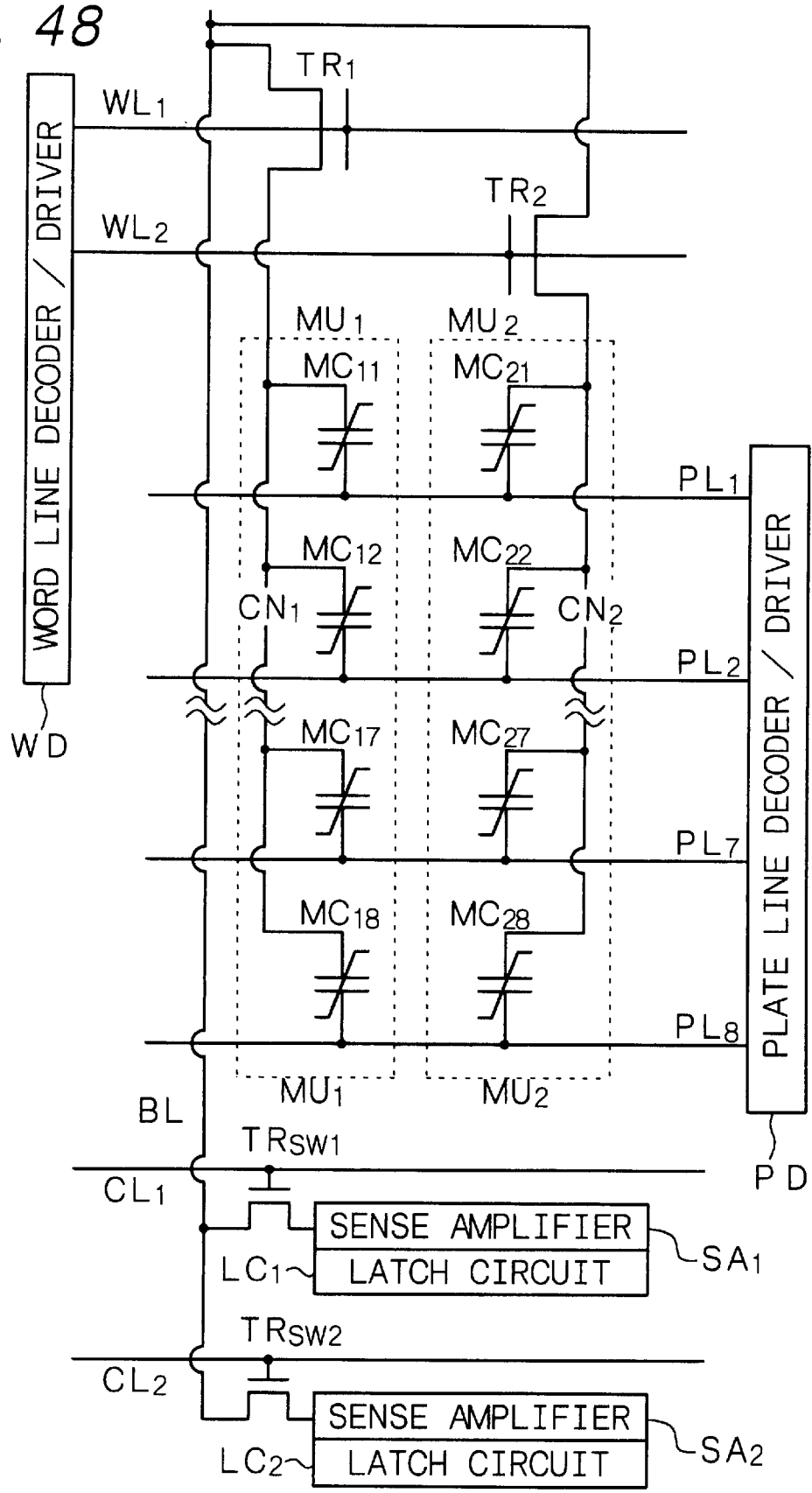
FIG. 48 is a circuit diagram of a ferroelectric-type nonvolatile semiconductor memory in Example 21.
Figure 49:
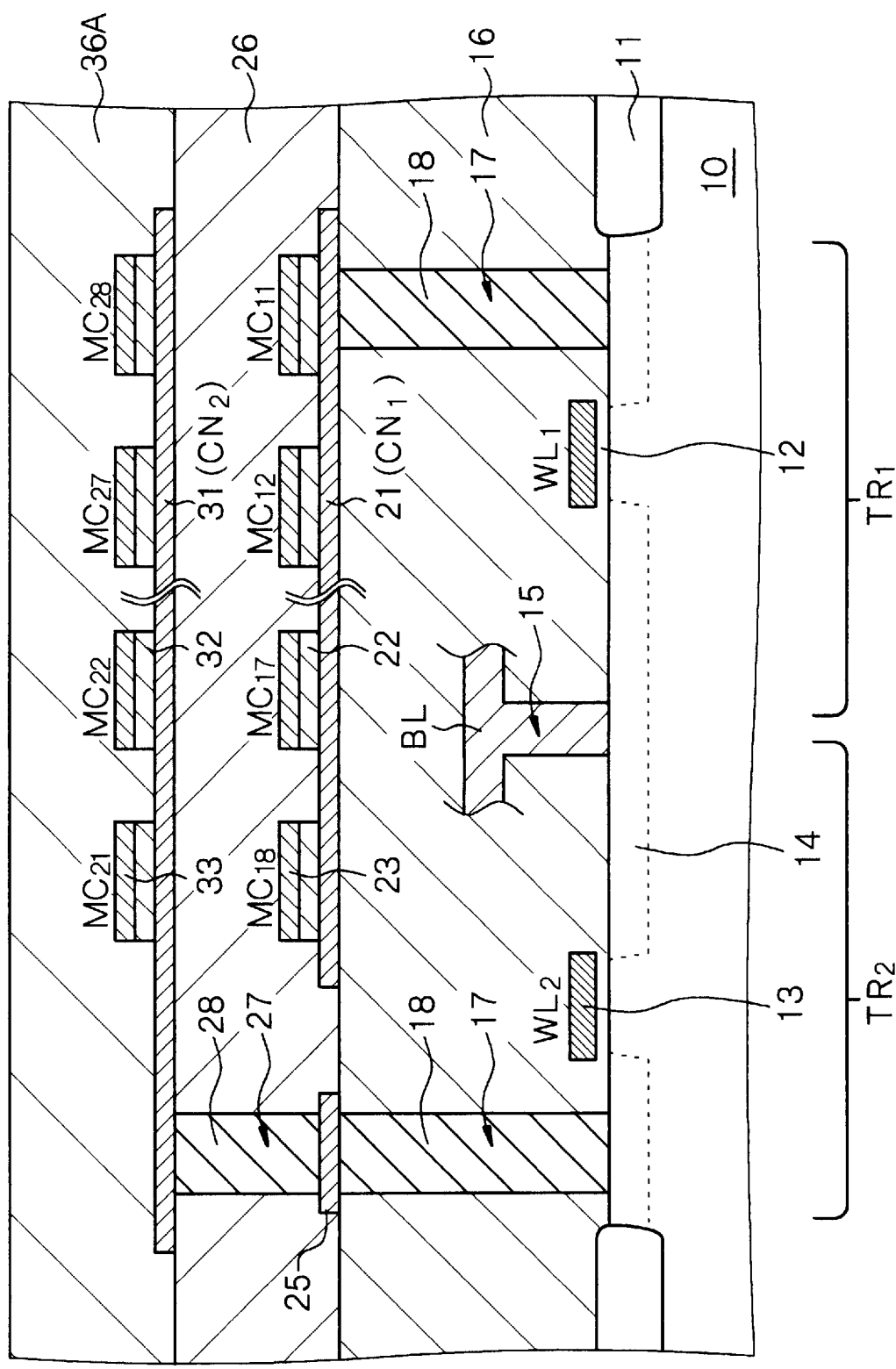
FIG. 49 is a schematic partial cross-sectional view of the ferroelectric-type nonvolatile semiconductor memory in Example 21.

Example 21 is concerned with the nonvolatile memory according to the thirteenth aspect of the present invention and the operation method according to the second and third aspects of the present invention. FIG. 48 shows a circuit diagram of the nonvolatile memory in Example 21, and FIG. 49 shows a schematic partial cross-sectional view thereof.

The nonvolatile memory of Example 21 comprises;

(A) a bit line BL, (B) transistors for selection $TR_1$, $TR_2$ in the number of N wherein $N \geq 2$ and N=2 in Example 21, (C) memory units ($MU_1$, $MU_2$) in the number of N, each memory unit comprising memory cells $MC_{nm}$ in the number of M wherein $M \geq 2$, M=8, n=1 and 2, and m=1 to 8 in Example 21, and (D) plate lines $PL_m$ in the number of M.

Each memory cell $MC_{nm}$ comprises a first electrode 21 or 31, a ferroelectric layer 22 or 32 and a second electrode 23 or 33. The first electrodes 21 of the memory cells $MC_{1m}$ constituting the first memory unit $MU_1$ are in common in the first memory unit $MU_1$, and the common first electrode (common node $CN_1$) is connected to the bit line BL through the first transistor for selection $TR_1$. The second electrode 23 of the m-th memory cell $MC_{1m}$ (m=1, 2 ... M) is connected to the common m-th plate line $PL_m$ common to the memory units. The first electrodes 31 of the memory cells $MC_{2m}$ constituting the second memory unit $MU_2$ are in common in the second memory unit $MU_2$, and the common first electrode (common node $CN_2$) is connected to the bit line BL through the second transistor for selection $TR_2$. The second electrode 33 of the m-th memory cell $MC_{2m}$ (m=1, 2 ... M) is connected to the common m-th plate line $PL_m$ common to the memory units.

The number (M) of the memory cells constituting the memory unit of the nonvolatile memory shall not be limited to eight (8), and it is any number so long as it satisfies $M \geq 22$. The above number is preferably an exponent of 2 (M=2, 4, 8, 16 ...).

Latch circuits in the number of at least N are connected to the bit line BL for latching data stored in the memory cells. Specifically, in Example 21, the n-th latch circuit $LC_n$ (n=1, 2 ... N) latches the data stored in the memory cell $MC_{nm}$ constituting the n-th memory unit $MU_n$. A first transistor for switching $TR_{SW1}$ is provided between the first latch circuit $LC_1$ and the bit line BL, and a second transistor for switching $TR_{SW2}$ is provided between the second latch circuit $LC_2$ and the bit line BL. A first sense amplifier $SA_1$ comprises the first latch circuit $LC_1$ and a second sense amplifier $SA_2$ comprises the second latch circuit $LC_2$, while the constitution of the sense amplifiers shall not be limited thereto. The gate electrodes of the transistor for switching $TR_{SW1}$ and $TR_{SW2}$ are connected to a first latch control line $CL_1$ and a second latch control line $CL_2$, respectively. The latch circuit may be the same circuit as that shown in FIG. 41, so that the detailed explanation thereof is omitted.

The plate line $PL_m$ of the memory cell $MC_{2m}$ is common to the plate line $PL_m$ of the memory cell $MC_{1m}$, and is connected to a plate line decoder/driver PD. The gate electrode of the first transistor for selection $TR_1$ is connected to a first word line $WL_1$, and the gate electrode of the second transistor for selection $TR_2$ is connected to a second word line $WL_2$. The word lines $WL_1$ and $WL_2$ are connected to a word line decoder/driver WD.

Figure 50:
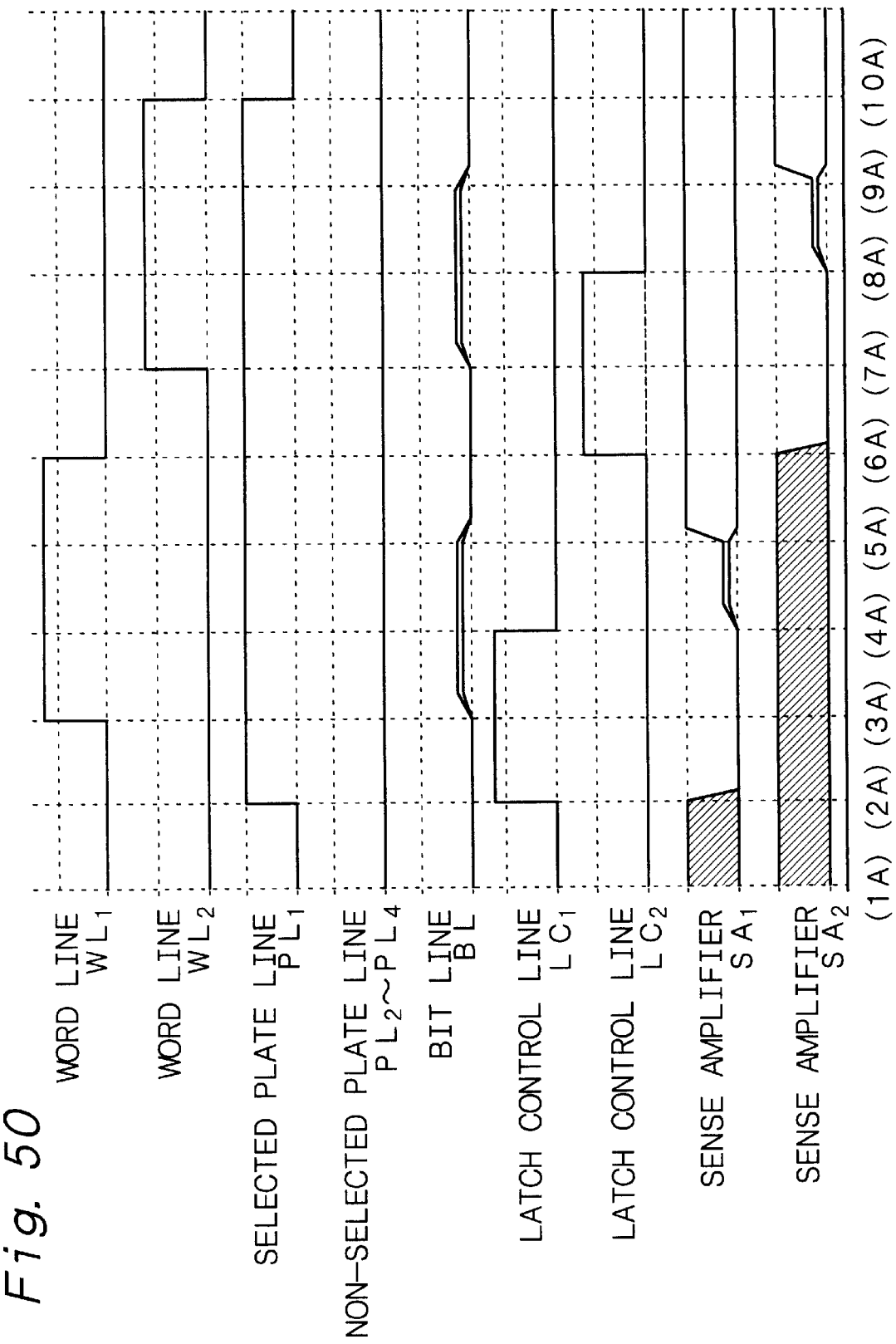
FIG. 50 is a diagram of operation waveforms of the ferroelectric-type nonvolatile semiconductor memory in Example 21.
Figure 51:
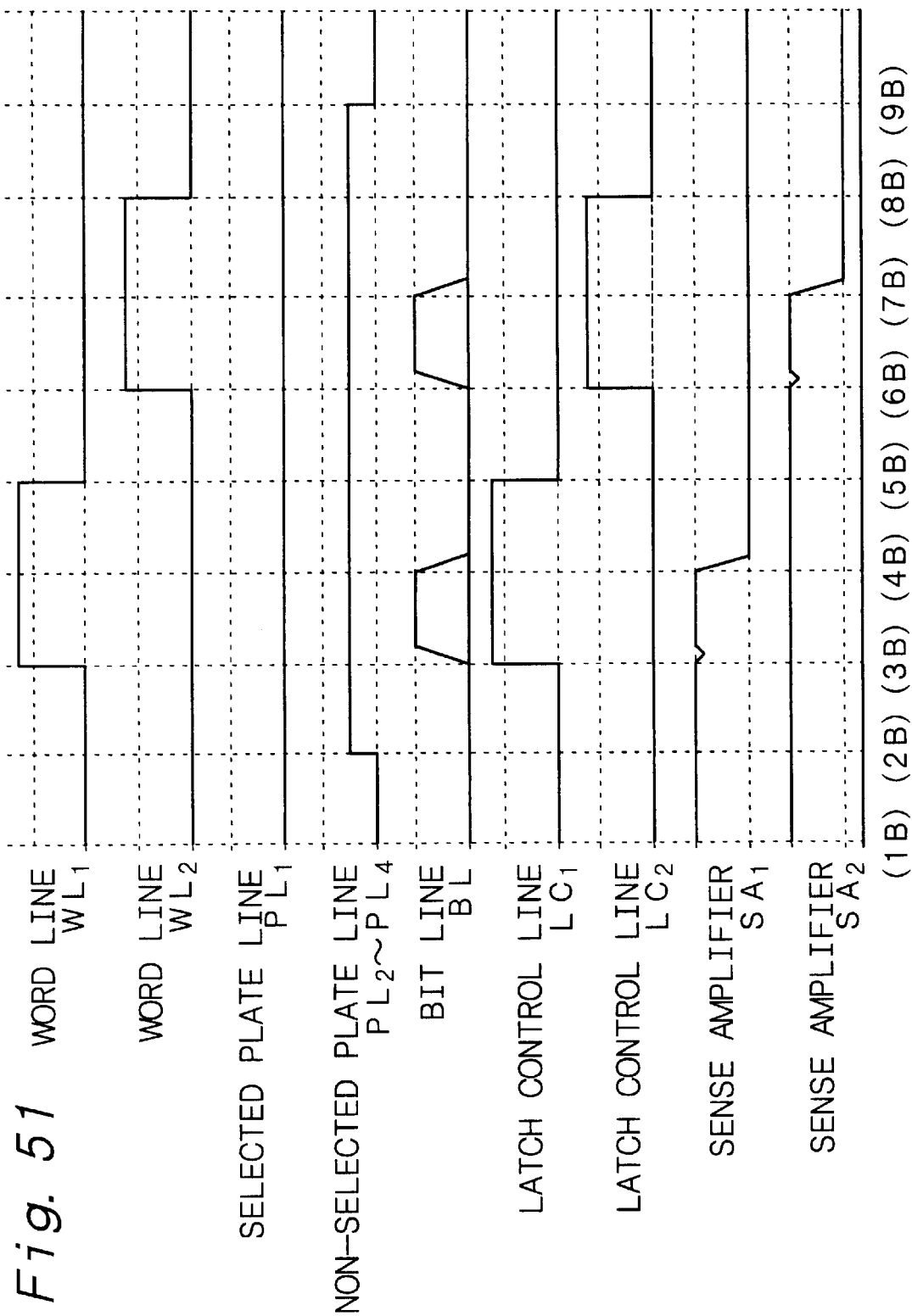
FIG. 51 is a diagram of operation waveforms of the ferroelectric-type nonvolatile semiconductor memory in Example 21.

One example of the operation method of reading out data from, and re-writing the data into, the nonvolatile memory of Example 21 will be explained below. As one example, data is read out from the memory cells $MC_{11}$ and $MC_{21}$ which memory cells share the plate line $PL_1$, and data is re-written therein. The memory cells $MC_{11}$ has stored data "1" and the memory cell $MC_{21}$ has stored data "0". FIGS. 50 and 51 show operation waveforms. In FIGS. 50 and 51, parenthesized numbers correspond to Nos. of steps to be explained below. In the drawings showing the operation waveforms, "sense amplifier $SA_1$" and "sense amplifier $SA_2$" stand for the potentials at the outputs portions of these sense amplifier, respectively.

First, readout of the data stored in the selected memory cell $MC_{11}$ and the selected memory cell $MC_{21}$ will be carried out (see FIG. 50).

(1A) In a standby state, all bit lines, all word lines, and all plate lines have 0 volt. Further, the common nodes $CN_1$ and $CN_2$ have 0 volt and are in a floating state.

(2A) When the data is read out, potential rising of the selected plate line $PL_1$ is carried out, that is, $V_{PL-H}(=V_{CC})$ is applied to the selected plate line $PL_1$, and the non-selected plate lines $PL_m$ (m=2, 3 . . . M) are maintain at a potential of $V_{PL-L}(=0$ volt). In this case, the common nodes $CN_1$ and $CN_2$ come to have a value close to 0 volt since their coupling with the non-selected plate lines $PL_m$ (m=2, 3 . . . M) is intense. As a result, polarization inversion takes place in the ferroelectric layer of the memory cell $MC_{11}$ in which data "1" is stored, and the potential of the common node $CN_1$ increases. At the same time, the first transistor for switching $TR_{SW1}$ is brought into an ON-state through the first latch control line $CL_1$, whereby the first latch circuit $LC_1$ is selected, while the potential of the first sense amplifier $SA_1$ is brought into 0 volt. Then, a grounding line (not shown) and the bit line BL are electrically disconnected, to bring the bit line BL into a floating state.

(3A) Then, the first word line $WL_1$ is brought to a high level to bring the first transistor for selection $TR_1$ into an ON-state, whereby the common node $CN_1$ of the first memory unit $MU_1$ is connected to the bit line BL.

(4A) Thereafter, the first transistor for switching $TR_{SW1}$ is brought into an OFF-state through the first latch control line $CL_1$, to disconnect the first latch circuit $LC_1$ from the bit line BL.

(5A) Then the first latch circuit $LC_1$ is activated to determine the data, and such data (data "1" in this example) is latched in the first latch circuit $LC_1$ in the first sense amplifier $SA_1$. And, the bit line BL is set at 0 volt, whereby data "0" is written into the selected memory cell $MC_{11}$.

(6A) Then, the first word line $WL_1$ is brought to a low level to bring the first transistor for selection $TR_1$ into an OFF-state. As a result, the common node $CN_1$ of the first memory unit $MU_1$ and the bit line BL are disconnected. And, the second transistor for switching $TR_{SW2}$ is brought into an ON-state through the second latch control line $CL_2$, whereby the second latch circuit $LC_2$ is selected, while the potential of the second sense amplifier $SA_2$ is brought into 0 volt. Then, the grounding line (not shown) and the bit line BL are electrically disconnected, to bring the bit line BL into a floating state.

(7A) Then, the second word line $WL_2$ is brought to a high level to bring the second transistor for selection $TR_2$ into an ON-state, whereby the common node $CN_2$ of the second memory unit $MU_2$ is connected to the bit line BL. No polarization inversion takes place in the ferroelectric layer of the memory cell $MC_{21}$ in which data "0" is stored. Therefore, the potential (bit line potential) in the bit line BL is low.

(8A) Thereafter, the second transistor for switching $TR_{SW2}$ is brought into an OFF-state through the second latch control line $CL_2$, to disconnect the second latch circuit $LC_2$ from the bit line BL.

(9A) Then, the second latch circuit $LC_2$ is activated to determine the data, and such data (data "0" in this example) is latched in the second latch circuit $LC_2$ in the second sense amplifier $SA_2$. And, the bit line BL is set at 0 volt, whereby data "0" is written into the selected memory cell $MC_{21}$.

(10A) Then, the second word line $WL_2$ is brought to a low level to bring the second transistor for selection $TR_2$ into an OFF-state. As a result, the common node $CN_2$ of the second memory unit $MU_2$ and the bit line BL are disconnected. At the same time, potential falling of the selected plate line $PL_1$ is carried out, that is, the potential of the selected plate line $PL_1$ is brought back to $V_{PL-L}(=0$ volt).

Readout of data from the memory cell $MC_{11}$ and the memory cell $MC_{21}$ is completed by the above procedures. In this state, the memory cell $MC_{11}$ and the memory cell $MC_{21}$ have data "0" written therein. Further, the data already stored in the memory cell $MC_{11}$ constituting the first memory unit $MU_1$ and the memory cell $MC_{21}$ constituting the second memory unit $MU_2$ are latched in the first latch circuit $LC_1$ and the second latch circuit $LC_2$, respectively.

Then, re-writing of data into the selected memory cell $MC_{11}$ and the memory cell $MC_{21}$ will be carried out. Specifically, re-writing of data "1" will be carried out.

(1B) In an initial state, all bit lines, all word lines, and all plate lines have 0 volt. Further, the common nodes $CN_1$ and $CN_2$ have 0 volt and are in a floating state.

(2B) Then, $(1/2)V_{PL-H}[=(1/2)V_{CC}]$ is applied to the non-selected plate lines $PL_m$ (m=2, 3 . . . M). The potential of the selected plate line $PL_1$ remains at $V_{PL-L}$ (=0 volt).

(3B) Then, the first word line $WL_1$ is brought to a high level to bring the first transistor for selection $TR_1$ into an ON-state, whereby the common node $CN_1$ of the first memory unit $MU_1$ is connected to the bit line BL. At the same time, the first transistor for switching $TR_{SW1}$ is brought into an ON-state through the first latch control line $CL_1$, whereby the first latch circuit $LC_1$ is connected to the bit line BL. As a result, the potential of the bit line BL is increased up to $V_{BL-H}(=V_{CC})$ due to the data latched in the first latch circuit $LC_1$ (date "1" in this example). Therefore, the selected memory cell $MC_{11}$ undergoes re-inversion of polarization in its polarization state, to re-write data "1".

(4B) Then, the potential of the bit line BL is brought to 0 volt to bring the common node $CN_1$ back to 0 volt.

(5B) Then, the first word line $WL_1$ is brought to a low level to bring the first transistor for selection $TR_1$ into an OFF-state, whereby the common node $CN_1$ of the first memory unit $MU_1$ and the bit line BL are disconnected. At the same time, the first transistor for switching $TR_{SW1}$ is brought into an OFF-state through the first latch control line $CL_1$, to disconnect the first latch circuit $LC_1$ from the bit line BL.

(6B) Then, the second word line $WL_2$ is brought to a high level to bring the second transistor for selection $TR_2$ into an ON-state, whereby the common node $CN_2$ of the second memory unit $MU_2$ is connected to the bit line BL. At the same time, the second transistor for switching $TR_{SW2}$ is brought into an ON-state through the second latch control line $CL_2$, whereby the second latch circuit $LC_2$ is connected to the bit line BL. As a result, the potential of the bit line BL remains at $V_{BL-L}(=0$ volt) due to the data latched in the second latch circuit $LC_2$ (date "0" in this example). Therefore, the selected memory cell $MC_{21}$ undergoes no change in its polarization state and retains data "0".

(7B) Then, the potential of the bit line BL is brought to 0 volt to bring the common node $CN_2$ back to 0 volt.

(8B) Then, the second word line $WL_2$ is brought to a low level to bring the second transistor for selection $TR_2$ into an OFF-state, whereby the common node $CN_2$ of the second memory unit $MU_2$ and the bit line BL are disconnected. At the same time, the second transistor for switching $TR_{SW2}$ is brought into an OFF-state through the second latch control line $CL_2$, to disconnect the second latch circuit $LC_2$ from the bit line BL.

(9B) Thereafter, the potential of each of the non-selected plate lines $PL_m$ (m=2, 3 . . . M) is brought back to $V_{PL-L}(=0$ volt).

Re-writing of data "1" is completed by the above procedures. In the above procedures, readout of the data from, and re-writing of data into, the memory cell $MC_{11}$ and the memory cell $MC_{21}$ which memory cells share the plate line $PL_1$ in the two memory units $MU_1$ and $MU_2$ are performed by performing potential rising of the plate line ($V_{PL-L} \to V_{PL-H}$) in the step (2A) and potential falling ($V_{PL-H} \to V_{PL-L}$) in the step (10A) once each.

Further, in the two memory units $MU_1$ and $MU_2$, the data stored in the memory cells in the memory units in which the plate lines are shared is read out by first providing the plate line with a pulse in the step (2A) and then consecutively selecting the transistors for selection in the number of N, that is, the step (3A) to the step(5A) and the step (7A) to the step(9A) are carried out.

Thereafter, the procedures of the steps (1A) to (10A) and the steps (1B) to (9B) are consecutively carried out with regard to the memory cell $MC_{12}$ and the memory cell $MC_{22}$ which memory cells share the plate line $PL_2$, the memory cell $MC_{13}$ and the memory cell $MC_{23}$ which memory cells share the plate line $PL_3$, and the memory cell $MC_{14}$ and the memory cell $MC_{24}$ which memory cells share the plate line $PL_4$, and so on.

When new date is written, first, the steps (1A) to (10A) may be carried out, then, a desired value corresponding to the new data is latched in the latch circuit relating to a memory cell into which new data is to be written (that is, the first latch circuit for the memory cells constituting the first memory unit or the second latch circuit for the memory cells constituting the second memory unit), and then, the steps (1B) to (9B) may be carried out.

The plate line connected to a plurality of memory cells has a large load capacity, so that driving speed is slow, that is, charge and discharge take a lot of time, and that a consumption power is high. Therefore, the operation method of the nonvolatile memory of Example 21, in which readout of the data from, and re-writing of the data into, the memory cell $MC_{11}$ and the memory cell $MC_{21}$ which memory cells share the plate line $PL_1$ are performed by performing potential rising of the plate line and potential falling once each, is advantageous in view of driving speed and power consumption as compared with the operation method of the nonvolatile memory disclosed in JP-A-158632/1999 in which readout of the data from, and re-writing of data into, the memory cell $MC_{11}$ and the memory cell $MC_{21}$ which memory cells share the plate line $PL_1$ are performed by performing potential rising of the plate line and potential falling twice each.

In the operation method of the nonvolatile memory of Example 21, readout of data and re-writing of data are performed in order of $(MC_{11}, MC_{21}) \to (MC_{12}, MC_{22}) \to (MC_{13}, MC_{23}) \to (MC_{14}, MC_{24})$ . . . . . Therefore, no disturbance is exerted on the memory cell $MC_{1m}$ and the memory cell $MC_{2m}$ which memory cells share the plate line $PL_m$, from which memory cells data are read out and into which memory cells data are re-written.

In the steps (1A) to (10A), the potential in the non-selected plate lines $PL_m$ (m=2, 3 . . . M) is fixed at $V_{PL-L}(=0$ volt). The potential in the bit line BL varies between 0 volt and the bit line potential (reading signal amount). The above bit line potential (reading signal amount) is generally approximately 0.5 volt or lower. Therefore, in the steps (1A) to (10A), no or little disturbance takes place in the memory cells $MC_{1m}$ and $MC_{2m}$ (m=2, 3 . . . M) connected to the non-selected plate lines $PL_m$ (m=2, 3 . . . M).

In the steps (1B) to (9B), the potential of the selected plate line $PL_1$ is fixed at $V_{PL-L}(=0$ volt) and the potential of the non-selected plate lines $PL_m$ (m=2, 3 . . . M) is fixed at $(1/2)V_{PL-H}[=(1/2)V_{CC}]$. Further, the potential of the bit line BL is $V_{BL-L}(=0$ volt) or $V_{BL-H}(=V_{CC})$. Therefore, although disturbance of $\pm(1/2)V_{CC}$ is exerted on the memory cells connected the non-selected plate lines $PL_m$ (m=2, 3 . . . M), the potential exerted on these memory cells is stable and no polarization inversion takes place so long as the coercive voltage is set at a value higher than the above value. Further, no effective disturbance is exerted on the memory cell $MC_{11}$ and the memory cell $MC_{21}$ which are connected to the selected plate line $PL_1$.

The structure of the nonvolatile memory explained in any one of Examples 1 to 11 can be applied to the nonvolatile memory explained in Example 21. Further, the operation method of the nonvolatile memory explained in Example 13 in which the memory cells connected to the selected plate line are re-written in a "page" mode like so-called flash memory can be applied to Example 21. Further, the operation method of the nonvolatile memory explained in Example 14 can be applied to Example 21.

While the present invention has been explained with reference to preferred embodiments hereinabove, the present invention shall not be limited thereto. Structures of the nonvolatile memories, materials, forming conditions, circuit constitutions, operation methods, etc., explained in Examples are given by way of examples and may be altered as required.

Generally, if the total number of signal lines for driving units is A, if the number of word lines in the signal lines is B, and if the number of plate lines in the signal lines is C, the equation of A=B+C is satisfied. If the total number A is constant, a maximum number of total addresses (=B×C) of the units is obtained when B=C. For arranging peripheral circuits most efficiently, it is sufficient to bring the number B of the word lines and the number C of the plate lines in the units into agreement. Further, the number of the word lines in access units of row addresses equals the number of stages (stories) of the memory cell stacking, and the number of the plate lines equals the number of memory cells constituting the memory unit or sub-memory unit, while the integration degree of a nonvolatile memory improves with an increase in the numbers of the word lines and the plate lines. And, a product of the number of the word lines and the number of the plate lines represents the number (or times) of addresses that can be accessed. If the premises is introduced that blanket continuous accesses are made, a value obtained by reducing "1" from the above product is the number of disturbance that occur. Therefore, the value of the product of the number of the word lines and the number of the plate lines can be determined depending upon durability of the memory cells against disturbance and process factors thereof.

Figure 52:
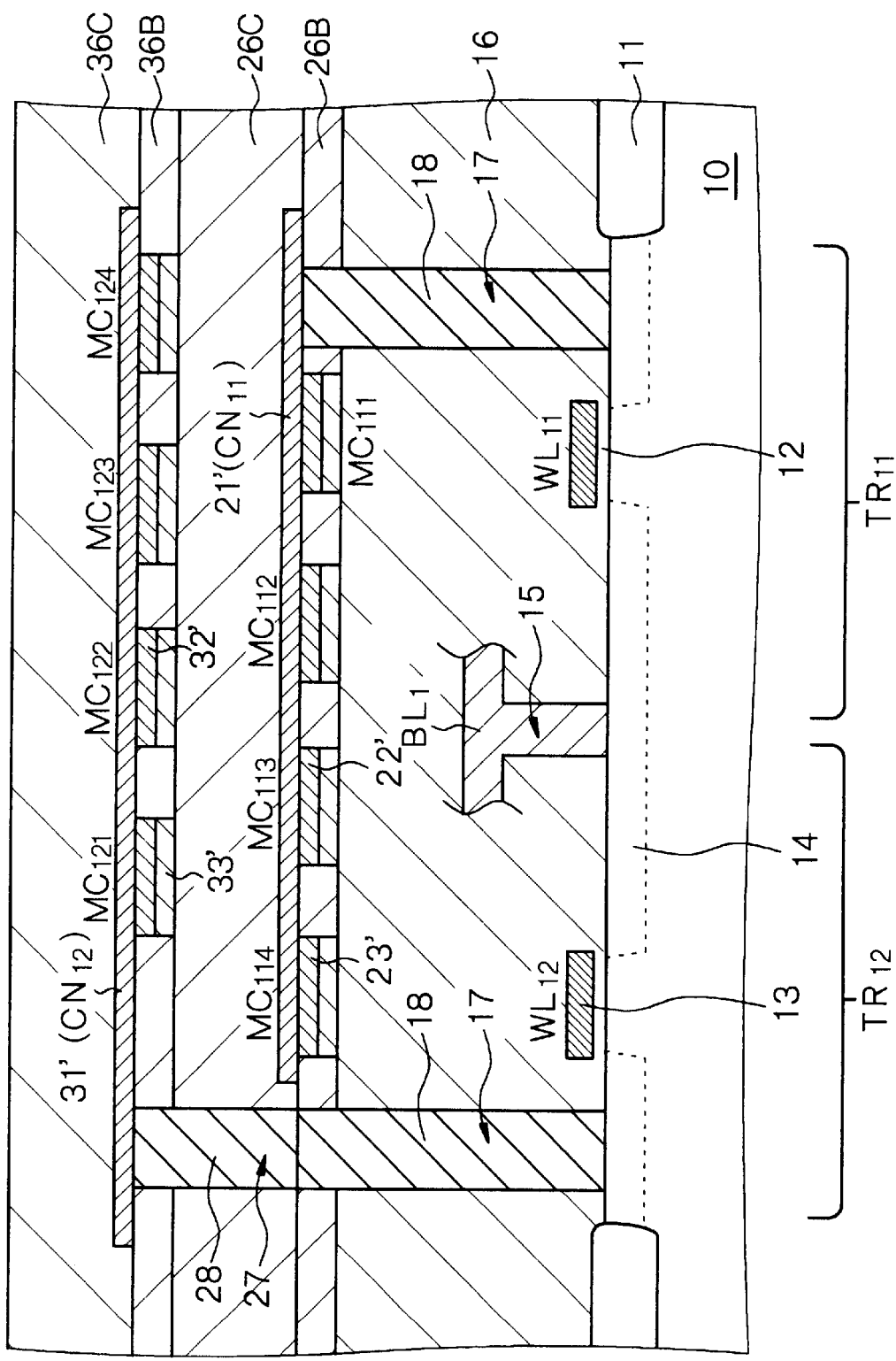
FIG. 52 is a schematic partial cross-sectional view of variant of the ferroelectric-type nonvolatile semiconductor memory in Example 4.
Figure 53:
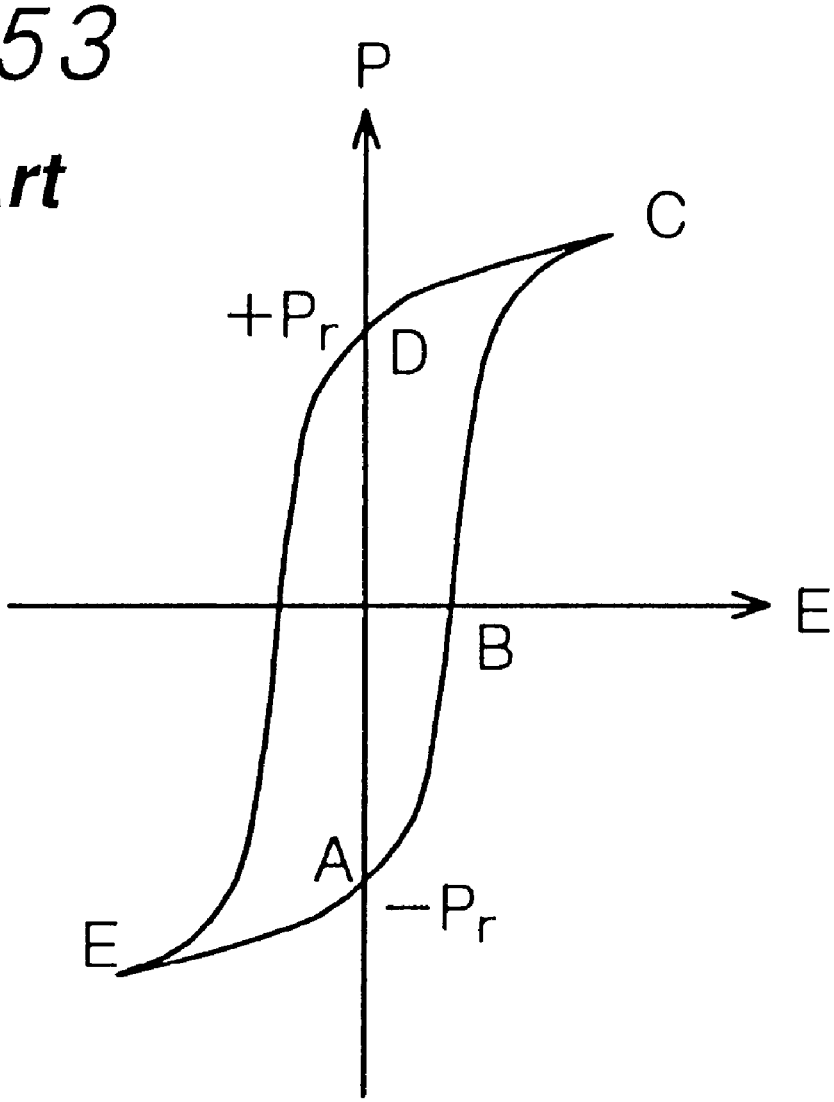
FIG. 53 is a diagram of P-E hysteresis loop of a ferroelectric material.
Figure 54:
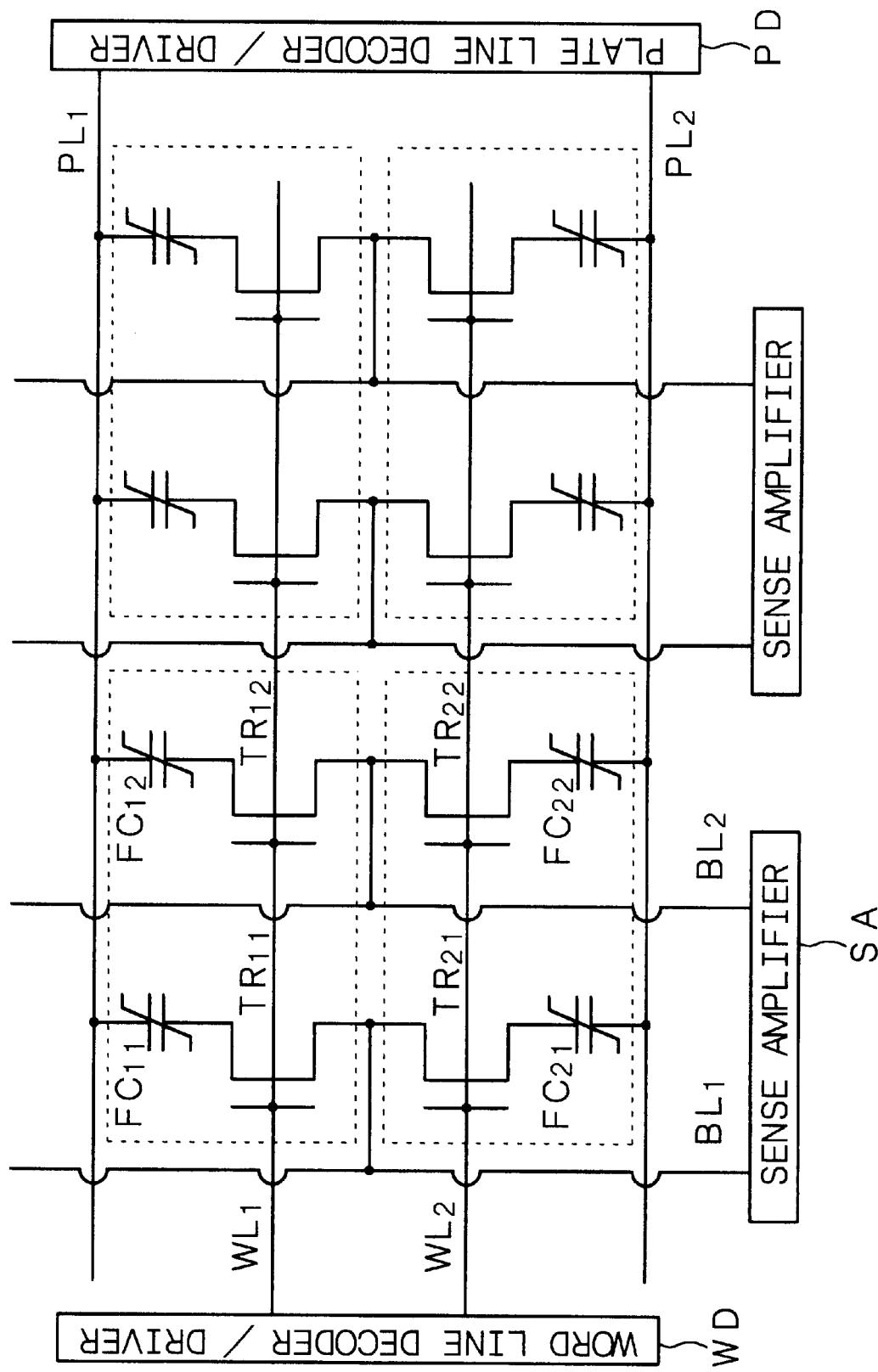
FIG. 54 is a circuit diagram of a ferroelectric-type nonvolatile semiconductor memory disclosed in U.S. Pat. No. 4,873,664.
Figure 55:
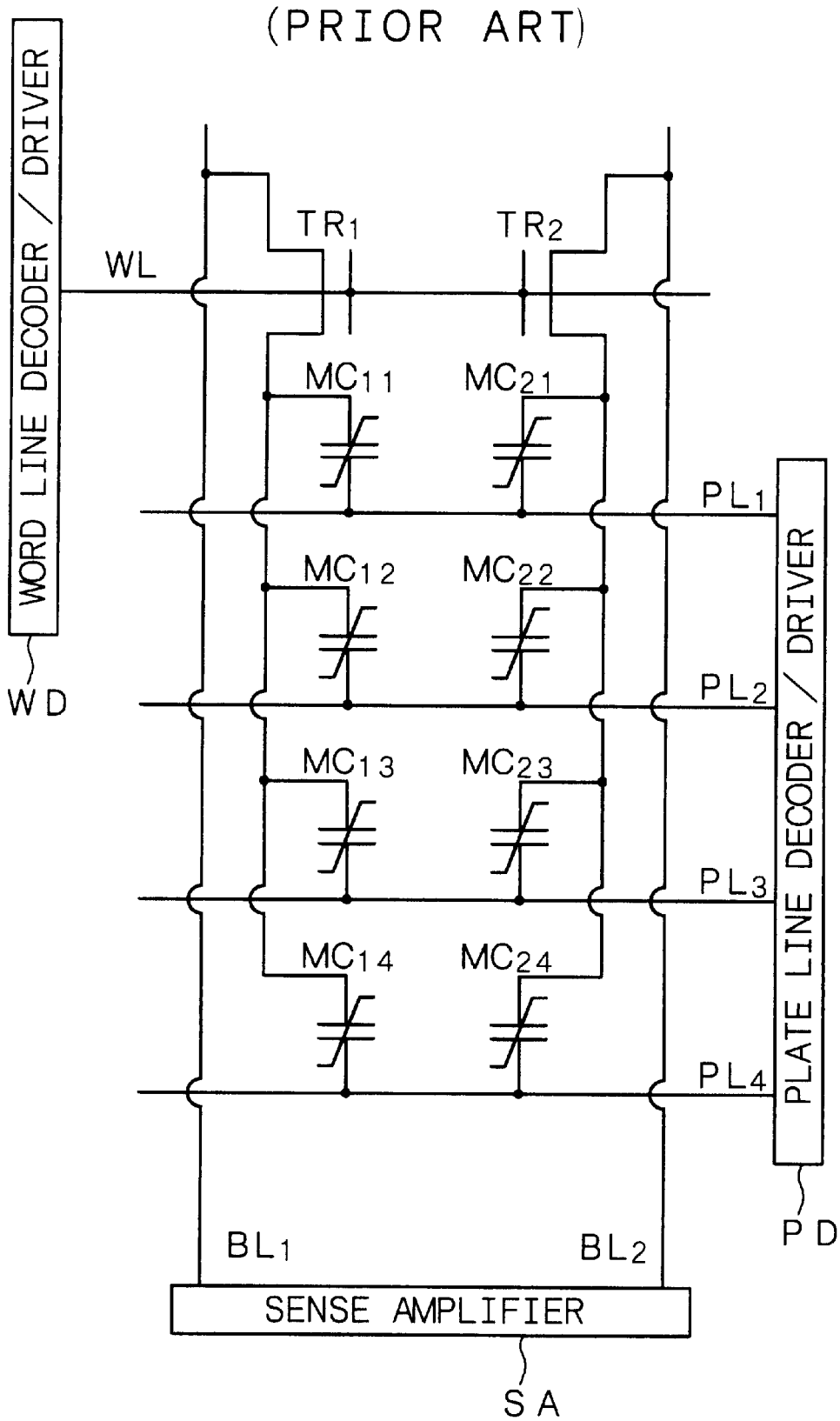
FIG. 55 is a circuit diagram of a ferroelectric-type nonvolatile semiconductor memory disclosed in JP-A-121032/1997.

For example, the nonvolatile memory in Example 2 includes a variant in which a first electrode 21' is an upper electrode and a second electrode 23' is a lower electrode as shown in FIG. 52. Such a structure can be applied to the nonvolatile memories of other Examples. In FIG. 52, reference numerals 26B and 26C refer to lower and upper layers of a first insulating interlayer, and reference numerals 36B and 36C refer to lower and upper films of an upper insulating film.

The ferroelectric layers 22, 32, 43 and 52 may have a plane form nearly similar to the plane form of the first electrode and may be formed so as to cover the first electrode depending upon the methods of producing the nonvolatile memories. Alternatively, there may be employed a constitution in which the ferroelectric layer is not patterned.

While Examples mostly explain nonvolatile memories having a constitution in which a plurality of memory cells are connected to one transistor for selection, the constitution of the nonvolatile memory according to the seventh or eighth aspect of the present invention can be applied to a nonvolatile memory having any type or constitution in which a non-selected memory cell is disturbed. The constitution of such a nonvolatile memory according to the seventh or eighth aspect of the present invention can be applied, for example, to a nonvolatile memory having a constitution in which a transistor for selection and a capacitor member are integrated, specifically, to a nonvolatile memory having a memory unit formed by arranging a plurality of memory cells having a structure in which a ferroelectric film is formed in place of a gate insulating layer of field effect transistors.

In the nonvolatile memory according to any one of the first to fifth aspects of the present invention, a plurality of memory cells are formed, so that the cell area per bit can be decreased. Further, the memory units or sub-memory units are stacked, so that a nonvolatile memory having a far higher integration degree, for example, a nonvolatile memory of a giga-byte class, can be materialized. Moreover, a higher capacity of a nonvolatile memory can be attained without limitations imposed by the minimum fabrication dimensions. Further, the number of driving wiring lines for address selection can be decreased, so that the peripheral circuit can be decreased in size. Furthermore, a decrease in the size of the memory cells and a decrease in the size of the peripheral circuits can be compatibilized, so that the integration degree of a device as a whole can be improved in a well-balanced style.

In the nonvolatile memory according to the sixth aspect of the present invention, the crystallization temperature of the ferroelectric layers constituting capacitor members or memory cells constituting the memory units or sub-memory units positioned on several stages (stories) is defined. Therefore, even if heat treatment for crystallization is carried out as many times as the number of stages of the stacked capacitor members or stages of the stacked memory units or sub-memory units, the nonvolatile memory is free from the problem that the capacitor member(s) or the memory unit(s) or sub-memory unit(s) existing in lower positions deteriorate(s) in properties, and the nonvolatile memory is excellent in performances.

In the nonvolatile memory according to any one of the seventh and eighth aspects of the present invention, there is provided the power source circuit whose output has a negative temperature characteristic or a clamp circuit whose clamp voltage has a negative temperature characteristic. Therefore, even if the coercive voltage of the ferroelectric layer decreases due to an increase in the operation temperature of the nonvolatile memory, the electric field to be exerted on the ferroelectric layer of non-selected memory cells can be moderated. As a result, the charge inversion of the ferroelectric layer of the non-selected memory cells can be reliably prevented. Therefore, the operation of the nonvolatile memory in a required temperature range can be reliably ensured, and the nonvolatile memory can have stable properties.

In the nonvolatile memory according to any one of the ninth to eleventh aspects of the present invention, further, the first electrodes are in common in a plurality of memory cells constituting the memory unit or sub-memory unit, so that the memory unit or sub-memory unit is in a state in which a kind of additional load capacity is added to the first electrode. Therefore, an increase in the potential of the first electrode in a floating state can be prevented when a voltage is applied to the plate line at the time of reading out data, so that a sufficient potential difference can be generated between the first electrode and the second electrode, and that the ferroelectric layer can be allowed to undergo reliable polarization inversion.

In the nonvolatile memory according to any one of the twelfth and thirteenth aspects of the present invention and the operation method of any one of the first to third aspects of the present invention, a higher integration degree of a nonvolatile memory can be attained. Further, in the nonvolatile memory operation method according to any one of the first and second aspects of the present invention, readout and re-writing of data stored in the memory cells sharing the plate line are performed by carrying out the potential rising and the potential falling of the plate line once each, and in the nonvolatile memory operation method according to the third aspect of the present invention, readout of data stored in the memory cells sharing the plate line is performed by providing the plate line with a pulse and then consecutively selecting transistors for selection in the number of N. Therefore, the memory cells sharing the plate line are not disturbed, and the number of times of disturbance on the memory cells can be decreased. While the plate line connected to a plurality of memory cells has a large load capacity and has a low driving speed (that is, its charging and discharging take a lot of time), the readout and re-writing of data stored in the memory cells are performed by carrying out the potential rising and the potential falling of the plate line once each, so that a faster operation and a low power consumption can be attained. In the nonvolatile memory according to any one of the twelfth and thirteenth aspects of the present invention, further, there is provided the latch circuit or are provided the first and second latch circuits, so that re-writing data into the memory cells or the first and second memory cells can be reliably performed.

What is claimed is:

1. A ferroelectric-type nonvolatile semiconductor memory comprising;
   (A) a bit line,
   (B) a transistor for selection,
   (C) memory units in the number of N, each memory unit comprising memory cells in the number of M wherein $N \geq 2$ and $M \geq 2$, and
   (D) plate lines in the number of M×N, in which
      the memory units in the number of N are stacked through an insulating interlayer,
      each memory cell comprises a first electrode, a ferroelectric layer and a second electrode,
      the first electrodes are in common in each memory unit, and the common first electrode is connected to the bit line through the transistor for selection, and
      the second electrode of the m-th memory cell in the n-th memory unit is connected to the [(n−1)M+m]-th plate line wherein m=1, 2 . . . M and n=1, 2 . . N.

2. The ferroelectric-type nonvolatile semiconductor memory according to claim 1, in which the ferroelectric layer constituting the memory cells of the memory unit positioned above has a lower crystallization temperature than the ferroelectric layer constituting the memory cells of the memory unit positioned below.

3. A ferroelectric-type nonvolatile semiconductor memory comprising;
   (A) a bit line,
   (B) transistors for selection in the number of N wherein $N \geq 2$,
   (C) memory units in the number of N, each memory unit comprising memory cells in the number of M wherein $M \geq 2$, and
   (D) plate lines in the number of M, in which
      each memory cell comprises a first electrode, a ferroelectric layer and a second electrode,
      the first electrodes are in common in each memory unit,
      the common first electrode in the n-th memory unit is connected to the bit line through the n-th transistor for selection wherein n=1, 2 . . . N, and
      in the n-th memory unit, the second electrode of the m-th memory cell is connected to the m-th plate line common to the memory units wherein m=1, 2 . . . M.

4. The ferroelectric-type nonvolatile semiconductor memory according to claim 3, in which the memory units in the number of N are stacked through an insulating interlayer.

5. The ferroelectric-type nonvolatile semiconductor memory according to claim 4, in which the ferroelectric layer constituting the memory cells of the memory unit positioned above has a lower crystallization temperature than the ferroelectric layer constituting the memory cells of the memory unit positioned below.

6. A ferroelectric-type nonvolatile semiconductor memory comprising;
   (A) a bit line,
   (B) transistors for selection in the number of 2N wherein $N \geq 1$,
   (C) memory units in the number of 2N, each memory unit comprising memory cells in the number of M wherein $M \geq 2$, and
   (D) plate lines in the number of M, in which
      each memory cell comprises a first electrode, a ferroelectric layer and a second electrode,
      the first electrodes are in common in each memory unit,
      the common first electrode in the (2n−1)-th memory unit is connected to the bit line through the (2n−1)-th transistor for selection wherein n=1, 2 . . . N,
      the common first electrode in the 2n-th memory unit is connected to the bit line through the 2n-th transistor for selection, and
      the m-th memory cell constituting the (2n−1)-th memory unit and the m-th memory cell constituting the 2n-th memory unit share the second electrode, and the shared m-th second electrode is connected to the m-th plate line wherein m=1, 2 . . . M.

7. A ferroelectric-type nonvolatile semiconductor memory comprising a first memory unit and a second memory unit, the first memory unit comprising;
   (A-1) a first bit line,
   (B-1) first transistor or transistors for selection in the number of N wherein $N \geq 1$,
   (C-1) first sub-memory unit or units in the number of N, each first sub-memory unit comprising first memory cells in the number of M wherein $M \geq 2$, and
   (D-1) plate lines in the number of M, each of the plate lines being common to the first memory cell or cells constituting the first sub-memory unit or units in the number of N, and the second memory unit comprising;
   (A-2) a second bit line,
   (B-2) second transistor or transistors for selection in the number of N,
   (C-2) second sub-memory unit or units in the number of N, each second sub-memory unit comprising second memory cells in the number of M, and
   (D-2) the plate lines in the number of M, each of the plate lines being common to the second memory cell or cells constituting the second sub-memory unit or units in the number of N, the plate lines constituting the second memory unit being common to the plate lines constituting the first memory unit, in which
      the first sub-memory unit is stacked on the second sub-memory unit through an insulating interlayer,
      each memory cell comprises a first electrode, a ferroelectric layer and a second electrode,
      in the first memory unit, the first electrodes of the first memory cells constituting the n-th-place first sub-memory unit are in common in the n-th-place first sub-memory unit wherein n=1, 2 . . . N; the common first electrode in the n-th-place first sub-memory unit is connected to the first bit line through the n-th-place first transistor for selection; and the second electrode of the m-th-place first memory cell is connected to the common m-th plate line wherein m=1, 2 . . . M, and
      in the second memory unit, the first electrodes of the second memory cells constituting the n-th-place second sub-memory unit are in common in the n-th-place second sub-memory unit; the common first electrode in the n-th-place second sub-memory unit is connected to the second bit line through the n-th-place second transistor for selection; and the second electrode of the m-th-place second memory cell is connected to the common m-th plate line.

8. The ferroelectric-type nonvolatile semiconductor memory according to claim 7, in which the ferroelectric layer constituting the memory cells of the sub-memory unit positioned above has a lower crystallization temperature than the ferroelectric layer constituting the memory cells of the sub-memory unit positioned below.

9. The ferroelectric-type nonvolatile semiconductor memory according to claim 7, in which one of the first bit line and the second bit line is connected to a sense amplifier to which the other is connected.

10. The ferroelectric-type nonvolatile semiconductor memory according to claim 9, in which the n-th-place first transistor for selection and the n-th-place second transistor for selection are connected to the same word line.

11. The ferroelectric-type nonvolatile semiconductor memory according to claim 9, in which the n-th-place first transistor for selection and the n-th-place second transistor for selection are connected to the different word lines.

12. A ferroelectric-type nonvolatile semiconductor memory comprising a first memory unit and a second memory unit, the first memory unit comprising;
   (A-1) a first bit line,
   (B-1) first transistor or transistors for selection in the number of N wherein N≧1,
   (C-1) first sub-memory unit or units in the number of N, each first sub-memory unit comprising first memory cells in the number of M wherein M≧2, and
   (D-1) plate lines in the number of M, each of the plate lines being common to the first memory cell or cells constituting the first sub-memory unit or units in the number of N, and the second memory unit comprising;
   (A-2) a second bit line,
   (B-2) second transistor or transistors for selection in the number of N,
   (C-2) second sub-memory unit or units in the number of N, each second sub-memory unit comprising second memory cells in the number of M, and
   (D-2) the plate lines in the number of M, each of the plate lines being common to the second memory cell or cells constituting the second sub-memory unit or units in the number of N, the plate lines constituting the second memory unit being common to the plate lines constituting the first memory unit, in which
      each memory cell comprises a first electrode, a ferroelectric layer and a second electrode,
      in the first memory unit, the first electrodes of the first memory cells constituting the n-th-place first sub-memory unit are in common in the n-th-place first sub-memory unit wherein n=1, 2 . . . N; and the common first electrode in the n-th-place first sub-memory unit is connected to the first bit line through the n-th-place first transistor for selection,
      in the second memory unit, the first electrodes of the second memory cells constituting the n-th-place second sub-memory unit are in common in the n-th-place second sub-memory unit; and the common first electrode in the n-th-place second sub-memory unit is connected to the second bit line through the n-th-place second transistor for selection, and
      the m-th-place first memory cell constituting the n-th-place first sub-memory unit in the first memory unit and the m-th-place second memory cell constituting the n-th-place second sub-memory unit in the second memory unit share the second electrode, and the shared m-th second electrode is connected to the m-th plate line wherein m=1, 2 . . . M.

13. The ferroelectric-type nonvolatile semiconductor memory according to claim 12, in which one of the first bit line and the second bit line is connected to a sense amplifier to which the other is connected.

14. The ferroelectric-type nonvolatile semiconductor memory according to claim 13, in which the n-th-place first transistor for selection and the n-th-place second transistor for selection are connected to the same word line.

15. The ferroelectric-type nonvolatile semiconductor memory according to claim 13, in which the n-th-place first transistor for selection and the n-th-place second transistor for selection are connected to the different word lines.

16. A ferroelectric-type nonvolatile semiconductor memory having memory cells each of which comprises a first electrode, a ferroelectric layer and a second electrode and which are stacked through an insulating interlayer,
   in which the ferroelectric layer constituting the memory cell positioned above has a lower crystallization temperature than the ferroelectric layer constituting the memory cell positioned below.

17. A ferroelectric-type nonvolatile semiconductor memory having a memory unit in which a plurality of memory cells having a capacitor member having a ferroelectric layer are provided and which has a structure in which a disturbance takes place in nonselected memory cells when a selected memory cell is accessed,
   in which provided is a power source circuit that is connected to the capacitor member and whose output has a negative temperature characteristic.

18. The ferroelectric-type nonvolatile semiconductor memory according to claim 17, in which one end of the capacitor member is connected to a bit line, the other end thereof is connected to a plate line, and the power source circuit is connected to the bit line or the plate line or is connected to the bit line and the plate line.

19. The ferroelectric-type nonvolatile semiconductor memory according to claim 17, in which the power source circuit comprises;
   (a) a reference-voltage circuit,
   (b) a comparator having a first input portion into which a reference voltage outputted from the reference-voltage circuit is inputted, and
   (c) a circuit for applying a negative feed back to an output voltage from the comparator according to the output voltage from the comparator.

20. The ferroelectric-type nonvolatile semiconductor memory according to claim 19, in which the reference-voltage circuit comprises a first resistance element having one end connected to a power source and a second resistance element having one end connected to the other end of the first resistance element and the other end grounded, and
   the reference voltage is outputted from a connection portion of the first resistance element and the second resistance element.

21. The ferroelectric-type nonvolatile semiconductor memory according to claim 20, in which the first resistance element and the second resistance element have a negative temperature characteristic, and
   the absolute value of a change in the resistance value of the second resistance element based on the temperature change is greater than the absolute value of a change in the resistance value of the first resistance element based on the temperature change.

22. The ferroelectric-type nonvolatile semiconductor memory according to claim 21, in which the first resistance element and the second resistance element are constituted of a resistance material.

23. The ferroelectric-type nonvolatile semiconductor memory according to claim 20, in which the first resistance element comprises a resistance material, and the second resistance element comprises at least one PMOS FET having a drain portion and a gate portion which are short-circuited.

24. The ferroelectric-type nonvolatile semiconductor memory according to claim 20, in which the first resistance element has a positive temperature characteristic, and the second resistance element has a negative temperature characteristic.

25. The ferroelectric-type nonvolatile semiconductor memory according to claim 24, in which the first resistance element comprises a PMOS FET having a gate portion grounded and the second resistance element comprises a resistance material.

26. A ferroelectric-type nonvolatile semiconductor memory having a memory unit in which a plurality of memory cells having a capacitor member having a ferroelectric layer are provided and which has a structure in which a disturbance takes place in nonselected memory cells when a selected memory cell is accessed,
  in which one end of the capacitor member is connected to a bit line and the other end thereof is connected to a plate line, and
  provided is a clamp circuit which is connected to the bit line and whose clamp voltage has a negative temperature characteristic.

27. The ferroelectric-type nonvolatile semiconductor memory according to claim 26, in which a power source circuit connected to the plate line is further provided and the output of the power source circuit has a negative temperature characteristic.

28. The ferroelectric-type nonvolatile semiconductor memory according to claim 26, in which the clamp circuit is constituted to have a structure in which PMOS FETs whose drain portion and gate portion are short-circuited each are connected in series.

29. A ferroelectric-type nonvolatile semiconductor memory comprising;
  (A) a bit line,
  (B) a transistor for selection,
  (C) a memory unit comprising memory cells in the number of M wherein $M \geq 2$, and
  (D) plate lines in the number of M, in which
    each memory cell comprises a first electrode, a ferroelectric layer and a second electrode,
    the first electrodes of the memory cells are in common in each memory unit,
    the common first electrode is connected to the bit line through the transistor for selection, and
    the second electrode constituting the memory cell is connected to the plate line, and further in which
      (E) a signal detective circuit for detecting a change in potential of the common first electrode and transmitting a detection result to the bit line as a current or a voltage is provided.

30. The ferroelectric-type nonvolatile semiconductor memory according to claim 29, in which the transistor for selection and the signal detective circuit are formed on a semiconductor substrate, and the memory unit is formed on an insulation layer formed on the semiconductor substrate.

31. A ferroelectric-type nonvolatile semiconductor memory comprising;
  (A) a bit line,
  (B) a transistor for writing-in,
  (C) a memory unit comprising memory cells in the number of M wherein $M \geq 2$, and
  (D) plate lines in the number of M, in which
    each memory cell comprises a first electrode, a ferroelectric layer and a second electrode,
    the first electrodes of the memory cells are in common in each memory unit,
    the common first electrode is connected to the bit line through the transistor for writing-in, and
    the second electrode constituting the memory cell is connected to the plate line, and
    the ferroelectric-type nonvolatile semiconductor memory further having;
  (E) a transistor for detection, and
  (F) a transistor for read-out,
    and further in which one end of the transistor for detection is connected to a wiring having a predetermined potential, and the other end thereof is connected to the bit line through the transistor for read-out, and
    when data stored in the memory cell is read out, the transistor for read-out is brought into a continuity state, and the operation of the transistor for detection is controlled by means of a potential that takes place in the common first electrode on the basis of the data stored in the memory cell.

32. The ferroelectric-type nonvolatile semiconductor memory according to claim 31, in which the value of M satisfies $2 \leq M \leq 128$.

33. A ferroelectric-type nonvolatile semiconductor memory comprising;
  (A) a bit line,
  (B) a transistor for writing-in,
  (C) memory units in the number of N, each memory unit comprising memory cells in the number of M wherein $N \geq 2$ and $M \geq 2$,
  (D) transistors for selection in the number of N, and
  (E) plate lines in the number of M, each plate line being common to the memory cells each of which constitutes each of the memory units in the number of N, in which
    each memory cell comprises a first electrode, a ferroelectric layer and a second electrode,
    the first electrodes are in common in each memory unit,
    the common first electrode in the n-th memory unit is connected to the bit line through the n-th transistor for selection and the transistor for writing-in wherein n=1, 2 . . . N, and
    the second electrode constituting the m-th memory cell is connected to the common m-th plate line wherein m=1, 2 . . . M,
    the ferroelectric-type nonvolatile semiconductor memory further comprising;
    (F) a transistor for detection, and
    (G) a transistor for read-out,
      and further in which one end of the transistor for detection is connected to a wiring having a predetermined potential, and the other end thereof is connected to the bit line through the transistor for read-out, and
      when data stored in the memory cell constituting the n-th memory unit is read out, the n-th transistor for selection and the transistor for read-out are brought into a continuity state, and the operation of the transistor for detection is controlled by means of a potential that takes place in the common first electrode on the basis of the data stored in the memory cell.

34. The ferroelectric-type nonvolatile semiconductor memory according to claim 33, in which the value of M satisfies $2 \leq M \leq 128$.

35. A ferroelectric-type nonvolatile semiconductor memory comprising a first memory unit and a second memory unit, the first memory unit comprising;

(A-1) a first bit line, (B-1) first transistor or transistors for selection in the number of N wherein $N \geq 1$, (C-1) first sub-memory unit or units in the number of N, each first sub-memory unit comprising first memory cells in the number of M wherein $M \geq 2$, and (D-1) plate lines in the number of M, each of the plate lines being common to the first memory cell or cells constituting the first sub-memory unit or units in the number of N, and the second memory unit comprising;

(A-2) a second bit line, (B-2) second transistor or transistors for selection in the number of N, (C-2) second sub-memory unit or units in the number of N, each second sub-memory unit comprising second memory cells in the number of M, (D-2) the plate lines in the number of M, each of the plate lines being common to the second memory cell or cells constituting the second sub-memory unit or units in the number of N, the plate lines constituting the second memory unit being common to the plate lines constituting the first memory unit, in which each memory cell comprises a first electrode, a ferroelectric layer and a second electrode, in the first memory unit, the first electrodes of the first memory cells constituting the n-th-place first sub-memory unit are in common in the n-th-place first sub-memory unit wherein n=1, 2 . . . N; the common first electrode in the n-th-place first sub-memory unit is connected to the first bit line through the n-th-place first transistor for selection; and the second electrode of the m-th-place first memory cell is connected to the common m-th-place plate line wherein m=1, 2 . . . M, in the second memory unit, the first electrodes of the second memory cells constituting the n-th-place second sub-memory unit are in common in the n-th-place second sub-memory unit; the common first electrode in the n-th-place second sub-memory unit is connected to the second-bit line through the n-th-place second transistor for selection; and the second electrode of the m-th-place second memory cell is connected to the common m-th-place plate line, and further wherein latch circuits in the number of P are provided between the first bit line and the second bit line for latching data stored in the first memory cell and second memory cell.

36. The ferroelectric-type nonvolatile semiconductor memory according to claim 31, in which $N \geq 1$ and P=2N are satisfied.

37. The ferroelectric-type nonvolatile semiconductor memory according to claim 36, in which the (2n−1)-th latch circuit latches the data stored in the first memory cell constituting the n-th-place first sub-memory unit, and the 2n-th latch circuit latches the data stored in the second memory cell constituting the n-th-place second sub-memory unit.

38. The ferroelectric-type nonvolatile semiconductor memory according to claim 35, in which $N \geq 2$ and P=N are satisfied.

39. The ferroelectric-type nonvolatile semiconductor memory according to claim 38, in which the n-th latch circuit latches the data stored in the first memory cell constituting the n-th-place first sub-memory unit and the second memory cell constituting the n-th-place second sub-memory unit.

40. The ferroelectric-type nonvolatile semiconductor memory according to claim 38, in which the first sub-memory units constituting the first memory unit are stacked through an insulating interlayer and the second sub-memory units constituting the second memory unit are stacked through an insulating interlayer.

41. The ferroelectric-type nonvolatile semiconductor memory according to claim 40, in which the first sub-memory unit constituting the first memory unit and the second sub-memory unit constituting the second memory unit are stacked through an insulating interlayer.

42. A ferroelectric-type nonvolatile semiconductor memory comprising;

(A) a bit line, (B) transistors for selection in the number of N wherein $N \geq 2$, (C) memory units in the number of N, each memory unit comprising memory cells in the number of M wherein $M \geq 2$, and (D) plate lines in the number of M, in which each memory cell comprises a first electrode, a ferroelectric layer and a second electrode, the first electrodes are in common in each memory unit, the common first electrode in the n-th memory unit is connected to the bit line through the n-th transistor for selection wherein n=1, 2 . . . N, and in the n-th memory unit, the second electrode of the m-th memory cell is connected to the m-th plate line common to the memory units wherein m=1, 2 . . . M, and further in which latch circuits in the number of at least N are connected to the bit line for latching data stored in the memory cells.

43. The ferroelectric-type nonvolatile semiconductor memory according to claim 43, in which the n-th latch circuit latches the data stored in the memory cell constituting the n-th memory unit wherein n=1, 2 . . . N.

44. The ferroelectric-type nonvolatile semiconductor memory according to claim 42, in which the memory units in the number of N are stacked through an insulating interlayer.

* * * * *